United States Patent [19]

Takeuchi et al.

[11] Patent Number: 6,046,940
[45] Date of Patent: Apr. 4, 2000

[54] NONVOLATILE SEMICONDUCTOR MEMORY DEVICE

[75] Inventors: Ken Takeuchi; Koji Sakui, both of Tokyo; Tomoharu Tanaka; Seiichi Aritome, both of Yokohama, all of Japan

[73] Assignee: Kabushiki Kaisha Toshiba, Kawasaki, Japan

[21] Appl. No.: 09/295,335

[22] Filed: Apr. 21, 1999

Related U.S. Application Data

[62] Division of application No. 08/866,350, May 30, 1997, Pat. No. 5,940,321, which is a division of application No. 08/496,625, Jun. 29, 1995, Pat. No. 5,680,347.

[30] Foreign Application Priority Data

| Jun. 29, 1994 | [JP] | Japan | 6-148319 |
| May 22, 1994 | [JP] | Japan | 6-218342 |
| May 15, 1995 | [JP] | Japan | 7-116005 |
| May 16, 1995 | [JP] | Japan | 7-116903 |

[51] Int. Cl.⁷ .................................................. G11C 7/00
[52] U.S. Cl. ........................ 365/185.17; 365/185.05; 365/185.18; 365/185.24; 365/185.11
[58] Field of Search .................. 365/185.01, 185.17, 365/185.05, 185.18, 185.24, 185.11

[56] References Cited

U.S. PATENT DOCUMENTS

| 3,754,841 | 8/1973 | Gradd et al. . | |
| 4,959,812 | 9/1990 | Momodomi et al. | 305/185.01 |
| 4,980,861 | 12/1990 | Herdt et al. | 365/203 |
| 5,355,332 | 10/1994 | Endoh et al. | 365/182 |
| 5,392,238 | 2/1995 | Kirisawa | 365/185 |
| 5,541,879 | 7/1996 | Suh et al. | 365/185.22 |
| 5,555,204 | 9/1996 | Endoh et al. | 365/189.01 |
| 5,587,948 | 12/1996 | Nakai | 365/185.17 |
| 5,659,505 | 8/1997 | Kobayashi et al. | 365/185.29 |
| 5,680,347 | 10/1997 | Takeuchi et al. | 365/185.17 |
| 5,761,122 | 6/1998 | Nakamura et al. | 365/185.21 |
| 5,784,327 | 7/1998 | Hazahi | 365/230.01 |
| 5,831,903 | 11/1998 | Ohuchi et al. | 365/185.22 |
| 5,917,752 | 6/1999 | Seki | 365/185.18 |
| 5,920,507 | 7/1999 | Takeuchi et al. | 365/185.22 |
| 5,940,321 | 8/1999 | Takeuchi et al. | 365/185.17 |

FOREIGN PATENT DOCUMENTS

| 25 05 880 A1 | 8/1976 | Germany . |
| 28 14 384 A1 | 10/1979 | Germany . |
| 32 38 882 A1 | 4/1984 | Germany . |
| 36 30 987 A1 | 3/1988 | Germany . |
| 39 08 677 | 7/1990 | Germany . |
| 3-50866 | 3/1991 | Japan . |
| 6-168596 | 6/1994 | Japan . |

*Primary Examiner*—Viet Q. Nguyen
*Attorney, Agent, or Firm*—Oblon, Spivak, McClelland, Maier & Neustadt, P.C.

[57] ABSTRACT

A nonvolatile semiconductor memory device comprises a memory cell array in which a plurality of memory cell units are arranged in a matrix, and a first and second common signal lines for exchanging signals with the memory cell array, wherein each of the memory cell units contains a nonvolatile memory section having at least one nonvolatile memory cell, a first select MOS transistor for making the nonvolatile memory section conducting to the first common signal line, and a second select MOS transistor with a threshold voltage different from that of the first select MOS transistor for making the nonvolatile memory section conducting to the second common signal line.

7 Claims, 100 Drawing Sheets

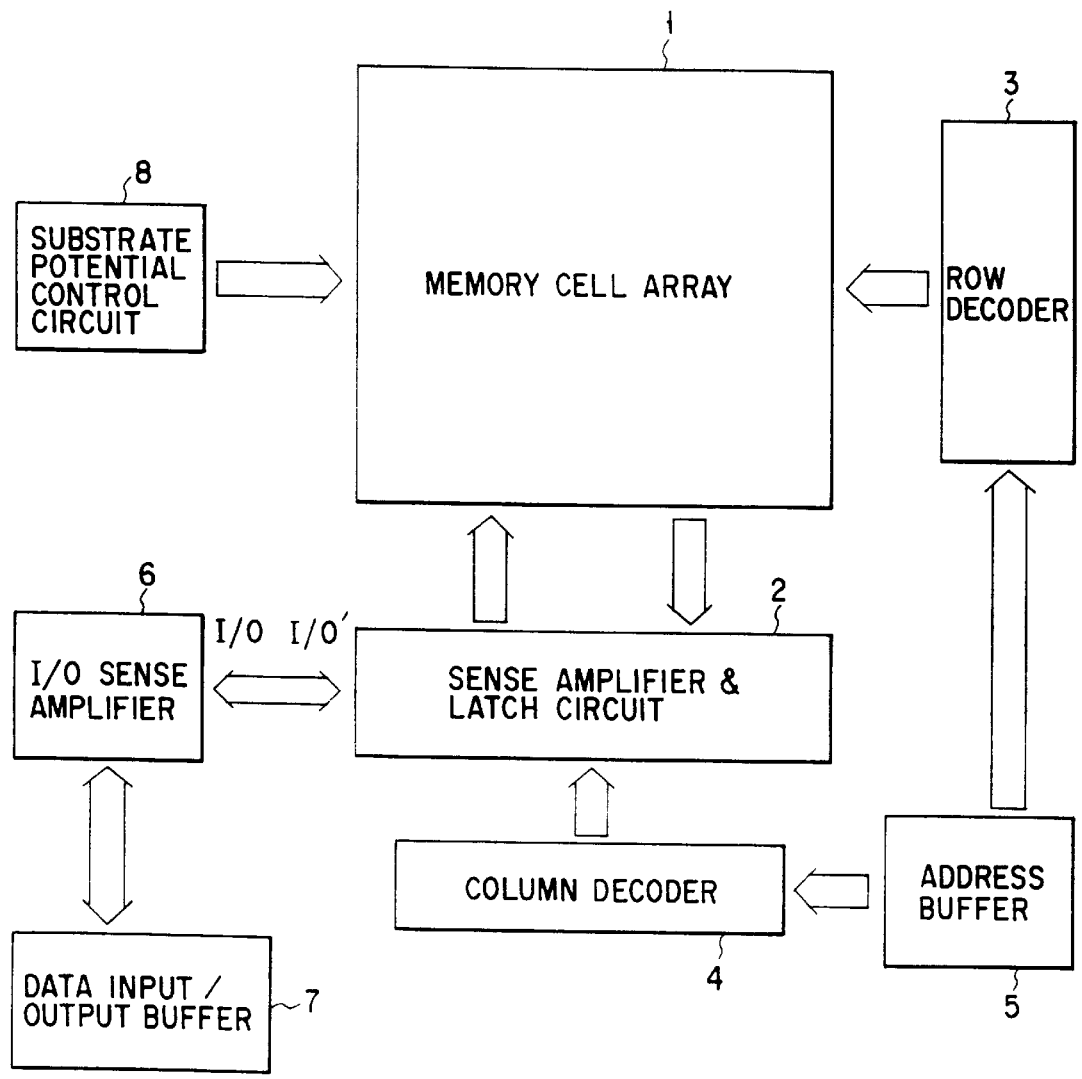
F I G. 10

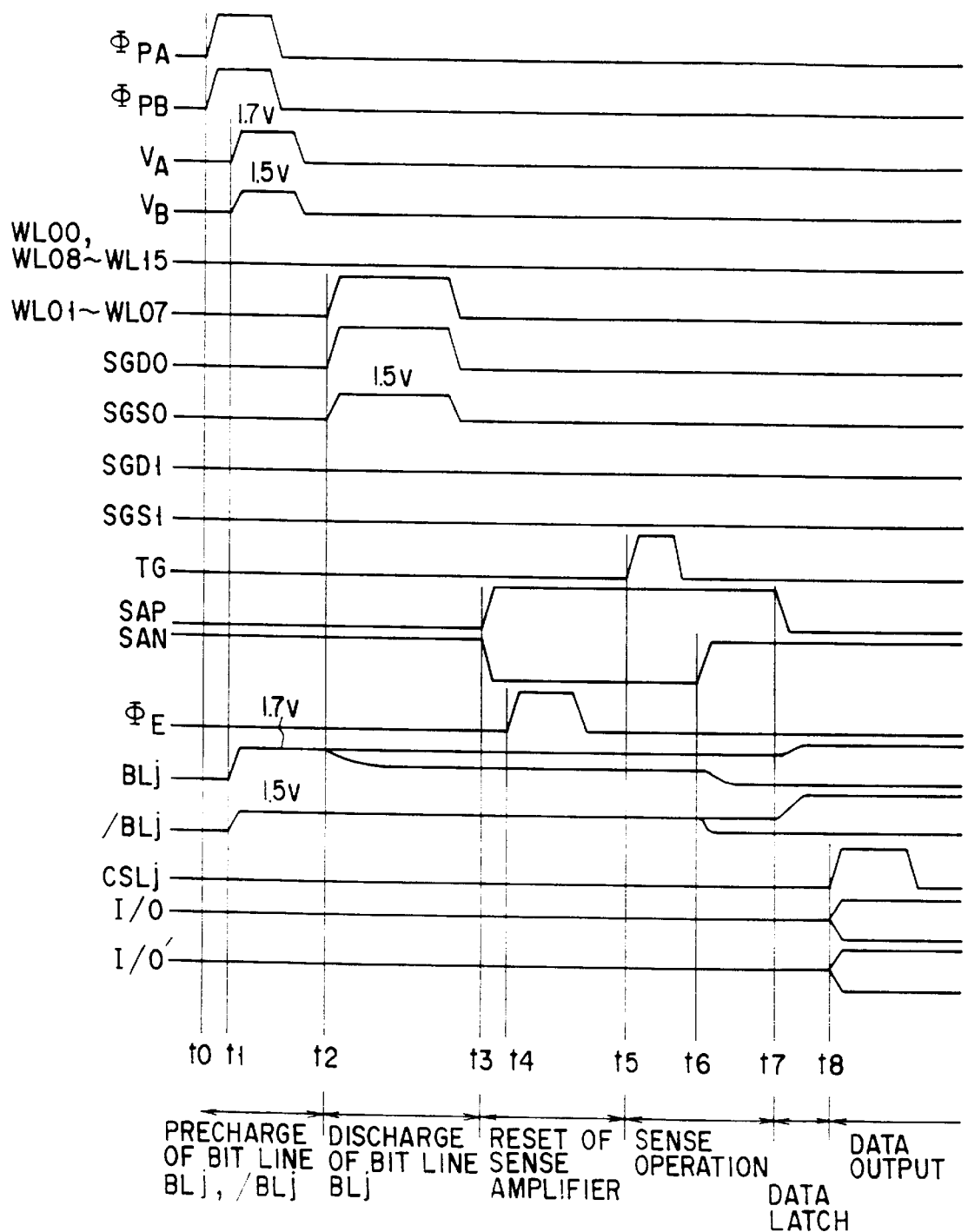
F I G. 18

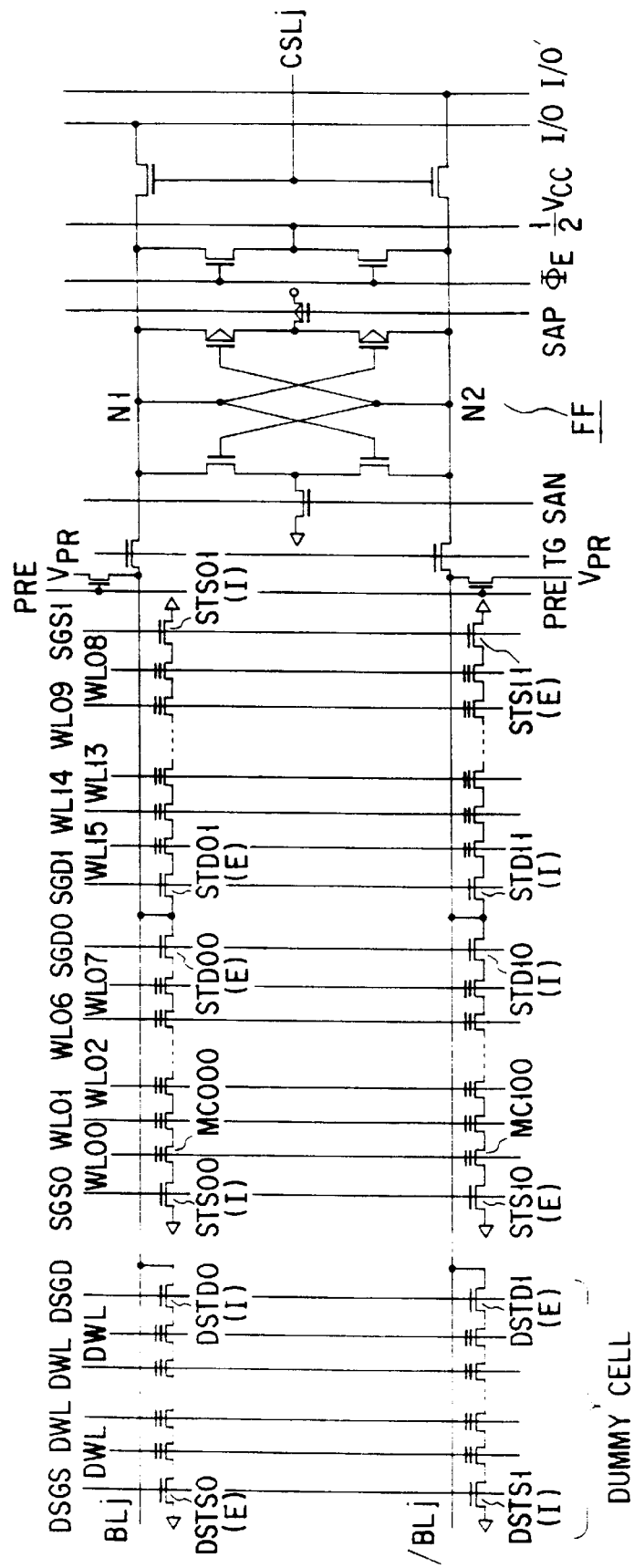
F I G. 20

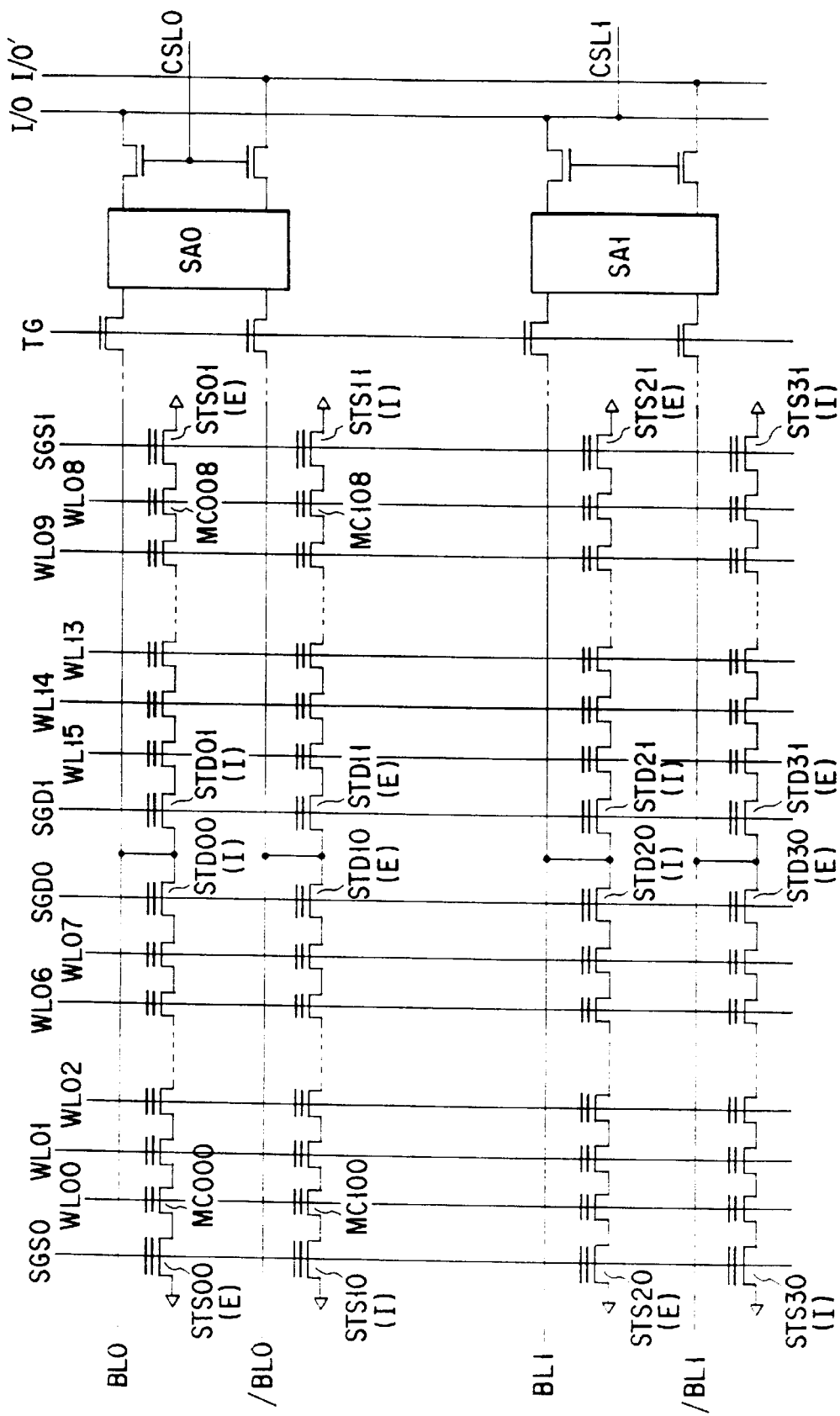
F I G. 24

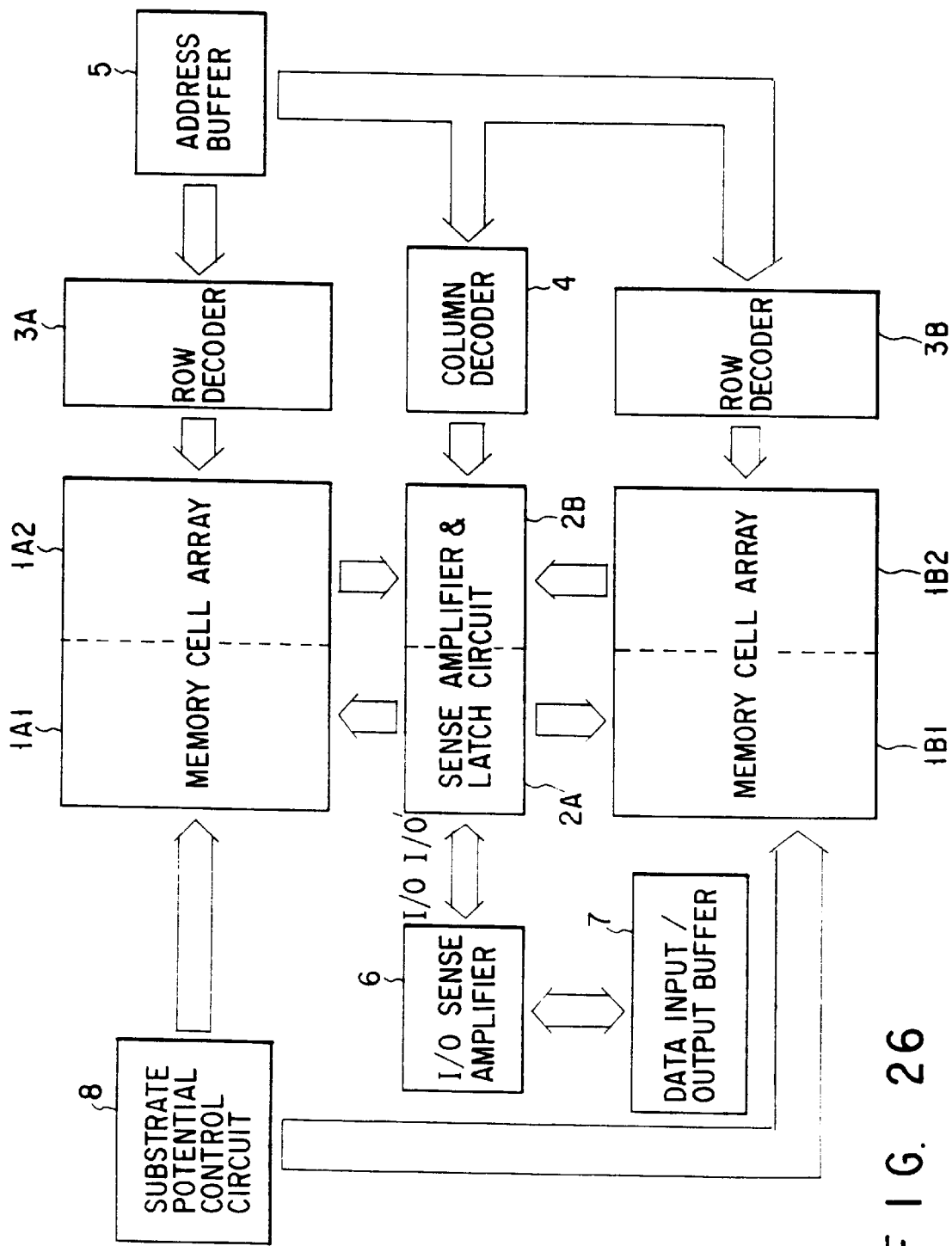
F I G. 26

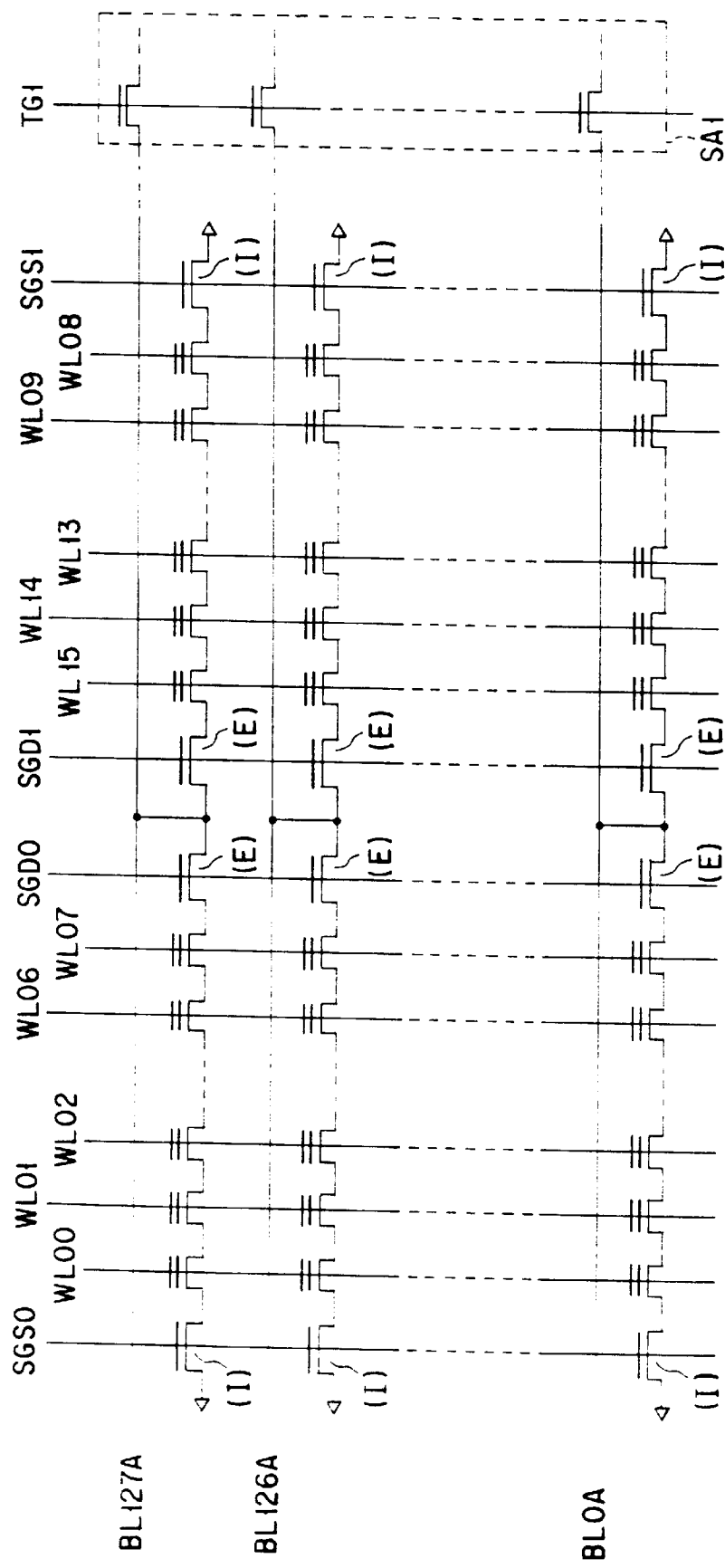
F I G. 27A

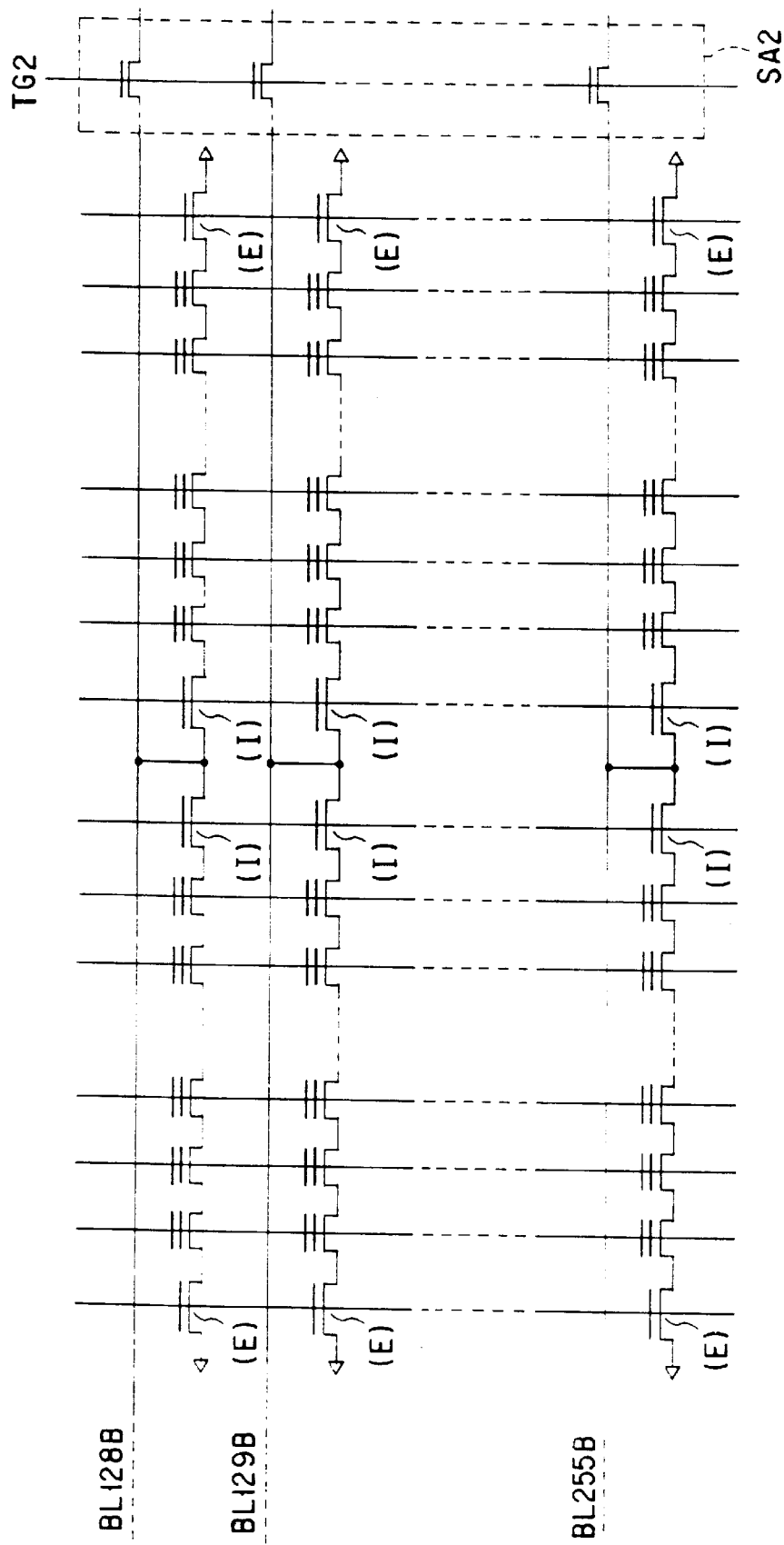
F I G. 27D

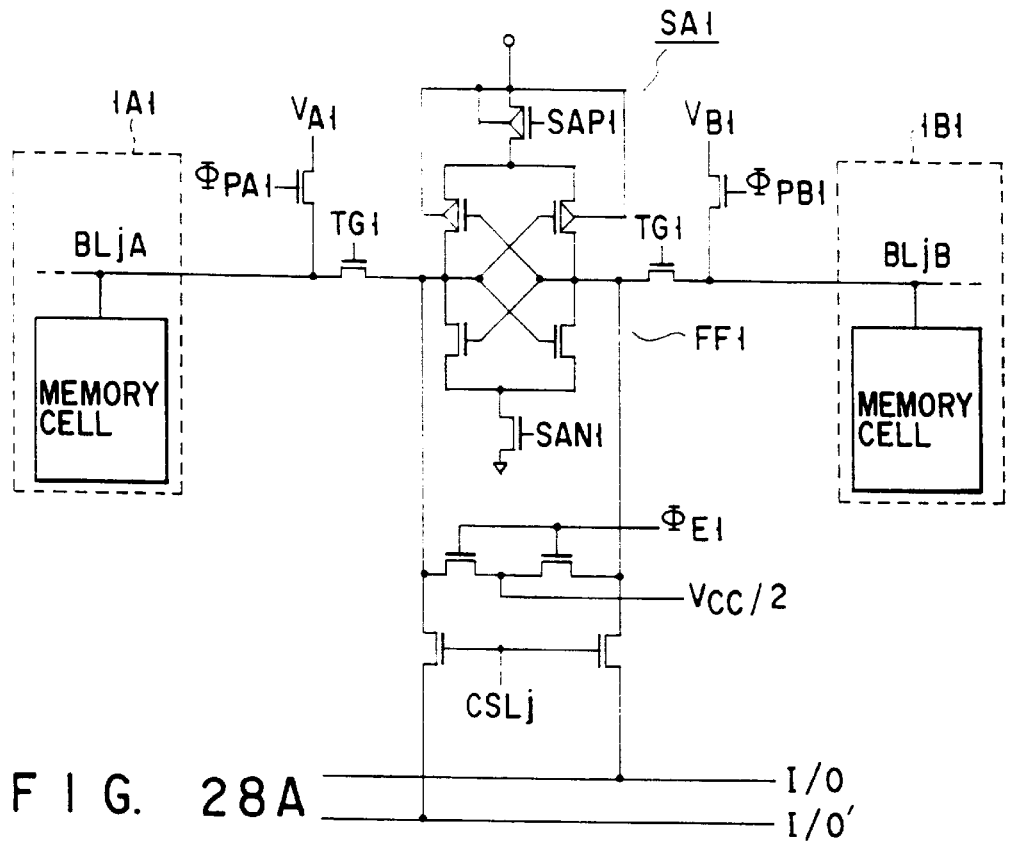
F I G. 28A
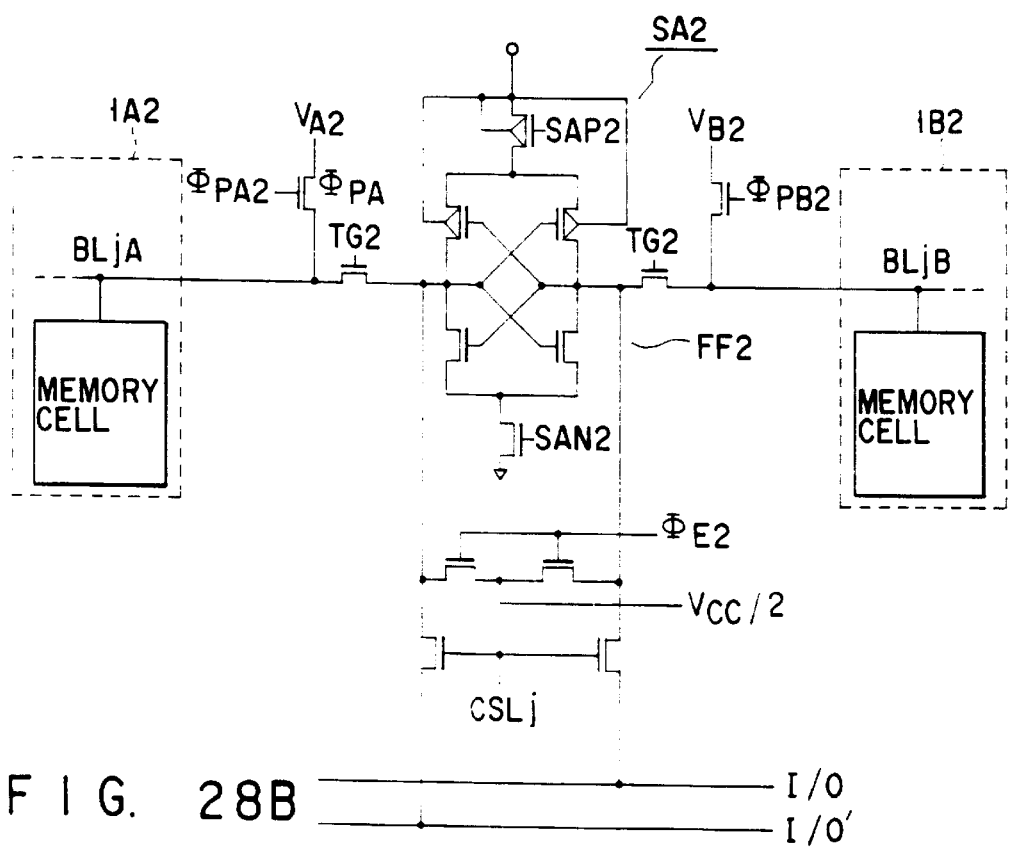
F I G. 28B

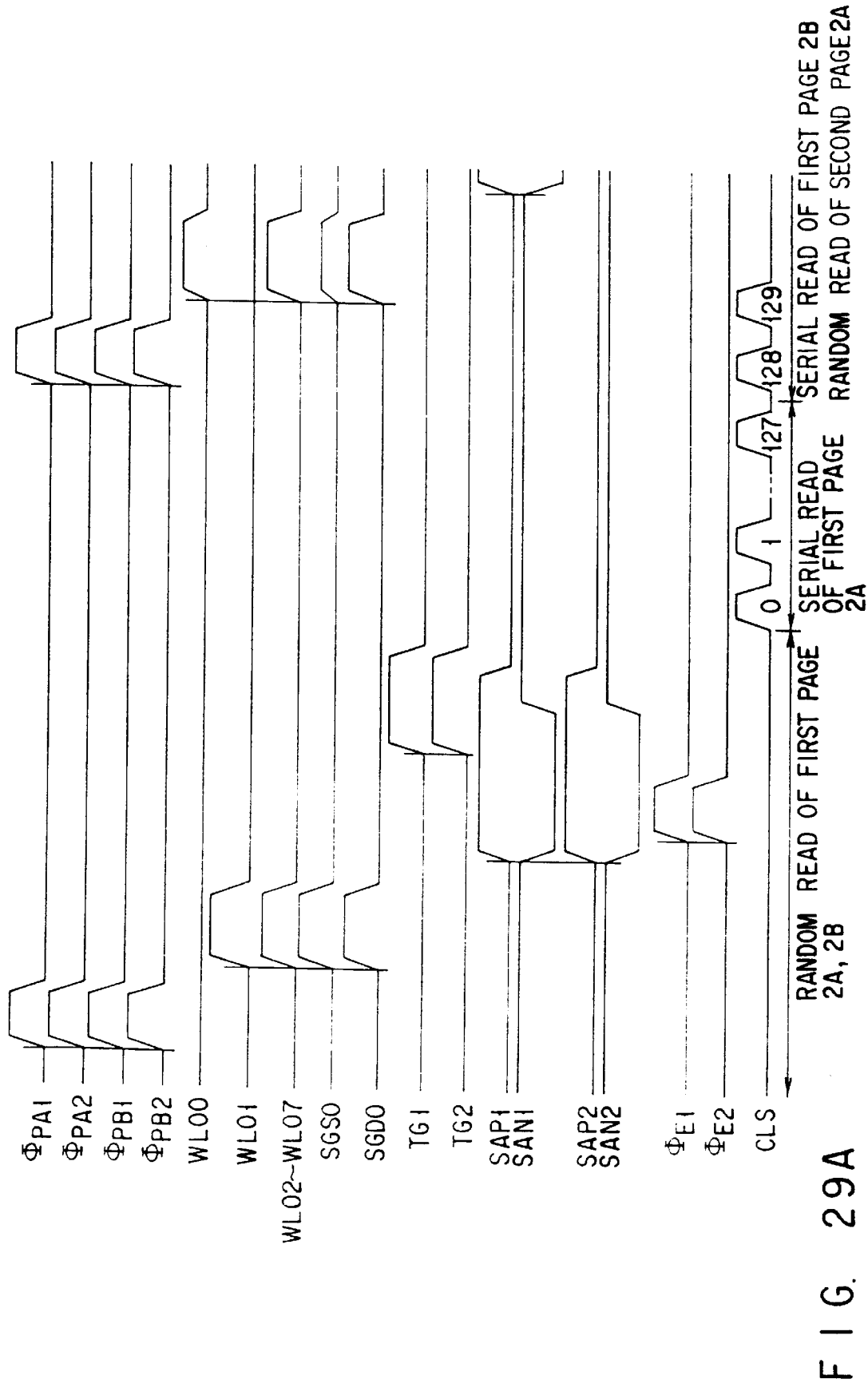
F I G. 29A

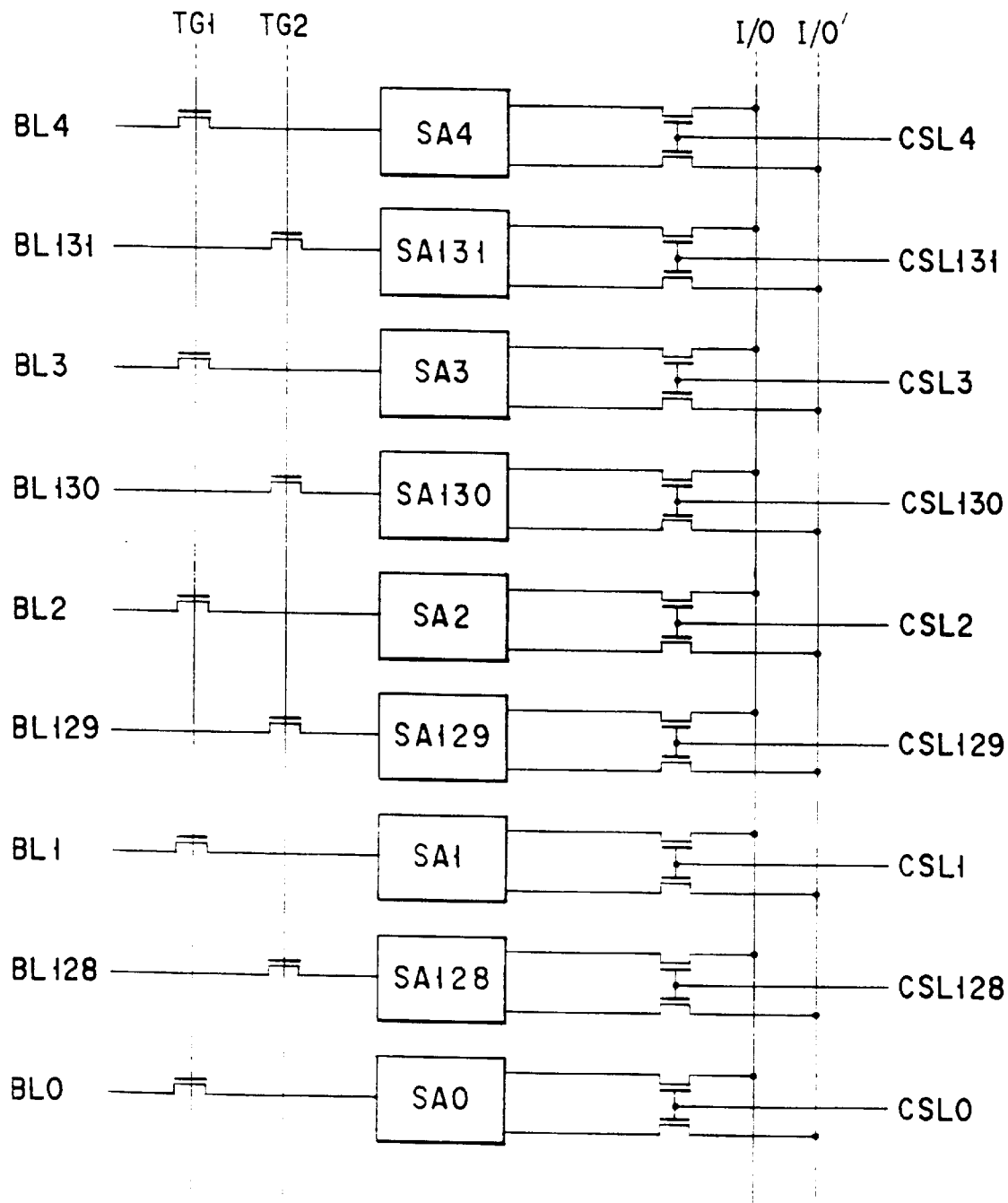
F I G. 32

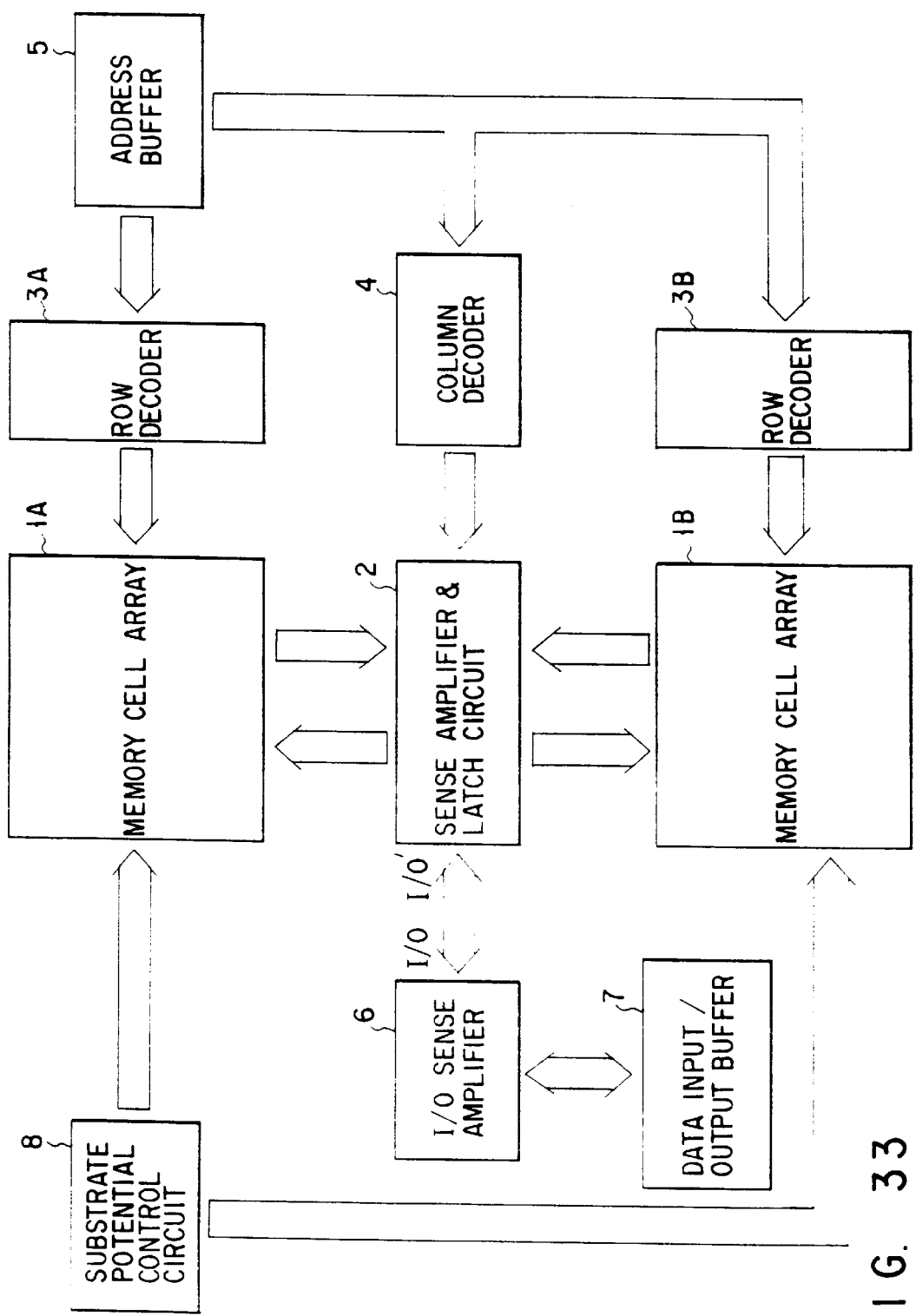
F I G. 33

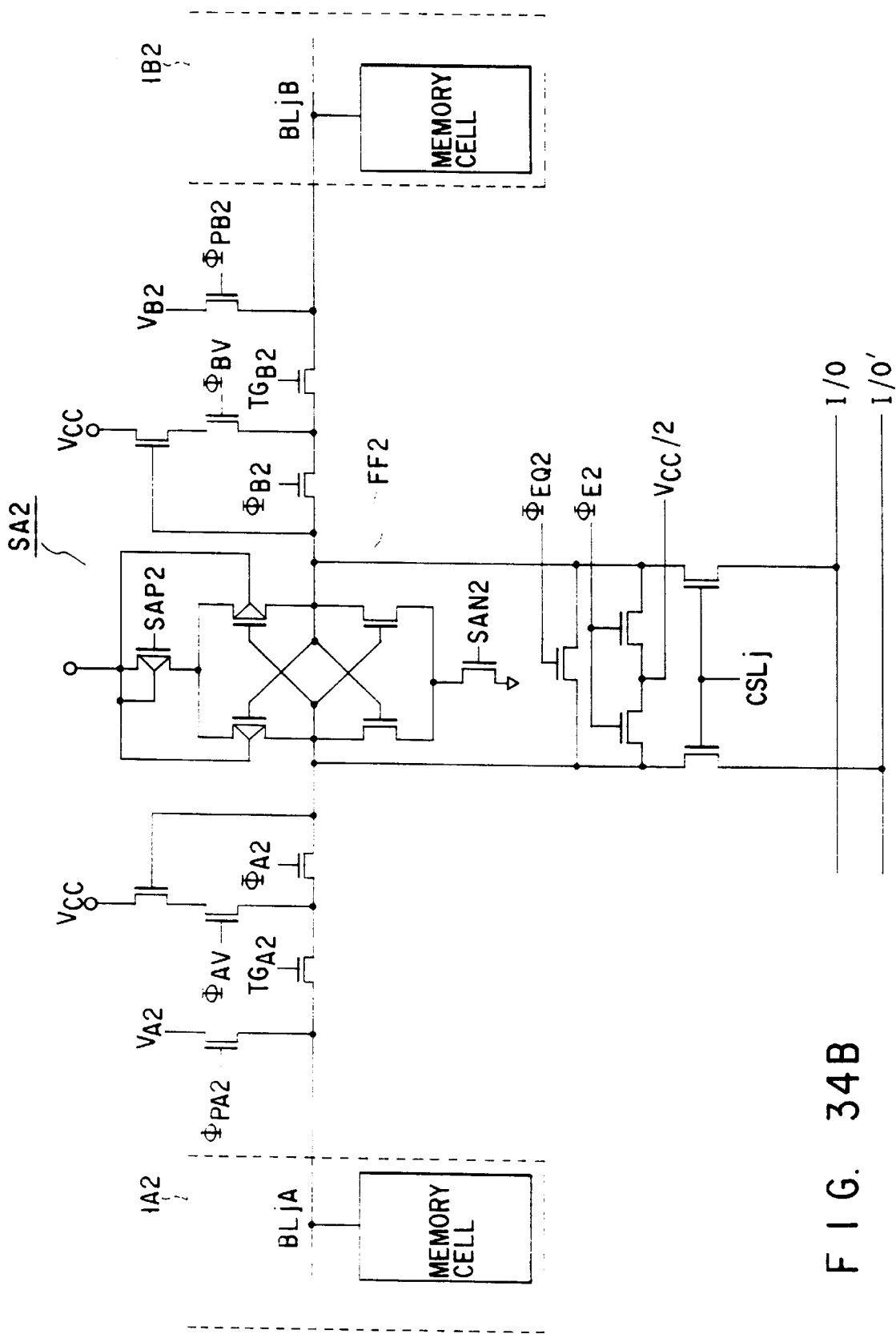
F I G. 34B

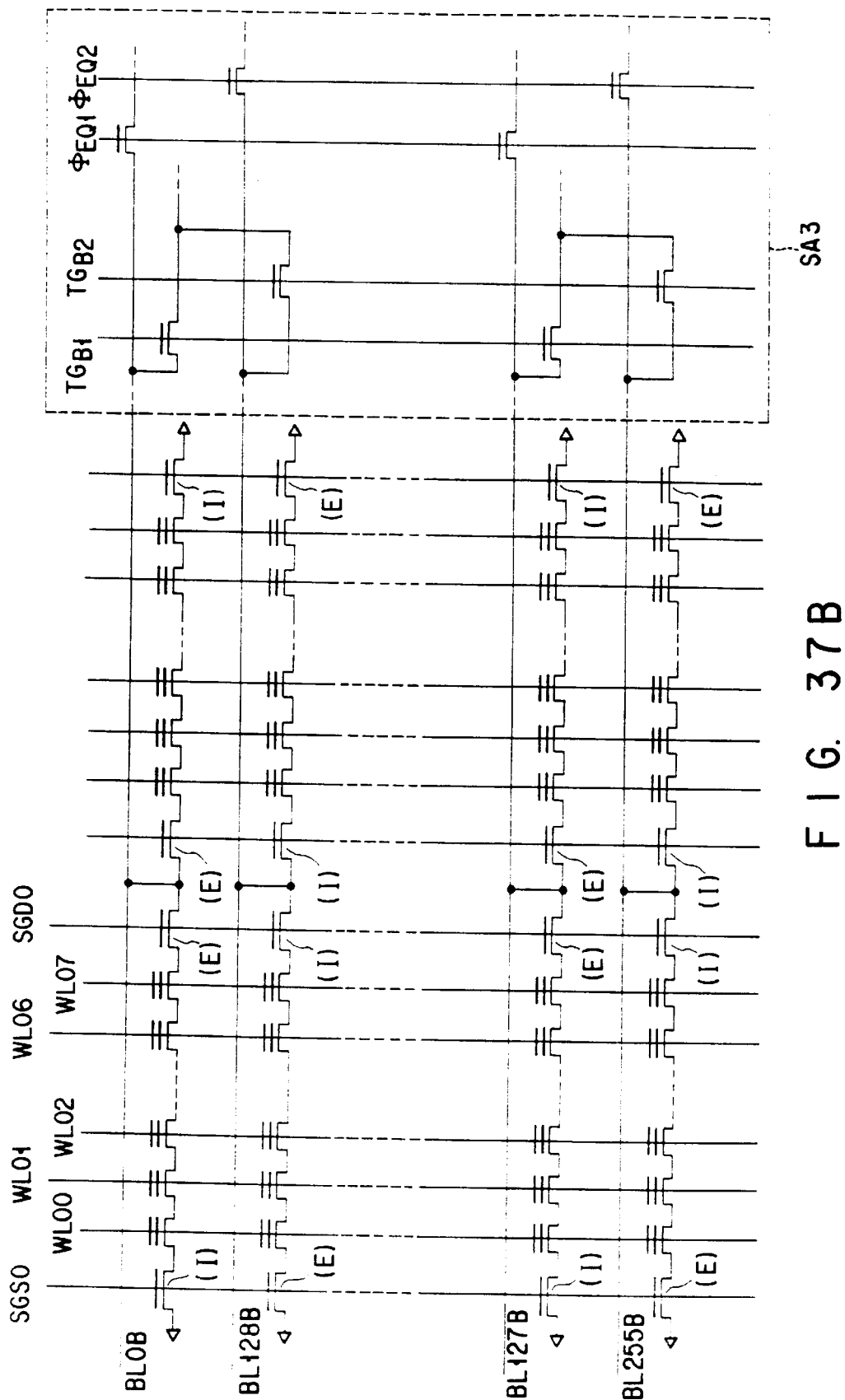
F I G. 37B

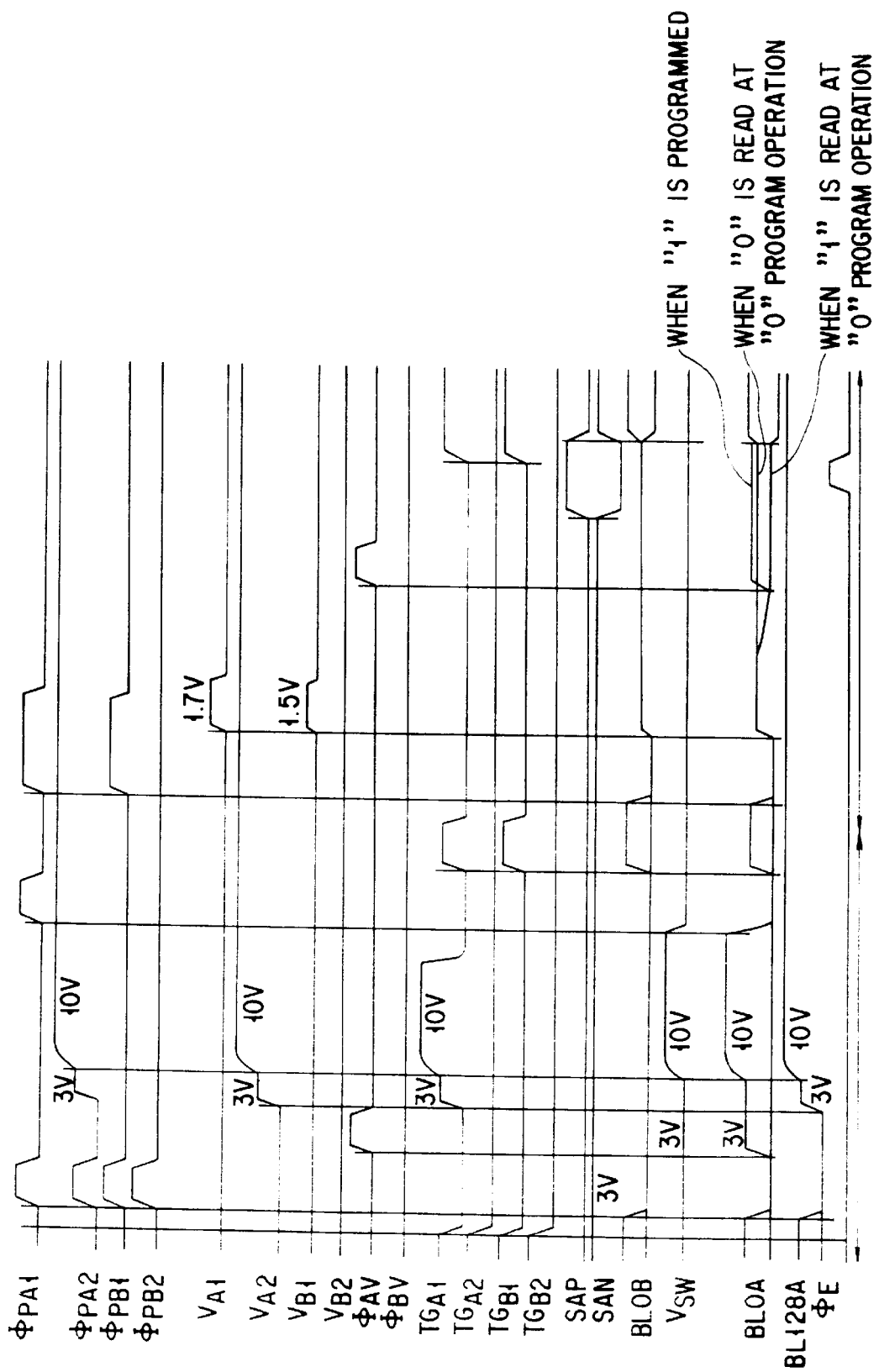
F I G. 40

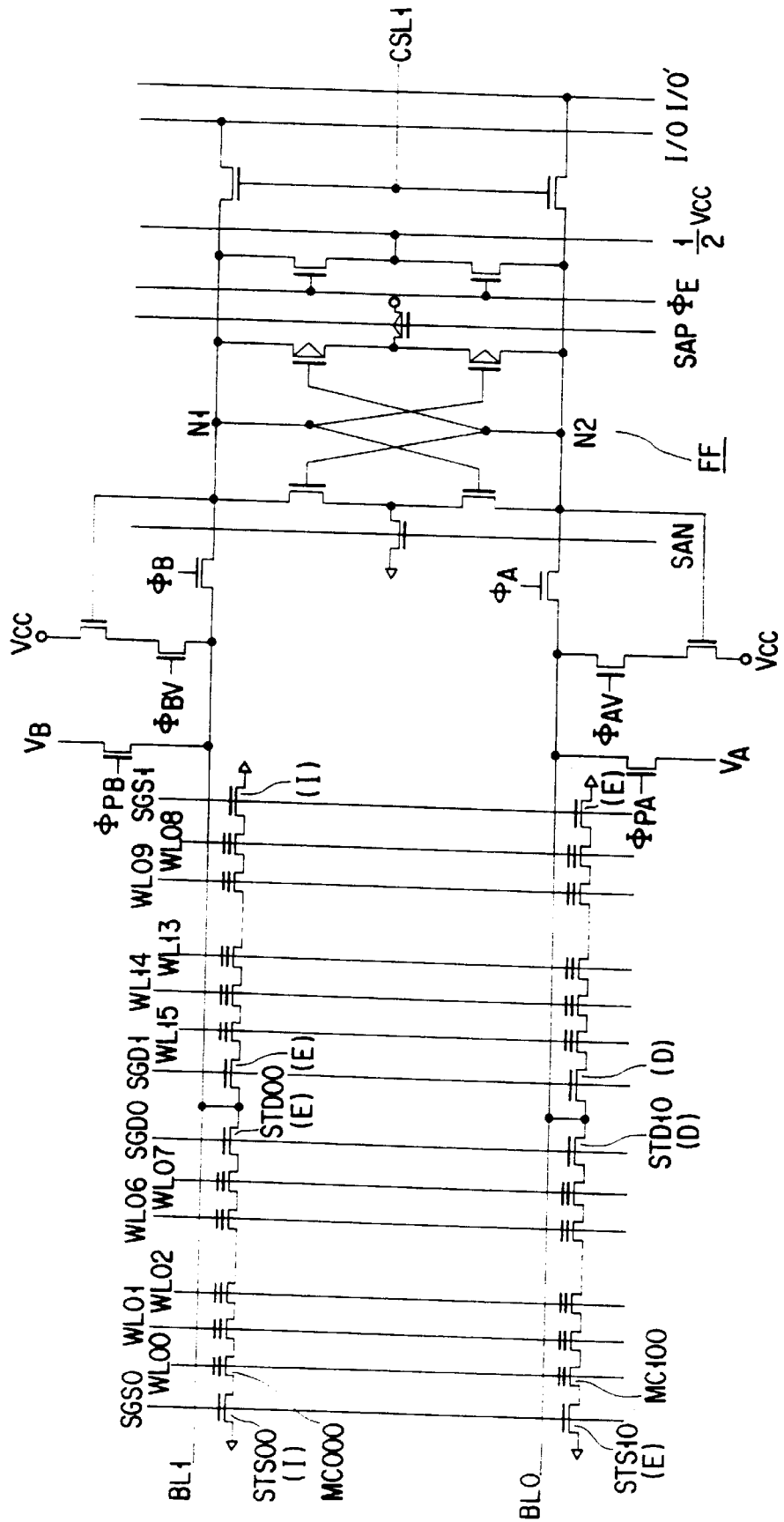
F I G. 47

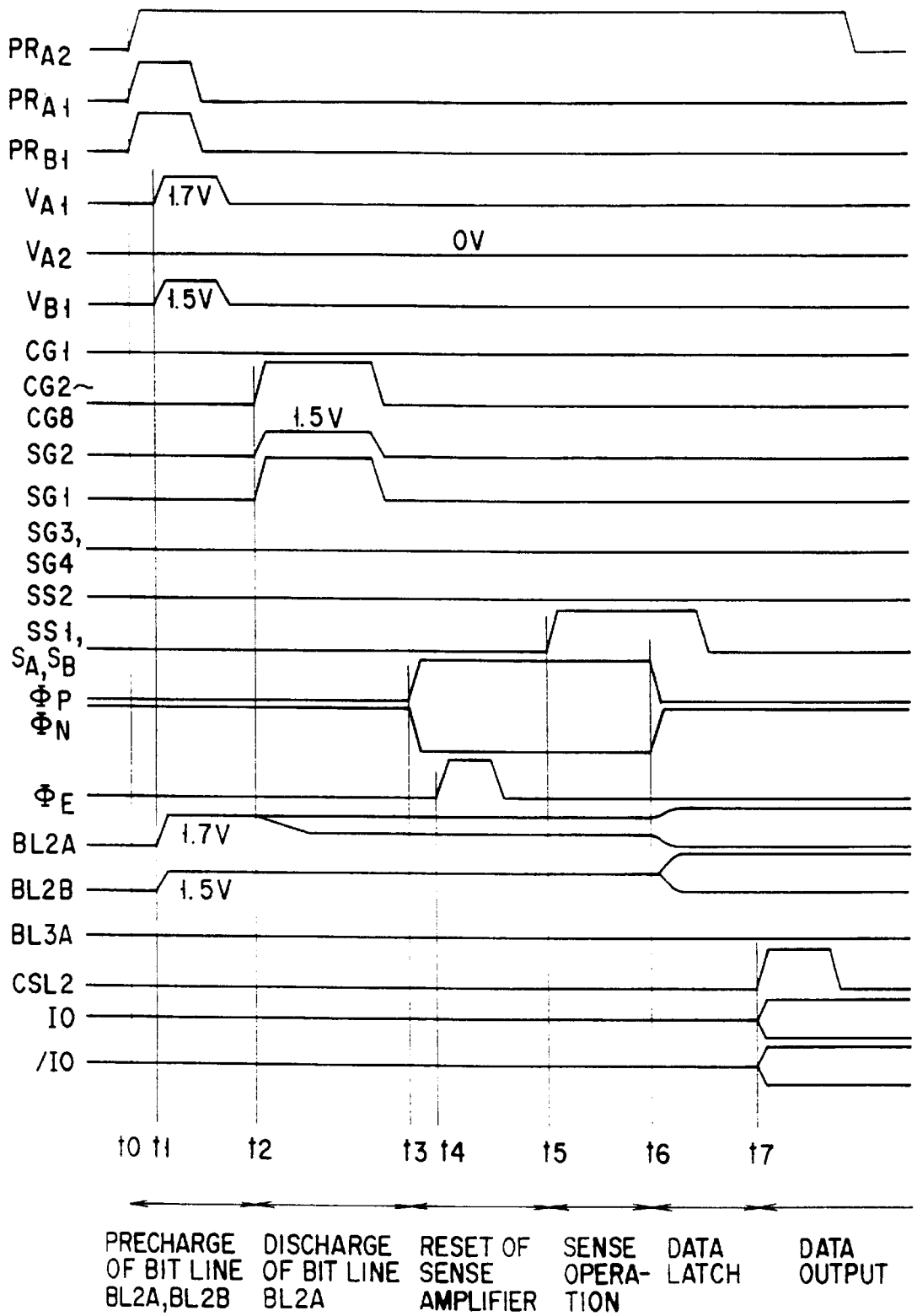
F I G. 53

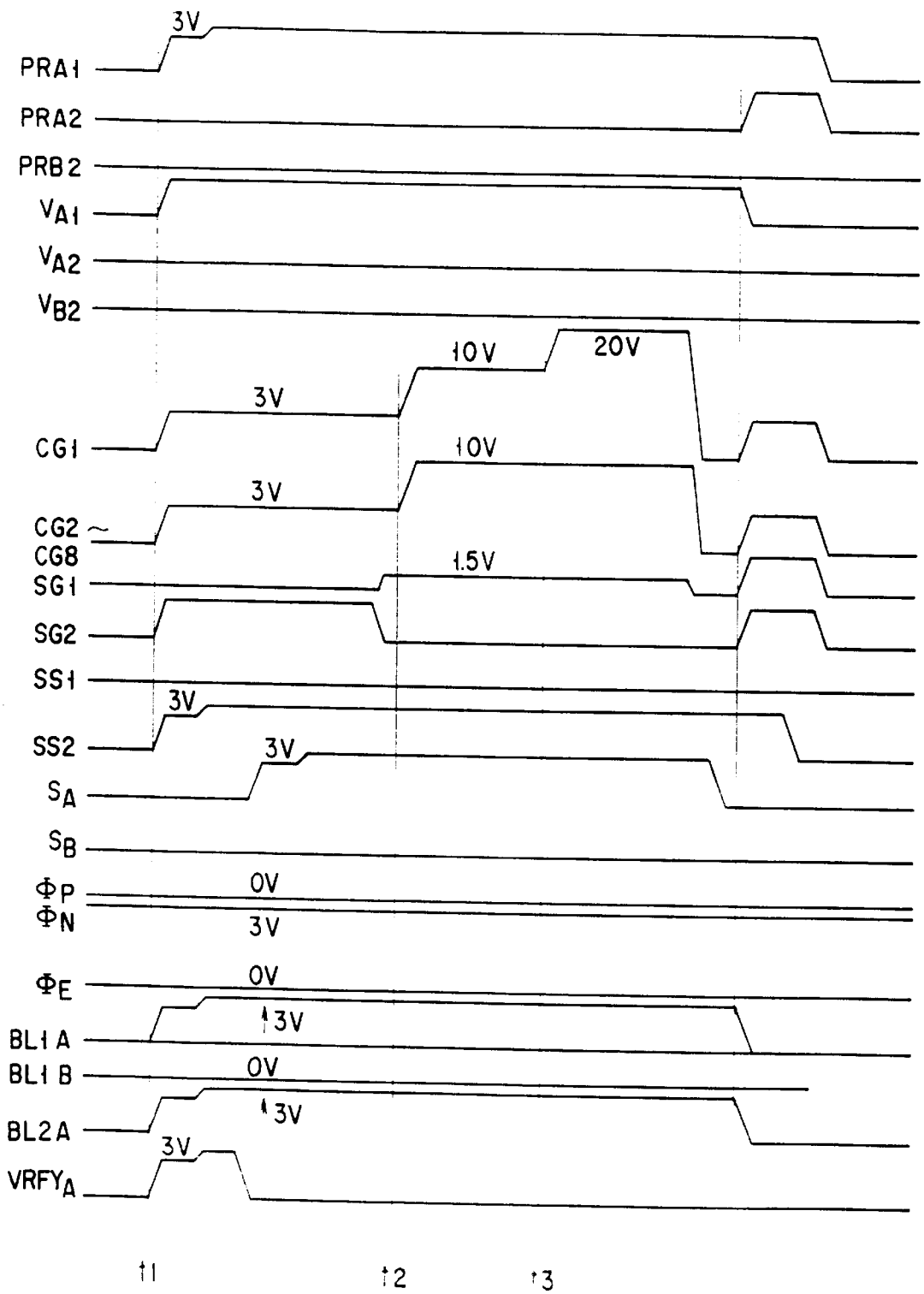
F I G. 55A

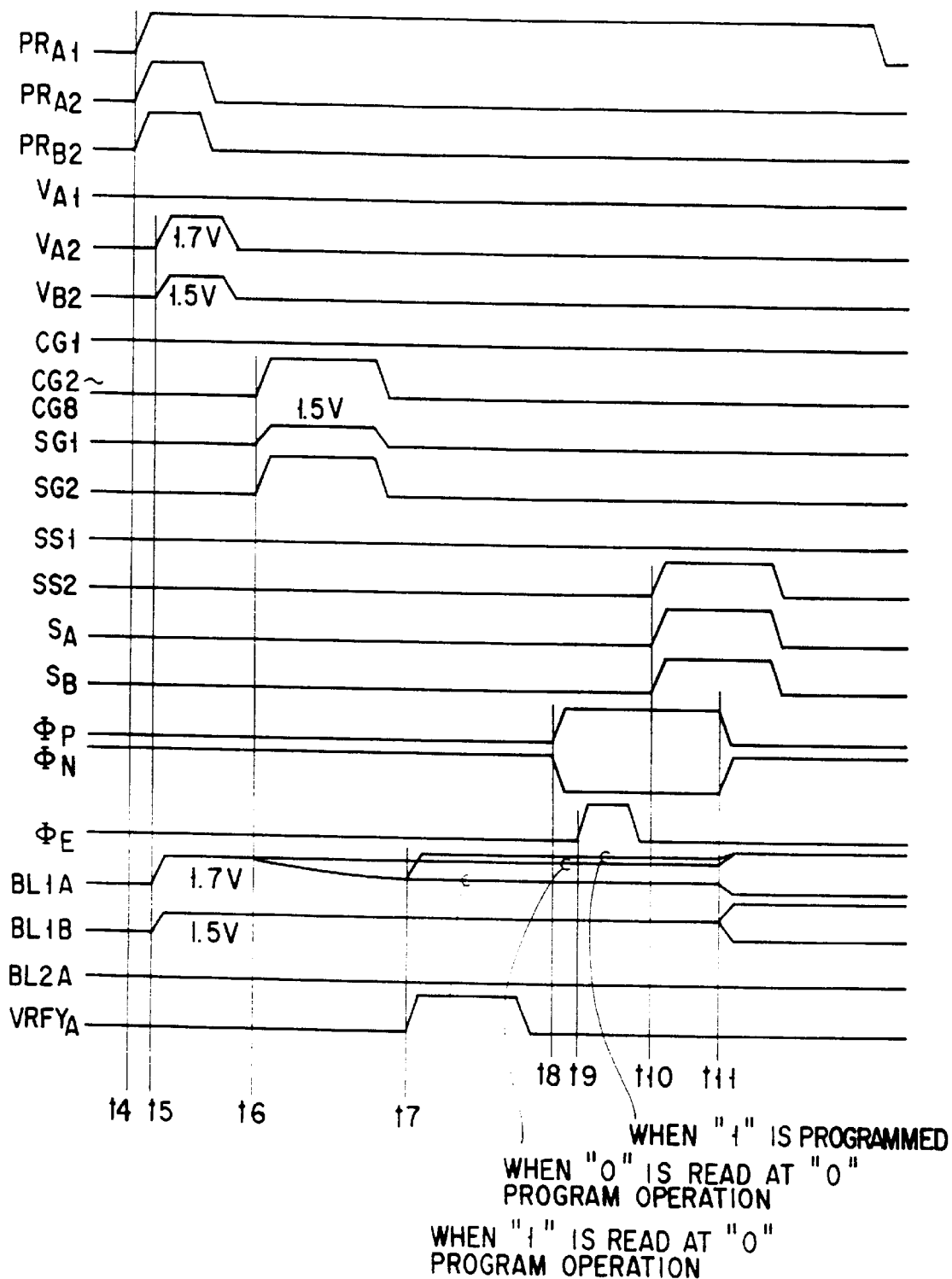
F I G. 55B

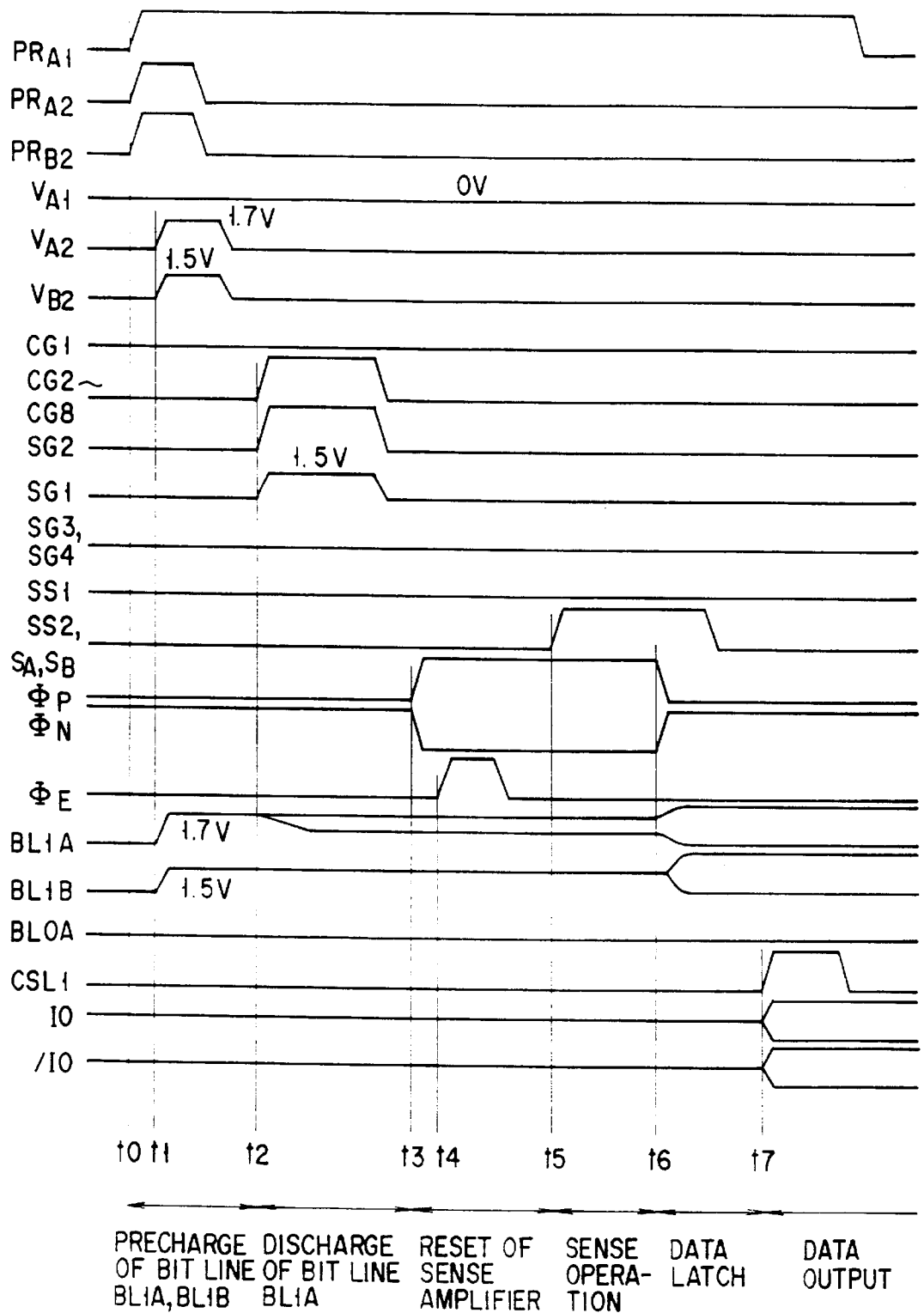
F I G. 61

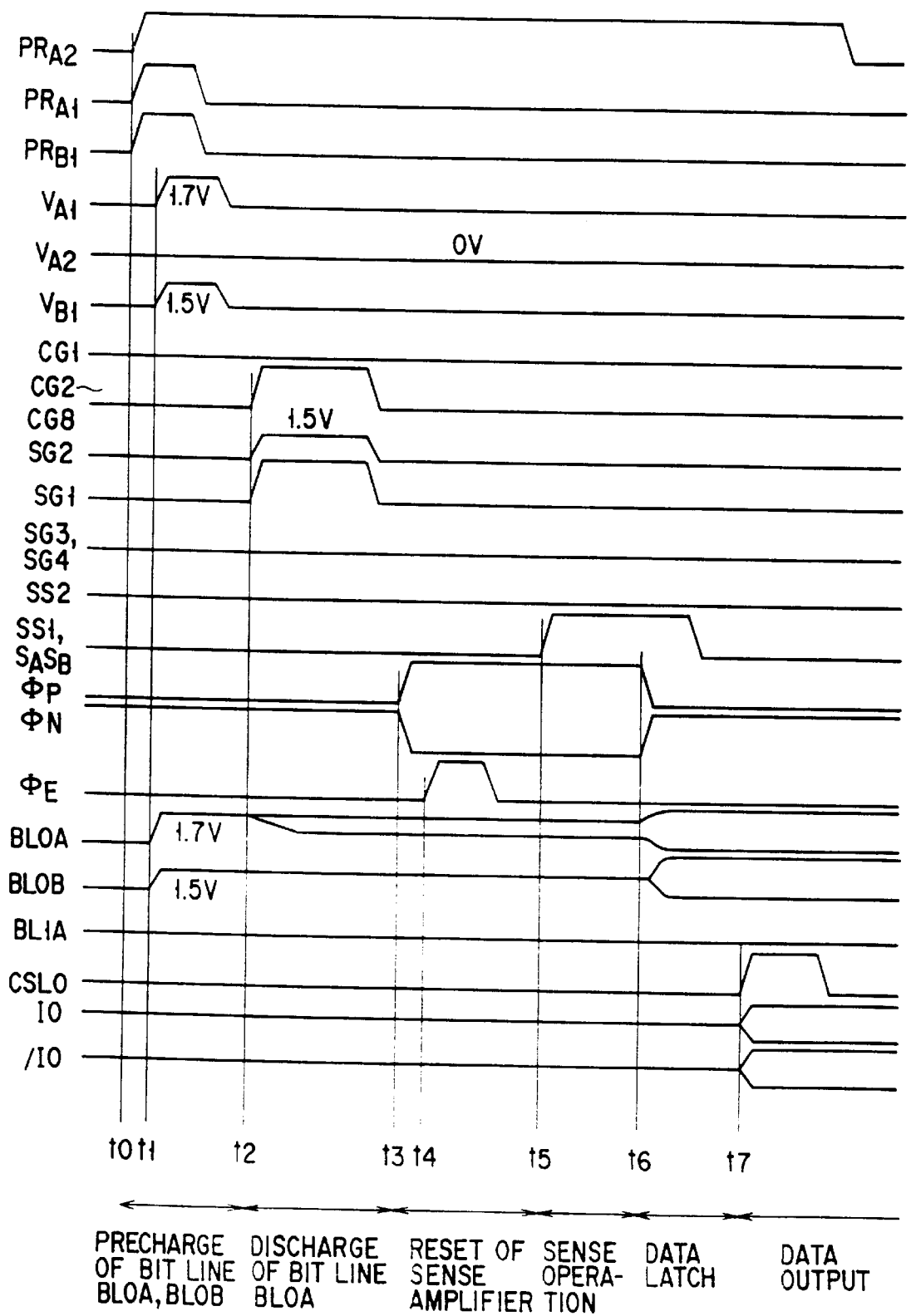
F I G. 62

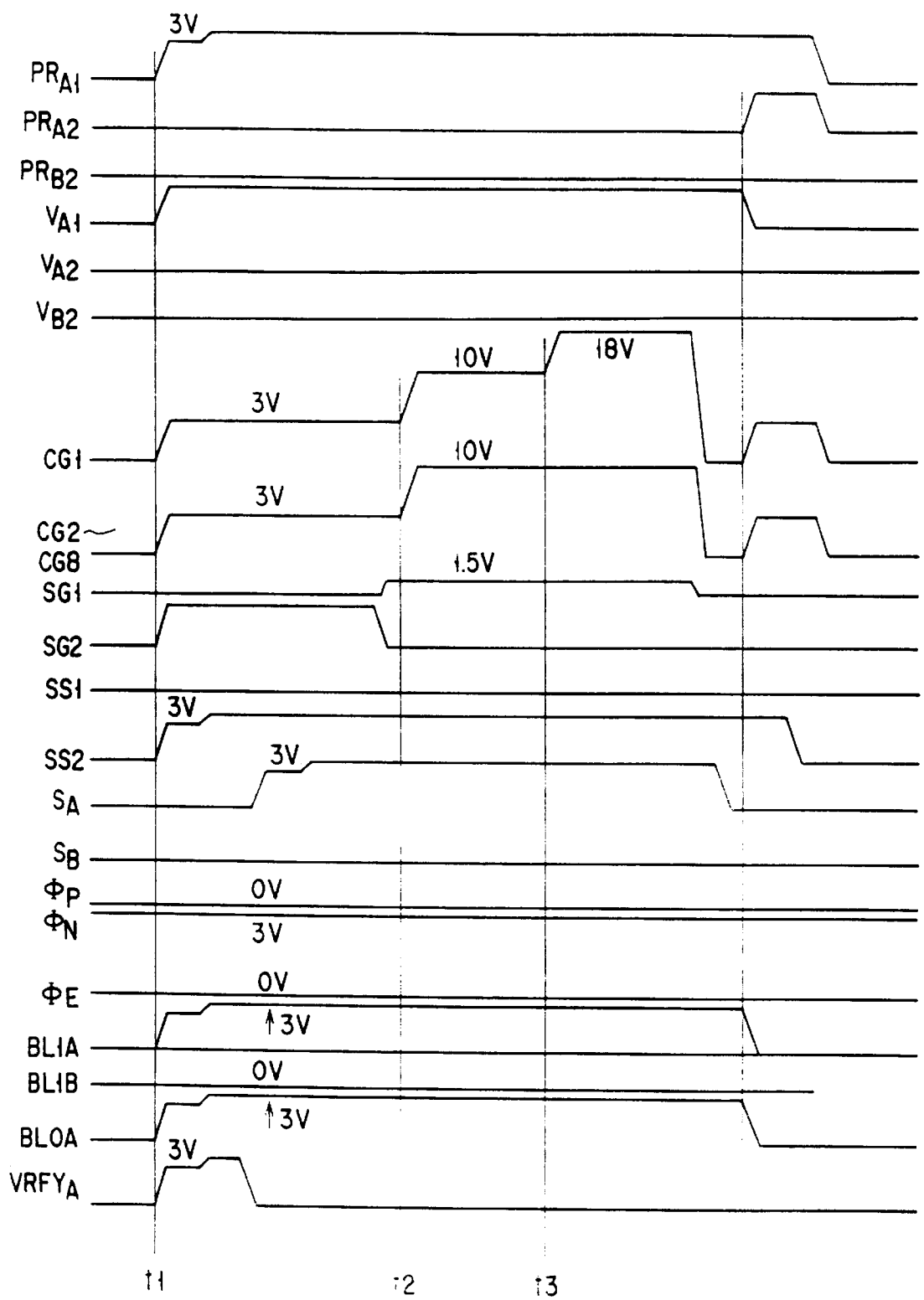
F I G. 63A

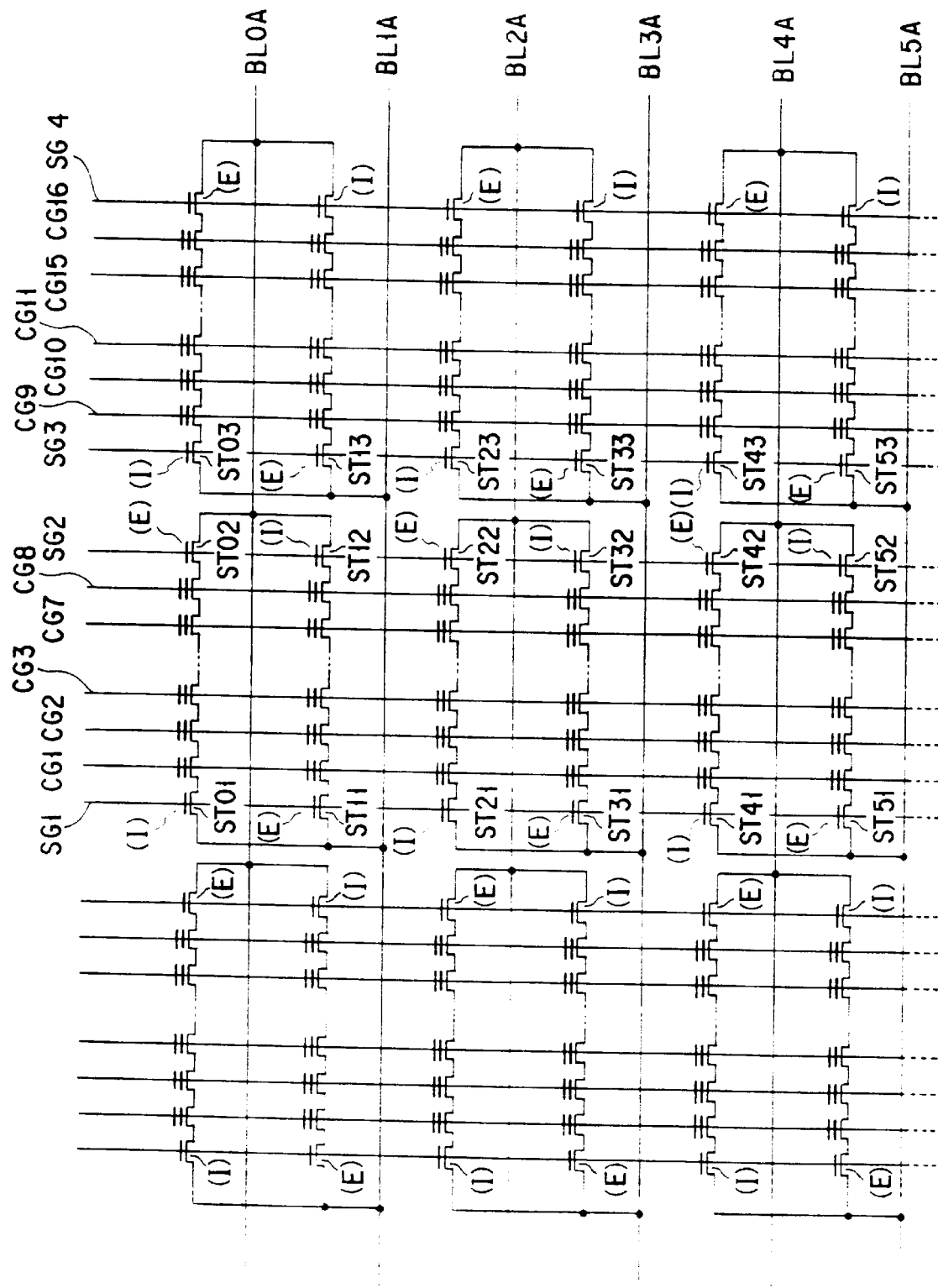

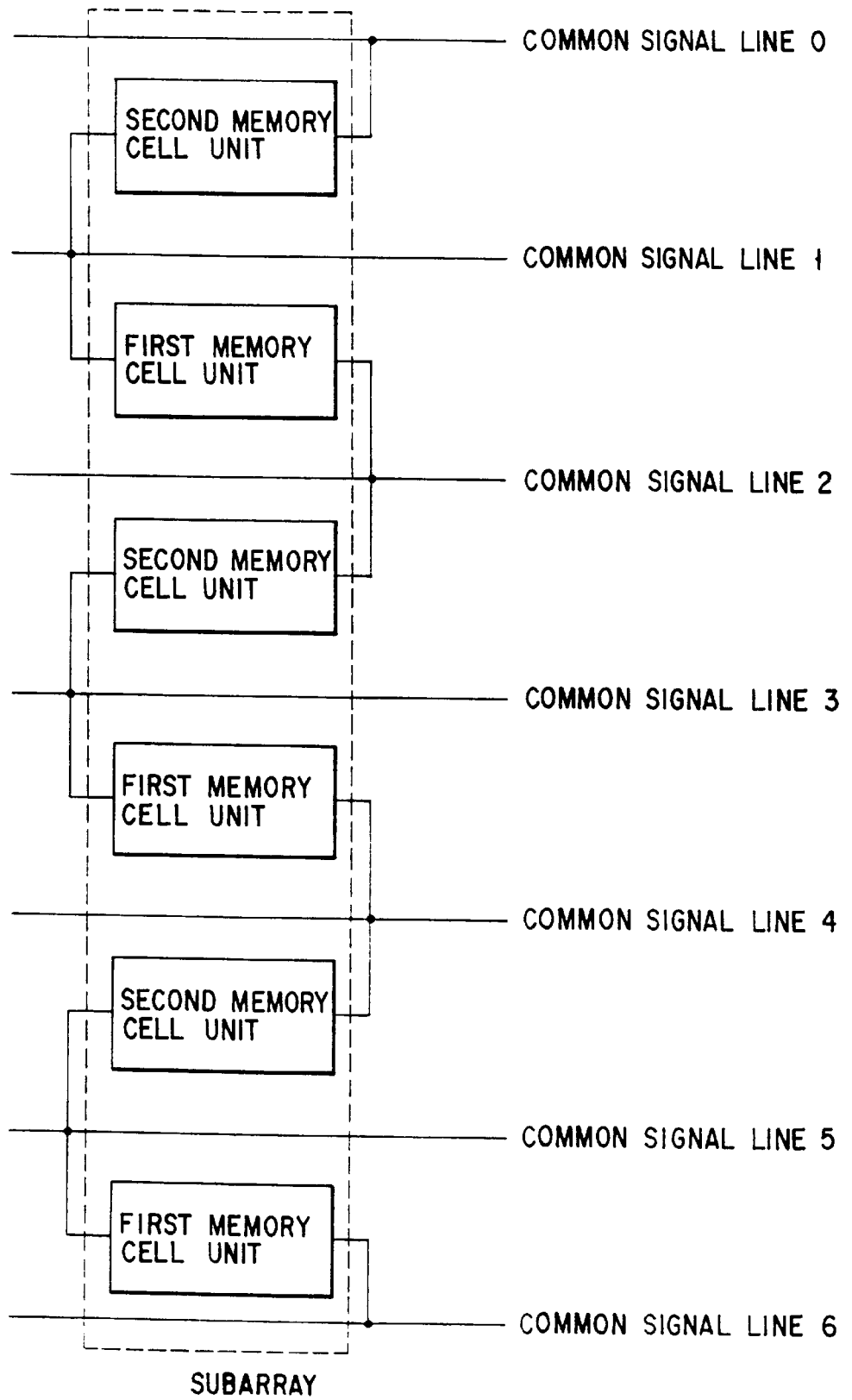
F I G. 69

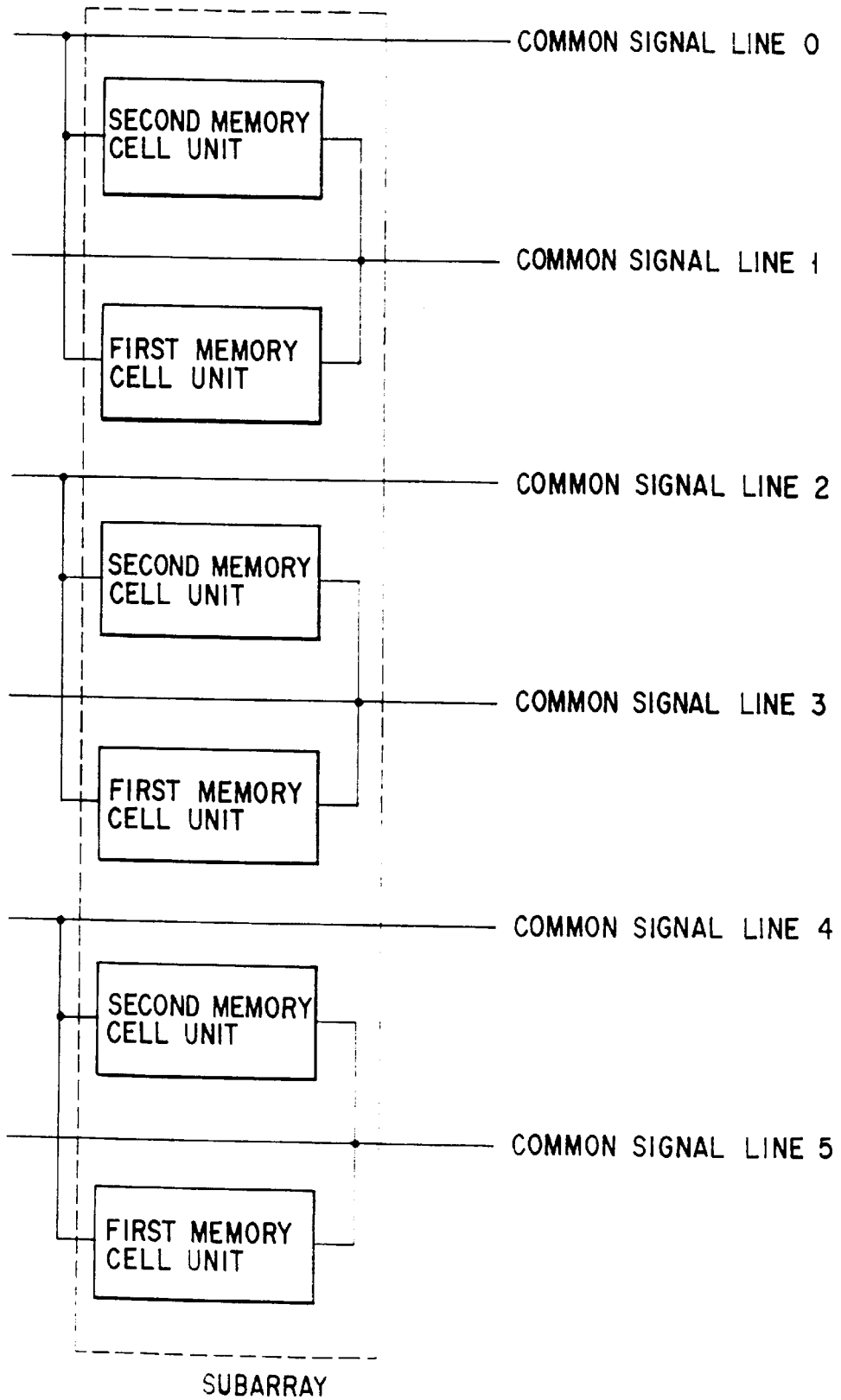
F I G. 71

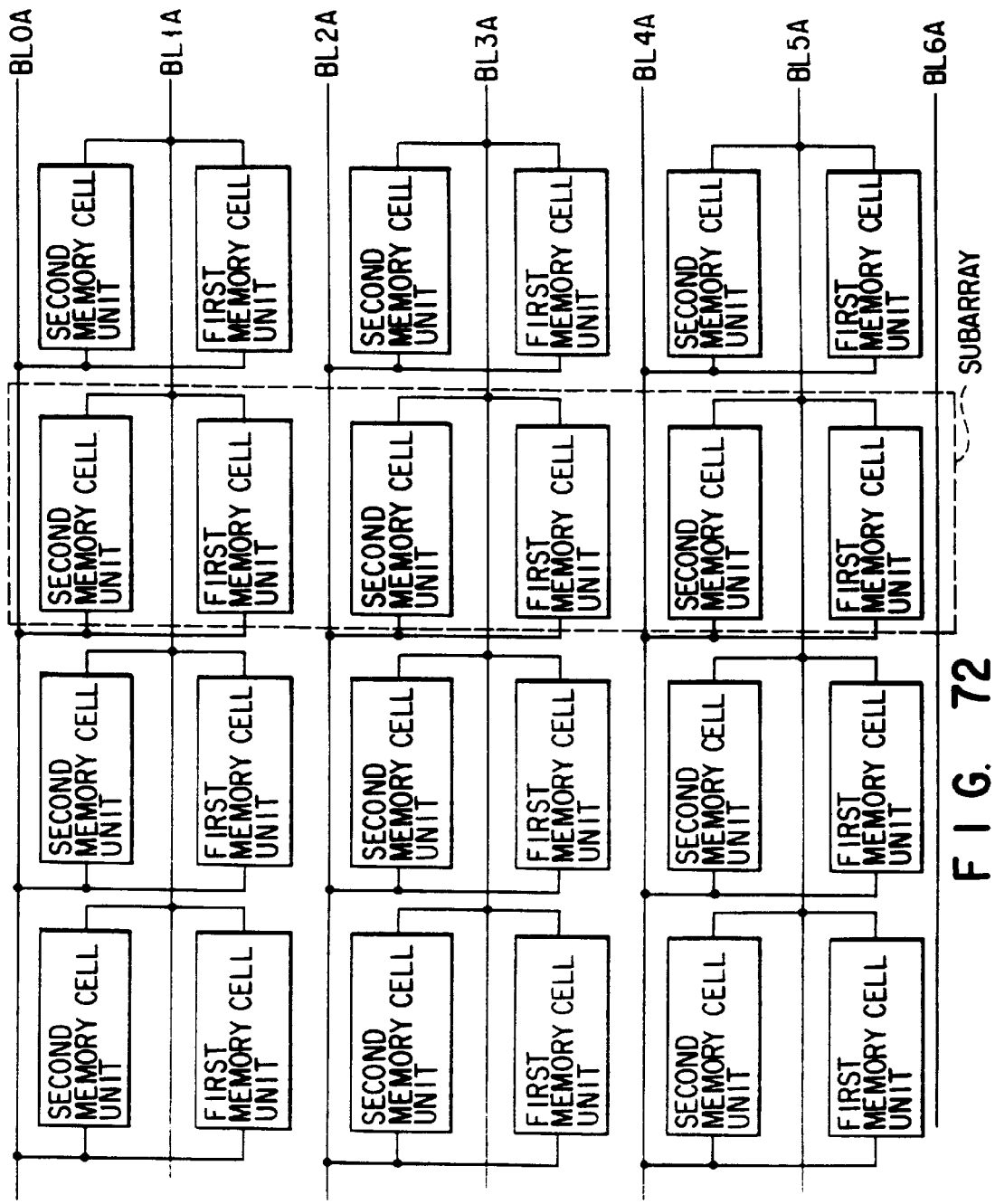
F I G. 72

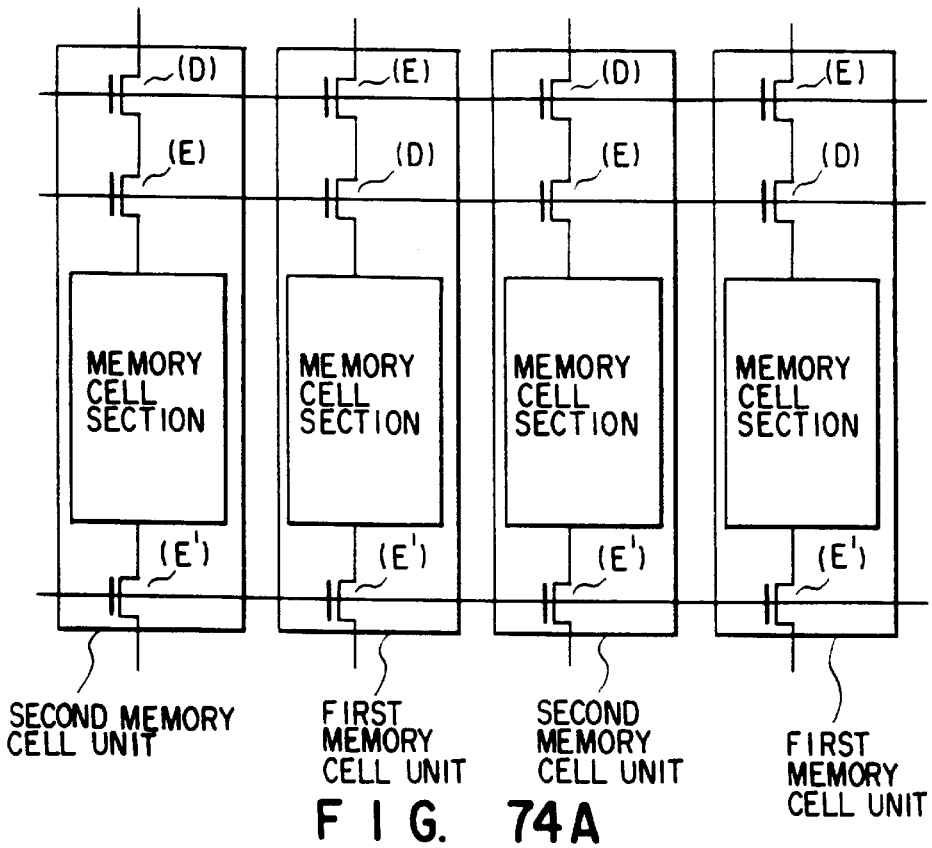
F I G. 74A
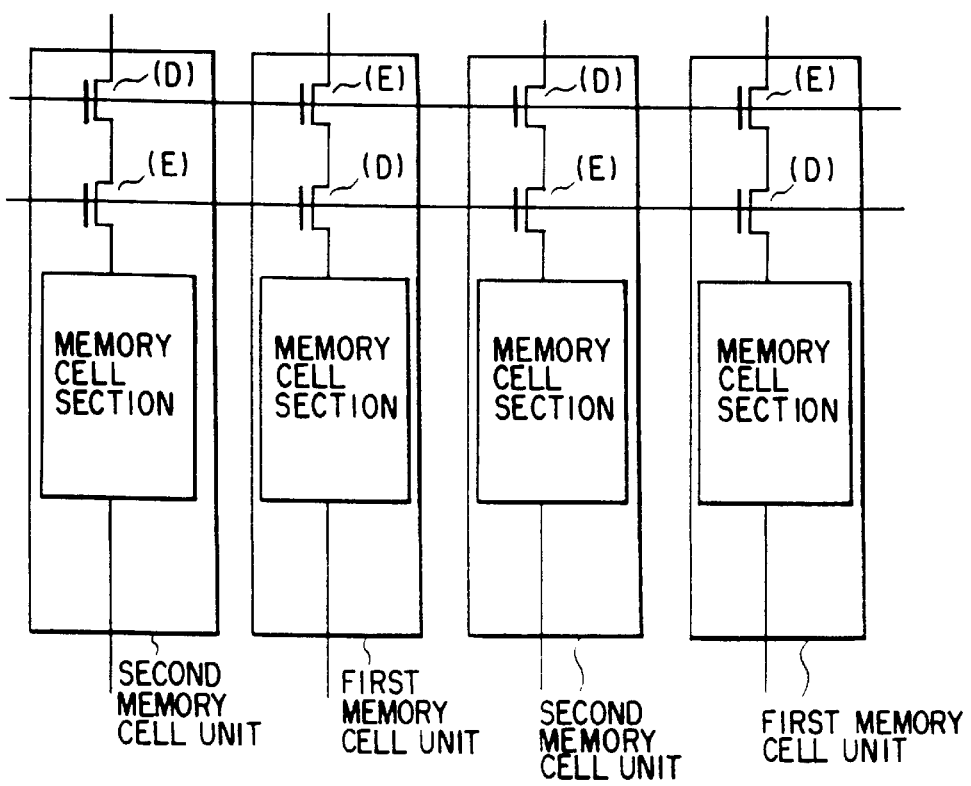
F I G. 74B

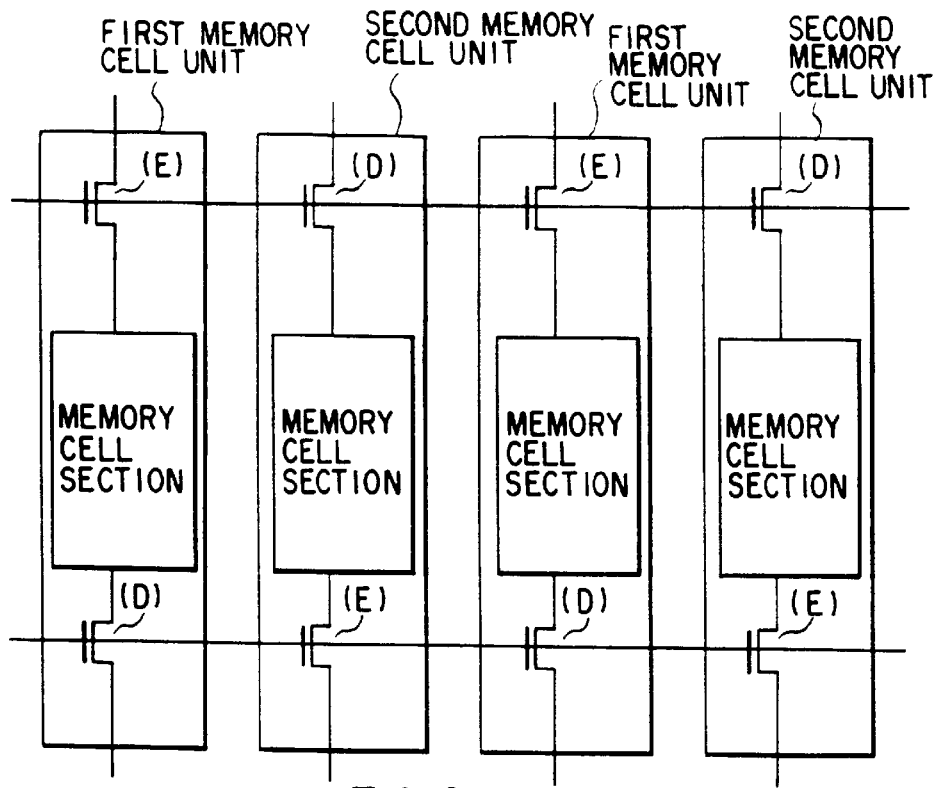
F I G. 75A
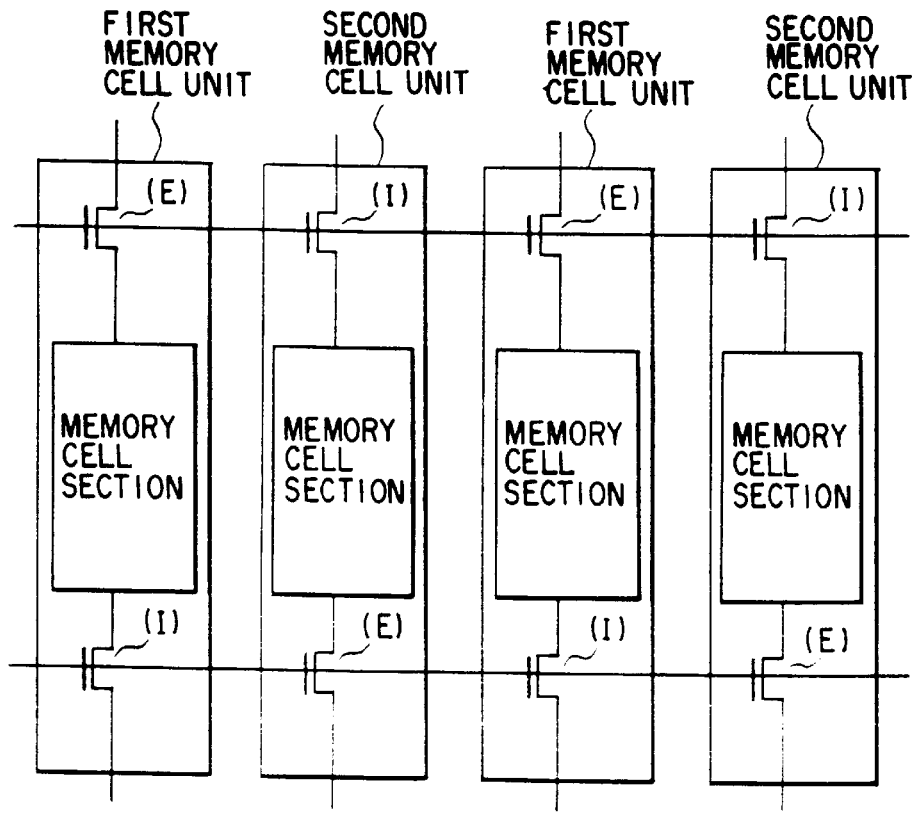
F I G. 75B

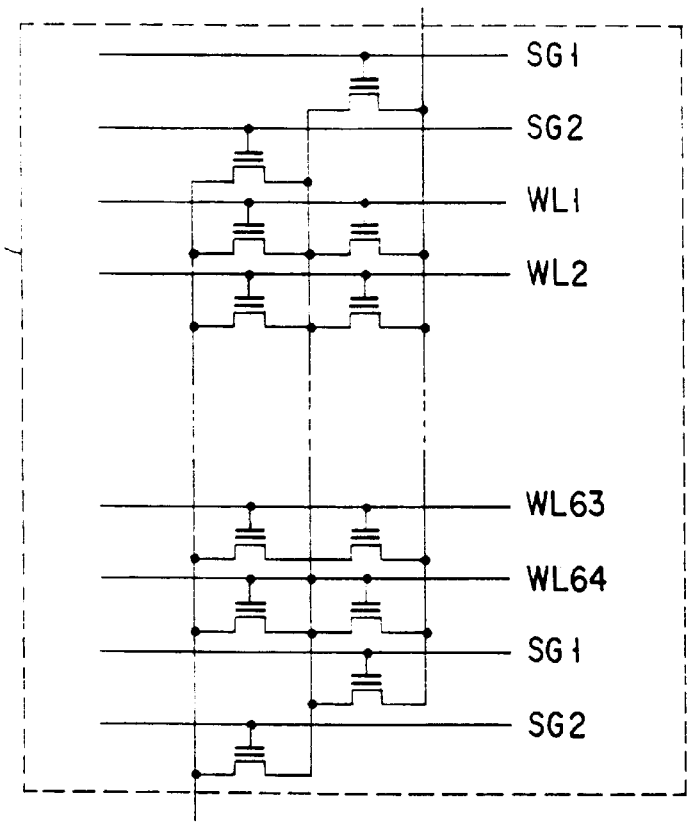
FIG. 76
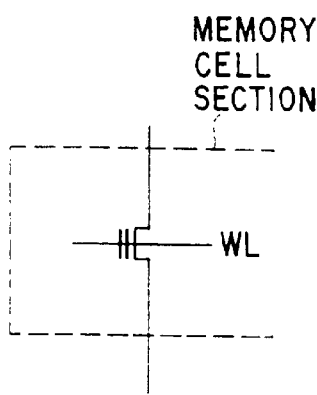
FIG. 77A
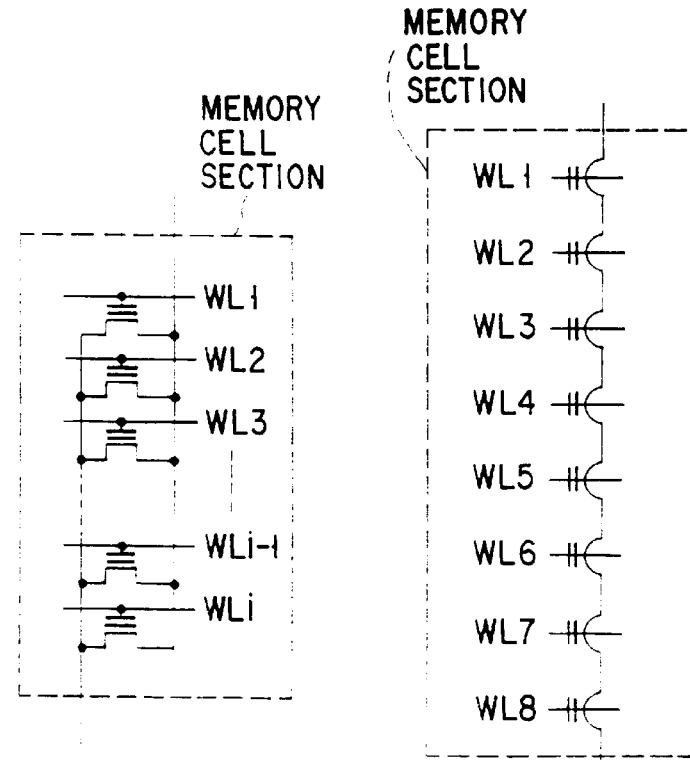
FIG. 77B
FIG. 77C

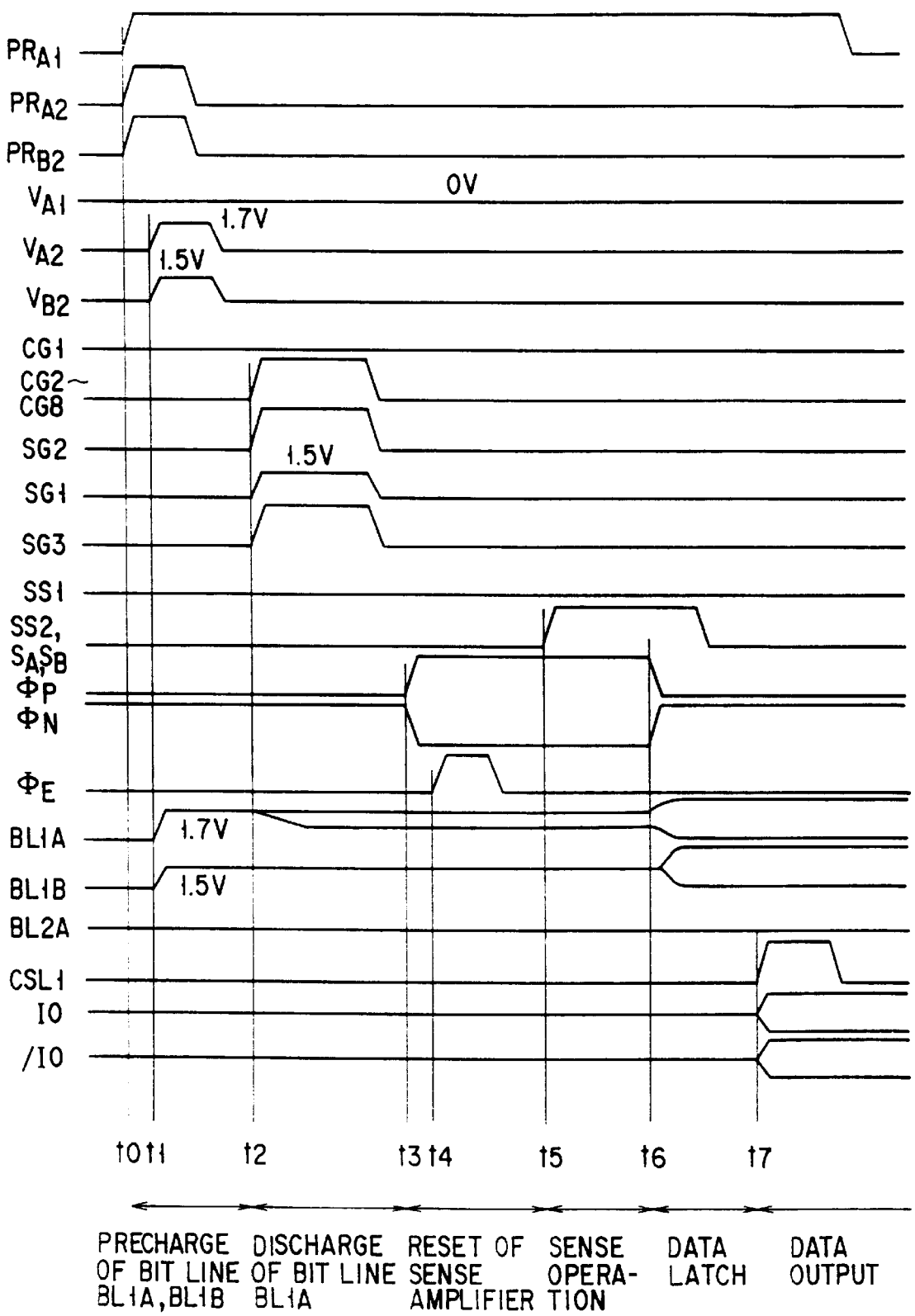
F I G. 83

NONVOLATILE SEMICONDUCTOR MEMORY DEVICE

This application is a division of application Ser. No. 08/866,350 filed May 30, 1997, now U.S. Pat. No. 5,940,321 which is a division of application Ser. No. 08/496,625, now U.S. Pat. No. 5,680,347, filed Jun. 29, 1995.

BACKGROUND OF THE INVENTION

1. Field of the Invention

This invention relates to a semiconductor memory device, and more particularly to a semiconductor memory device with electrically rewritable nonvolatile memory cells.

2. Description of the Related Art

Recently, NAND-cell EEPROMs have been proposed as a type of highly integrated, electrically rewritable nonvolatile semiconductor memory devices (EEPROMs). The NAND-cell EEPROM is such that a plurality of memory cells of an n-channel FETMOS structure, each composed of a charge storage layer (e.g., a floating gate) and a control gate laid on an insulating film on the floating gate, are connected in series so as to share adjacent sources and drains and each series connection is determined to be a unit (a NAND cell) and connected to a bit line.

FIGS. 1A and 1B are a plan view and equivalent circuit diagram of a single NAND cell portion in a memory cell array, respectively. FIGS. 2A and 2B are sectional views taken along line 2A—2A and 2B—2B, respectively.

In a p-type silicon substrate 11 (or a p-well) enclosed by an isolation layer 12, a memory cell array composed of a plurality of NAND cells is formed. An explanation will be given, centering on a single NAND cell. In FIG. 1A, eight memory cells M1 to M8 are connected in series to form a NAND cell. Each memory cell is such that a floating gate 14 ($14_1$, $14_2$, . . . , $14_8$) is formed above the substrate 11 via a tunnel insulating film 13 and above the floating gate, a control gate 16 ($16_1$, $16_2$, . . . , $16_8$) is formed via an insulating film 15. A plurality of n-type diffusion layer 19, the sources and drains of these memory cells, are connected so that the memory cells may share the adjacent sources and drains, thereby connecting the memory cells in series.

At the drain side and source side of the NAND cell, there are provided first select gates $14_9$, $16_9$ and second select gates $14_{10}$, $16_{10}$ formed together with the floating gates and control gates of the memory cells. The substrate in which elements have been formed is covered with a CVD oxide film 17, on which a bit line 18 is provided. The control gate 16 of the NAND cell is provided in the form of control gates CG1, CG2, . . . , CG8. These control gate lines act as word lines. The select gates $14_9$, $16_9$ and $14_{10}$, $16_{10}$ are provided as select gates $SG_1$, $SG_2$ in succession in the row direction.

FIG. 3 is an equivalent circuit diagram of a memory cell array where NAND cells as described above are arranged in a matrix.

A source line is connected via a contact to a reference potential wire made of, for example, aluminum or polysilicon for every 64 bit line, for example. The reference potential wire is connected to a peripheral circuit. The control gates of the memory cells, first select gates and second select gates are provided consecutively in the row direction. Usually, a set of memory cells connected to a single control gate is called one page, and a group of pages sandwiched by a pair of the drain-side select gates (the first select gates) and that of the source-side select gates (the second select gates) is called one NAND block, or just one block.

The NAND-cell EEPROM Operates as Follows.

Program operation is effected, starting from the memory cell farthest from the bit line (that is, closest to the source line). A raised program voltage Vpp (=about 20 V) is applied to the control gate of the selected memory cell, an intermediate potential (=about 10 V) is applied to the control gates of the unselected memory cells and the first select gate, and either a 0 V ("0" programming) or the intermediate potential ("1" programming) is applied to the bit line, depending on the data. At this time, the potential of the bit line is transferred to the selected memory cell. In the case of data "0", a high voltage is applied between the floating gate of the selected memory cell and the substrate, causing electrons to be injected from the substrate into the floating gate by tunneling, causing the threshold voltage move in the positive direction. When the data is "1", the threshold voltage remains unchanged.

Erasing is effected in blocks almost at the same time. Specifically, all of the control gates and select gates in the blocks to be erased are placed at 0 V, and the raised potential VppE (about 20 V) applied to the p-well and n-type substrate is also applied to the control gates and select gates in the blocks not to be erased. This allows electrons in the floating gate to discharge into the well in the block to be erased, causing the threshold voltage to shift in the negative direction.

Reading is effected by placing the control gate of the selected memory cell at 0 V and the control gates of the other memory cells at the power supply voltage Vcc (e.g., 3 V) and sensing whether or not current flows in the selected memory cell. Since a plurality of memory cells are connected in columns in the NAND-cell EEPROM, a cell current in reading is small. Furthermore, since the control gates, first select gate, and second select gate are arranged consecutively in the row direction, a page of data is read onto the bit line simultaneously.

The NAND-cell EEPROM, however, has the following problems:

(1) A first problem is as follows. A single end-type sense amplifier is slow in reading. To realize what is called a high-speed reading folded bit line system used for DRAMs by using nonvolatile semiconductor memory devices, the area of the cell array increases, resulting in an increase in the chip area. The reason for this will be described below.

FIG. 4 is a circuit diagram of a sense amplifier in a NAND-cell EEPROM.

The sense amplifier senses a bit-line potential as follows. First, when an address is set and the read mode turns on, a bit-line precharge control signal PREB changes from Vcc to Vss, thereby charging bit line BLj and node N2 to the power supply voltage Vcc. Furthermore, node N2 is placed at Vcc and node N1 is placed at Vss, resetting sense amplifier SA. After a word line has been selected, if the cell data is "0", the bit-line potential will be kept at Vcc; if the cell data is "1", the bit-line potential is discharged to Vss. After the potential of the bit line has been determined, the bit-line potential is transferred to node N2.

Next, select signals SENB1, SENB2 change from Vcc to Vss and signals SEN1, SEN2 change from Vss to Vcc, thereby activating clocked inverter $INV_1$. If the potential of node N2 is higher than the threshold voltage of clocked inverter $INV_2$, node N1 is kept at Vss. If the potential of node N2 is lower than the threshold voltage of clocked inverter $INV_2$, node Ni goes to Vcc and the potential of bit line BLj is sensed. Thereafter, clocked inverter $INV_2$ is activated and the data is sensed and latched. When column select signal CSLj has changed from Vss to Vcc, the latched data is outputted to:I/O, I/O'.

With the above method, the cell data is sensed, depending on whether the potential of the bit line in the floating state is higher or lower than the threshold voltage of the clocked inverter. The bit-line potential in the floating state varies with the state of adjacent bit lines, because of the capacitive coupling with adjacent bit lines. For example, when "0" data is programmed in the cell, a read current should not be allowed to flow and the potential of bit line BLj be kept at the precharge potential Vcc. On the other hand, when "1" data is programmed in the cell connected to the adjacent bit line BLi and a read current is allowed to flow, the potential of bit line BLi drops from Vcc to Vss. Then, the potential of bit line BLj supposed to remain at Vcc drops, being influenced by the potential of adjacent bit line BLi dropping from Vcc to Vss.

Therefore, to correctly sense that bit line BLj has "0" data on it, the threshold voltage of clocked inverter $INV_1$ must be set rather low, taking into account changes in the bit-line potential due to the capacitive coupling between bit lines. To read "1" data from bit line BLi, the potential of bit line BLi must be dropped from Vcc to the threshold voltage of clocked inverter $INV_1$. Taking into account the fact that the read current in the NAND cell is small, when the threshold voltage of clocked inverter $INV_1$ is set rather low, it takes a longer time to sense the bit line.

In a sense amplifier using a clocked inverter as shown in FIG. 4, it take a long time to sense the bit-line potential. This will be described in numbers.

If the capacitance between adjacent bit lines accounts for ½ of the total capacitance of bit lines, bit line BLj supposed to remain at Vcc is dropped to Vcc/2 according to the voltage of BLi, provided that adjacent bit line BLi is at 0 V. For example, if the power supply voltage Vcc is 3 V, the voltage of bit line BLj is dropped to 1.5 V. Therefore, the threshold voltage of clocked inverter $INV_1$ is set at, for example, 1.2 V, allowing a margin. The cell current when the read current in the NAND cell is the smallest (that is, when "1" is programmed in the selected cell and "0" is programmed in the series-connected unselected cells) is determined to be 1 $\mu$A. If the capacitance of the bit line is 3 pF, discharging the potential of bit line BLi to the circuit threshold voltage requires:

$$3 \text{ pF} \times (3-1.2) \text{V}/1 \mu\text{A} = 5.4 \ \mu\text{s}$$

To solve the above problem, the folded bit-line system used for DRAMs may be used with a bit-line pair BLj, /BLj inputted to a sense amplifier, and the bit lines BLj, /BLj may be forced to operate differentially for high speed reading. As an example of reading the data from the cell connected to bit line BLj, the time required to discharge the bit line is estimated. If potential of bit line /BLj is kept at, for example, 1.5 V, and bit line BLj is precharged to 1.7 V, bit line BLj will remain at 1.7 V, provided that the information in the cell coupled to bit line BLj is "0", and the bit line will be discharged to 1.3 V, provided the information is "1". If the cell current 1 $\mu$A and the bit-line capacitance is 3 pF, the time required to discharge the bit line will be:

$$3 \text{ pF} \times (1.7-1.3)/1 \ \mu\text{A} = 1.2 \ \mu\text{s}$$

This makes reading faster than in the conventional single end system.

In the folded bit-line system, when the cell coupled to bit line BLj is read from, bit line /BLj must not be discharged. With the conventional NAND-cell EEPROM, since the control gates of memory cells, the first select gate, and the second select gate are arranged consecutively in the row direction, when "1" is programmed in both of the cells coupled to adjacent bit lines BLj, /BLj, bit lines BLj, /BLj will be discharged simultaneously.

A method of not discharging bit line /BLj when the cell coupled to bit line BLj is read from may be, for example, a method of operating the select gates on the drain side (or the select gates on the source side) of bit line BLj and bit: line /BLj with different timings. For example, to operate the drain-side select gate of bit line BLj and that of bit line /BLj with different timings, a control signal $SGD_1$ to select the select gate of bit line BLj and a control signal SGD2 to select the select gate of bit line /BLj are required. When eight memory cells are assumed to be connected in series between the bit-line contact and the source line, the conventional cell array needs 10 wires (eight control gates and two select gates) for each block in the row direction. With this method, since 11 wires (eight control gates and three select gates) are needed, the cell array area increases, resulting in an increase in the chip area.

(2) A second problem is as follows. When the data extending over a plurality of pages is read, random reading is necessary at the time of switching the word line, leading to a waste of time, making the reading time longer. To solve this problem, the memory cell array and sense amplifiers may be divided into two to effect random reading and page reading simultaneously. With this method, however, the chip area will increase. The reason for this will be given below.

In the NAND-cell EEPROM, since memory cells are connected in series, the cell current is so small that it takes several $\mu$s for the bit line to be discharged and about 10 $\mu$s to complete random reading. A page of data is sensed and latched simultaneously. In page reading, because the latched data is just read out, it can be read in about 100 ns. For example, when the page length is 256 bytes and a page of data is read, a random read operation and 255 page read operations require:

10+0.1×255 to 35 $\mu$s

To read the data extending over a plurality of pages, the page switching section must effect a 10-$\mu$s random read operation.

A method of reading pages of data with apparent page reading cycles without a random reading operation in changing the page includes, for example, a method of dividing the memory cell array and sense amplifiers into two to effect random reading and page reading simultaneously. While page reading is being done at one halved memory cell array, random reading is effected at the other halved memory cell array. This makes it possible to read the data extending over a plurality of pages, while maintaining the timing for page reading, without inserting a random reading operation at a point where pages change.

In this case, however, to effect random reading on the halved memory arrays with staggered timings, more peripheral circuits for applying a voltage to the word lines (e.g., a row decoder) must be needed. Since in the EEPROM, a high voltage of about 20 V is particularly applied to the word line in a program operation, the areas of transistors constituting the peripheral circuits (e.g., a row decoder) for applying a voltage to the word line are large. Therefore, when the conventional memory cell array employs the high-speed page reading method, use of more peripheral circuits (e.g., row decoders) for transmitting a voltage to the word line leads to an increase in the chip area.

(3) A third problem is as follows. When bit-line shielding that maintains every other bit line at a reference potential in a read operation is applied to a memory cell array of the open-bit line system or the single-end system to reduce noise stemming from the coupling capacitance between bit lines, because reading and writing are done on every other bit line, the unselected bit lines must be charged and discharged to an intermediate potential (about 10 V) for each cycle of programming and verify reading. Furthermore, in reading the data extending over a plurality of pages, the bit lines to be shielded at the time of page change must be discharged and the bit line to be selected next must be precharged. As a result, power consumption in a program operation and a read operation is great, and programming and reading get slower by the precharging time. The reason for this will be described below.

As the memory device gets more highly integrated and the distance between bit lines gets shorter, the capacitive coupling between bit lines becomes greater. As a result, the potential of a bit lint supposed to remain high in reading is influenced by an adjacent bit line discharging to the low state and drops from the high to the low state. To reduce noise stemming from the capacitive coupling between bit lines, a method of keeping every other bit line at a constant potential in reading (bit-line shielding) has been proposed. In bit-line shielding, since reading is done on every other bit line, writing is also done on every other bit line.

In the open bit-line system and the single end system shown in FIG. 1A, since adjacent bit lines share select gates and control gates, when the cell data is read onto one bit line, the cell data is also read onto the adjacent bit line, with the result that the bit line discharges. Therefore, in using a method of keeping every other bit line at a reference potential to reduce noise stemming from the capacitive coupling between bit lines (bit-line shielding), the reference potential has to be at 0 V. As a result, when the data programmed over a plurality of pages is read (e.g., when the data in a memory cell connected to an odd-numbered bit line is read after the data in a memory cell connected to an even-numbered bit line has been read), the first read even-numbered bit line has discharged completely to 0 V and the second read odd-numbered bit line is precharged, starting at 0 V.

Specifically, at the time of page change in reading the data from a memory cell connected to an even-numbered bit line and then reading the data on an odd-numbered bit line, and at the time of page change in reading the data from a memory cell connected to an odd-numbered bit line and then reading the data on an even-numbered bit line, all of the previously read bit lines must be discharged and all of the bit lines to be read next has to be precharged, starting at 0 V. As described above, when bit-line shielding is applied to the open bit-line system or the single end system, using a conventional array, it takes time to precharge the bit lines at the time of page change in reading and the power consumption is large.

Explained next will be a problem arising in a read operation when bit-line shielding is applied to the open bit-line system or the single end system, using a conventional array.

When bit-line shielding is applied as described above, writing is also effected separately on a memory cell connected to an even-numbered bit line and a memory cell connected to an odd-numbered bit line. Therefore, for example, when the data is programmed into a memory cell connected to an even-numbered bit line, the data is not programmed into a memory cell connected to an odd-numbered bit line, so that an intermediate potential (about 10 V) is applied to the odd-numbered bit line. Namely, in a program operation, at least half of the bit lines must be charged to an intermediate potential.

In a program operation, first, writing is done and then, verify reading is done to check to see if the programming has been done sufficiently. Then, the cell sufficiently programmed into is not programmed into additionally, and only the insufficiently programmed cell is programmed into additionally. With the conventional memory cell array, when verify reading is effected after a memory cell connected to an even-numbered bit line has been programmed into, the odd-numbered bit line is also discharged from the intermediate potential. Therefore, for example, when a memory cell connected to an even-numbered bit line is programmed into, the odd-numbered bit line must be charged and discharged to the intermediate potential for each cycle of programming and verify reading, thus lengthening the writing time and increasing the power consumption.

(4) A fourth problem is as follows.

In the NAND-cell EEPROM, the control gate of the memory cell selected in reading is placed at 0 V and the control gates of the other memory cells are placed at Vcc (e.g., 3 V), and then whether or not a cell current Icell flows is sensed. In this case, the amount of the cell current depends not only on the threshold voltage of the cell to be read from but also on the threshold voltages of all of the remaining cells connected in series.

In a case where eight memory cells are connected in series to form a NAND cell, Icell(Best), the largest Icell (the lowest resistance) is obtained when all of the threshold voltages of the eight cells connected in series are negative (in the "1" state). In a "1" read operation, Icell (Worst), the smallest Icell (the highest resistance) is obtained when "1" data is read from the memory cell (e.g., MC1 in FIG. 3) closest to the bit-line contact provided that the threshold voltages of all of the other cells connected in series with the cell to be read from are positive (in the "0" state).

The cell current flows from the bit line through the memory cells to the source line. In the conventional memory cell array, the source line is shared by a page of NAND cells to be read from simultaneously (FIG. 3). Here, consideration will be given to a case where the threshold voltages of the other 7 cells connected in series with the memory cell MC1 are positive (i.e., the cell current is the smallest Icell(Worst)) and the resistance of the other NAND columns sharing the source line is the lowest (i.e., the cell current is the largest Icell(Best)) when the memory cell farthest from the contact between the source line and the reference potential wire is read from (memory cell MC1 of FIG. 3). In this case, at the beginning of a read operation, a cell current flows from a low-resistance NAND column and the potential of the source line of the NAND cell to which the memory cell MC1 belong is I×R (where I is the cell current flowing at the beginning of reading and R is the resistance of the source line), because the resistance of the source line is high.

Specifically, because the sources of the memory cells in the NAND column containing the memory cell MC1 bounce from the ground potential Vss, the source-drain voltage and source-gate voltage in the memory cell drop, and the floating of the source from Vss causes the substrate bias effect, increasing the threshold voltage of the memory cell, with the result that the conductance of the memory cells in the NAND-cell column containing MC1 drops. As describe above, when the resistance of the source line is high, the source line bounces from the ground potential, making the cell current to flow less easily in the NAND column with a small cell current.

It is assumed that if the bit-line capacitance is $C_B$ and the threshold voltage of the memory cell is negative (i.e., in the "1" state), the bit-line potential must drop by $\Delta V_B$ from the precharge potential in order to effect reading. The maximum value of the bit-line discharging time $T_{RWL}$ is determined by the smallest cell current. When the source does not bounce, $T_{RWL} = C_B/\text{Icell(Worst)}$ will be given. In the conventional memory cell, however, because the source line bounces, $T_{RWL}$ gets longer, lengthening the random accessing time. Furthermore, in the conventional NAND-cell EEPROM, to make the floating of the source line lower, a contact between the source line and the reference potential wire is provided for every 16 lines, for example. In this case, the area of the memory cell increases.

An increase in the bit-line discharging time due to the floating of the source line not only lengthens the reading time, but also causes variations in the threshold value programmed in the memory cells.

FIG. 5 shows the dependence of the bit-line discharging time on MCC1's threshold voltage in verify reading after "0" has been programmed into memory cell MCC1 of FIG. 6 (the threshold voltage of the memory cell is changed from a negative value to a positive value). In the verify reading of memory cell MCC1 of FIG. 6, because "0" has been programmed into the other memory cells MCC2, MCC3, MCC4, MCC5, ... in the same page insufficiently as shown in FIG. 6 (i.e., they have a negative threshold-value, not a positive threshold value), a large cell current flows, so that the source line bounces, lengthening the bit-line discharging time as shown in FIG. 5.

Therefore, when it is assumed that if the bit-line discharging time is equal to or longer than $T_{BL1}$ at the time of verify reading, "0" has been programmed in the memory cell, because the source line bounces in the memory cell MCC1 of FIG. 6, it is judged that "0" has been programmed when the threshold voltage of the memory cell is equal to or larger than Vth1 of FIG. 5. On the other hand, when the cell current is large and the source does not bounce as in the memory cell MCD1 of FIG. 7, the bit-line discharging time is as shown in FIG. 5. Namely, when the data is programmed into memory cell MCD1, it is judged that "0" has been programmed if the threshold value of FIG. 5 is equal to or larger than Vthd1.

As described above, a variation of Vthd1−Vth1 in the threshold voltage takes place in memory cell MCC1 and memory cell MCD1. If the bit-line discharging time can be shortened by preventing the source line from floating and the bit-line discharging time of the memory cell MCC1 can be made as shown in FIG. 5, variations in the threshold value in the circuit can be made smaller (Vthd1−Vth2 of FIG. 5).

Furthermore, it is assumed that after memory cell MCC1 has been programmed into by a first write pulse and the threshold voltage (FIG. 8) has become Vth1, the memory cells MCC2, MCC3, MCC4, MCC5, ... are brought into the "0" state by a second and later write pulses. Since programming into memory cell MCC1 has been completed by the first write pulse, memory cell MCC1 is not programmed into by the second and later pulses and the threshold value remains at Vth1.

As a result, because after the data has been programmed into the page of memory cells MCC1, MCC2, MCC3, ..., a cell current does not flow through the memory cells MCC1, MCC2, MCC3, MCC4, MCC5, ... in reading the data from memory cell MCC1, there is a possibility that the source line will not bounce and the bit-line discharging time will be shortened by $\Delta T$ as shown in FIG. 8, and "1" will be read out. Specifically, because the data in the memory cells MCC2, MCC3, MCC4, ... in the same page of memory cell MCC1 has changed by the second and later write pulses after memory cell MCC1 has been programmed into, the data in memory cell MCC1 in which "0" should have been programmed is read out as "1". The reason why the erroneous reading takes place is that when the memory cell is read from, the data in another memory cell influences the read current in the memory cell to be read from.

(5) A fifth problem is as follows.

In the NAND-cell EEPROM, contacts between the drain-side select gates and the bit lines are provided adjacently as shown in FIG. 3. FIG. 9A shows an element area in a conventional memory cell array, including n-type diffusion layers, the source, gate, and drain regions of memory cells, and contacts (hereinafter, referred to as bit-line contacts) connecting the n-type diffusion layer to the bit lines (e.g., A1). In FIG. 9A, areas other than the shaded portions indicate element isolating areas between memory cells. In the Y-direction of FIG. 9A, NAND cells are connected in series. In the X-direction in FIG. 9A, n-type diffusion layers (source lines) and contacts between the memory cell array and bit lines are arranged. L' is the distance between bit-line contacts, L is the element isolation width between memory cells, and W is the channel width of the memory cell transistor.

In the conventional NAND cell array, even if the element isolating region width between memory cells is shortened, the pitch of memory cells in the column direction (the X-direction) cannot be shortened, because the bit-line contacts are arranged adjacently as seen from FIG. 9A. Namely, since the size in the X-direction is determined by the distance between bit-line contacts, L, the element isolation width L between memory cells is larger than the minimum element isolation width L0 determined by the field inversion withstand voltage between adjacent NAND cell columns and element isolation technology, resulting in an increase in the area of the memory cell array.

Furthermore, as shown in FIG. 9B, an allowance 1 for the contact and the element region must be made smaller according to a reduction in the memory cell pitch. With a smaller allowance 1, however, there is a possibility that misalignment will permit a contact to be shifted and formed on an element isolation, short-circuiting a well or a substrate in which bit lines and memory cells are formed.

As described above, with the conventional EEPROM, because the source line bounces from the ground potential when the resistance of the source line is high, the bit-line discharging time get longer and the random access time is lengthened. Furthermore, when a contact between the source line and a reference potential wires is provided for every 16 lines, for example, the area for the memory cells increases.

Furthermore, since bit-line contacts are arranged adjacently, the memory cell pitch in the column direction cannot be shortened. Additionally, an allowance for the alignment of the contact with the element area must be made smaller according to a reduction in the memory cell pitch. A smaller allowance can cause misalignment, which may permit a contact to be shifted and formed on an element isolation, thus short-circuiting a well or a substrate in which bit lines and memory cells are formed.

SUMMARY OF THE INVENTION

An object of the present invention is to provide a nonvolatile semiconductor memory device which enables high-speed random reading without increasing the chip area.

Another object of the present invention is to provide a nonvolatile semiconductor memory device which enables high-speed page reading by eliminating a waist of time caused at the time of changing the word line without increasing the chip area.

Still another object of the present invention is to provide a nonvolatile semiconductor memory device which can avoid problems encountered when bit line shielding is applied to the open bit-line system or the single end system using conventional cell arrays, or which can prevent an increase in the power consumption in reading and programming the data from and into consecutive pages and an increase in the reading and writing time.

Still another object of the present invention is to provide a nonvolatile semiconductor memory device which can realize a highly dense memory cell structure by shifting the positions of bit-line contacts in adjacent NAND columns to reduce the pitch of memory cells in the column direction.

To accomplish the foregoing objects, a first nonvolatile semiconductor memory device of the present invention employs the following structures.

A nonvolatile semiconductor memory device according to the present invention is characterized by comprising: a memory cell array in which a plurality of memory cell units are arranged in a matrix; and a first and second common signal lines for exchanging signals with the memory cell array, wherein each of the memory cell units contains: a nonvolatile memory section having at least one nonvolatile memory cell; a first select MOS transistor for making the nonvolatile memory section conducting to the first common signal line; and a second select MOS transistor with a threshold voltage different from that of the first select MOS transistor for making the nonvolatile memory section conducting to the second common signal line. With this configuration, the device is characterized in that the first common signal line is a bit line and the second common signal line is a source line. Furthermore, the device is characterized in that the memory cell unit contains at least a first memory cell unit and a second memory cell unit, the first and second memory cell units constituting a subarray in such a manner that they share the gate electrodes of the first and second select MOS transistors as a first and a second select gate, respectively, with the threshold voltage of the second select MOS transistor in the first memory cell unit being lower than the threshold voltage of the second select MOS transistor in the second memory cell unit when the threshold voltage of the first select MOS transistor in the first memory cell unit is higher than the threshold voltage of the first select MOS transistor in the second memory cell unit, and the is threshold voltage of the second select MOS transistor in the first memory cell unit being higher than the threshold voltage of the second select MOS transistor in the second memory cell unit when the threshold voltage of the first select MOS transistor in the first memory cell unit is lower than the threshold voltage of the first select MOS transistor in the second memory cell unit.

Another semiconductor memory device according to the present invention Os characterized by comprising: a memory cell array in which a plurality of memory cell units are arranged in a matrix; a first and second common signal lines for exchanging signals with the memory cell array; and connecting/disconnecting means for connecting and disconnecting bit lines to and from each other in a bit line group having a plurality of bit lines which are the remaining bit lines in the memory cell array while the data is being read from and writing into a memory cell unit connected to at least one bit line in the memory cell array, wherein each of the memory cell units contains: a nonvolatile memory section having at least one nonvolatile memory cell; a first select MOS transistor for making the nonvolatile memory section conducting to the first common signal line; and a second select MOS transistor for making the nonvolatile memory section conducting to the second common signal line.

Preferable embodiments of the present invention are as follows:

(1) The second select MOS transistor in the first memory cell unit has a threshold voltage different from that of the first select MOS transistor in the second memory cell unit.

(2) Timing means which performs the serial reading of the data stored in the other memory cell unit while performing the random reading of the data stored in one of the first and second memory cell units is further provided.

(3) Potential applying means which applies a read select gate voltage to the first and second select MOS transistors in the subarray selected in such a manner that when the data in the first memory cell unit is read out, both of the first and second select MOS transistors in the first memory cell unit are made conducting and at least one of the first and second select MOS transistors in the second memory cell unit is made nonconducting, and when the nonvolatile memory section in the second memory cell unit is read from, at least one of the first and second select MOS transistors in the first memory cell unit is made nonconducting and both of the first and second select MOS transistors in the second memory cell unit are made conducting is provided. In this case, means for keeping the unselbit lines connected to the other memory cell unit at an unselected read bit-line potential when the data stored in one of the first and second memory cell units contained in the subarray are read out to the selected bit lines is further provided. Bit-line voltage sensing means for differentially sensing the difference between a first bit-line potential connected to the first memory cell unit and a second bit-line potential connected to the second memory cell unit in a read operation, by using the unselected read bit-line potential as a reference potential is still further provided.

(4) The nonvolatile memory section is composed of a plurality of electrically rewritable nonvolatile memory cells.

(5) The nonvolatile memory section is constructed in such a manner that a plurality of electrically rewritable nonvolatile memory cells, each cell made up of a charge storage layer and a control gate stacked one on top of the other on a semiconductor layer, connected in series so that adjacent memory cells may share the sources and drains.

(6) Each of nonvolatile memory cells is composed of a charge storage layer and a control gate stacked one on top of the other on a semiconductor layer. The nonvolatile memory section is constructed in such a manner that at least one nonvolatile memory cell is connected in parallel so as to share all sources and drains.

(7) A first, second, third, and fourth threshold voltages are selected by controlling impurities in the channel of a nonvolatile memory cell.

(8) Each of a first and second select MOS transistors is composed of a charge storage layer and a select gate stacked one on top of the other on a semiconductor layer.

(9) A first select MOS transistor and a second select MOS transistor differ from each other in gate length.

(10) The device further comprises means for keeping the bit lines connected to the other memory cell unit at a constant potential in writing into one of the first and second memory cell units contained in the subarray and performing a verify operation to check to see if the programming has been done sufficiently or in performing a write, a program verify, a rewrite, and a program verify operation.

(11) The memory cell array contains at least a first sub-memory cell array and a second sub-memory cell array, each of the first and second sub-memory cell arrays containing a first and a second memory cell unit, and the nonvolatile semiconductor memory device further comprising: means for applying a voltage applied to the gate of the first select MOS transistor in the first sub-memory cell array to the gate of the second select MOS transistor in the second sub-memory cell array and applying a voltage applied to the gate of the second select MOS transistor in the first sub-memory cell array to the gate of the first select MOS transistor in the second sub-memory cell array.

(12) The connecting/disconnecting means contains a MOS transistor between the bit lines.

(13) The bit line group is composed of the bit-line pairs connected to the same sense amplifier circuit.

(14) The memory cell array is an open bit-line memory cell array where the sense amplifier is provided between bit lines.

(15) The bit-line pairs containing at least two first bit lines (first bit line pair) and two second bit lines (second bit line pair) share the sense amplifier, the semiconductor memory device further comprising means for connecting the bit lines forming the second bit-line pair to each other in reading and programming the data from and into the memory cell connected to the first bit-line pair.

(16) The first select MOS transistor has a threshold voltage different form that of the second select MOS transistor.

(17) The memory cell unit contains at least a first memory cell unit and a second memory cell unit, the first and second memory cell units constituting, a subarray in such a manner that they share the gate electrodes of the first and second select MOS transistors as a first and a second select gate, respectively, with the threshold voltage of the second select MOS transistor in the first memory cell unit being lower than the threshold voltage of the second select MOS transistor in the second memory cell unit when the threshold voltage of the first select MOS transistor in the first memory cell unit is higher than the threshold voltage of the first select MOS transistor in the second memory cell unit, and the threshold voltage of the second select MOS transistor in the first memory cell unit being higher than the threshold voltage of the second select MOS transistor in the second memory cell unit when the threshold voltage of the first select MOS transistor in the first memory cell unit is lower than the threshold voltage of the first select MOS transistor in the second memory cell unit.

(18) The threshold voltage of the first select MOS transistor in the first memory cell unit is equal to the threshold voltage of the second select MOS transistor in the second memory cell unit, and the threshold voltage of the second select MOS transistor in the first memory cell unit is equal to the threshold voltage of the first select MOS transistor in the second memory cell unit.

(19) The first memory cell units and the second memory cell units are arranged alternately to form the subarray.

With the first nonvolatile semiconductor memory device of the present invention, of the select MOS transistors sharing a single select gate, some are made conducting and the other are made nonconducting. Use of two such select gates provides selected ones and unselected ones easily among the memory cells sharing the same select gate. For instance, by changing the threshold voltages of the source-side select gate and the drain-side select gate and the threshold voltages of the select gates of adjacent memory cells, the memory cells connected to odd-numbered bit lines can be made unselected when the data in the memory cells connected to even-numbered bit lines-is read onto the bit lines. As a result, the folded bit-line system can be realized without increasing the chip area, enabling a high-speed random read operation.

Furthermore, by effecting the page reading of the other while the random reading of one of the first and second memory cell units is being effected, high-speed page reading can be done with no waist of time caused at the time of changing the word line, without increasing the chip area. In addition, with the invention, because precharging required by bit-line shielding can be eliminated, it is possible to avoid problems encountered when bit line shielding is applied to the open bit-line system or the single end system using conventional cell arrays, or to prevent an increase in the power consumption in reading and programming the data from and into consecutive pages and an increase in the reading and writing time.

Therefore, with the first nonvolatile semiconductor memory device, it is possible to realize the folded bit-line system without increasing the chip area, enabling a high-speed random read operation. Furthermore, it is possible to perform high-speed page reading by eliminating a waist of time caused at the time of changing the word line without increasing the chip area. In addition, it is possible to avoid problems encountered when bit line shielding is applied to the open bit-line system or the single end system using conventional cell arrays, or to prevent an increase in the power consumption in reading and programming the data from and into consecutive pages and an increase in the reading and writing time.

A second nonvolatile semiconductor memory device according to the present invention is characterized by comprising: a first and second common signal lines; at least one word line; and a memory cell array in which a plurality of memory cell units arranged in a matrix, each of the memory cell units containing a memory cell section having at least one nonvolatile memory cell; wherein at one end of the memory cell units, a plurality of memory cell units sharing the word line share a contact and are connected to the first common signal line; and at the other end of the memory cell units, a plurality of memory cell units sharing the word line share a contact and are connected to the second common signal line. With this configuration, each of the memory cell units contains at least one select MOS transistor for making the memory cell section conducting to at least one of the first and second common signal lines.

(1) The device comprises: a first and second common signal lines; at least one word line; and a memory cell array in which a plurality of memory cell units arranged in a matrix, each of the memory cell units containing a memory cell section having at least one nonvolatile memory cell and at least one select MOS transistor for making the memory cell section conducting to at least one of the first and second common signal lines; with this configuration, at one end of the memory cell units, a plurality of memory cell units sharing word line share a contact and are connected to the first common signal line; and the other end of the memory cell units shares a contact with at least one memory cell unit sharing word line and not sharing a contact with the one end of the memory cell units and is connected to the second caomon signal line.

(2) The device comprises: a first and second common signal lines; at least one word line; and a memory cell array in which a plurality of memory cell units arranged in a matrix, each of the memory cell units containing a memory cell section having at least one nonvolatile memory cell and at least one select MOS transistor for making the memory cell section conducting to at least one of the first and second common signal lines; with this configuration, at one end of the memory cell units, a plurality of memory cell units sharing word line share a contact and are connected to the first common signal line; and the other end of the memory cell units shares a contact with at least one memory cell unit sharing word line and a contact with the one end of the memory cell units and is connected to the second common signal line.

(3) The device comprises: a first and second common signal lines; at least one word line; and a memory cell array in which a plurality of memory cell units arranged in a matrix, each of the memory cell units containing a memory cell section having at least one nonvolatile memory cell and at least one select MOS transistor for making the memory cell section conducting to at least one of the first and second common signal lines; with this configuration, at one end of the memory cell units, a plurality of memory cell units sharing word line share a contact and are connected to the first common signal line; and the other end of the memory cell units shares a contact with at least one memory cell unit sharing word line and not sharing a contact with the one end of the memory cell units and at least one memory cell unit sharing a contact with one end of the memory cell units and are connected to the second common signal line.

Preferable embodiments of the present invention are as follows in addition to as claimed inventions described in claim 65 to claim 165:

(1) The read unselected potential is the ground potential.

(2) The program unselected potential is a power supply voltage or an in-chip power supply voltage.

(3) The unselected gate voltage is negative.

(4) The memory cell section is composed of electrically rewritable nonvolatile memory cells.

(5) Each of nonvolatile memory cells is composed of a charge storage layer and a control gate stacked one on top of the other on a semiconductor layer. A plurality of memory cells are connected in series so that adjacent memory cells may share the sources and drains.

(6) Each of nonvolatile memory cells is composed of a charge storage layer and a control gate stacked one on top of the other on a semiconductor layer. The nonvolatile memory cells are connected in parallel in such a manner that at least two memory cell shares all sources and drains.

(7) The threshold voltages of a first to ninth select MOS transistors are made equal or different by making the channel impurity concentration equal or different.

With the second nonvolatile semiconductor memory device of the present invention, because each end of the memory cell unit shares a contact with another memory cell unit and is connected to the first and second common signal lines, the problem of source-line bouncing can be solved by using bit lines formed of, for example, low-resistance Al instead of conventional source lines formed of high-resistance n-type diffusion layers. Therefore, it is possible to reduce the resistance of source lines to alleviate the floating of source lines, enabling high-speed random accessing.

Furthermore, by suitably selecting E-type or I-type select MOS transistors as select MOS transistors for connecting one end and the other end of the memory cell unit to the common signal lines, it is possible to realize the high-speed random access memory cell array without increasing the chip area. Additionally, by shifting the positions of bit-line contacts in adjacent NAND columns, it is possible to shorten the pitch of memory cells in the column direction, enabling a highly dense memory cell structure.

With the second nonvolatile semiconductor memory device of the present invention, because each end of the memory cell unit shares a contact with another memory cell unit and is connected to the first and second common signal lines, the problem of source-line bouncing can be solved by using bit lines formed of, for example, low-resistance Al instead of conventional source lines formed of high-resistance n-type diffusion layers. Therefore, it is possible to realize a nonvolatile semiconductor memory device that reduces the resistance of source lines to alleviate the floating of source lines, achieving high-speed random accessing.

Furthermore, by suitably selecting E-type or I-type select MOS transistors as select MOS transistors for connecting one end and the other end of the memory cell unit to the common signal lines, it is possible to realize the high-speed random access memory cell array without increasing the chip area. Additionally, by shifting the positions of bit-line contacts in adjacent NAND columns, it is possible to shorten the pitch of memory cells in the column direction. Namely, a nonvolatile semiconductor memory device of a highly dense memory cell structure can be realized by shifting the positions of bit-line contacts in adjacent NAND columns to shorten the pitch of memory cells in the column direction.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 10 shows an overall configuration of a NAND-cell EEPROM according to a first embodiment of the present invention;

FIG. 18 is a timing chart to help explain the data read operation in the first embodiment;

FIG. 20 is a circuit diagram of the memory cell array and sense amplifier circuit in the first embodiment;

FIG. 24 shows the structure of a memory cell array where the select MOS transistor has a select gate and a floating gate;

FIG. 26 shows an overall configuration of a NAND-cell EEPROM according to a second embodiment of the present invention;

FIGS. 27A to 27D show memory cell array structures in the second embodiment;

FIGS. 28A and 28B show the structures of the sense amplifier circuit in the second embodiment;

FIGS. 29A and 29B are timing charts to help explain the data read operation in the second embodiment;

FIG. 32 shows the structure of a single end memory cell array and a sense amplifier;

FIG. 33 shows an overall configuration of a NAND-cell EEPROM according to a third embodiment of the present invention;

FIGS. 34A and 34B show the structures of the sense amplifier circuit in the third embodiment;

FIGS. 37A and 37B show memory cell array structures in the common sense amplifier system;

FIG. 40 is a timing chart to help explain the data program operation in a fourth embodiment of the present invention;

FIG. 47 is a circuit diagram of the memory cell array and sense amplifier circuit in the sixth embodiment;

FIG. 53 is a timing chart to help explain the data read operation in the seventh embodiment;

FIGS. 55A and 55B are timing charts to help explain the data program operation in the seventh embodiment;

FIG. 61 is a timing chart to help explain the data read operation in the eighth embodiment;

FIG. 62 is a timing chart to help explain the data read operation in the eighth embodiment;

FIGS. 63A and 63B are timing charts to help explain the data program operation in the eighth embodiment;

FIGS. 64A and 64B show memory cell array structures in the eighth embodiment;

FIG. 69 shows a memory cell array structure of the present invention;

FIG. 71 shows a memory cell array structure of the present invention;

FIG. 72 shows a memory cell array structure of the present invention;

FIGS. 74A and 74B show arrangements of the memory cells and memory cell sections in the present invention;

FIGS. 75A and 75B show arrangements of the memory cells and memory cell sections in the present invention;

FIG. 76 shows a structure of the memory cell section in the present invention;

FIGS. 77A to 77C show structures of the memory cell section in the present invention;

FIG. 83 is a timing chart to help explain the data read operation in the thirteenth embodiment;

DETAILED DESCRIPTION OF THE PREFERRED EMBODIMENTS

Figures 1A, 1B:
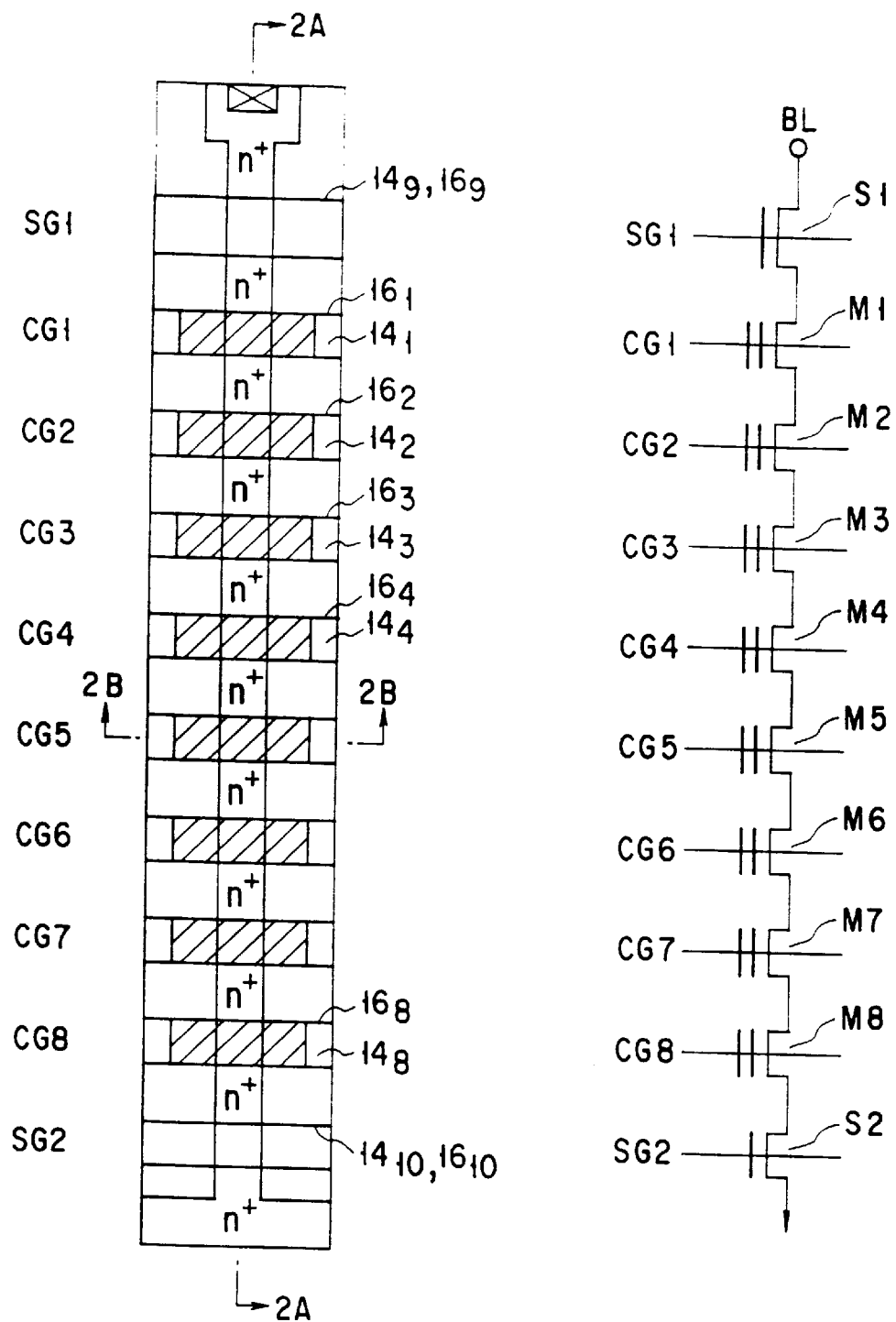
FIGS. 1A and 1B are a plan view and an equivalent circuit diagram of a cell structure of a conventional NAND EEPROM, respectively.
Figure 2A:
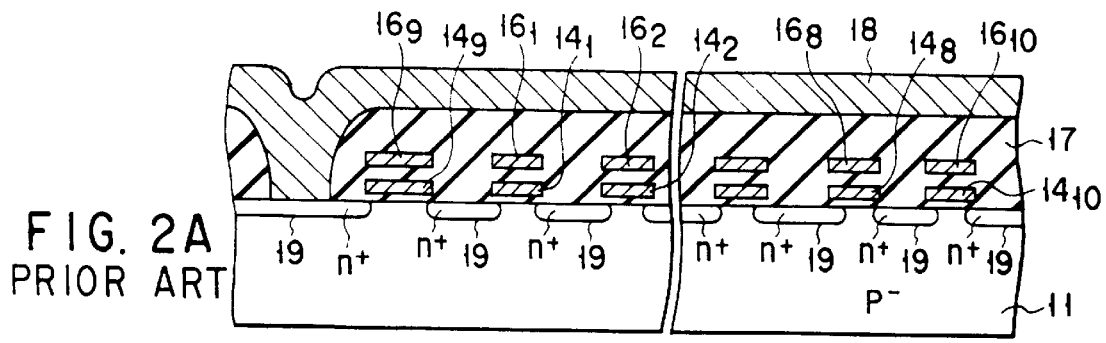
FIGS. 2A and 2B are sectional views taken along line 2A—2A and 2B—2B of FIG. 1, respectively.
Figure 2B:
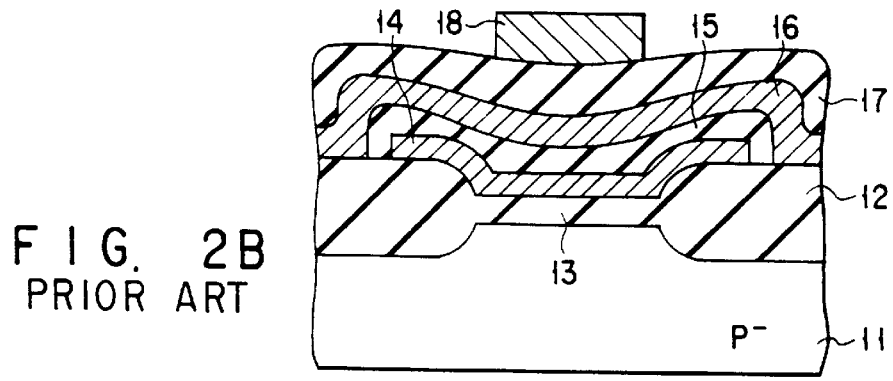

Hereinafter, embodiments of the present invention will be explained.

FIG. 10 is a block diagram showing an overall structure of a NAND-cell EEPROM according to a first embodiment of the present invention. The first embodiment is a concrete embodiment to solve the first problem.

A NAND-cell EEPROM of the first embodiment comprises a memory cell array 1, a sense amplifier and latch circuit 2 serving as latching means for programming and reading data, a row decoder 3 for selecting word lines, a column decoder for selecting bit lines, an address buffer 5, an I/O sense amplifier 6, a data input/output buffer 7, and a substrate potential control circuit 8.

Figure 11:
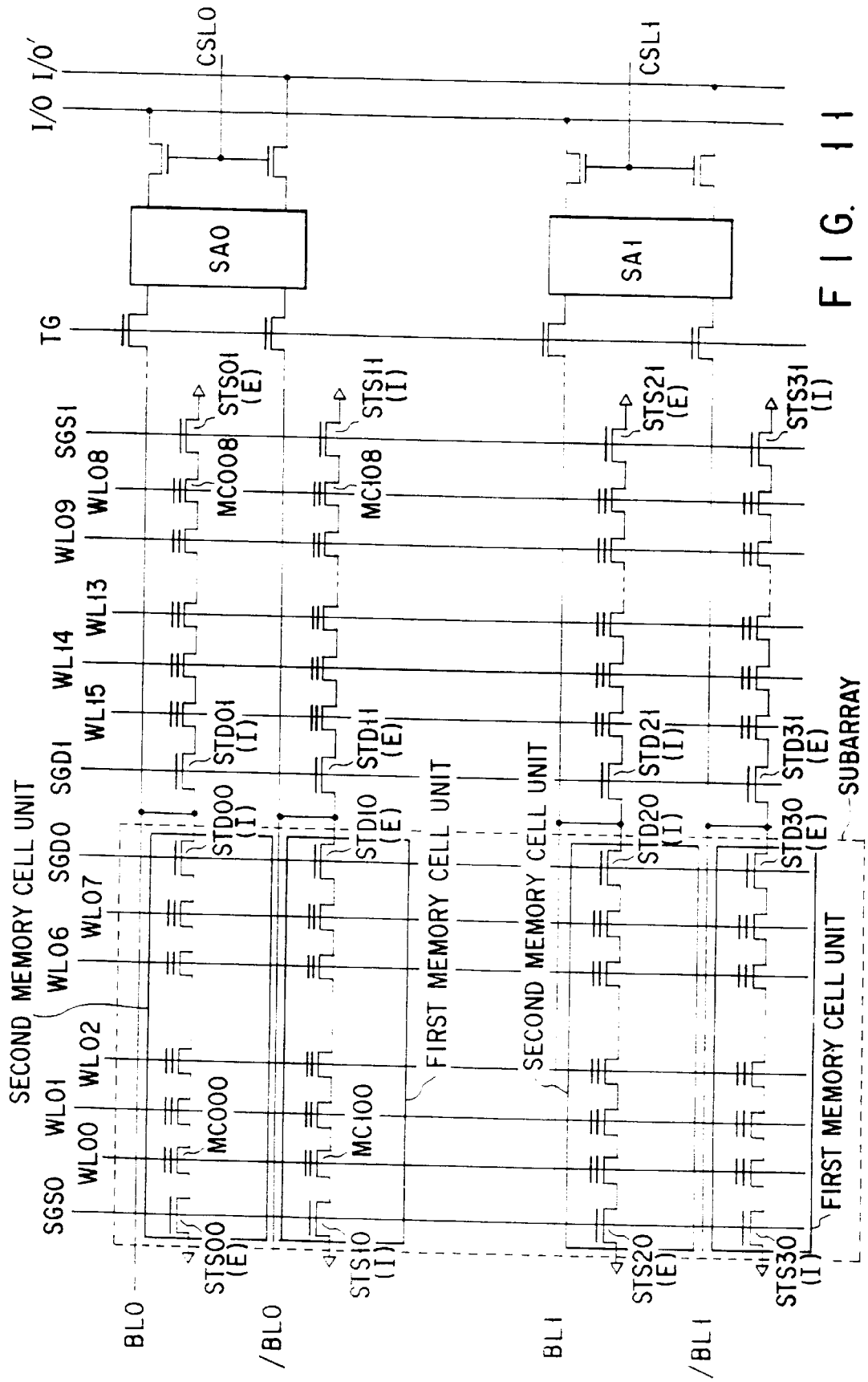
FIG. 11 shows a memory cell array structure in the first embodiment.

FIG. 11 shows the structure of the memory cell array. In FIG. 11, BL, /BL indicate bit lines, WL word lines, STD first select MOS transistors coupled to the drain side of NAND cells, STS second select MOS transistors coupled to the source side of NAND cells, SGD select gates for driving select MOS transistors STD, SGS select gates for driving select MOS transistors STS, SA sense amplifiers, and TG a control signal for driving a gate for coupling sense amplifiers SA to bit lines BL. In the representation in the figure, the subscripts, for example, 00 in $WL_{00}$ are omitted. Hereinafter, for the sake of the representative for the rest, the subscripts will be omitted similarly.

As shown in FIG. 11, a sense amplifier SA uses a pair of bit lines BLj, /BLj as input. This is the folded bit-line system used for DRAMs. To realize the folded bit-line system, when one bit line of the bit-line pair discharges, the other bit line must be prevented from discharging. In the first embodiment, the other bit line is prevented from discharging in the folded bit-line system by making different the threshold voltages of the select MOS transistors sharing the same select gate (e.g., $STS_{00}$ and $STS_{10}$, $STD_{00}$ and $STD_{10}$ in FIG. 11) and then applying different voltages to the drain-side select gate and the source-side select gate.

Specifically, in FIG. 11, a select MOS transistor with a high threshold voltage Vt1 (e.g., 2 V) is determined to be of the E-type, and a select MOS transistor with a low threshold voltage Vt2 (e.g., 0.5 V) (Vt1>Vt2) is determined to be of the I-type. The voltages applied to the gates (select gates) of the two types of select MOS transistors include voltage Vsgh (e.g., 3 V) (Vsgh>Vt1, Vt2) with which both of the I-type transistor and the E-type transistor turn on,and voltage Vsg1 (e.g., 1.5 V) (Vt1>Vsg1>Vt2) with which the I-type transistor turns on, but the E-type transistor turns off.

A memory cell I is an electrically rewritable nonvolatile memory cell where a floating gate (a charge storage layer) and a control gate are stacked one on top of the other on a semiconductor substrate. A plurality of such memory cells are connected in series to form a NAND cell (a nonvolatile memory section). An I-type STS and an E-type STD are connected to a NAND cell to complete a first memory cell unit. An E-type STS and an I-type STD are connected to a NAND cell to complete a second memory cell unit. The first memory cell units and the second memory cell units are arranged alternately. A plurality of first memory cell units and a plurality of second memory cell units which share a word line constitute a subarray.

A method of applying a voltage to the select gate will be explained concretely with reference to FIG. 11.

When the data in memory cell $MC_{000}$ is read out, word lines $WL_{00}$, $WL_{08}$ to $WL_{15}$ are placed at 0 V and word lines $WL_{01}$ to $WL_{07}$ are placed at Vcc (e.g., 3 V). Then, the source-side select gate $SGS_0$ is placed at Vsgh and the drain-side select gate $SGD_0$ is placed at Vsg1. Select gates $SGS_1$, $SGD_1$ are placed at 0 V. In this case, the source-side select MOS transistors $STS_{00}$, $STS_{10}$ both turn on. On the other hand, the drain-side select MOS transistor $STD_{00}$ of bit line $BL_0$ turns on, but the drain-side select MOS transistor $STD_{10}$ of bit line $/BL_0$ turns off. Therefore, if the data in memory cell $MC_{000}$ is "1", bit line $BL_0$ will discharge, but bit line $/BL_0$ will not discharge, regardless of the data in memory cell $MC_{100}$.

When the data in memory cell $MC_{100}$ is read out, word lines $WL_{00}$, $WL_{08}$ to $WL_{15}$ are placed at 0 V and word lines $WL_{01}$ to $WL_{07}$ are placed at Vcc. The source-side select gate $SGS_0$ is placed at Vsg1 and the drain-side select gate $SGD_0$ is placed at Vsgh. Select gates $SGS_1$, $SGD_1$ are placed at 0 V. In this case, the drain-side select MOS transistors $STD_{00}$, $STD_{10}$ both turn on. Because the source-side select MOS transistor $STD_{10}$ turns on, if the data in memory cell $MC_{100}$ is "1", bit line $/BL_0$ will discharge, but bit line $BL_0$ will not discharge because select MOS transistor $STS_{00}$ turns off.

Figure 12:
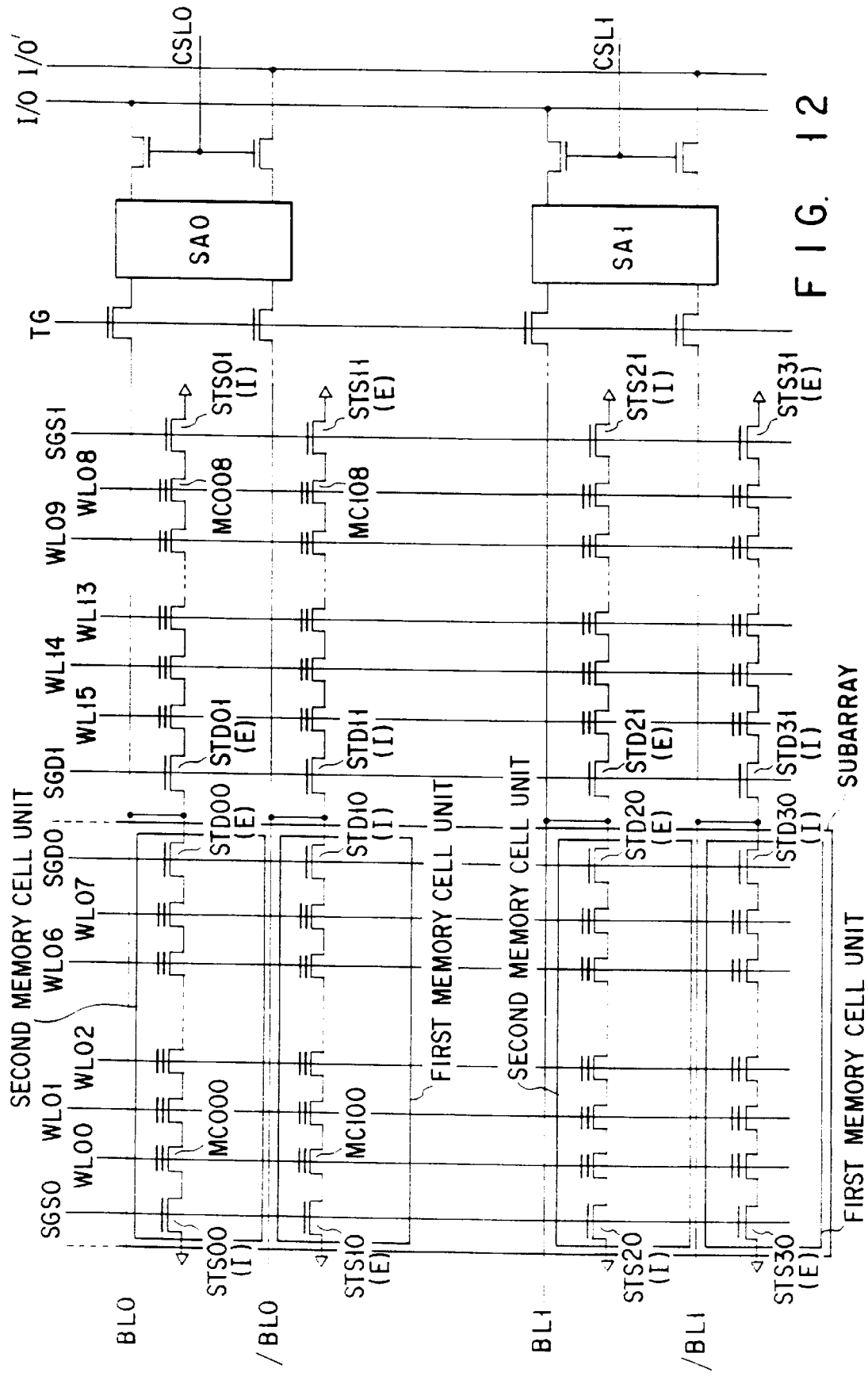
FIG. 12 shows a memory cell array structure in the first embodiment.

With the present invention, by using the select MOS transistors coupled to the bit-line pair $BLj$, $/BLj$, the threshold voltages of the select MOS transistors controlled by the same select gates SGS, SGD (e.g., $STD_{00}$ and $STD_{10}$, $STS_{00}$ and $STS_{10}$ $STD_{01}$ and $STD_{11}$, $STS_{01}$ and $STS_{11}$) are made different. A method of setting the threshold voltages is arbitrary. For example, as shown in FIG. 12, select MOS transistor $STD_{00}$ of bit line BLj may be of the E-type, $STS_{00}$ may be of the I-type, select MOS transistor $STD_{10}$ of bit line /BLj may be of the I-type, and $STS_{10}$ may be of the E-type.

Figure 13:
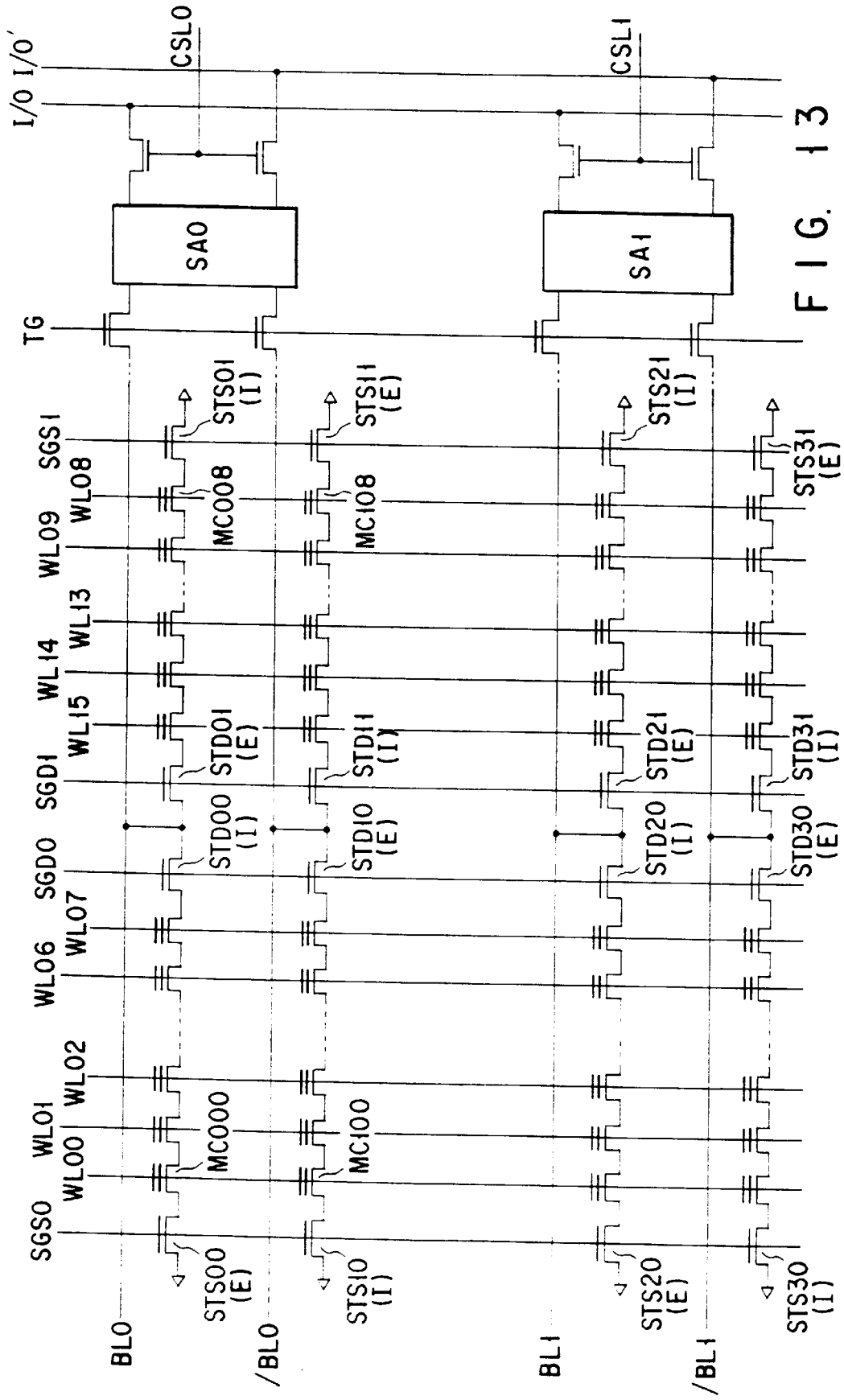
FIG. 13 shows a memory cell array structure in the first embodiment.
Figure 14:
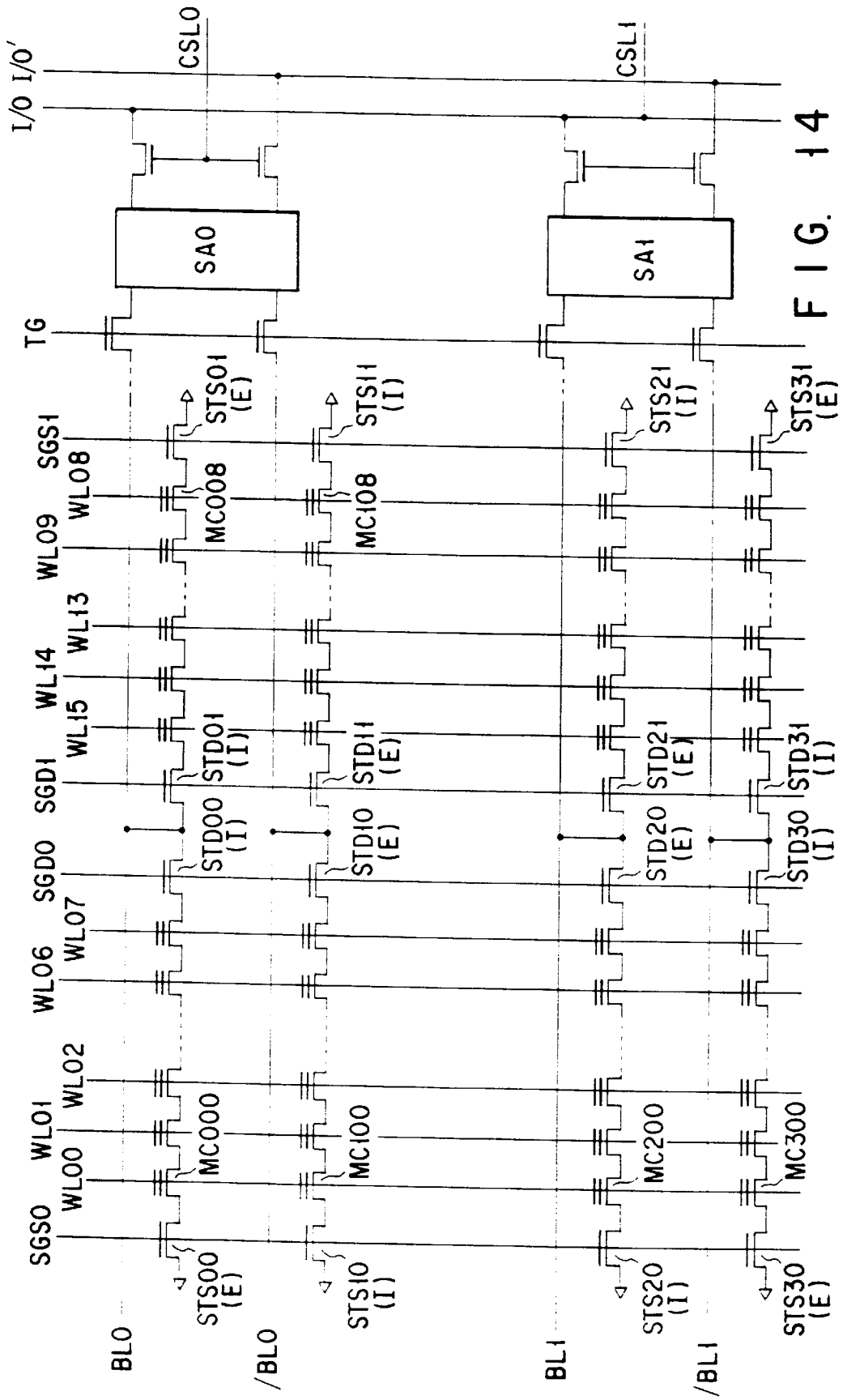
FIG. 14 shows a memory cell array structure in the first embodiment.

While in FIG. 11, all of the drain-side select MOS transistors of the cells coupled to bit line BLj are of the I-type, and all of the source-side select MOS transistors are of the E-type, one set of drain-side select MOS transistors may be of the I-type and the other set be of the E-type in the two NAND blocks sharing a bit-line contact as shown in FIG. 13, for example. Furthermore, while in FIGS. 11 to 13, the alternately arranged bit lines BLj are selected and read from simultaneously, the threshold voltages of the select MOS transistors may be set so that bit line $/BL_1$ may be selected when bit line $BL_0$ is selected as shown in FIG. 14, for example.

With the present invention, as shown in the first to thirteenth embodiments, among the select MOS transistors sharing a select gate, some are made conducting and the rest are made nonconducting. Use of two such select gates realizes selected ones and unselected ones easily among the memory cells sharing the same select gate.

Furthermore, the threshold voltages of select MOS transistors and the voltages applied to select gates are arbitrary. Specifically, the drain-side (bit line contact side) select MOS transistors-have two threshold voltages Vtd1, Vtd2 (Vtd1>Vtd2), the voltages applied to the drain-side select gates are of two kinds Vsghd (Vsghd>Vtd1), Vsgld (Vtd1>Vsgld>Vtd2), the source-side select MOS transistors have two threshold voltages Vts1, Vts2 (Vts1>Vts2), and the voltages applied to the source-side select gates are of two kinds Vsghs (Vsghs>Vts1), Vsgls (Vts1>Vsgls>Vts2). Unlike the above embodiments, the equations Vtd1=Vts1, Vtd2=Vts2, Vsghd=Vsghs, and Vsgld=Vsgls may not be met.

For example, the threshold voltages of the drain-side (bit line contact side) select MOS transistors may be of two kinds, 2 V and 0.5 V, the threshold voltages of the source-side select MOS transistors may be of two kinds, 2.5 V and 1 V, the voltages applied to the drain-side select gates may be Vsgh=3 V, Vsgl=1.5 V, and the voltages applied to the source-side select gates may be vsgh=3 V, Vsgl=1.2 V.

Making Vsgh higher than Vcc leads to an increase in the conductance of the select MOS transistors (i.e., a reduction in the resistance). This increases a cell current flowing in the NAND cell column in a read operation, shortening the bit-line discharging time, with the result that verify reading in a read and a program operation is made faster. Vsgh may be raised from Vcc at the charge pump circuit in the chip, for example.

It is desirable that such select gate voltage Vsgh as makes conductive all of the select MOS transistors sharing a single select gate should be equal to or lower than the power supply voltage Vcc. When Vsgh is higher than Vcc, the chip requires a charge pump circuit, leading to an increase in the chip area.

Furthermore, the lower threshold voltage Vt2 of the select MOS transistors may be a negative threshold voltage (e.g., −1 V). In a program operation, 0 V is applied to a bit line coupled to the cell to be programmed into, and an intermediate potential (about 10 V) is applied to a bit line coupled to the cell not to be programmed into. In this case, the source-side select gate must be turned off so that current may not flow between the two bit lines via the source line. Therefore, when threshold voltage Vt2 is set at a negative threshold voltage of about −1 V, a negative voltage (e.g., −1.5 V) with which a select gate having a negative threshold voltage turns off is applied to the source-side select gate in a program operation.

The higher one Vt1 of the threshold voltages of the select gates may be set at a voltage equal to or higher than the power supply voltage vcc (e.g., 3.5 V). In this case, to turn on a select MOS transistor having a threshold voltage of Vt1 in a read operation or verify read operation, for example, 4 V is applied to the select gate by using, for example, the charge pump circuit in the chip.

Using the timing chart of FIG. 16, the operation of reading the data from memory cell $MC_{000}$ connected to bit line BLj of FIG. 15 will be described. The sense amplifier is composed of a CMOS flip-flop controlled by control signals SAN, SAP.

First, control signal TG changes from Vcc (e.g., 3 V) to Vss, thereby disconnecting CMOS flip-flop FF from bit lines BLj, /BLj. Then, precharge signals $\phi_{pA}$, $\phi_{pB}$ change from Vss to Vcc (time t0), thereby precharging bit line BLj to $V_A$ (e.g., 1.7 V) and bit line /BLj to VB (e.g., 1.5 V) (time t1). When the precharging is completed, $\phi_{pA}$, $\phi_{pB}$ go to Vss, bringing bit lines BLj, /BLj in the floating state. Thereafter, row decoder 3 applies specified voltages to the control gate (word line) and select gate (time t2).

Figure 15:
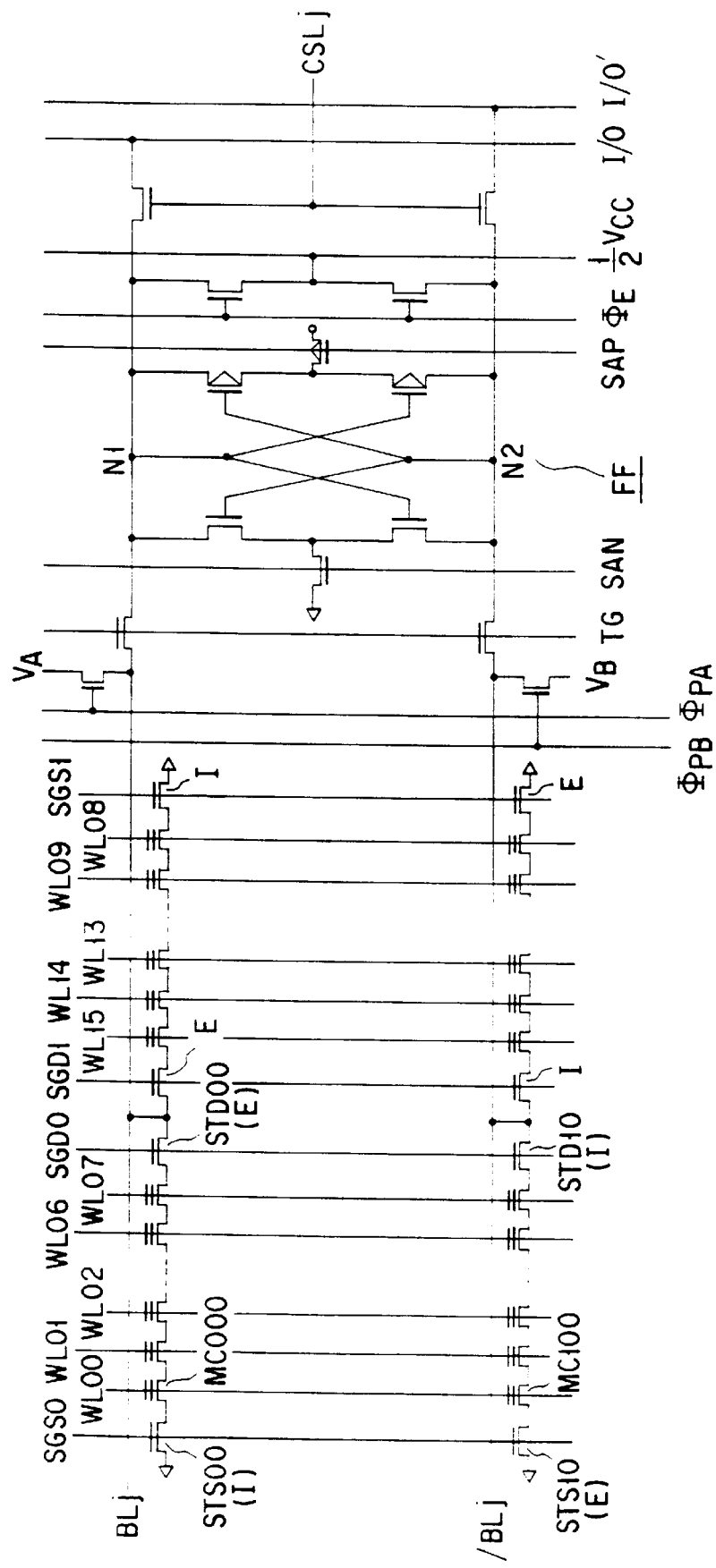
FIG. 15 is a circuit diagram of the memory cell array and sense amplifier circuit in the first embodiment.

When memory cell $MC_{000}$ of FIG. 15 is read from, $WL_{00}$ is at 0 V, $WL_{01}$ to $WL_{07}$ are at 3 V, $SGD_0$ is at 3 V (Vsgh), and $SGS_0$ is at 1.5 V (Vsg1). When the data programmed in memory cell $MC_{000}$ is "0", because the threshold voltage of memory cell $MC_{000}$ is positive, no cell current flows and the potential of bit line BLj remains at 1.7 V. When the data is "1", a cell current flows, causing the potential of bit line BLj to drop to 1.5 V or below. Because select gate $SGS_0$ is at 1.5 V, select MOS transistor $STS_{10}$ turns off, so that bit line /BLj does not discharge, regardless of the data programmed in memory cell $MC_{100}$, and remains at a precharge potential of 1.5 V.

Thereafter, at time t3, control signal SAP goes to 3 V and control signal SAN goes to 0 V, deactivating CMOS flip-flop FF. At time t4, $\phi_E$ goes to 3 V, thereby equalizing CMOS flip-flop FF, placing nodes N1, N2 at Vcc/2 (e.g., 1.5 V). At time t5, control signal TG goes to 3 V, connecting the bit line to the sense amplifier (time t6), and thereafter control signal SAN rises from 0 V to 3 V, causing the potential difference between bit lines BLj and /BLj to be amplified. Then, at time t7, control signal SAP drops from 3 V to 0 V, causing the data to be latched.

Specifically, if "0" is is programmed in memory cell $MC_{000}$, node N1 will be at 3 V and node N2 will be at 0 V. If "1" is programmed in memory cell $MC_{000}$, node N1 will be at 0 V and node N2 will be at 3 V. Thereafter, when column select signal CSLj rises from 0 V to 3 V, the data latched in CMOS flip-flop is outputted to I/O, I/O' (time 8).

Figure 17:
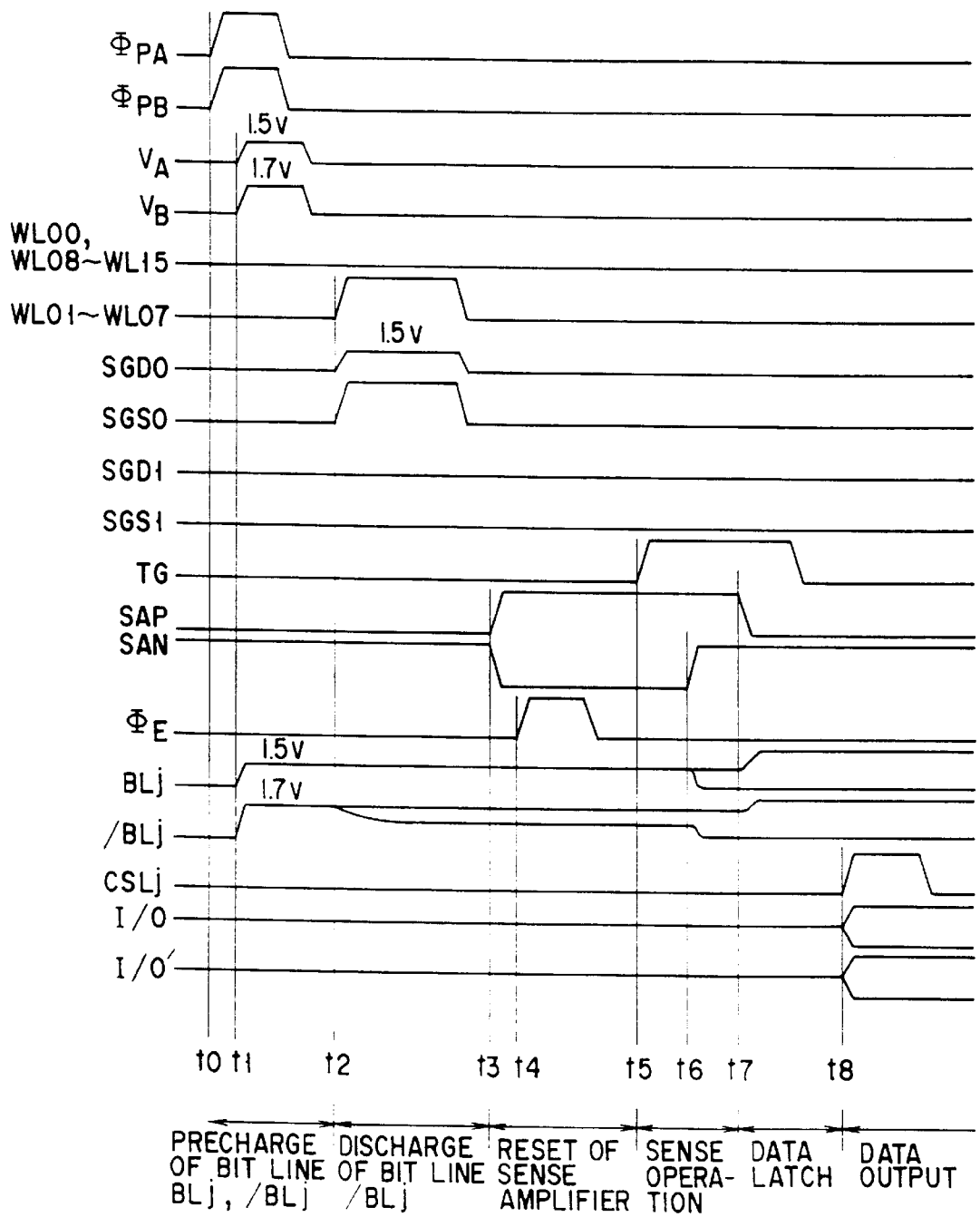
FIG. 17 is a timing chart to help explain the data read operation in the first embodiment.

The timing for reading memory cell $MC_{100}$ connected to bit line /BLj of FIG. 15 is shown in FIG. 17. In this case, bit line BLj is precharged to 1.5 V and bit line /BLj is precharged to 1.7 V (time t1). The voltage applied from row decoder 3 to the control gate (word line) at the time of reading the cell data onto the bit line is the same as when memory cell $MC_{000}$ is read from. For the voltages applied to the select gates, $SGD_0$ is 1.5 V and $SGS_0$ is 3 V (time 2).

When the data programmed in memory cell $MC_{100}$ is "0", because the threshold voltage of memory cell $MC_{100}$ is positive, no current will flow and the potential of bit line /BLj remains at 1.7 V. When the data is "1", a cell current will flow, causing the potential of bit line /BLj to drop to 1.5 V or below. Since select gate $SGD_0$ is at 1.5 V, select MOS transistor $STD_{00}$ turns off, with the result that bit line BLj does not discharge, regardless of the data programmed in memory cell $MC_{000}$ and remains at the precharge potential of 1.5 V. Thereafter, as when memory cell $MC_{000}$ is read from, the data read onto bit line /BLj is sensed and latched in the sense amplifier and outputted to I/O, I/O'.

The timing for reading is arbitrary. For example, at time t5, the transfer gate connecting the bit lines to the sense amplifier may be turned on to transfer the potentials of bit lines BLj, /BLj to nodes N1, N2 and then be turned off. Therefore, the load capacitance of the sense amplifier decreases as a result of the bit-line pair being disconnected from the sense amplifier, so that the potentials of nodes N1, N2 are determined rapidly at the time of sensing and latching.

Figure 16:
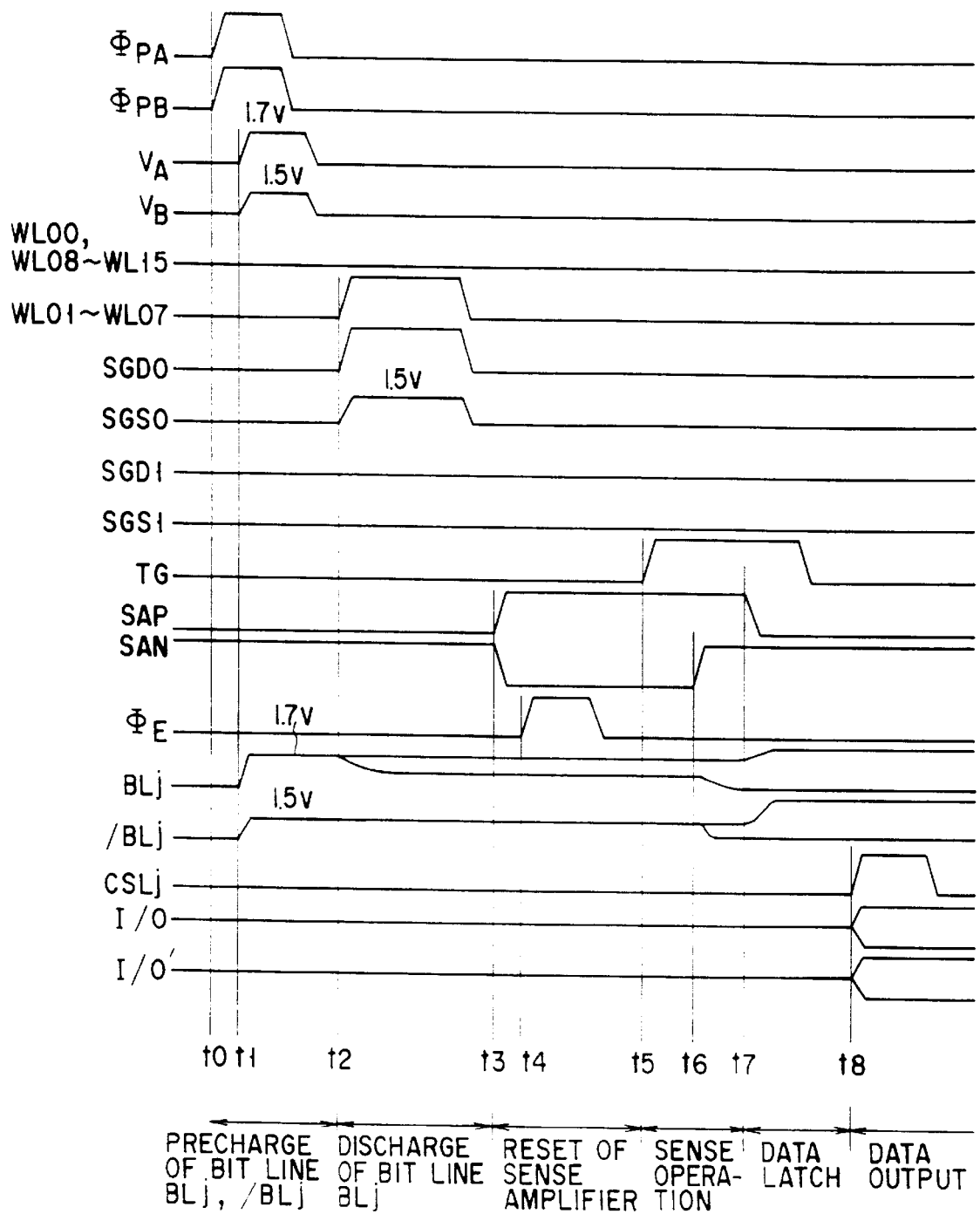
FIG. 16 is a timing chart to help explain the data read operation in the first embodiment.

In the timing charts of FIGS. 16 to 18, in a sense operation of the sense amplifier, after SAN has been raised from 0 V to 3 V to turn on the n-channel transistor in CMOS flip-flop FF, control signal SAP is dropped from 3 V to 0 V to turn on the p-channel transistor in CMOS flip-flop FF. However, control signal SAP may be dropped from 3 V to 0 V at the same time that SAN is raised from 0 V to 3 V.

When the data in the cell connected to bit line BLj is sensed and latched at the sense amplifier, one of bit lines BLj, /BLj has a potential of 0 V and the other has a potential of Vcc (e.g., 3 V). If $\phi_E$ is placed at 3 V after the cell data on bit line BLJ has been outputted from the sense amplifier to I/O, I/O', bit line BLj will be coupled (equalized) to bit line /BLj, enabling bit lines BLj, /BLj to go to 1.5 V without precharging. Thereafter, for example, to read the data from bit line /BLj, bit line /BLj is precharged to 1.7 V by placing $\phi_{PB\ at}$ 3 V and $V_B$ at 1.7 V. As described above, by coupling bit line BLj to bit line /BLj after bit line BLj has been sensed, the precharging time for the next reading can be shortened and furthermore the power consumption needed for precharging can be reduced.

Figure 19:
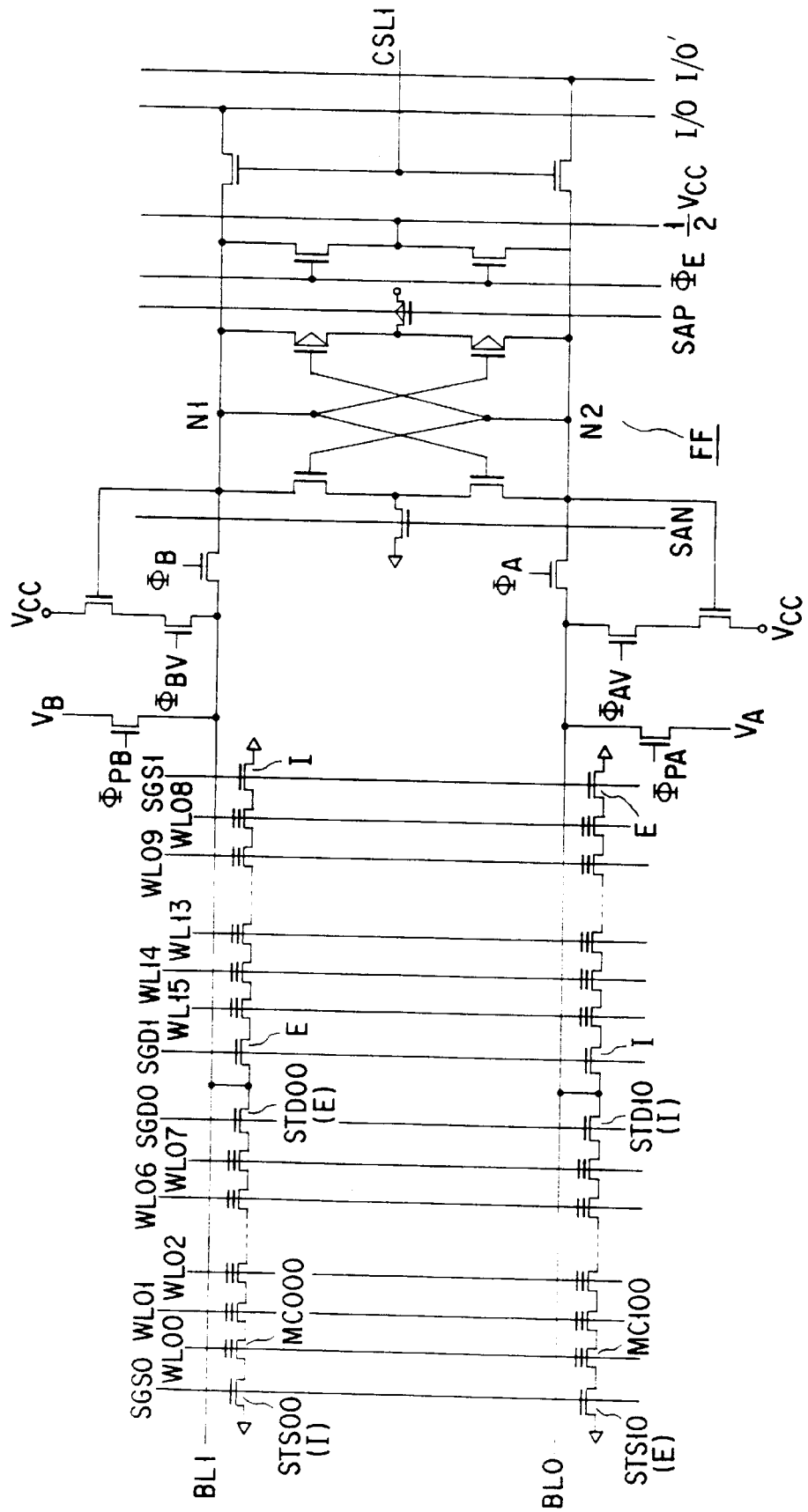
FIG. 19 is a circuit diagram of the memory cell array and sense amplifier circuit in the first embodiment.

As shown in FIG. 19, a circuit for performing verification after writing may be added to the sense amplifier.

To precharge bit lines forming a pair to different potentials, a dummy cell may be provided as shown in FIG. 20, for example, in addition to a method of transferring potentials $V_A$, $V_B$ from a peripheral circuit as shown in FIG. 15. In this case, bit lines BLj, /BLj are precharged to the same potential $V_{PR}$. A current flowing through the dummy cell is made smaller than the cell worst reading current. This can be achieved by composing a dummy NAND cell to be connected in series of a depletion-type transistor with a larger channel length of L and a narrower channel width of W.

If the threshold voltage of the dummy select MOS transistor is set as shown in FIG. 20, when the data in the memory cell connected to bit line BLj is read onto bit line BLj, bit line /BLj will be discharged via the dummy cell, and when the data in memory cell connected to bit line /BLj is read, bit line BLj will be discharged via the dummy cell.

The operation of the circuit of FIG. 20 will be described giving an example of reading the data from memory cell $MC_{000}$.

First, precharge control signal PRE goes to 3 V, causing bit lines BLj, /BLj to be precharged to the precharge potential VPR (e.g., 1.7 V). Thereafter, the control gate lines and select gates of the memory cell are selected and 0 V is applied to dummy word line DWL and almost the same voltage as that applied to the select gates SGS, SGD of the select MOS transistor is applied to dummy select gates DSGS, DSGD.

When "0" is programmed in memory cell $MC_{000}$, bit line BLj will not discharge and remain at the precharge potential of 1.7 V. When "1" is programmed in $MC_{000}$, bit line BLj will discharge to 1.3 V, for example. When the bit line BLj in which "1" is programmed has discharged to 1.3 V, bit line /BLj discharges to 1.5 V via the dummy cell. Thereafter, the potential of the bit line pair undergoes differential amplification at the sense amplifier in the same manner as in the embodiment of FIG. 15.

Figure 21:
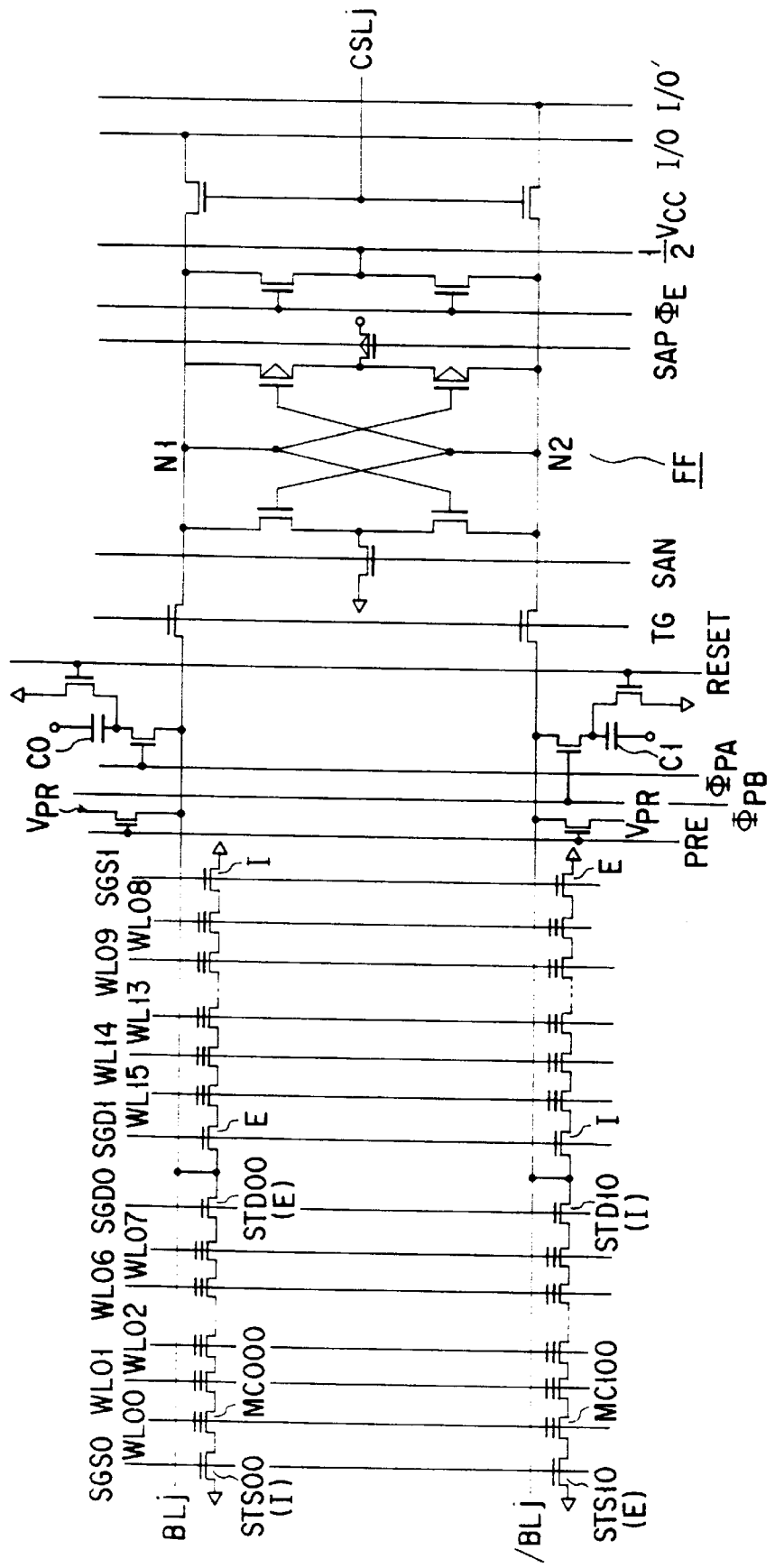
FIG. 21 is a circuit diagram of the memory cell array and sense amplifier circuit in the first embodiment.

To precharge bit lines forming a pair to different potentials, the dummy cell may be composed of a transistor and a capacitor as shown in FIG. 21. First, bit-line precharge control signal PRE goes to 3 V, causing bit lines BLj, /BLj to be precharged to the same potential $V_{PR}$. When the data in memory cell $MC_{000}$ is read onto bit line BLj after control signal PRE has been placed at 0 V and the bit line has been brought in the floating state, $\phi_{PB}$ goes to 3 V and capacitor C1 is charged. Bit line /BLj is dropped from the precharge potential $V_{PR}$ as much as the amount of charge accumulated in capacitor C1. This is used as a reference potential in effecting differential amplification of the bit-line pair.

When the data in memory cell $MC_{100}$ is read onto bit line /BLj, $\phi_{PA}$ goes to 3 V, charging capacitor $C_0$, causing bit line BLj to drop from the precharge potential $V_{PR}$. The potential of the bit line BLj is used as a reference potential.

In the arrangements of FIGS. 15 to 21, while the bit line connected to the memory cell to be read from is being discharged, the other bit line of the bit-line pair connected to the sense amplifier (e.g., when memory cell $MC_{000}$ of FIG. 15 is read from, the other bit line is bit line /BLj, and when memory cell $MC_{100}$ is read from, the other bit line is bit line BLj) is in the floating state. By keeping precharge control signal $\phi_{PB}$ at 3 V while the data in the memory cell is being read after the bit line (e.g., bit line BLj) has been precharged to 1.7 V, the bit line serving as a reference (e.g., bit line /BLj) can be fixed at a reference potential of 1.5 V.

In this way, by keeping bit line /BLj at the reference potential, noise resulting from the capacitive coupling between adjacent bit lines during bit-line discharging can be reduced.

Furthermore, as in the read operation, at the time of verify reading (which is explained in detail in the fourth embodiment) after writing, the bit line is charged and discharged according to the data programmed in the cell. By keeping the bit line /BLj not to be read from at the reference potential, noise stemming from the capacitive coupling between bit lines can be reduced.

Figure 22:
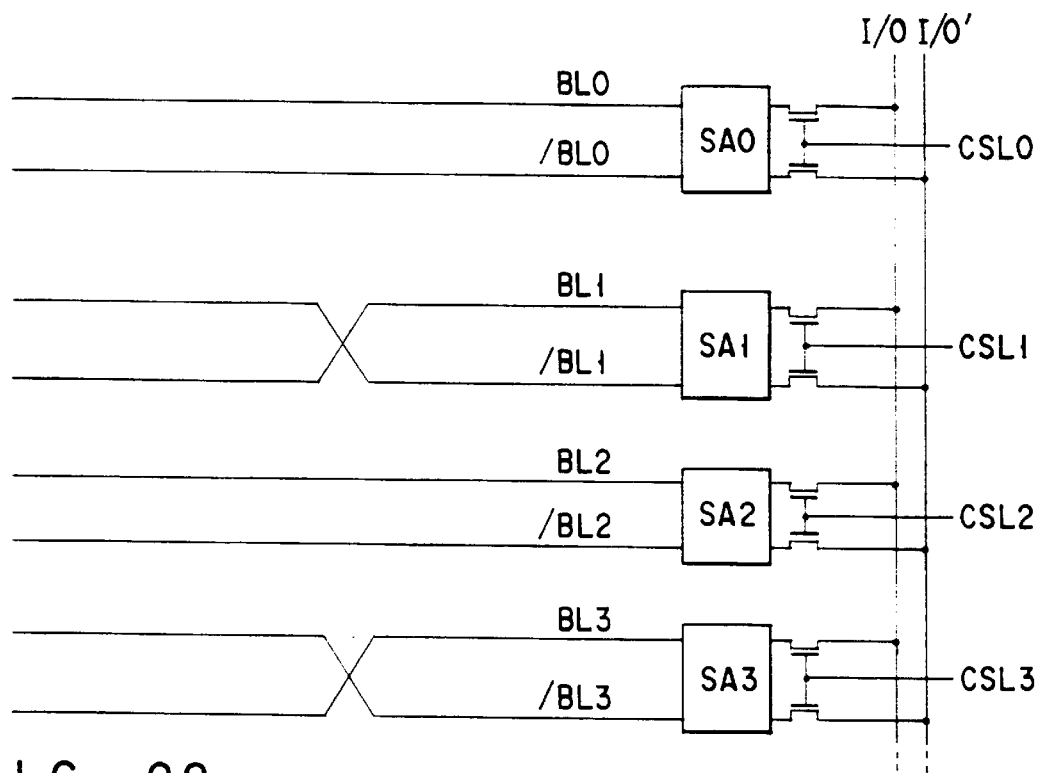
FIG. 22 shows the structure of a twisted bit line system.
Figure 23:
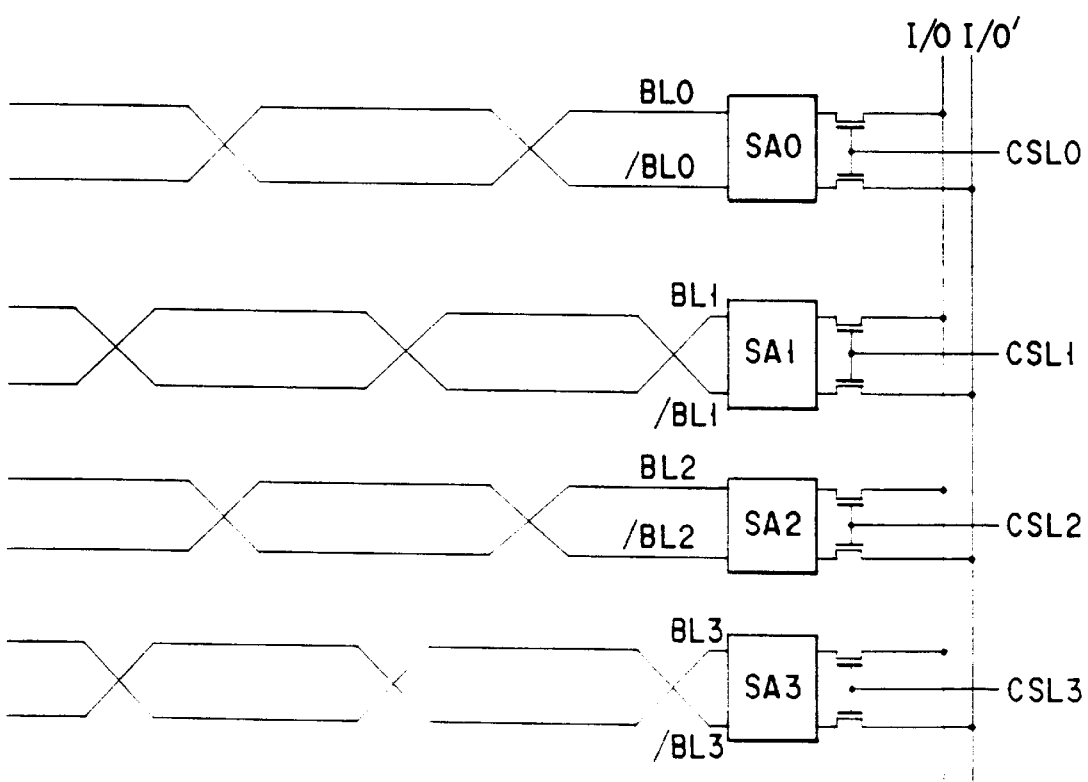
FIG. 23 shows the structure of a twisted bit line system.
Figure 25:
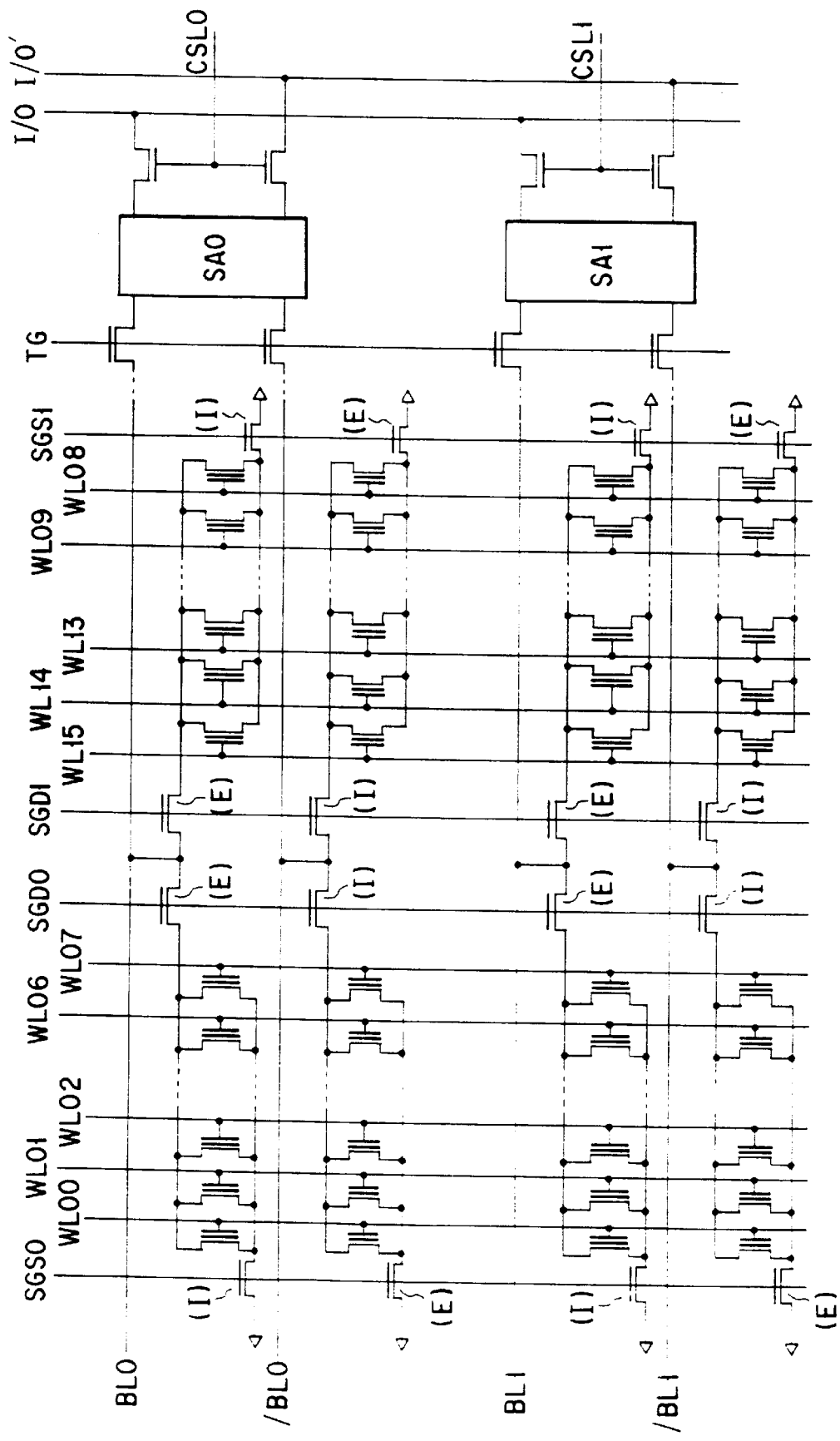
FIG. 25 shows a memory cell array structure in the first embodiment.

To reduce noise due to the capacitive coupling between adjacent bit lines in sensing and latching the data in the memory cell read onto the bit line, the twisted bit line system proposed in connection with DRAMs may be used as shown in FIG. 22. The twisted bit line system as shown in FIG. 23 may be used, too.

The select MOS transistor may be composed of a cell with a select gate and a floating gate as shown in FIG. 24. In this case, by injecting electrons into the floating gates of the select MOS transistors before shipping semiconductor memory devices, the threshold voltages of the select MOS transistors can be determined. The injection of electrons into the floating gate of the drain-side select MOS transistor (e.g., $STD_{00}$ of FIG. 24) can be effected by tunneling from the substrate.

Specifically, word lines $WL_{00}$ to $WL_{07}$ are placed at an intermediate potential (about 10 V) or 0 V, select gate $SGD_0$ is placed at Vpp (about 20 V), select gates $SGS_0$ and $SGD_1$ are placed at 0 V, bit line $BL_0$ is place at 0 V, and bit lines /BL0, BL1, /BL1 are placed at an intermediate potential (about 10 V). Furthermore, to determine the threshold-voltage of the source-side select MOS transistor, select gates $SGD_0$, $SGS_0$, and word lines $WL_{00}$ to $WL_{07}$ are all brought into the high state to turn on all of the NAND cell columns, and bit line $BL_0$ is placed at Vpp or the intermediate potential and bit lines $/BL_0$, $BL_1$, $/BL_1$ are placed at 0 V to inject hot electrons.

As described above, with the present invention, by changing the threshold voltages of the select MOS transistors and the voltages applied to the select gates, the folded bit line system can be realized without increasing the chip area, enabling high-speed random reading. To change the threshold voltage, the thickness of the gate oxide film of the select MOS transistor may be changed or the concentration of impurities doped in the channel of the select MOS transistor may be changed. The threshold voltages may be made different, depending on whether or not the select MOS transistors undergo channel doping of impurities. By changing the channel length of the select MOS transistor, the threshold voltage can be changed. That is, because in a transistor with a short channel length, the threshold voltage is low because of short channel effects, this may be used as an I-type transistor.

Furthermore, to change the thickness of the gate oxide film or the impurity concentration in the channel, the other manufacturing processes such as channel doping of peripheral circuits, may be used without introducing an additional process. In any method, the threshold voltages of the select MOS transistors have only to be made different. Once differences have been introduced to the threshold voltages, specified threshold voltages can be obtained by using substrate biases.

In the conventional NAND-cell EEPROM, 0 V is applied to the source-side select gate in the write block. When the source-side select MOS transistor is of the I-type and threshold voltage Vt2 is about 0.1 V (or a negative threshold voltage), the source-side select MOS transistor does not cut off completely, with the result that a cell current of, for example, 0.1 IA flows, allowing the bit line not to be programmed into to discharge from the intermediate potential (about 10 V).

For example, if the memory cells connected to 200 bit lines are not programmed into and the bit lines are charged to the intermediate potential, as much cell current as a total of 200×0.1 $\mu$A=20 $\mu$A will flow. To improve the cut-off characteristic of the I-type transistor, a voltage of, for example, about 0.5 V may be applied to the common source line in a program operation. When 0.5 V is applied to the source, the potential difference between the source and the substrate is −0.5 V, allowing the threshold voltage of the I-type transistor to increase because of substrate bias effects, with the result that the cut-off characteristic in applying 0 V to the gate of the I-type transistor improves, thereby reducing the cell current in a read operation.

To set the smaller one (of the I-type) of the threshold voltages of the select gates at, for example, 0.5 V, the substrate concentration may be made lower. With an I-type transistor with a low substrate concentration, application of a drain voltage widens the depletion layer between the drain and the substrate even if a gate voltage is not applied, with the result that the depletion layer between the drain and the substrate is liable to couple with the depletion between the source and the substrate (punch-through). is To raise the punch-through withstand voltage of the I-type select MOS transistor, the channel length L of the I-type select MOS transistor is made greater.

While in the first embodiment, a NAND-cell EEPROM has been explained, the present invention may be applied to nonvolatile semiconductor memory devices where the drain side of the memory cell is connected to the bit line via a select gate and the source side of the cell is also connected to the source line via a select gate. For example, the invention may be applied to an AND-cell EEPROM (H. Kume, et al., IEDM Tech. Dig., December 1992, pp. 991–993). The invention may be also applied to NOR-type EEPROMs and mask ROMs where a single memory cell is provided between the drain-side select gate and the source-side select gate.

FIG. 26 is a block diagram of a NAND-cell EEPROM according to a second embodiment of the present invention. In FIG. 26, since a memory cell array 1 serving as memory means is of the open bit line system, it is divided into two, memory cell array 1A and memory cell array 1B. Each of memory cell array 1A and memory cell array 1B is divided into at least two specified 10 units. The second embodiment is a concrete embodiment to solve the second problem.

In the second embodiment, it is assumed that a single page contains 256 bits and that memory cell array 1A is divided into two units of 128 bits, 1A1 and 1A2, and memory cell 1B is divided into two units of 128 bits, 1B1 and 1B2. Like memory cell arrays 1A, 1B, a sense amplifier circuit 2 serving as latching means for effecting data programming and reading, is divided into at least two specific units. In FIG. 26, the sense amplifier circuit is divided into two, 2A and 2B. A row decoder 3 selects word lines. A column decoder 4 selects bit lines. In addition, an address buffer 5, an I/O sense amplifier 6, a data input/output buffer 7, and a substrate potential control circuit 8 are provided.

The memory cell arrays 1A1, 1B1, 1A2, 1B2 are shown in FIGS. 27A to 27D, respectively. The threshold voltages of the select MOS transistors of the memory cell arrays in FIGS. 27A to 27D have two values as in the first embodiment. It is assumed that the threshold voltages of the select MOS transistors marked with the E-type are 2 V, and the threshold voltages of the select MOS transistors marked with the I-type are 0.5 V. Therefore, to turn on both of the E-type select MOS transistors and the I-type select MOS transistors, Vcc (e.g., 3 V) is applied to the select gates. To turn on only the I-type select MOS transistors, 1.5 V is applied to the select gates.

When the data in memory cell array 1A1 is read onto bit lines $BL_{0A}$ to $BL_{127A}$, the drain-side select igate SGD is placed at 3 V and the source-side select gate SGS is place at 1.5 V. When the data in memory cell array 1A2 is read onto bit lines $BL_{128A}$ to $BL_{225A}$, the drain-side select gate SGD is placed at 1.5 V and the source-side select gate SGS is place at 3 V. When the data in memory cell arrays 1A1 and 1A2 is read simultaneously, both SGS and SGD are placed on 3 V.

The sense amplifier is a differential sense amplifier. Sense amplifier 2A (SA1) connected to memory cell arrays 1A1, 1B1 is shown in FIG. 28A, and sense amplifier 2B (SA2) connected to memory cell arrays 1A2, 1B2 is shown in FIG. 28B.

Using the timing charts in FIGS. 29A and 29B, the read operation in the second embodiment will be explained, taking an example of reading the data programmed on two pages.

First, on a first page, sense amplifier 2A (SA1) and sense amplifier 2B (SA2) operate at the same time. Control signals TG1, TG2 drop from 3 V to 0 V, disconnecting CMOS flip-flops FF1, FF2 from bit lines $BL_{jA}$, $BL_{jB}$ (j=0, 1, . . . , 255).

Then, precharge signals $\phi_{pA1}$, $\phi_{pB1}$, $\phi_{pA2}$, $\phi_{pB2}$ rise from 0 V to 3 V, precharging bit line $BL_{jA}$ (j=0, 1, . . . , 255) to, for example, 1.7 V, and bit line $BL_{jB}$ (j=0, 1, . . . , 255) to, for example, 1.5 V. After the precharging has been completed, precharge signals $\phi_{pA1}$, $\phi_{pB1}$, $\phi_{pA2}$, $\phi_{pB2}$ drop to 0 V, bringing bit lines $BL_{jA}$, $BL_{jB}$ (j=0, 1, . . . , 255) into the floating state. Thereafter, row decoder 3 applies specified voltages to the control gates and select gates.

Figure 27B:
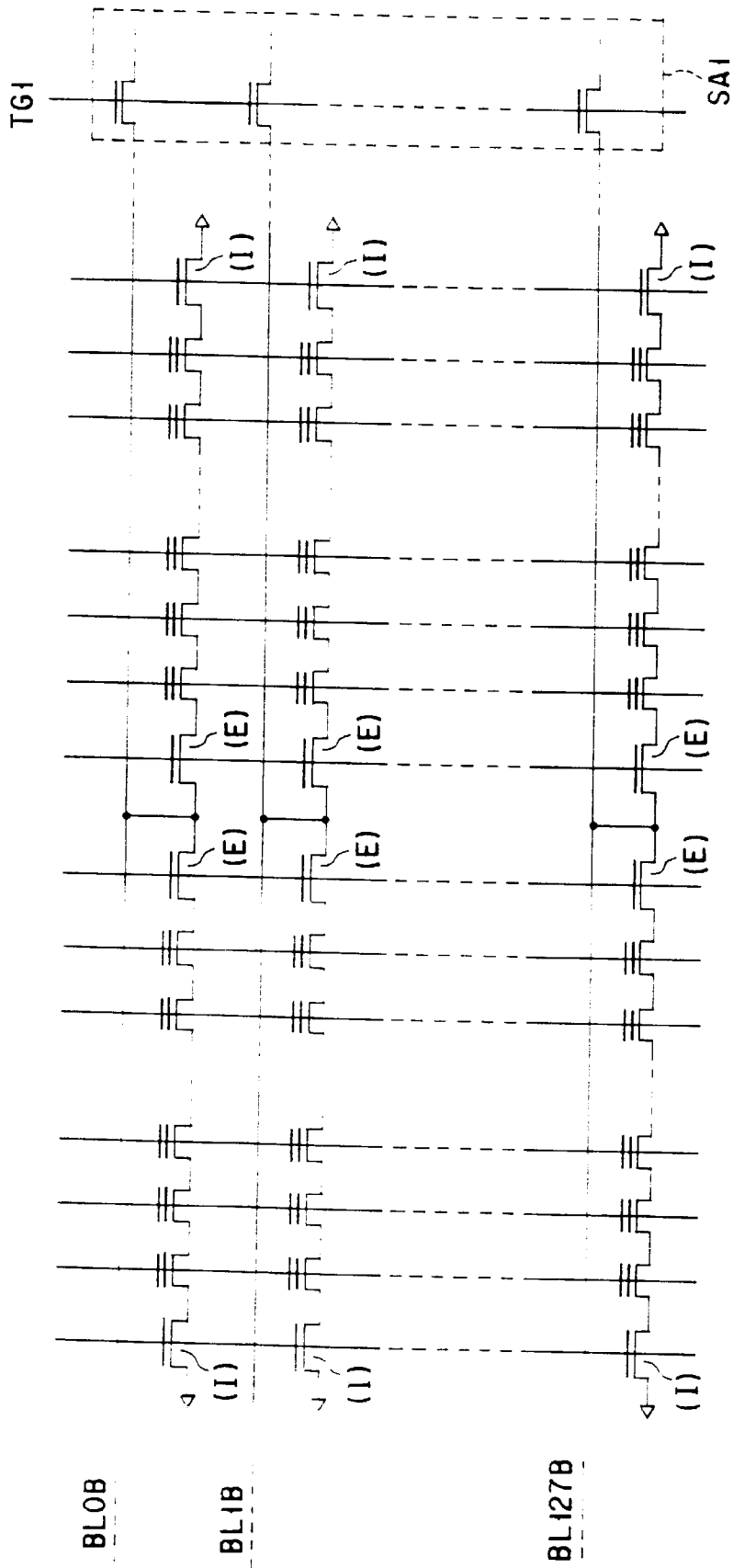
Figure 27C:
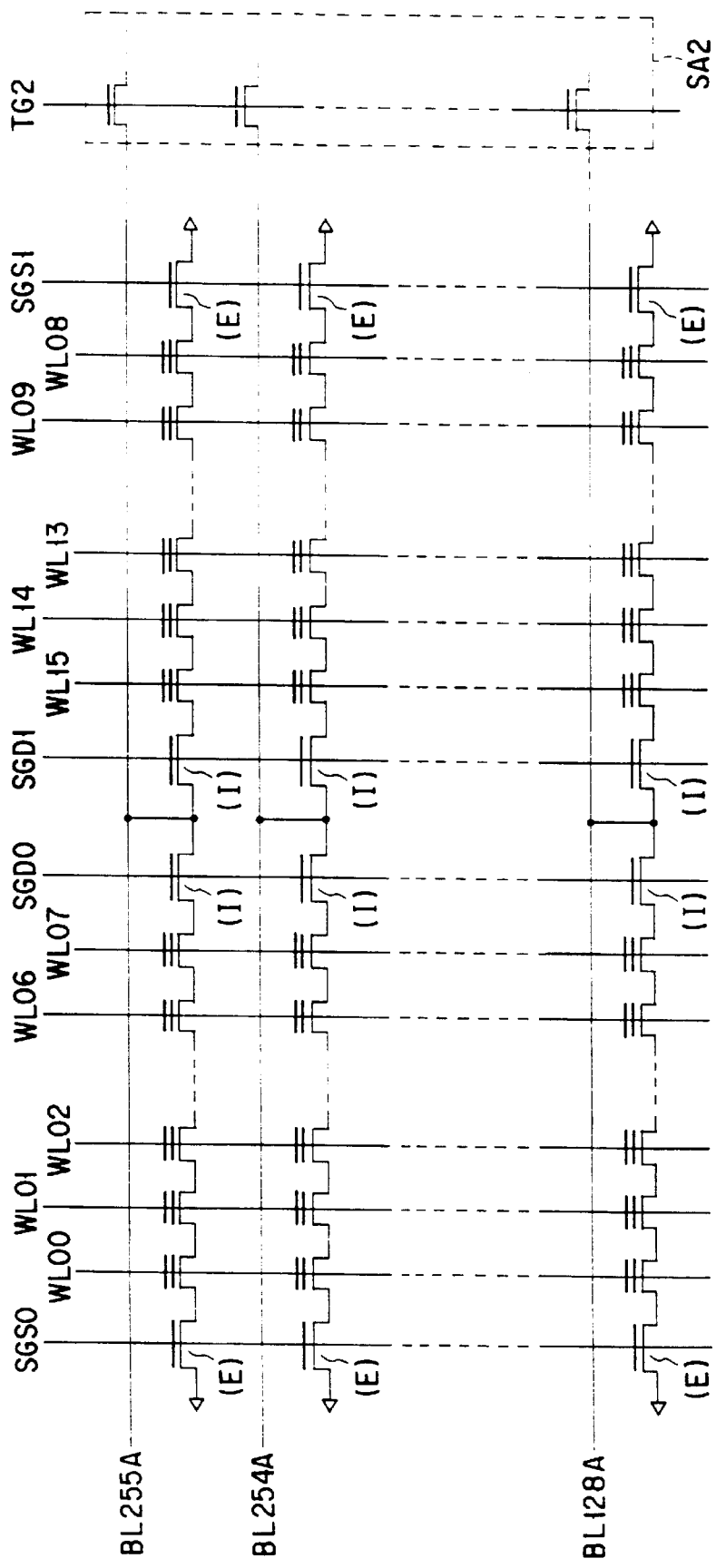

In FIGS. 27A and 27B, $WL_{00}$ is at 0 V, $WL_{01}$ to $WL_{07}$ are at 3 V, $SGD_0$ is at 3 V, and $SGS_0$ is at 3 V. When the data programmed into the memory cell selected by word line $WL_{00}$ is "0", the threshold voltage of the memory cell will be positive, so that no current will flow and the potential of bit line $BL_{jA}$ will remain at 1.7 V. When the data is "1", a cell current will flow, causing the potential of bit line $BL_{jA}$ to drop to 1.5 V or below. Furthermore, bit line $BL_{jB}$ will not discharge and remain at a precharge potential of 1.5 V.

Thereafter, control signals $SAP_1$, SAP2 go to 3 V, and $SAN_1$, $SAN_2$ go to 0 V, deactivating CMOS flip-flops FF1, FF2. When $\phi_{E1}$, $\phi_{E2}$ go to 3 V, resetting CMOS flip-flops FF1, FF2. Then, after $TG_1$, $TG_2$ have gone to 3 V, connecting the bit lines to the sense amplifier, $SAN_1$, $SAN_2$ drop from 3 V to 0 V, amplifying the potential difference between bit lines $BL_{jA}$ and $BL_{jB}$ (j=0, 1, . . . , 255):. Thereafter, $SAP_1$, $SAN_2$ rise from 0 V to 3 V, latching the data. Then, column select signals CSLj (j=0, 1, . . . , 255) are selected one after another, thereby allowing the data latched in CMOS flip-flop to be outputted to I/O, I/O' (page reading).

During the time from when the data on the first half of the first page (column addresses 0 to 127) has undergone page reading until the second half of the first page undergoes page reading, the data for the first half of the row addresses on the second page (the data in the memory cells coupled to bit lines $BL_{jA}$ (J=0, 1, . . . , 127, . . . ) undergoes random reading. This is done by sensing that the column address is 128, for example.

First, precharge signals $\phi_{pA1}$, $\phi_{pB1}$, $\phi_{pA2}$, $\phi_{pB2}$ rise from 0 V to 3 V, precharging bit line $BL_{jA}$ (j=0, 1, . . . , 127) to 1.7 V, and bit line $BL_{jB}$ (j=0, 1, . . . , 127) to 1.5 V. After the precharging has been completed, precharge signals $\phi_{pA1}$, $\phi_{pB1}$, $\phi_{pA2}$, $\phi_{pB2}$ drop to 0 V, bringing bit lines $BL_{jA}$, $BL_{jB}$ (j=0, 1, . . . , 127) into the floating state. Thereafter, row decoder 3 applies specified voltages to the control gates and select gates. $WL_{01}$ is at 0 V, $WL_{00}$ and $WL_{02}$ to $WL_{07}$ are at 3 V, $SGD_0$ is at 3 V, and $SGS_0$ is at 1.5 V.

When the data programmed into the memory cell selected by word line $WL_{01}$ is "0", the threshold voltage of the memory cell will be positive, so that no current will flow and the potential of bit lines $BL_{jA}$ (j=0, 1, . . . , 127) will remain at 1.7 V. When the data is "1", a cell current will flow, causing the potential of bit lines $BL_{jA}$ (j=0, 1, . . ., 127) to drop to 1.5 V or below. Furthermore, bit lines $BL_{jB}$ (j=0, 1, . . . , 127) will not discharge and remain at a precharge potential of 1.5 V.

Thereafter, $SAP_1$ goes to 3 V and $SAN_1$ goes to 0 V, deactivating CMOS flip-flop FF1. When $\phi_{E1}$ goes to 3 V, equalizing CMOS flip-flop FF1. Then, after $TG_1$ has gone to 3 V, connecting the bit lines to the sense amplifier, $SAN_1$ drops from 3 V to 0 V, amplifying the potential difference between bit lines $BL_{jA}$ and $BL_{jB}$ (j=0, 1, . . . , 127). Thereafter, $SAP_1$, $SAN_2$ rise from 0 V to 3 V, latching the data in sense amplifier 2A (SA1).

When page reading of the first page has been effected as far as 256 column addresses, the data for 128 column addresses on the second page has already been latched in sense amplifier 2A (SA1), so that random reading need not be carried out. While page reading from sense amplifier 2A ($SA_1$) is being effected as far as column addresses 0 to 127 on the second page, random reading of column addresses 128 to 255 on the second half of the second page is performed. Namely, row decoder 3 applies specified voltages to the control gates and the select gates. $WL_{01}$ is at 0 V, $WL_{00}$ and $WL_{02}$ to $WL_{07}$ are at 3 V, $SGD_0$ is at 1.5 V, and $SGS_0$ is at 3 V.

When the data programmed into the memory cell selected by word line $WL_{01}$ is "0", the threshold voltage of the memory cell will be positive, so that no current will flow and the potential of bit lines $BL_{jA}$ will remain at 1.7 V. When the data is "1", a cell current will flow, causing the potential of bit lines $BL_{jA}$ (j=128, 129, . . . , 255) to drop to 1.5 V or below.

Furthermore, bit lines $BL_{jB}$ (j=128, 129, . . . , 255) will not discharge and remain at a precharge potential of 1.5 V. Then, $SAP_1$ goes to 3 V and $SAN_2$ goes to 0 V, deactivating CMOS flip-flop FF2. When $\phi_{E2}$ goes to 3 V, resetting CMOS flip-flop FF2. Then, after $TG_2$ has gone to 3 V, connecting the bit lines to the sense amplifier, $SAN_2$ rises from 0 V to 3 V, amplifying the potential difference between bit lines $BL_{jA}$ and $BL_{jB}$ (j=128, 129, . . . , 255). Thereafter, $SAP_2$ drops from 3 V to 0 V, latching the data in sense amplifier 2B (SA2).

When page reading of the second page has been effected as far as 128 column addresses, the data for 128 column addresses on the second half of the second page has already been latched in sense amplifier 2B (SA2), so that random reading need not be carried out and the data for 128 column addresses on the second half of the second page can be read serially.

The present invention is not limited to the second embodiment. While in the second embodiment, the memory cell array is divided into two, it may be divided into, for example, four subarrays, or a given number of subarrays.

Figure 29B:
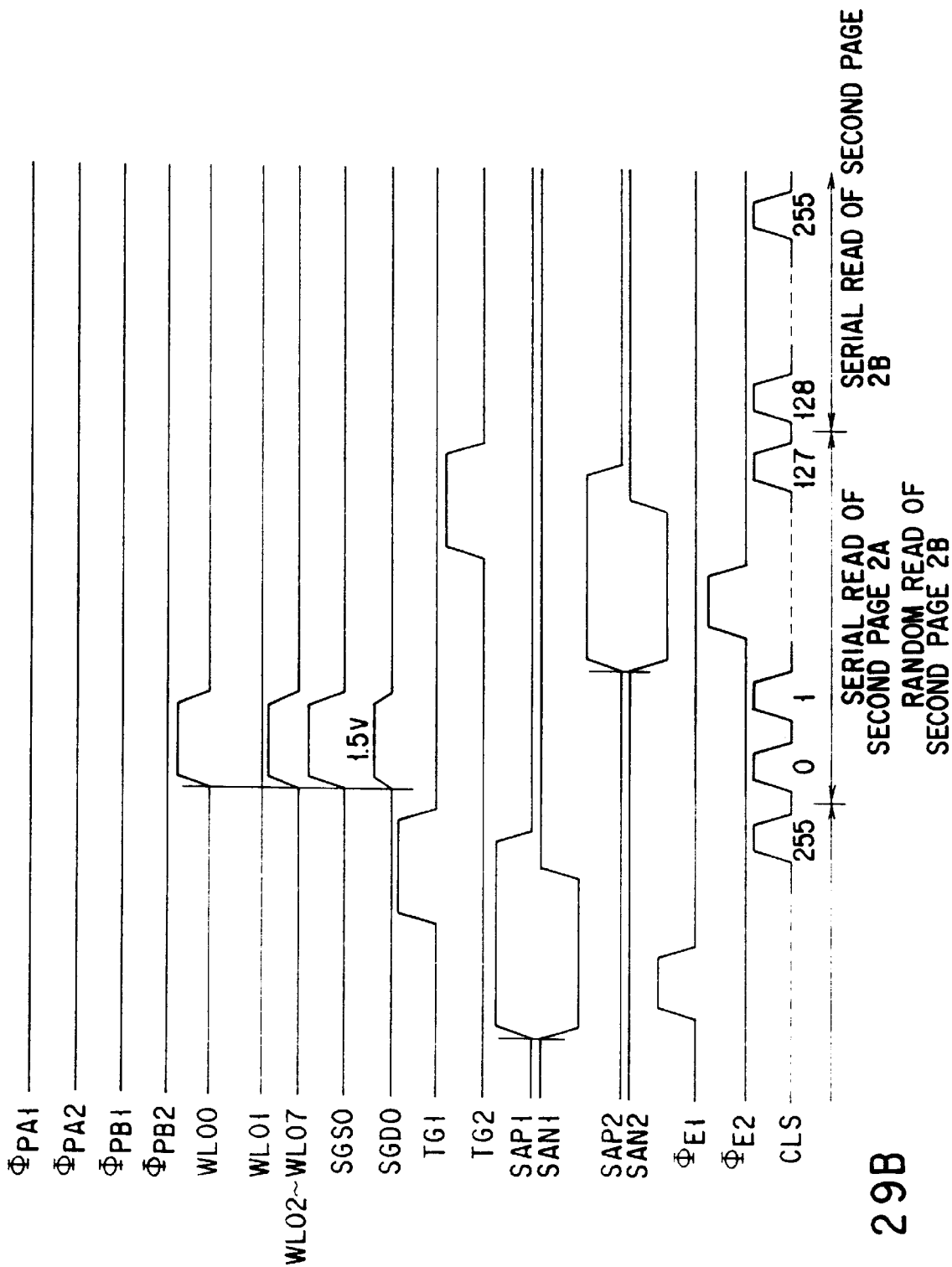

The timing charts of FIGS. 29A and 29B are just illustrative and not restrictive. The random reading of the data on the first page is effected simultaneously at sense amplifier 2A ($SA_1$) and sense amplifier 2B ($SA_2$) according to the timing charts of FIGS. 29A and 29B. As shown in the timing charts of FIGS. 30A and 30B, the memory cells corresponding to the column addresses on the first half of the first page may undergo random reading and then, while the page reading of the data for the first half of the first page is being effected, the data for the second half of the first page may undergo random reading.

Figure 30A:
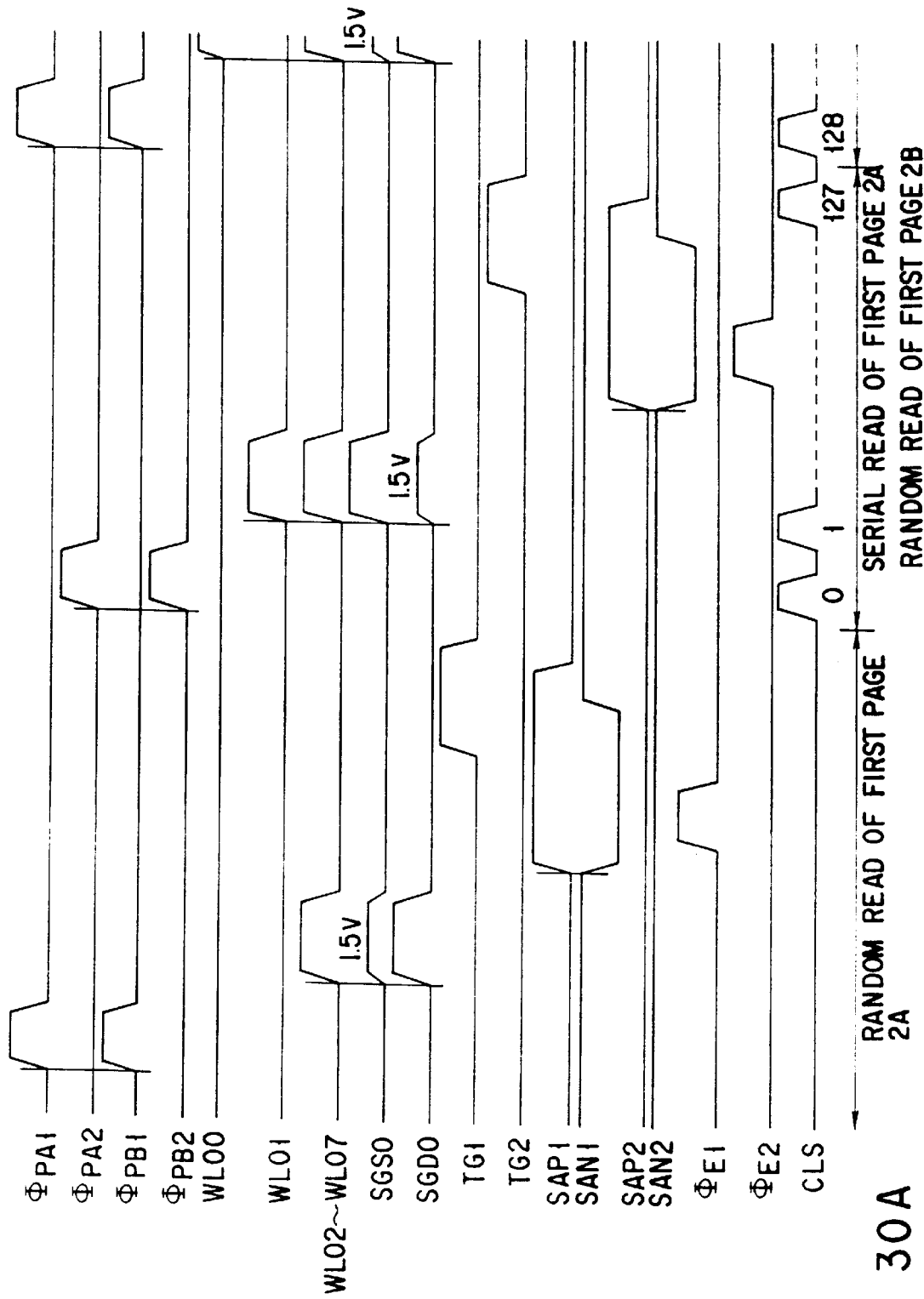
FIGS. 30A and 30B are timing charts to help explain the data read operation in the second embodiment.
Figure 30B:
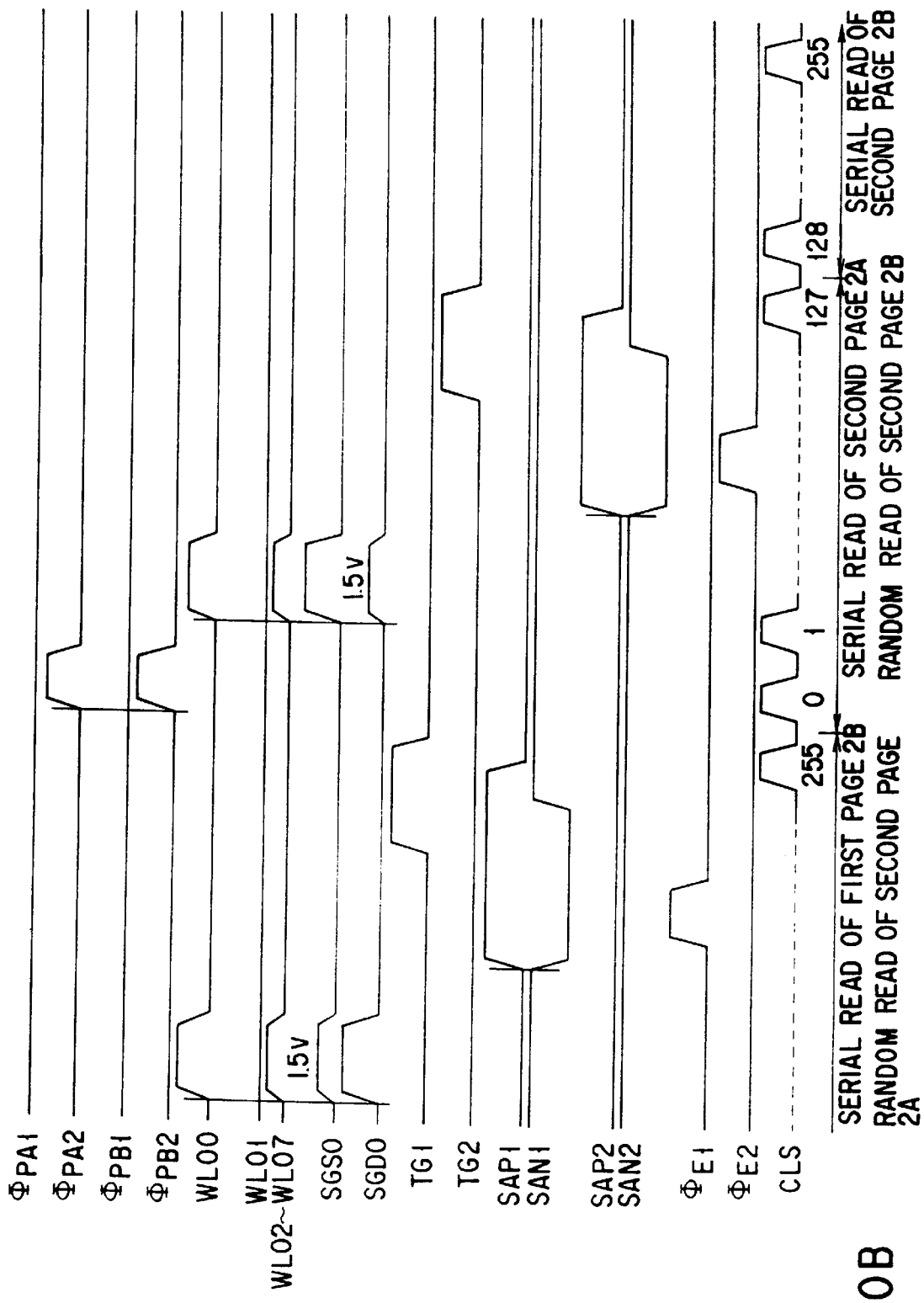

Furthermore, while in FIGS. 29A and 29B, the precharging of bit lines is effected at the same time in the random reading of the first half of the second page and the random reading of the second half of the second page, the timing for the precharging of bit lines may be varied between the random reading at sense amplifier 2A ($SA_1$) and the random reading at sense amplifier 2B ($SA_2$) as shown in FIGS. 30A and 30B.

Figure 31A:
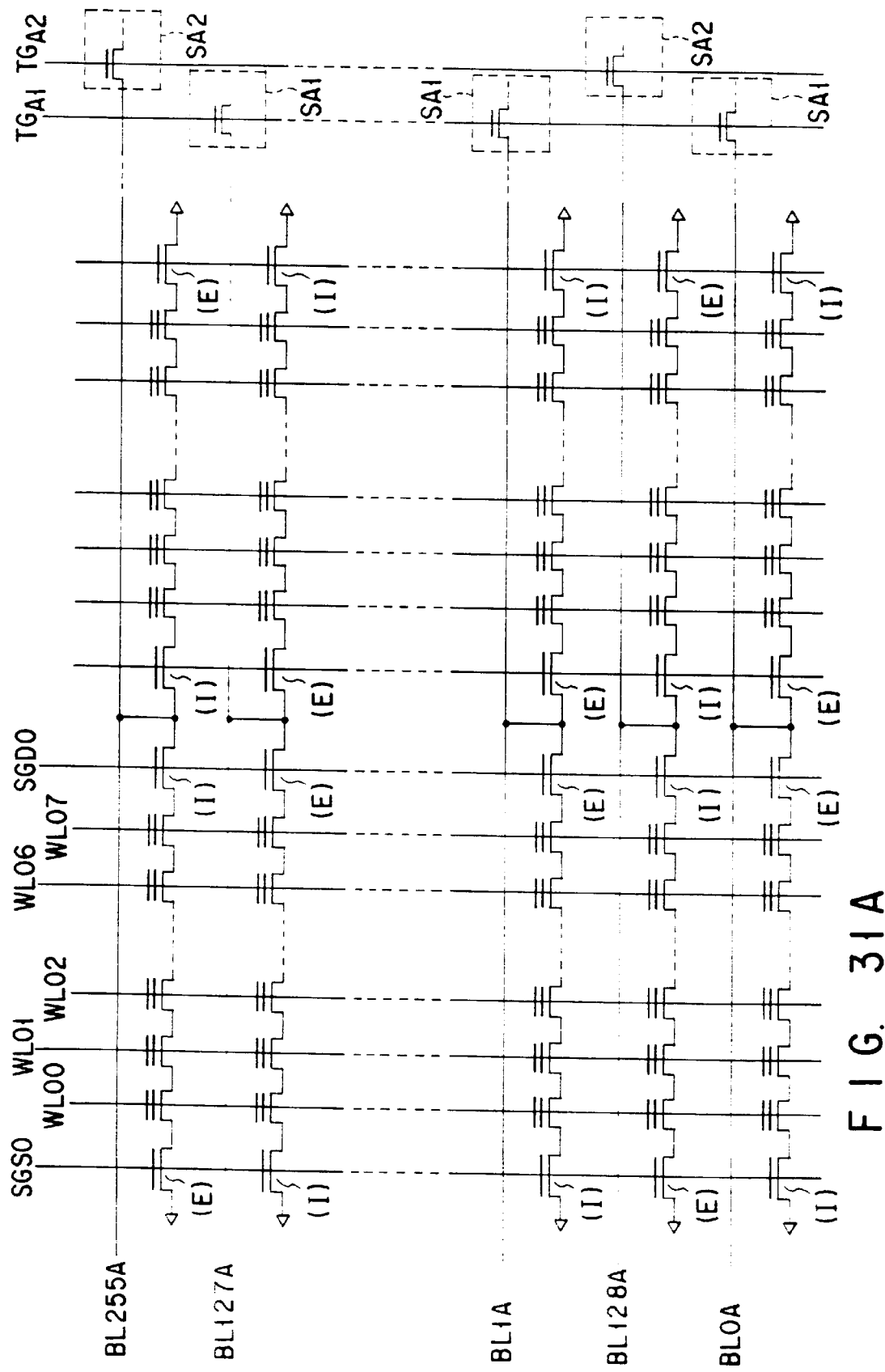
FIGS. 31A and 31B show memory cell array structures in the second embodiment.
Figure 31B:
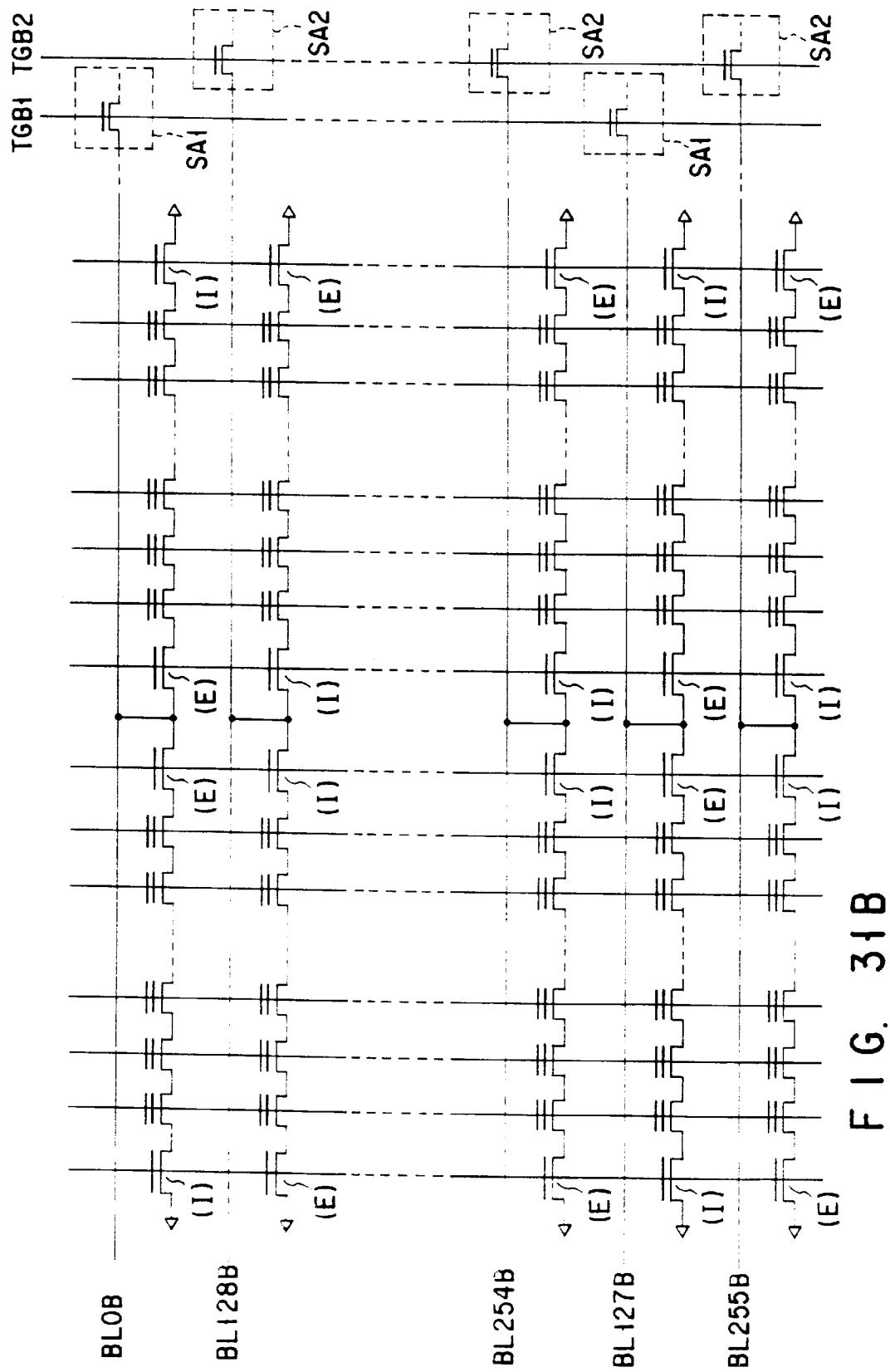

Furthermore, the memory cell array may not be divided into physically consecutive division units. For example, as shown in FIGS. 31A and 31B, the bit lines connected to sense amplifier $SA_1$ and the bit lines connected to sense amplifier $SA_2$ are arranged alternately. While the random reading of the bit lines connected to sense amplifier $SA_1$ is being effected, the bit lines connected to sense amplifier $SA_2$ can be grounded to 0 V. In this case, since the distance between bit lines connected to sense amplifier $SA_1$ is twice that in FIGS. 27A to 27D, noise attributable to the capacitive coupling between bit lines can be reduced in random reading.

Figure 4:
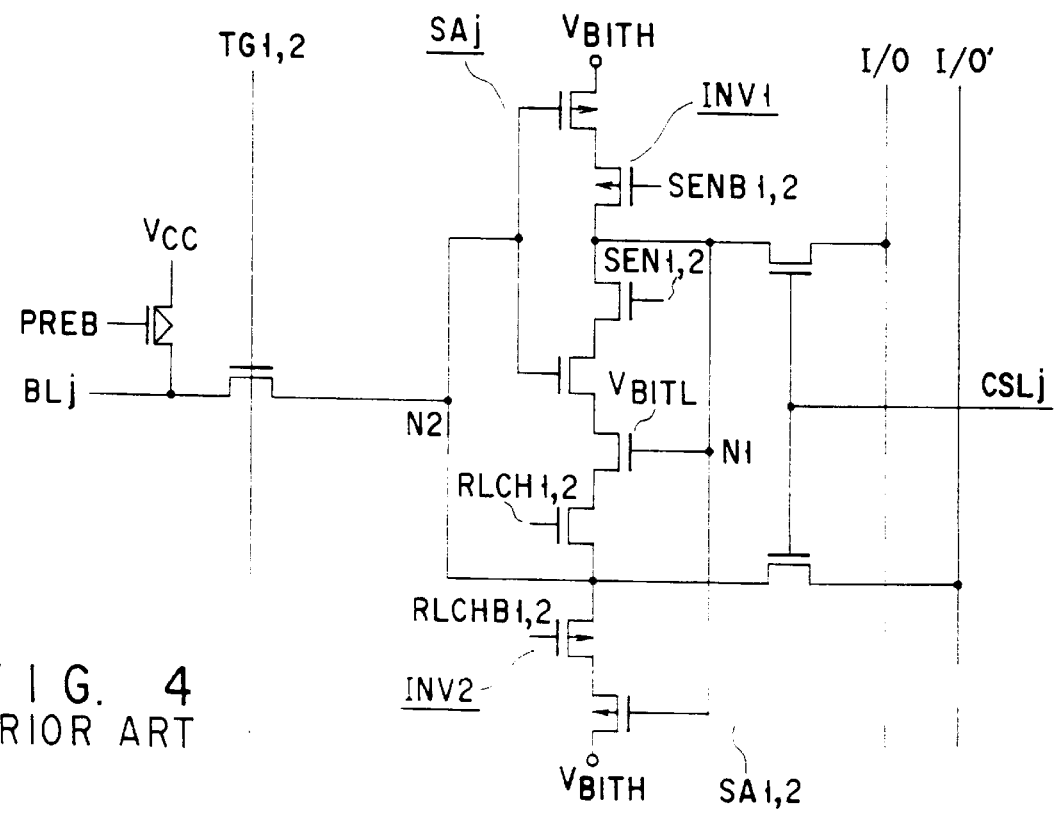
FIG. 4 is a circuit diagram of an inverter-type sense amplifier circuit.

The present invention is not restricted to memory cell arrays with open bit lines. For example, the invention may be applied to a single-end memory cell arrangement as shown in FIG. 32, which has an inverter-type sense amplifier as shown in FIG. 4. The memory cell array connected to bit lines BLj (j=0, 1, . . . , 255) in FIG. 32 may be the memory cell array connected to bit line $BL_{jA}$ (j=0, 1, . . . , 255) of FIG. 31A.

FIG. 33 shows an overall configuration of a NAND-cell EEPROM according to a third embodiment of the present invention. The third embodiment is a concrete embodiment to solve the third problem.

In a conventional memory cell array, when row decoder 3 select a word line in a read or a program operation, the memory cells located at the intersections where the selected word line crosses the bit lines are all selected. Therefore, it is impossible to make one of the memory cells connected to adjacent bit lines selected and the other unselected.

As described in the first and second embodiments, with the present invention, by changing the threshold voltages of the source-side select MOS transistor and the drain-side select MOS transistor in the NAND block and by changing the voltage applied to the source-side select gate and the drain-side select gate, it is possible to select one of the adjacent bit lines and not select the other bit line. As a result, by eliminating the precharging of bit lines in a read and a program operation, the precharging time can be shortened, leading to a reduction in the power consumption.

The third embodiment is an embodiment that shortens the precharging time in a read operation and reduces the power consumption. An example of shortening the precharging time in a program operation and reducing the power consumption will be explained in a fourth embodiment of the present invention.

A NAND-cell EEPROM of the third embodiment has a memory cell array 1 serving as memory means. The memory cell array is of the open bit line system and divided into two, memory cell arrays 1A and 1B. In this embodiment, a page is assumed to contain 256 bits. The device of the third embodiment comprises a sense amplifier circuit 2 serving as latching means for programming and reading data, a row decoder 3 for selecting word lines, a column decoder 4 for selecting bit lines, an address buffer 5, an I/O sense amplifier 6, a data input/output buffer 7, and a substrate potential control circuit 8.

Figure 34A:
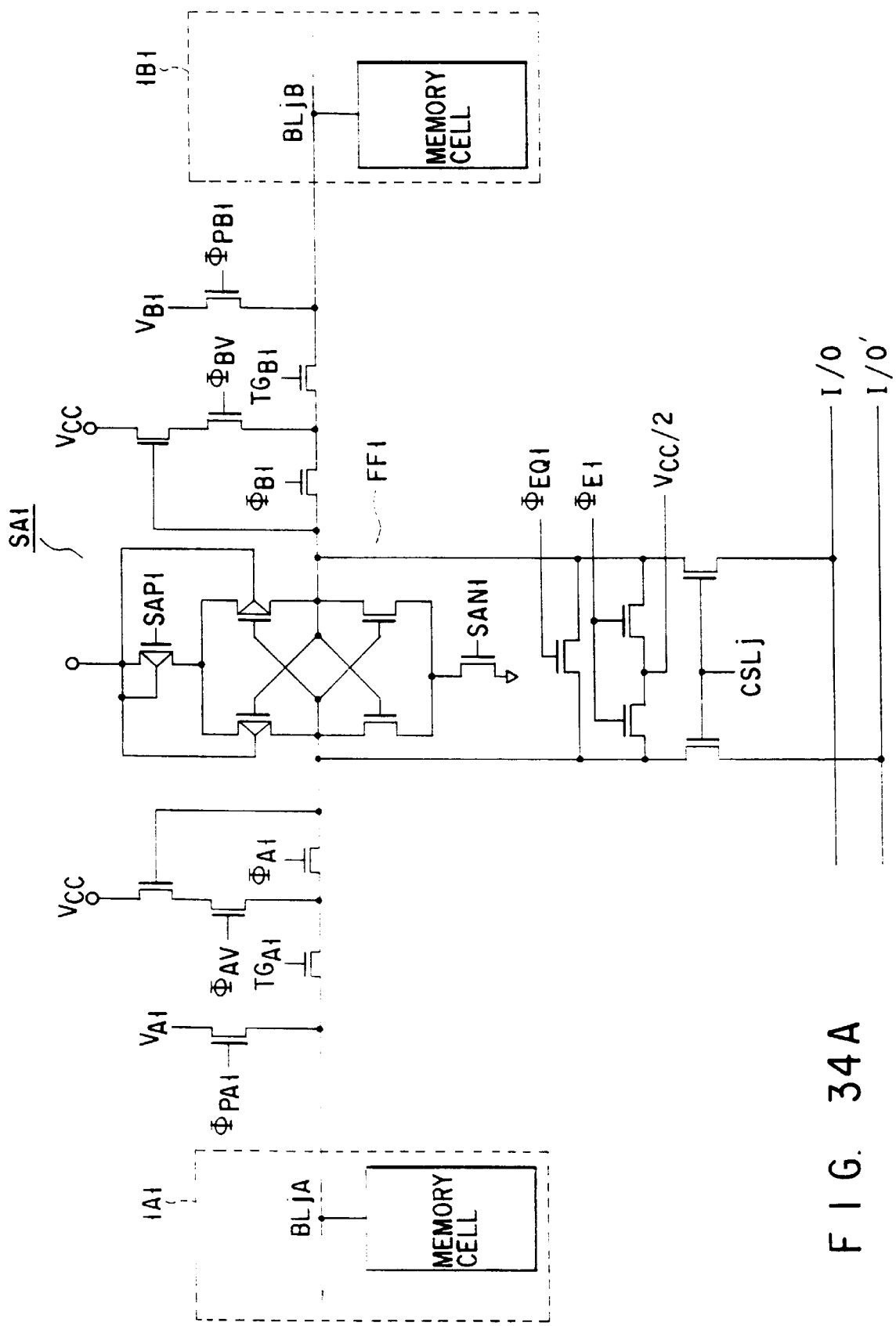

The memory cell array 1A is the same as that of FIG. 31A, and the memory cell array 1B is the same as that of FIG. 31B, except that sense amplifier $SA_1$ connected to bit lines $BL_{jA}$, $BL_{jB}$ (j=0, 1, . . . , 127) of FIG. 31A provided on memory cell arrays 1A, 1B is that of FIG. 34A, not that of FIG. 28A, and similarly except that sense amplifier $SA_2$ connected to bit lines $BL_{jA}$, $BL_{jB}$ (j=128, 129, . . . , 255) of FIG. 31B provided on memory cell arrays 1A, 1B is that of FIG. 34B, not that of FIG. 28B. The sense amplifiers SA1, SA2 of FIGS. 34A and 34B are such that transistors for equalizing the potentials of lines $BL_{jA}$ and $BL_{jB}$ using control signals $\phi_{EQ1}$, $\phi_{EQ2}$ are added to the sense amplifiers SA1, SA2 of FIGS. 28A, 28B, respectively.

To reduce noise attributable to the capacitive coupling between bit lines in a read operation, every other bit line is kept at a reference potential (bit line shield). In this case, writing is effected on the cells coupled to, for example, bit lines $BL_{jA}$ (j=0, 1, . . . , 127), and then on the cells connected to bit lines $BL_{jA}$ (j=128, 129, . . . , 255). This embodiment will be explained using an example of reading the data (the data for the first page) programmed onto bit lines $BL_{jA}$ (j=0, 1, . . . , 127) and then the data (the data for the second page) programmed onto bit lines $BL_{jA}$ (j=128, 129, . . . , 255).

Figure 35:
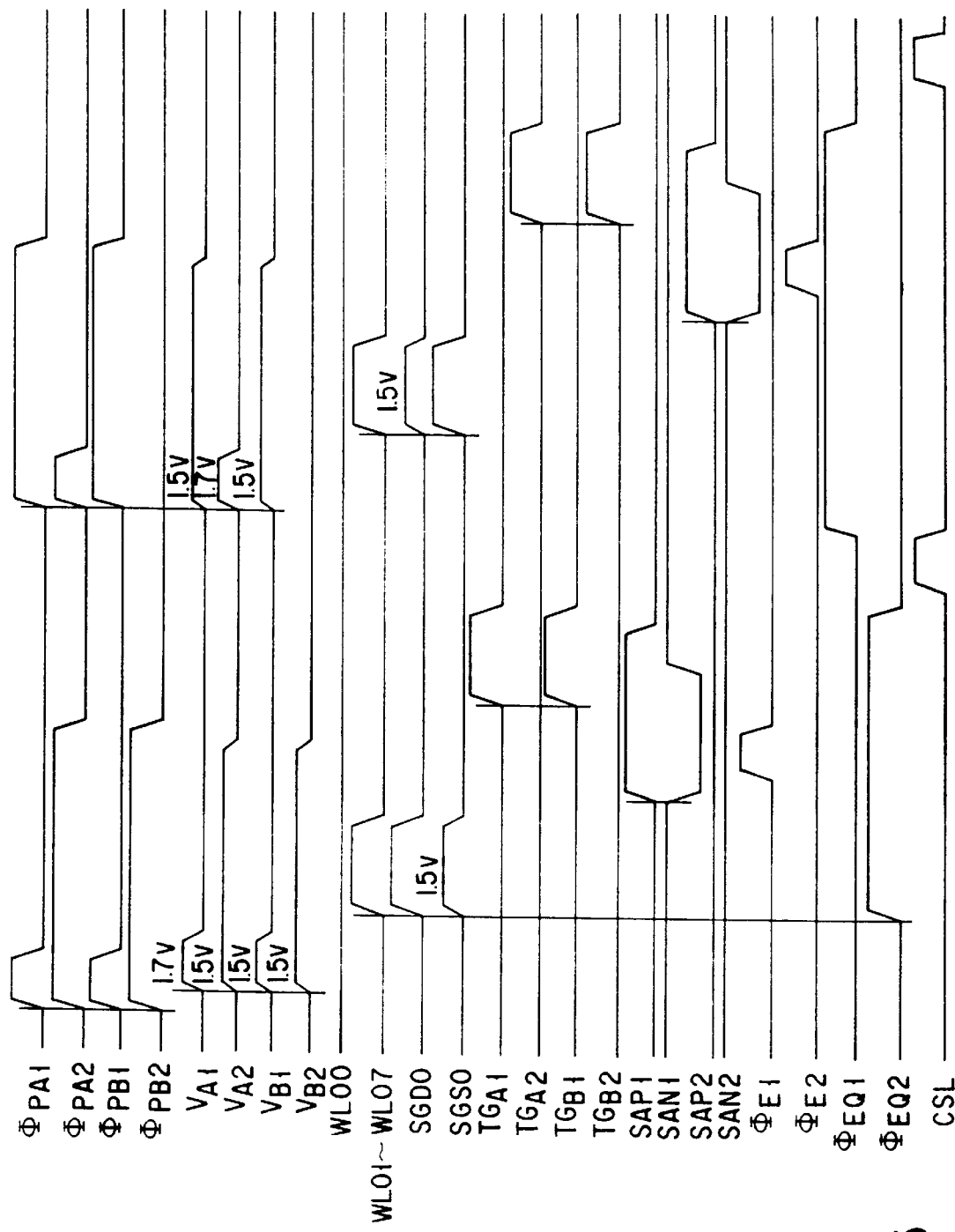
FIG. 35 is a timing chart to help explain the data read operation in the second embodiment.

When the data on bit lines $BL_{jA}$ (J=0, 1, . . . , 127) is read out, the bit lines $BL_{jA}$ (j=128, 129, . . . , 255) to be shielded are kept at a reference potential (e.g., 1.5 V). In a conventional memory cell array, since adjacent bit lines are selected at the same time and discharge, the bit lines to be shielded can be kept at only 0 V. Hereinafter, using the timing chart of FIG. 35, explanation will be given as to the case where the data for the first page is read onto the bit lines and the data read onto the bit lines are sensed at the sense amplifier and the case where the data for the second page is read onto the bit lines.

<When the data for the first page is read onto the bit lines>

In the memory cell array of FIG. 31A, when a memory cell selected by word line $WL_{00}$ and to be connected to bit line $BL_{jA}$ (j=0, 1, . . . , 127) is read from, bit lines $BL_{jA}$ (j=0, 1, . . . , 127) are precharged to 1.7 VI bit line $BL_{jB}$ (j=128, 129, . . . , 255) to 1.5 V, and bit line $BL_{jA}$, $BL_{jB}$ (j=128, 129, . . . , 255) to be shielded to a reference potential (e.g., 1.5 V).

After the precharging of the bit lines has been completed, control gate $WL_{00}$ is placed at 0 V, $WL_{01}$ to $WL_{07}$ are place at 3 V, select gate $SGS_0$ at 1.5 V, and $SGD_0$ is placed at 3 V. In this case, the source-side select MOS transistors of bit lines $BL_{jA}$ (j=0, 1, . . . , 127) turn on, whereas the source-side select MOS transistors of bit lines $BL_{jA}$ (j=128, 129, . . . , 255) turn off. Therefore, although bit lines $BL_{jA}$ (j=0, 1, . . . , 127) will discharge when the data in the memory cell selected by word line $WL_{00}$ is "1", bit lines $BL_{jA}$ (J=128, 129, . . . , 255) will not discharge.

The discharging of bit lines $BL_{jA}$ (j=0, 1, . . . , 127) causes the potential of bit lines $BL_{jA}$ (j=128, 129, . . . , 255) to drop from the reference potential due to the capacitive coupling between bit lines. If bit lines $BL_{jA}$, $BL_{jB}$ (j=128, 129, . . . , 255) is kept precharged at 1.5 V by placing, for example, terminals $V_{A2}$, $V_{B2}$ at the reference voltage of 1.5 V and control signals $\phi_{PA2}$, $\phi_{PB2}$ at 3 V, while bit lines $BL_{jA}$ (j=0, 1, . . . , 127) are discharging, the bit lines $BL_{jA}$, $BL_{jB}$ (j=128, 129, . . . , 255) to be shielded can be kept at the reference potential.

After the cell data has been read onto bit lines $BL_{jA}$ (j=0, 1, . . . , 127), control signals $\phi_{PA2}$, $\phi_{PB2}$ go to 0 V, bringing bit lines $BL_{jB}$ (J=0, 1, . . . , 127) and bit lines $BL_{jA}$, $BL_{jB}$ (j=128, 129, . . . , 255) into the floating state.

When the cell data is read onto the bit lines, the potentials of bit lines $BL_{jA}$, $BL_{jB}$ (j=128, 129, . . . , 255) may be equalized by placing control signal $\phi_{EQ2}$ at 3 V. The bit lines $BL_{jA}$ and $BL_{jB}$ (j=128, 129, . . . , 255) to be shielded may be precharged separately to the reference voltage of 1.5 V, without connecting the former to the latter. <When the Data for the First Page Read onto the Bit Lines are Amplified and Sensed>

After the potential of bit lines $BL_{jA}$ (j=0, 1, . . . , 127) has been determined reflecting the data in the memory cell selected by word line $WL_{00}$, the potential of the bit line is sensed in a differential manner as described in the second embodiment. At this time, the bit lines $BL_{jA}$ and $BL_{jB}$ (j=128, 129, ..., 255) to be shielded are in the floating state and equalized to the same potential (1.5 V) by keeping control signal $\phi_{EQ2}$ at 3 V. By sensing in a differential manner, bit lines $BL_{jA}$ are at 3 V and bit lines $BL_{jB}$ (j=0, 1, ..., 127) are at 0 V when the cell data read onto bit lines $BL_{jA}$ (j=0, 1, ..., 127) is "0".

Figure 36A:
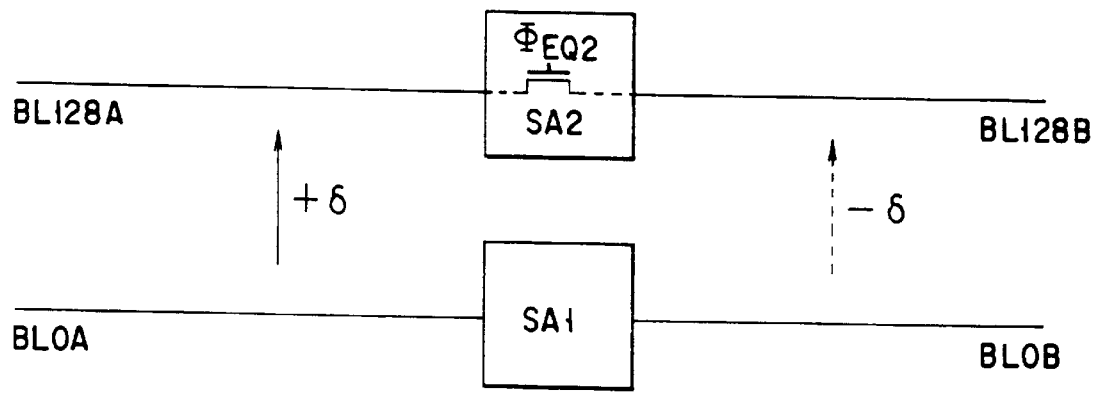
FIGS. 36A and 36B show the effect of noise on adjacent bit lines through the capacitive coupling between bit lines in amplifying the bit-line potential.

Therefore, as shown in FIG. 36A, the potential of bit lines $BL_{jA}$ (j=128, 129, ..., 255) to be shielded is raised from the reference potential by δ due to the capacitive coupling with bit lines $BL_{jA}$ (j=0, 1, ..., 127). On the other hand, the potential of bit lines $BL_{jB}$ (j=128, 129, ..., 255) to be shielded is dropped from the reference potential by −δ due to the capacitive coupling with bit lines $BL_{jB}$ (J=0, 1, ..., 127). Since the potentials of bit lines $BL_{jA}$ and $BL_{jB}$ (j=128, 129, ..., 255) to be shielded have been equalized, however, noise δ due to the bit-line capacitive coupling interfering with bit line $BL_{jA}$ cancels noise −δ due to the bit-line capacitive coupling interfering with bit line $BL_{jB}$, with the result that bit lines $BL_{jA}$ and $BL_{jB}$ (j=128, 129, ..., 255) to be shielded are kept at the reference voltage of 1.5 V.

Figure 36B:
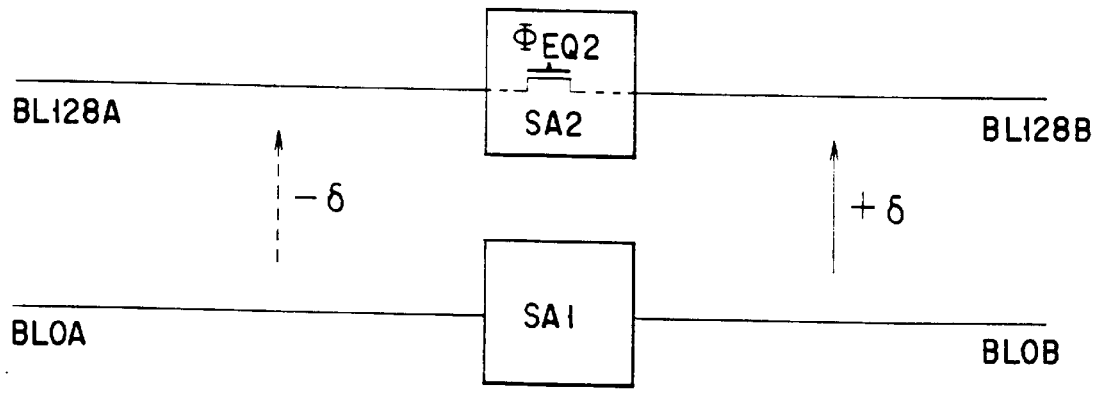

When the data read onto bit lines $BL_{jA}$ (j=0, 1, kept at the reference potential by coupling bit lines $BL_{jA}$ (j=0, 1, ..., 127) to $BL_{jB}$ (j=0, 1, ..., 127) as shown in FIG. 36B in the same manner.

<Reading the Data for the Second Page>

As explained above, after the data in the memory cells connected to bit lines $BL_{jA}$ (j=0, 1, ..., 127) has been read, bit lines $BL_{jA}$ and $BL_{jB}$ (j=128, 129, the first read bit line $BL_{jA}$ (j=0, 1, ..., 127) and bit line $BL_{jB}$ (j=0, 1, ..., 127), one is at 0 V and the other is at 3 V after the sense operation. Therefore, when the data connected to bit line $BL_{jA}$ (j=128, 129, ..., 255) is read out, bit lines $BL_{jA}$ and $BL_{jB}$ (j=0, 1, ..., 127) to be shielded can be placed at the reference voltage of 1.5 V without precharging, by placing $\phi_{EQ1}$ at 3 V (or $\phi_{E1}$ at 3 V).

Therefore, when the data in the memory cell connected to bit line $BL_{jA}$ (J=128, 129, ..., 255) is read out after a page of data in the memory cells connected to bit lines $BL_{jA}$ (J=0, 1, ..., 127) has been read out, a second precharging can be achieved by just raising the potential of bit line $BL_{jA}$ (j=128, 129, ..., 255) from 1.5 V to 1.7 V.

When reading is done using bit line shielding as described above, use of a memory cell array and sense amplifier of the invention enables the bit lines to be shielded to be set at a reference potential other than 0 V. As a result, when the data extending over several pages is read out, the precharging of bit lines can be shortened, making the reading speed faster and reducing the power consumption.

While in the third embodiment, the potentials of bit lines $BL_{jA}$ and $BL_{jB}$ are equalized using control signals $\phi_{EQ1}$, $\phi_{EQ2}$ they may be equalized using control signals $\phi_{E1}$, $\phi_{E2}$. In FIGS. 34A and 34B, the nodes connected to the sources and drains of the two transistors selected by control signal $\phi_{E1}$ ($\phi_{E2}$) are fixed at a potential of Vcc/2 (e.g., 1.5 V). When the cell data is read onto the bit lines, the conditions of FIGS. 34A and 34B hold true. When the bit line is sensed, the terminal connected to the node must be brought in the floating state because the bit line to be shielded is to be placed in the floating state.

Although in the third embodiment, the data in the memory cell connected to bit line $BL_{jA}$ (j=128, 129, line $BL_{jA}$ (J=0, 1, ..., 127) has been read out, the bit lines to be read from are arbitrary. As long as the bit line connected to sense amplifier SA2 is read from after the bit line connected to sense amplifier SA1 has been read from, any bit lines may be read from. Furthermore, the bit line connected to sense amplifier SA1 may be read from after the bit line connected to sense amplifier SA2 has been read from.

Figure 37A:
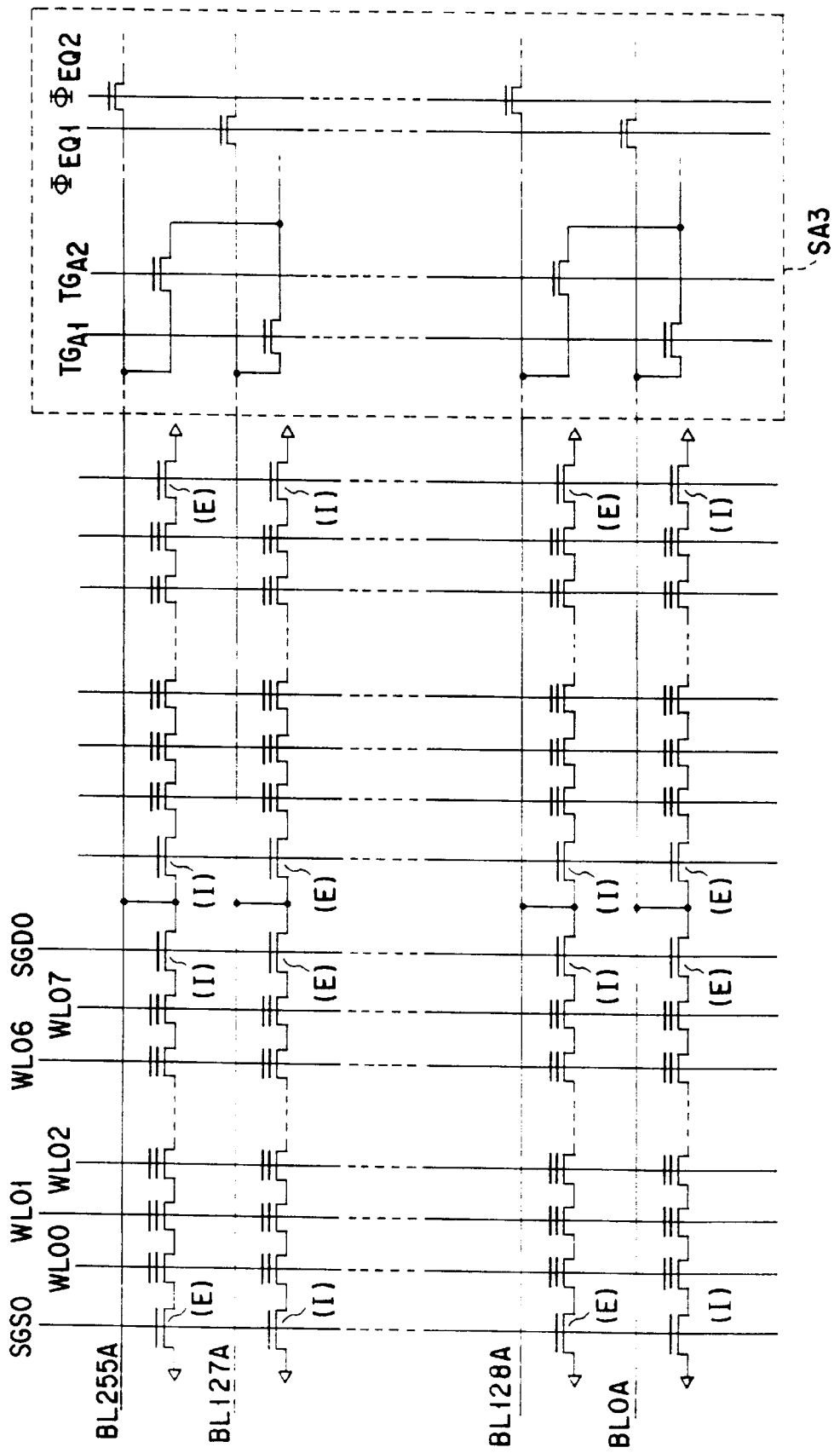
Figure 38:
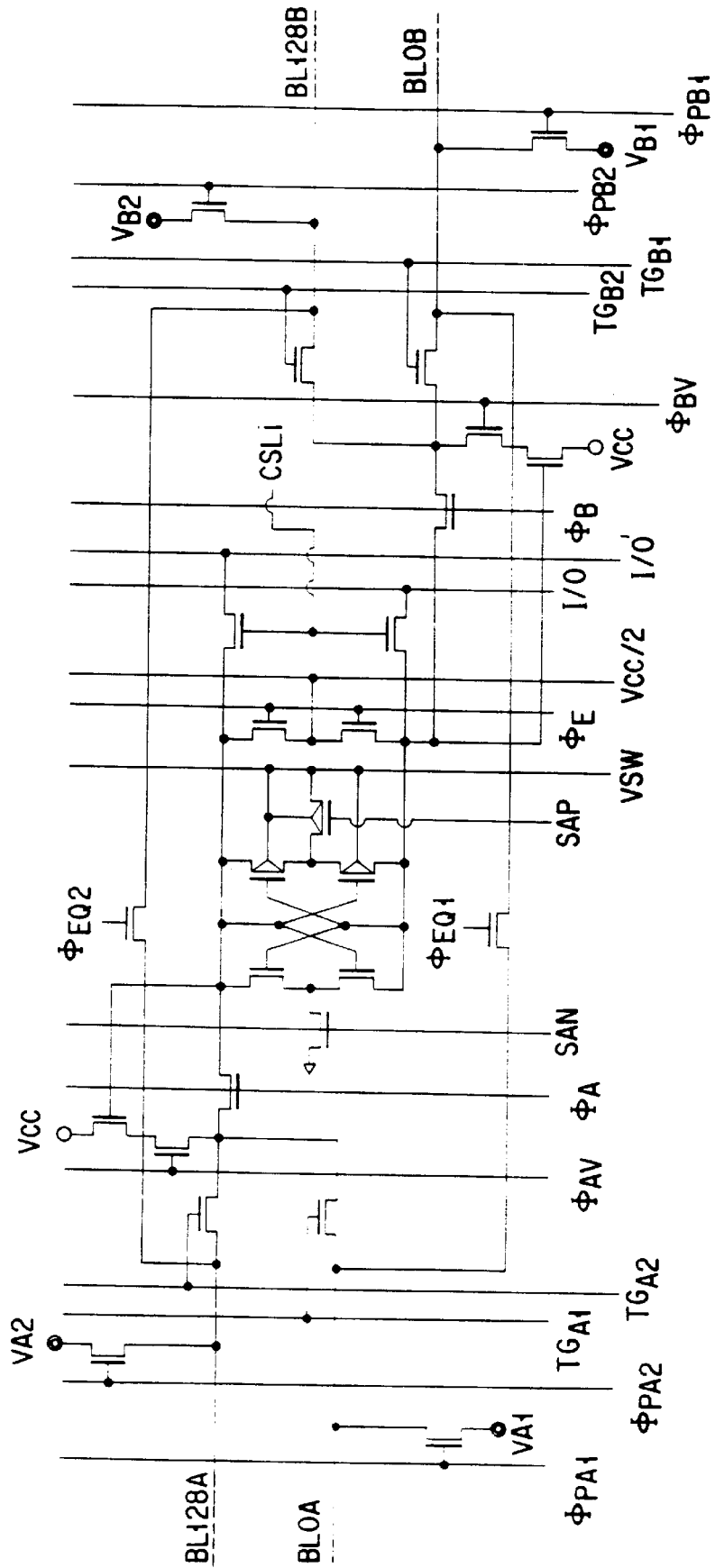
FIG. 38 shows the structure of a sense amplifier circuit in the common sense amplifier system.
Figure 39:
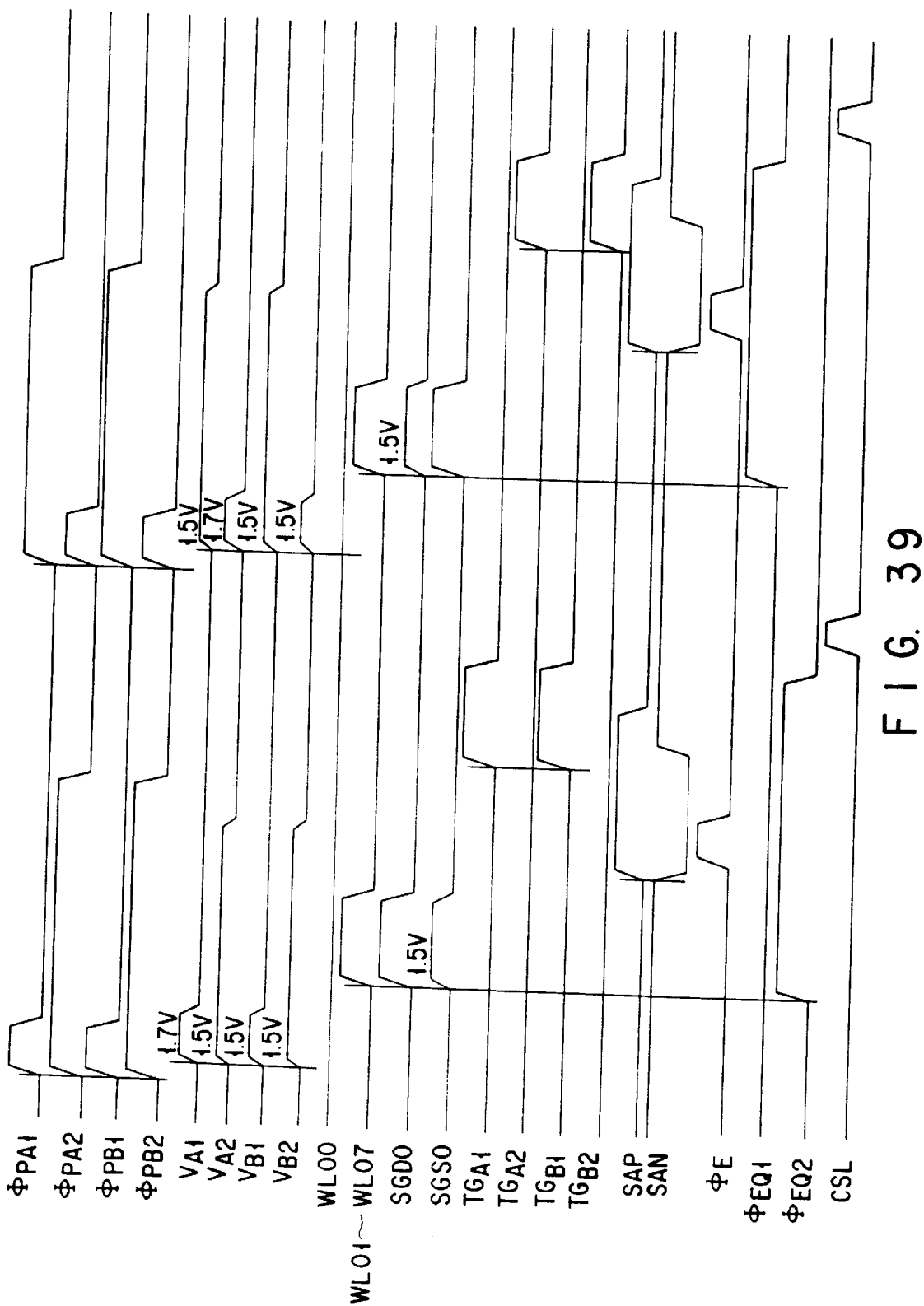
FIG. 39 is a timing chart to help explain the data read operation in the third embodiment.

The present invention may be applied to what is called a common sense amplifier system where a plurality of bit lines share a single sense amplifier. Memory cell arrays employing the common sense amplifier system are shown in FIGS. 37A and 37B. FIG. 38 shows a concrete structure of sense amplifier SA3. FIG. 39 is a timing chart for reading the data in the memory cell connected to bit line $BL_{jA}$ (j=128, 129, ..., 255) and selected by word line $WL_{00}$ after the data in the memory cell connected to bit line $BL_{jA}$ (j=0, 1, ..., 127) and selected by word line $WL_{00}$ has been read. The read operation is almost the same as in the above embodiment where each bit line is provided with a sense amplifier.

The present invention is not restricted to the memory cell array with open bit lines. For example, the invention may be applied to a single end-type memory cell arrangement as shown in FIG. 32, which has an inverter-type sense amplifier as shown in FIG. 4. A memory cell array connected to bit line BLj in FIG. 32 may be the memory cell array connected to bit line $BL_{jA}$ of FIG. 31A.

Furthermore, in the third embodiment, when the potential of the bit line is sensed after the data in a cell has been read onto the bit line, the two bit lines to be shielded are kept at the reference potential by connecting them. When the potential of the bit line is sensed, the two bit lines to be shielded may remain connected to the terminal supplying the reference potential, without equalizing the potentials of the two bit lines. For example, when the bit lines connected to sense amplifier in FIG. 28B or FIG. 34A are shielded (kept at the reference potential), $\phi_{PA1}$, $\phi_{PB1}$ may be kept at 3 V, TG1, TG2 may be kept at 0 V, and $V_{A1}$, $V_{B1}$ may be kept at the reference potential (e.g., 1.5 V).

Hereinafter, an embodiment to solve the third problem will be explained.

A block diagram of a NAND-cell EEPROM according to a fourth embodiment of the present invention is shown in FIG. 33. A memory cell array is the same as that in the third embodiment. Namely, memory cell array 1A is the same as that of FIG. 31A and memory cell array 1B is the same as that of FIG. 31B. In the memory cell arrays 1A, 1B, the sense amplifier SAI connected to bit lines $BL_{jA}$ 1 BLiB (j=0, 1, ..., 127) may be that of FIG. 28A or that of 34A. Similarly, in the memory cell ,15 arrays 1A, 1B, the sense amplifier SA1 connected to bit lines $BL_{jA}$, $BL_{jB}$ (j=128, 129, ..., 255) may be that of FIG. 28B or that of 34B.

When the bit line shielding system where every other bit line is kept at the reference potential is used in a read operation to reduce the capacitive coupling between bit lines, the cells connected to bit line $BL_{jA}$ (j=128, 129, ..., 255) are programmed into after the cells connected to bit line $BL_{jA\;(j=}0, 1, ..., 127)$ have been programmed into, as shown in the third embodiment. In the program operation, writing is first effected and then, verify reading is effected to see if programming has been done sufficiently. The cells sufficiently programmed into are not programmed into additionally, and only the cells insufficiently programmed into are programmed into additionally. The present embodiment will be explained using an example of programming the data into the memory cell connected to bit line $BL_{jA}$ (j=0, 1, ..., 127) of memory cell array 1A and selected by word line $WL_{00}$.

FIG. 40 is a time chart for the write/program verify read operation except for the operation of loading the programming data from data input/output buffer 7 into sense amplifier 2. Before writing, in the memory cell array, all of the control gates are placed at 0 V and a p-type substrate (or a p-well and an n-type substrate) in which memory cells are formed is placed at a high voltage Vpp (about 20 V), thereby erasing the data in unison. After the programming data from data input/output buffer 7 has been latched in CMOS flip-flop FF via input/output lines I/O, I/O', control signals $\phi_{PA1}$, $\phi_{PA2}$, $\phi_{PB1}$, $\phi_{PB2}$ go to 3 V, resetting all of the bit lines.

Thereafter, when transfer gate control signals $TG_{A1}$, $V_{SW}$ connecting bit line $BL_{jA}$ (j=0, 1, . . . , 127) to sense amplifier go to an intermediate potential (about 10 V), the bit line $BL_{jA}$ (j=0, 1, . . . , 127) is at the intermediate potential when the data is "1" and at 0 V when the data is "0". Because bit line $BL_{jA}$ (j=128, 129, . . . , 255) is not used Cor writing, it is charged by terminal $V_{A2}$ to the intermediate potential. Then, when row decoder selects word line $WL_{00}$, $WL_{00}$ goes to Vpp, $WL_{01}$ to $WL_{07}$, $SGD_0$ go to the intermediate potential, and $SGS_0$ goes to 0 V.

After a specific time has elapsed, the control gates and select gates are reset to 0 V and then, transfer gate control signal $TG_{A1}$ goes to 0 V, disconnecting bit line $BL_{jA}$ (j=0, 1, . . . , 127) from the sense amplifier. Thereafter, control signal $\phi_{PA1}$ goes to 3 V, resetting bit line $BL_{jA}$ (j=0, 1, . . . , 127) to 0 V. $V_{SW}$ also goes to 3 V. In the meantime, bit line $BL_{jA}$ (j=128, 129, . . . , 255) remain precharged to the intermediate potential.

Then, a verify operation starts. First, $\phi PA1$, $\phi_{PB1}$ go to 3 V, charging bit line $BL_{jA}$ (j=0, 1, . . . , 127) to 1.7 V and bit line $BL_{jB}$ (j=0, 1, . . . , 127) to 1.5 V. Thereafter, $\phi_{PA1}$, $\phi_{PB1}$ go to 0 V, bringing bit lines $BL_{jA}$, $BL_0$ B (j=0, 1, . . . , 127) into the floating state. Then, for example, 0.5 V is applied to control gate $WL_{00}$, placing word lines $WL_{01}$ to $WL_{07}$ at 3 V and select gate $SGS_0$ at 1.5 V, and $SGD_0$ at 3 V. In a normal read operation, when the threshold voltage of the memory cell is at 0 V or higher, it will be read as "0". In a verify read operation, however, only when the threshold voltage is at 0.5 V or higher, it will be read as "0".

After the bit lines have discharged, when verify signal $\phi_{AV}$ goes to 3 V and bit line $BL_{jA}$ (j=0, 1, . . . , 127) writes "1", it will be charged to about 3 V. The voltage level of precharging effected by the verify signal has only to be equal to or higher than a precharging voltage of 1.5 V. Thereafter, equalize signal $\phi_E$ toes to 3 V, resetting the sense amplifier. Then, transfer gate signals $TG_{A1}$, $TG_{B1}$ go to 3 V, allowing the data on bit line $BL_{jA}$ (j=0, 1, . . . , 127) to be read out. The read-out data is latched in the sense amplifier and used as the data for subsequent rewriting.

During the verify read operation, bit line $BL_{jA}$ (j=128, 129, . . . , 255) is not be discharged, but remains at the intermediate potential, so that in the verify reading of bit line $BL_{jA}$ (j=0, 1, . . . , 127), it serves as a shielding wire to reduce noise due to the coupling capacitance between bit lines.

When bit line $BL_{jA}$ (i=0, 1, . . . , 127) is written into again, bit line $BL_{jA}$ (j=128, 129, . . . , 255) need not be charged again because it has already been precharged to the intermediate potential, thereby eliminating the charging time. Furthermore, since the charge pump circuit for charging the intermediate potential consumes a lot of electric power at the time when the voltage starts to rise, the power consumption in the program operation can be reduced in the present embodiment.

While in this embodiment, unselected bit lines $BL_{jA}$ (j=128, 129, . . . , 255) are kept charged to the intermediate potential, the unselected bit lines may be placed in the floating state at the intermediate potential by, for example, placing $\phi PA2$ at 0 V.

The present embodiment is also effective in what is called a common sense amplifier system where a plurality of bit lines share a single sense amplifier. FIGS. 37A and 37B show memory cells employing the common sense amplifier system. A block diagram of a NAND-cell EEPROM using the common sense amplifier system is shown in FIG. 33. FIG. 38 shows sense amplifier SA3 using the common sense amplifier system. A timing chart for using the common sense amplifier system is almost the same as that of FIG. 40.

The present invention is not limited to a memory cell array with open bit lines. For example, the invention may be applied to a single end memory cell arrangement as shown in FIG. 32, which has an inverter-type sense amplifier as shown in FIG. 4. A memory cell array connected to bit line BLj in FIG. 32 may be the memory cell array connected to bit line $BL_{jA}$ in FIG. 31A.

Figure 41:
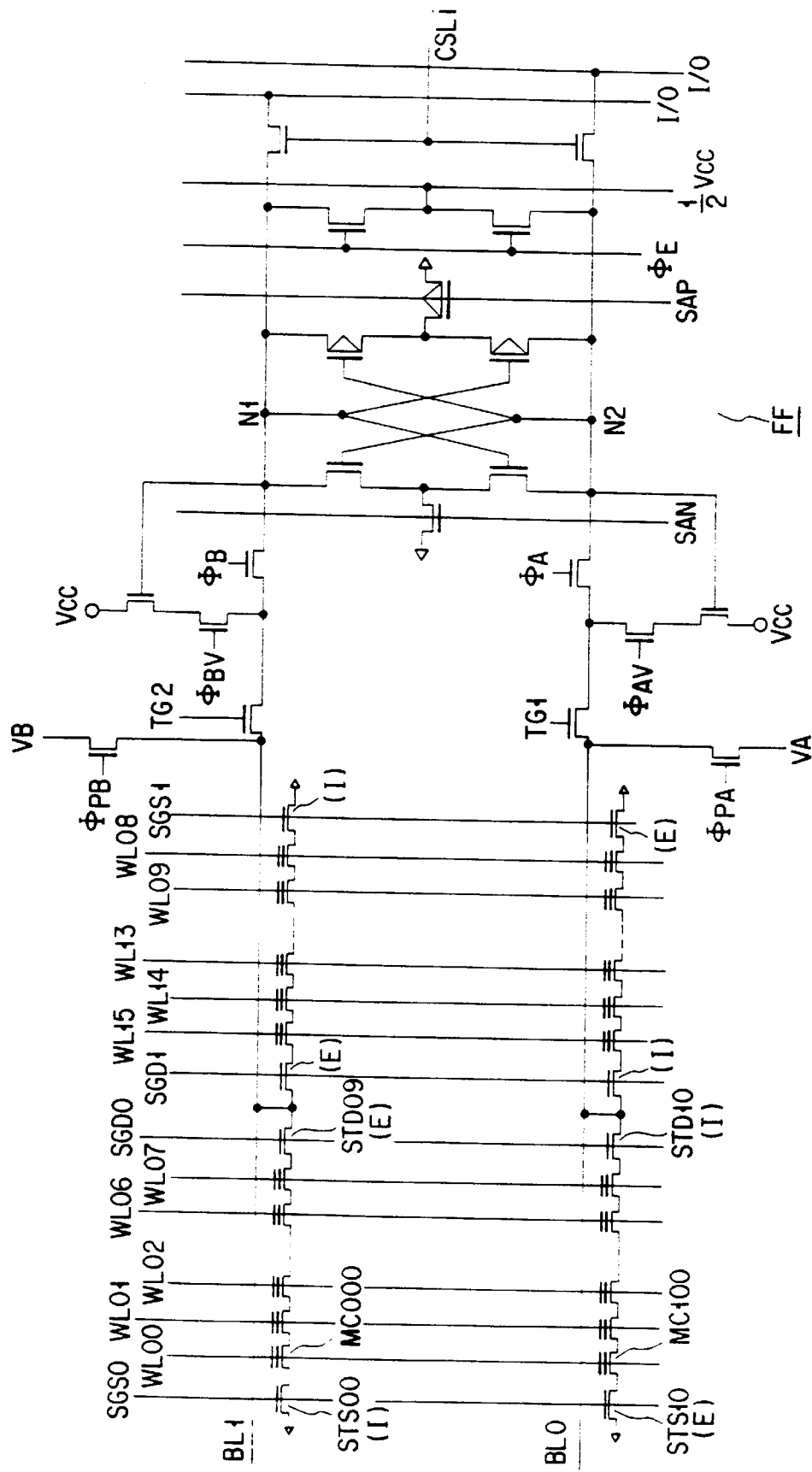
FIG. 41 shows the structure of a sense amplifier circuit of the folded bit-line system in the fourth embodiment.

The present invention may be applied to the folded bit line system as shown in FIG. 41. While the memory cell coupled to one (e.g., $BL_0$ of FIG. 41) of two bit lines connected to the sense amplifier is being programmed into, the other bit line $BL_1$ has only to be kept charged to the intermediate potential (about 10 V) from terminal $V_B$ by placing transfer gate control signal TG2. Because bit line $BL_1$ is kept at the intermediate potential while the memory cell coupled to bit line $BL_0$ programmed into is undergoing verify reading, the verify reading of the memory cell coupled to bit line $BL_0$ cannot be effected in a differential manner.

A normal read operation, however, may be performed in a differential manner by the folded bit line system as explained in the first embodiment, and a verify read operation may be carried out by the single end arrangement as described above. That is, one of two inverters constituting a sense amplifier flip-flop may be deactivated, and a judgment may be made as to whether the data read out depending on whether or not the potential of the bit line is higher than the threshold voltage of the inverter, is "0" or "1".

In the fifth embodiment, when $SGD_0$ is applied to the drain-side select MOS transistors and $SGS_0$ is applied to the source-side select MOS transistors in the half memory cell unit in one block selected by row decoder 3 at the time of program verify reading and at the time of normal reading, $SGS_0$ is applied to the drain-side select MOS transistors and $SGD_0$ is applied to the source-side select MOS transistors in the remaining half memory cell unit.

To apply a voltage to the select gates, for example, the signal applied to the select gates of the memory cells connected to bit lines $BL_0$ to $BL_{127}$ and the signal applied to the select gates of the memory cells connected to bit lines $BL_{128}$ to $BL_{225}$ are provided separately. Furthermore, as shown in FIG. 43, the source-side select gates may be replaced with the drain-side select gates in the middle of the memory cell array.

Figure 42:
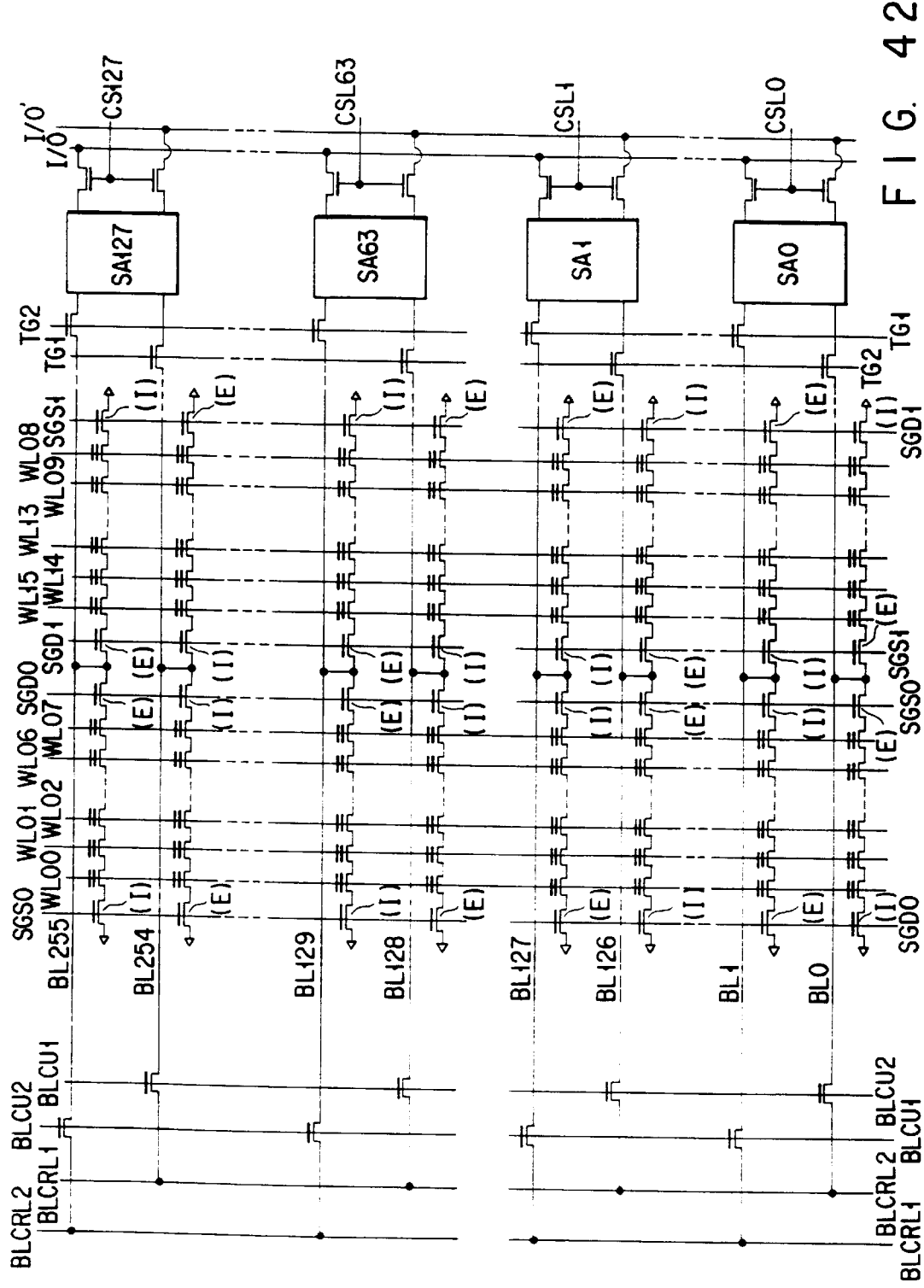
FIG. 42 shows a memory cell array structure in a fifth embodiment of the present invention.
Figure 43:
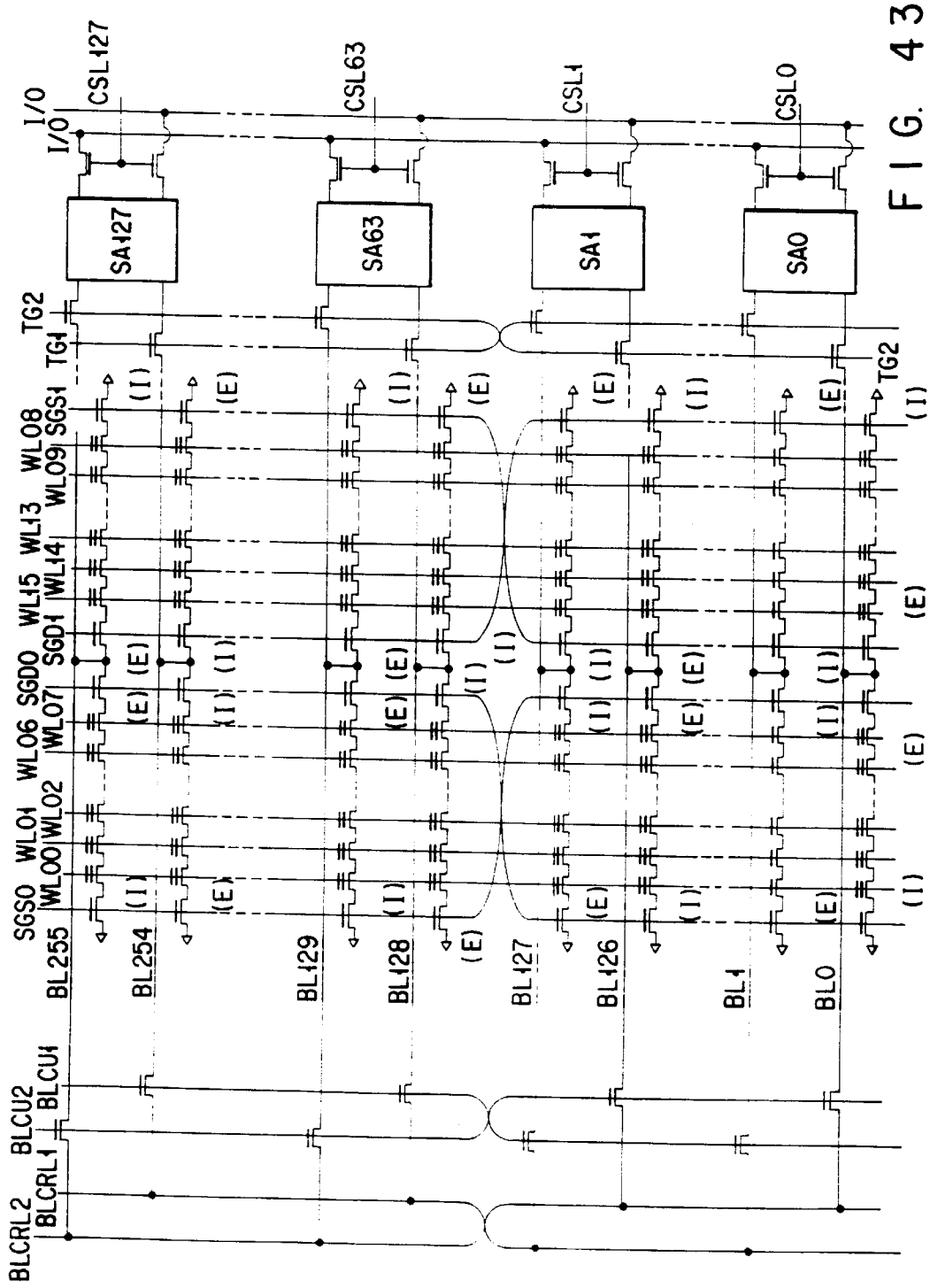
FIG. 43 shows a memory cell array structure in the fifth embodiment.

As shown in FIGS. 42 and 43, when the memory cell selected by word line $WL_{00}$ is read from, the memory cell connected to bit line BLj (j: an even number) is read from by placing select gate $SGS_0$ at 3 V and $SGD_0$ at 1.5 V. In this case, of the unselected bit lines BLj (j: an odd number) not to be read from, the unselected bit lines BLj (j=1, 3, 5, . . . , 125, 127) have the source-side select MOS transistors turned off and the unselected bit lines BLj (j=129, 131, 133, . . . , 253, 255) have the drain-side select MOS transistors turned off. Specifically, the turning off of the drain-side select MOS transistors prevents the half of the unselected bit lines from discharging, and the turning off of the source-side select MOS transistors prevents the remaining half of the unselected bit lines from discharging.

On the other hand, to read the data from the memory cell connected to bit line BLj (j : an odd number), select gate $SGS_0$ is placed at 1.5 V and $SGD_0$ is placed at 3 V. In this case, of the unselected bit lines BLj (j: an even number) not to be read from, the unselected bit lines BLj (j=0, 2, 4, . . . , 124, 126) have the drain-side select MOS transistors turned off and the unselected bit lines BLj (j=128, 130, 132, . . . , 252, 254) have the source-side select MOS transistors turned off. Specifically, the turning off of the drain-side select MOS transistors prevents the half of the unselected bit lines from discharging, and the turning off of the source-side select MOS transistors prevents the remaining half of the unselected bit lines from discharging.

As described above, both when an odd-numbered bit line is read from and when an even-numbered bit line is read from in a read operation, the turning off of the drain-side select MOS transistors prevents the half of the unselected bit lines from discharging, and the turning off of the source-side select MOS transistors prevents the remaining half of the unselected bit lines from discharging. Therefore, both when an odd-numbered bit line is read from and when an even-numbered bit line is read from, the total capacitance of the unselected bit lines remains unchanged. As a result, both when bit line BLj (j: an odd number) is read from and when bit line BLj (j: an even number) is read from, the precharging time and the reading time are allowed to remain unchanged.

The read operation has been explained. In the verify read operation after writing, too, the total capacitance of the bit lines remains unchanged both when an odd-numbered bit line is read from and when an odd-numbered bit line is read from.

While in FIGS. 42 and 43, the folded bit line system is used, the open bit line system explained in the first to fourth embodiments or the single end system may be used. Furthermore, the common sense amplifier where a plurality of bit lines share a single sense amplifier.

Figure 44:
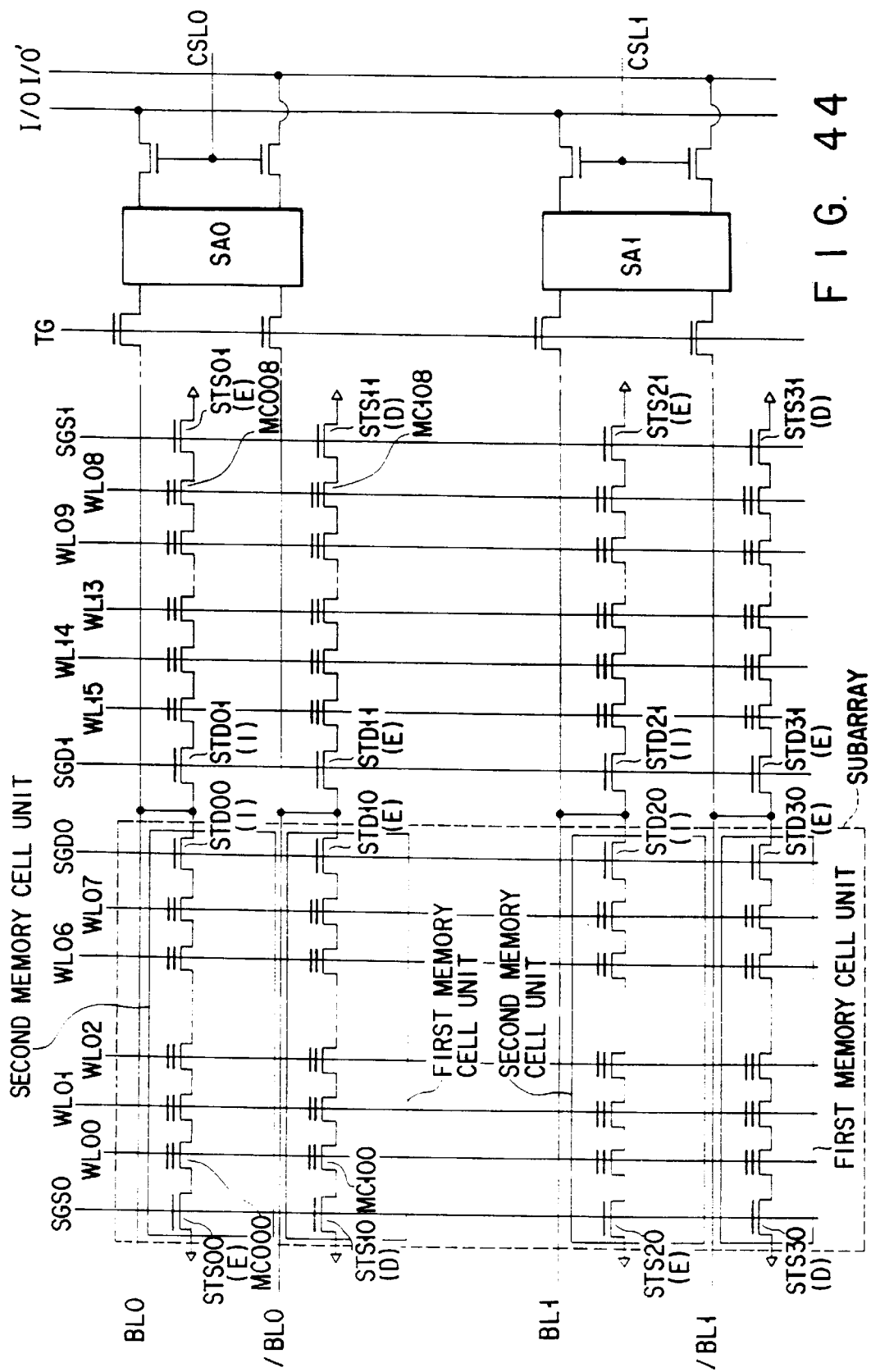
FIG. 44 shows a memory cell array structure in a sixth embodiment of the present invention.

FIG. 44 shows the structure of a memory cell array according to a sixth embodiment of the present invention. The sixth embodiment differs from that of FIG. 11 in that part of the I-type select MOS transistors are replaced with those of the D-type. That is, the sixth embodiment is basically the same as the first embodiment and differs from the latter in that the former uses select MOS transistors of a different type.

In FIG. 44, select MOS transistors with a high threshold voltage of Vt1 (e.g., 2 V) are determined to be of the E-type, and select MOS transistors having low threshold voltages of vt2 and vt3 (e.g., 0.5 V and −1 V) (Vt1>Vt2>Vt3) are determined to be of the I-type and the D-type, respectively. A voltage applied to select gates that turns on all of the I-type, D-type, and E-type transistors is determined to be voltage Vsgh (e.g., 3 V) (Vsgh>Vt1, Vt2, Vt3). A voltage applied to select gates that turns on the I-type transistors and turns off the E-type transistors is determined to be voltage Vsgl1 (e.g., 1.5 V) (Vt1>Vsgl1>Vt2). A voltage applied to select gates that turns on the D-type transistor and turns off the E-type transistors is determined to be voltage Vsgl2 (e.g., 0 V) (Vt1>Vsgl2 >Vt3).

Using FIG. 44, a method of applying a voltage to select gates will be explained concretely. For example, when the data in memory cell $MC_{000}$ is read out, word line $WL_{00}$, $WL_{08}$ to $WL_{15}$ are placed at 0 V, and word lines $WL_{01}$ to $WL_{07}$ are placed at Vcc (e.g., 3 V). Then, the source-side select gate $SGS_0$ is placed at Vsgh, and the drain-side select gate $SGD_0$ is placed at Vsgl1. $SGS_1$ and $SGD_1$ are placed at 0 V. In this case, the source-side select MOS transistors $STS_{00}$ and $STS_{10}$ are both turned on. On the other hand, the drain-side select MOS transistor $STD_{00}$ of bit line $BL_0$ turns on, whereas the drain-side select MOS transistor $STD_{10}$ of bit line $/BL_0$ turns off, so that bit line $BL_0$ discharges but bit line $/BL_0$ does not discharge.

On the other hand, when the data in memory cell $MC_{100}$ is read out, word line $WL_{00}$, $WL_{08}$ to $WL_{15}$ are placed at 0 V, and word lines $WL_{01}$ to $WL_{07}$ are placed at Vcc (e.g., 3 V), as when memory cell $MC_{000}$ is read from. Then, the source-side select gate $SGS_0$ is placed at Vs12, and the drain-side select gate $SGD_0$ is placed at Vsgh. $SGS_1$ and $SGD_1$ are placed at 0 V. In this case, the drain-side select MOS transistors $STD_{00}$ and $STD_{10}$ are both turned on. Because the source-side select MOS transistor $STS_{10}$ turns on, bit line $/BL_0$ discharges, whereas because select MOS transistor $STS_{00}$ turns off, bit line $BL_0$ does not discharges.

With the present invention, the select MOS transistors connected to the bit line pair BLj, /BLj are used to make different the threshold voltages of the select MOS transistors (e.g., $STD_{00}$ and $STD_{10}$, $STS_{00}$ and $STS_{10}$, $STD_{01}$ and $STD_{11}$, $STS_{01}$ and $STS_{11}$ in FIG. 44) controlled by the same select gates SGS, SGD. The way of setting the threshold voltages is arbitrary. While in FIG. 44, all of the drain-side select MOS transistors connected to bit lines BLj are of the I-type and the source-side select MOS transistors are of the E-type, one of the drain-side select MOS transistors may be of the I-type and the other be of the E-type in two NAND blocks sharing a bit-line contact, for example.

With the invention, some of the select MOS transistors sharing a single select gate are made conducting and the other are made nonconducting. Use of two such select gates makes it easy to realize selected memory cells and unselected memory cells among the memory cells sharing the same select gate.

Figure 45:
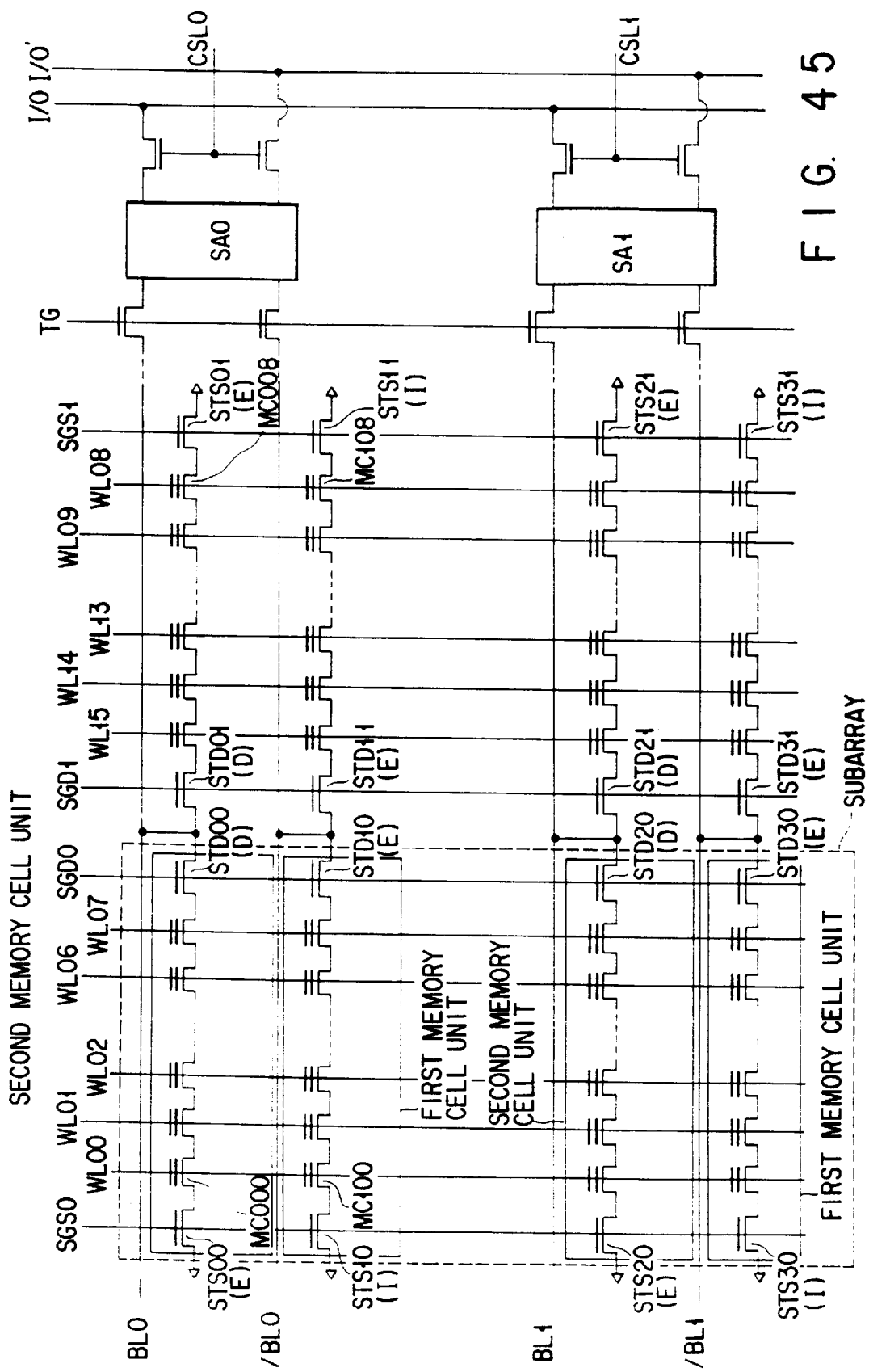
FIG. 45 shows a memory cell array structure in the sixth embodiment.

As shown in FIG. 45, the select MOS transistors connected to the drain side may be of the E-type or the D type, and the select MOS transistors connected to the source side may be of the E-type or the I-type. In this case, to select a memory cell (e.g., $MC_{000}$) in the memory cell unit 2, $SGS_0$ is placed at Vsgh (e.g., 3 V), $SGD_0$ is placed at Vsgl2 (e.g., 0 V), and $SGD_1$, $SGS_1$ are placed at 0 V. To select a memory cell (e.g., $MC_{100}$) in the memory cell unit 1, $SGS_0$ is placed at Vsgl1 (e.g., 1.5 V), $SGD_0$ is placed at Vsgh (e.g., 3 V), and $SGS_1$, $SGD_1$ are placed at 0 V.

Making Vsgh higher than Vcc leads to an increase in the conductance of the select MOS transistor (that is, a decrease in the resistance), causing a current flowing through the NAND cell column to increase in a read operation. This shortens the bit-line discharging time, making the reading and the program verify reading faster. Vsgh may be raised from Vcc at the charge pump circuit within the chip.

The threshold voltages of both of the I-type select MOS transistors and the D-type select MOS transistors may be negative (e.g., −1 V and −2 V).

The higher one Vt1 of the threshold voltages of the select gates may be set at a voltage (e.g., 3.5 V) equal to or higher than the power supply voltage Vcc. In this case, to turn on a select MOS transistor with a threshold voltage of Vt1 in a read operation or a verify read operation, for example, 4 V is applied to the select gate by using the charge pump circuit in the chip.

Figure 46:
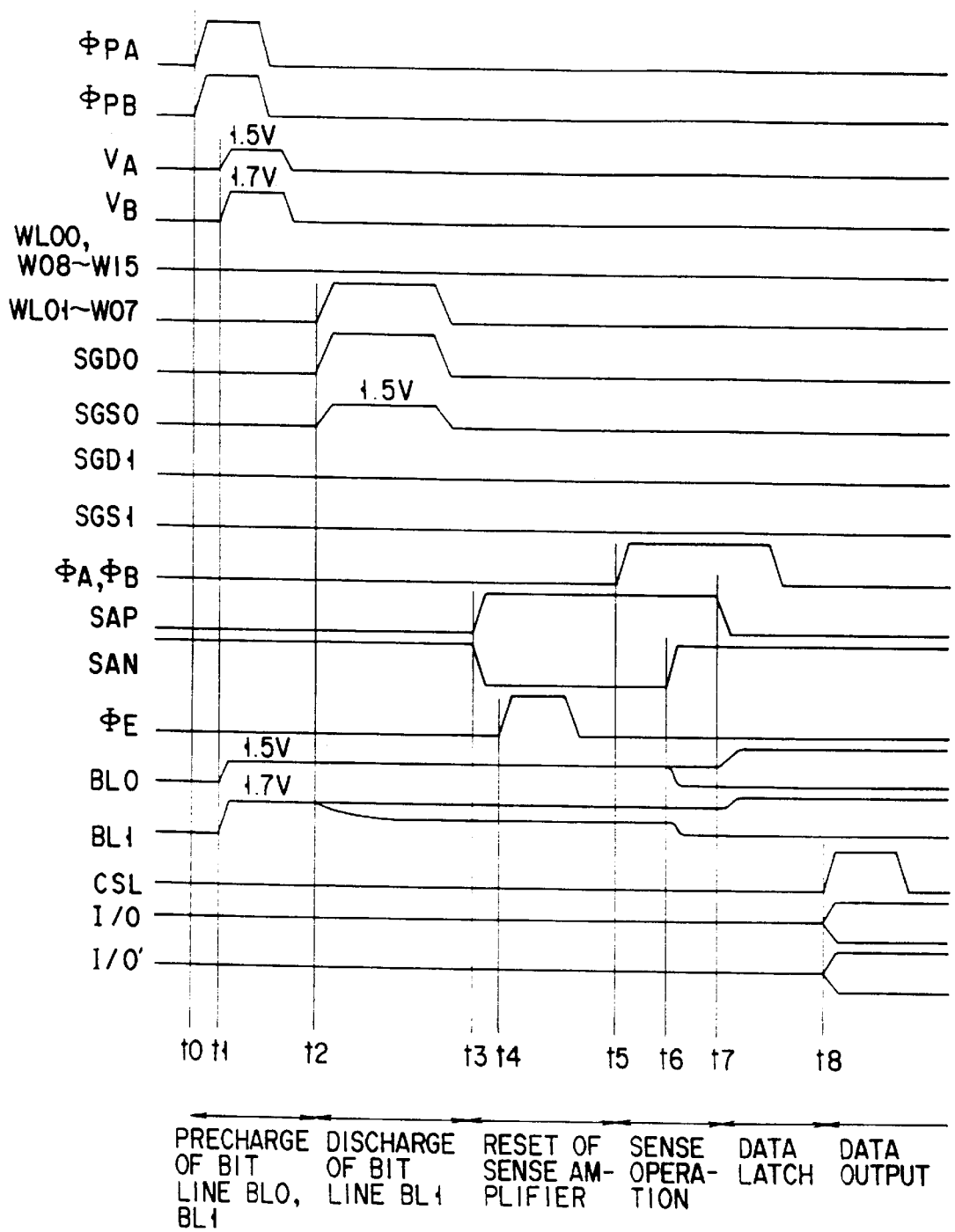
FIG. 46 is a timing chart to help explain the data read operation in the sixth embodiment.

Using the timing chart of FIG. 46, the operation of reading memory cell $MC_{000}$ connected to bit line $BL_1$ of FIG. 47 will be explained. The sense amplifier is composed of a CMOS flip-flop controlled by control signals SAN, SAP.

Control signals $\phi_A$, $\phi_B$ go to Vss, disconnecting COMS flip-flop FF from bit lines $BL_0$, $BL_1$. Then, precharge signals $\phi_{pA}$, $\phi_{pB}$ change from Vss to Vcc (time t0), precharging bit line $BL_1$ to $V_B$ (e.g., 1.7 V) and dummy bit line $BL_0$ to $V_A$ (e.g., 1.5) (time t1). After the precharging has been completed, $\phi_{pA}$, $\phi_{pB}$ go to Vss, bringing bit lines $BL_0$, $BL_1$ into the floating state. Thereafter, row decoder 3 applies specified voltages to the select gate (word line) and the select gate (time 2).

When memory cell $MC_{000}$ of FIG. 47 is read from, $WL_{00}$ is placed at 0 V, $WL_{01}$ to $WL_{07}$ are placed at 3 V, $SGD_0$ is placed at 3 V, and $SGS_0$ is placed at 1.5 V. When the data programmed in memory cell $MC_{000}$ is "0", the threshold voltage of memory cell $MC_{000}$ is positive, no cell current will flow, allowing bit line $BL_1$ to remain at 1.7 V. When the data is "1", a cell current will flow, causing the potential of bit line BLj to drop to 1.5 V or below. Since select gate $SGS_0$ is at 1.5 V, select gate transistor $STS_{10}$ turns off, with the result that bit line $BL_0$ is prevented from discharging, regardless of the data programmed in memory cell $MC_{100}$, and remains at a precharging potential of 1.5 V.

Thereafter, at time t3, SAP goes to 3 V and SAN goes to 0 V, deactivating CMOS flip-flop FF. At time t4, $\phi_E$ goes to 3 V, thereby equalizing CMOS flip-flop FF, placing nodes N1, N2 at Vcc/2 (e.g., 1.5 V). At time t5, $\phi_A$, $\phi_B$ go to 3 V, connecting the bit line to the sense amplifier (time t6), and thereafter SAN rises from 0 V to 3 V, causing the potential difference between bit lines $BL_0$ and $BL_1$ to be amplified. Then, at time t7, SAP drops from 3 V to 0 V, causing the data to be latched. Specifically, if "0" is programmed in memory cell $MC_{000}$, node N1 will be at 3 V and node N2 will be at 0 V. If "1" is programmed in memory cell $MC_{000}$, node N1 will be at 0 V and node N2 will be at 3 V. Thereafter, when column select signal $CSL_1$ rises from 0 V to 3 V, the data latched in CMOS flip-flop is outputted to I/O, I/O' (time 8).

The timing for reading is arbitrary. For example, at time t5, the transfer gate connecting the bit lines to the sense amplifier may be turned on to transfer the potential of bit lines $BL_1$, $BL_2$ to nodes N1, N2 and then be turned off. Therefore, the load capacity of the sense amplifier decreases as a result of the bit-line pair being disconnected from the sense amplifier, so that the potential of nodes N1, N2 is determined rapidly at the time of sensing and latching.

Furthermore, in a sense operation of the sense amplifier, after SAN has been raised from 0 V to 3 V to turn on the n-channel transistor in CMOS flip-flop FF, SAP is dropped from 3 V to 0 V to turn on the p-channel transistor in CMOS flip-flop FF. However, SAP may be dropped from 3 V to 0 V at the same time that SAN is raised from 0 V to 3 V.

In the sixth embodiment, while the bit line connected to a memory cell to be read from is being discharged, the other dummy bit line of the bit-line pair connected to the sense amplifier (e.g., bit line $BL_0$ in reading the data from memory cell $MC_{000}$ of FIG. 47 and bit line $BL_1$ in reading the data from memory cell $MC_{100}$) is in the floating state. However, by keeping precharge control signal $\phi_{pA}$ at 3 V while bit line $BL_1$ is being precharged and then the data in memory cell $MC_{000}$ is being read out, dummy bit line $BL_0$ serving as a reference can be fixed at a reference voltage of 1.5 V.

By keeping the dummy bit line at the reference potential as described above, noise attributable to the capacitive coupling between adjacent bit lines at the time of the bit line discharging, can be reduced. Furthermore, as in the read operation, in the verify read operation after writing, the cells are charged and discharged for bit lines according to the data programmed into the cells. Here, by keeping the dummy bit lines not to be read from at the reference potential, noise due to the capacitive coupling between bit lines can be reduced.

Hereinafter, the program operation in the sixth embodiment, for example, the procedure for programming the data into memory cell $MC_{000}$ of FIG. 47 will be explained.

Select gate $SGD_0$, and control gates $WL_{01}$ to $WL_{07}$ are placed at an intermediate potential of Vm (about 10 V) and $WL_{00}$ is placed at Vpp (about 20 V), and then bit line $BL_0$ is charged from $V_A$ to Vm8 (about 8 V). When "1" is programmed into memory cell $MC_{000}$, flip-flop FF applies Vm8 to bit line $BL_1$. When "0" is programmed into the memory cell, the flip-flop applies 0 V to the bit line $BL_1$. Then, electrons are not injected into the floating gates of memory cell $MC_{100}$ not to be programmed into and memory cell $MC_{000}$ into which "1" is programmed into, whereas electrons are injected into memory cell $MC_{000}$ into which "0" is programmed into.

After the programming is completed, the control gates, select gates, and bit lines are discharged one after another, terminating the program operation.

When the data is programmed into $MC_{000}$ in a memory cell array as shown in FIG. 44, such a voltage (e.g., −3 V) as turns off D-type select MOS transistor $STS_{10}$ may be applied to select gate $SGS_0$.

After the programming has been completed, a program verify operation to check whether programming has been done sufficiently is carried out.

$\phi_A$, $\phi_B$ go to Vcc and precharge signals $\phi_{pB}$, $\phi_{pA}$ go to Vcc, precharging bit line $BL_1$ to, for example, 1.7 V and (dummy) bit line $BL_0$ to for example, 1.5 V.

After the precharging has been completed, $\phi_{pA}$, $\phi_{pB}$ go to Vss, bringing bit lines $BL_0$, $BL_1$ into the floating state. Thereafter, row decoder 3 applies specified voltages to the select gate and the control gate. Control gate $WL_{00}$ is at a verify voltage (e.g., 0.5 V), $WL_{01}$ to $WL_{07}$ are at Vcc (e.g., 3 V), $SGS_0$ is at 1.5 V, and $SGD_0$ is at 3 V. When "0" has bee programmed sufficiently into memory cell $MC_{000}$, the threshold voltage of the memory cell is positive, no cell current will flow, allowing bit line $BL_1$ to remain at 1.7 V. When "1" or "0" has been programmed insufficiently, a cell current will flow, causing the potential of bit line $BL_1$ to drop to 1.5 V or below. In the meantime, dummy bit line $BL_0$ may be in the floating state or may be fixed at 1.5 V by placing $\phi_{pA}$ at Vcc. By keeping the dummy bit line at a constant voltage, noise due to capacitive coupling between bit lines during bit line discharging can be reduced remarkably.

After the bit lines have been discharged, verify signal $\phi_{BV}$ goes to 3 V and when the data to be programmed into memory cell $MC_{000}$ is "1", bit line $BL_1$ will be charged to about 3 V. Here, the voltage level of charging effected by the verify signal has only to be equal to or higher than the precharge voltage of 1.5 V for the dummy bit line $BL_0$.

Thereafter, SAP goes to 3 V and SAN goes to 0 V, deactivating CMOS flip-flop FF. Then, $\phi_E$ goes to 3 V, thereby equalizing CMOS flip-flop FF, placing nodes N1, N2 at Vcc/2 (e.g., 1.5 V). Thereafter, $\phi_A$, $\phi_B$ go to 3 V, connecting the bit line to the sense amplifier, and then SAN rises from 0 V to 3 V and SAP drops from 3 V to 0 V, causing the potential difference between bit line $BL_1$ and dummy bit line $BL_0$ to be amplified. allowing the reprogramming data to be latched in the sense amplifier.

As described above, with the sixth embodiment, by changing the threshold voltage of the select MOS transistor and the voltage applied to the select gate, the folded bit line system can be realized without increasing the chip area, as in the first embodiment, thereby enabling high-speed random reading. The various methods of changing the threshold voltage explained in the first embodiment can be used in the sixth embodiment. The select transistors each having threshold value as described in the sixth embodiment are also applied to second to fifth embodiments and seventh to fourteenth embodiments.

Figure 48:
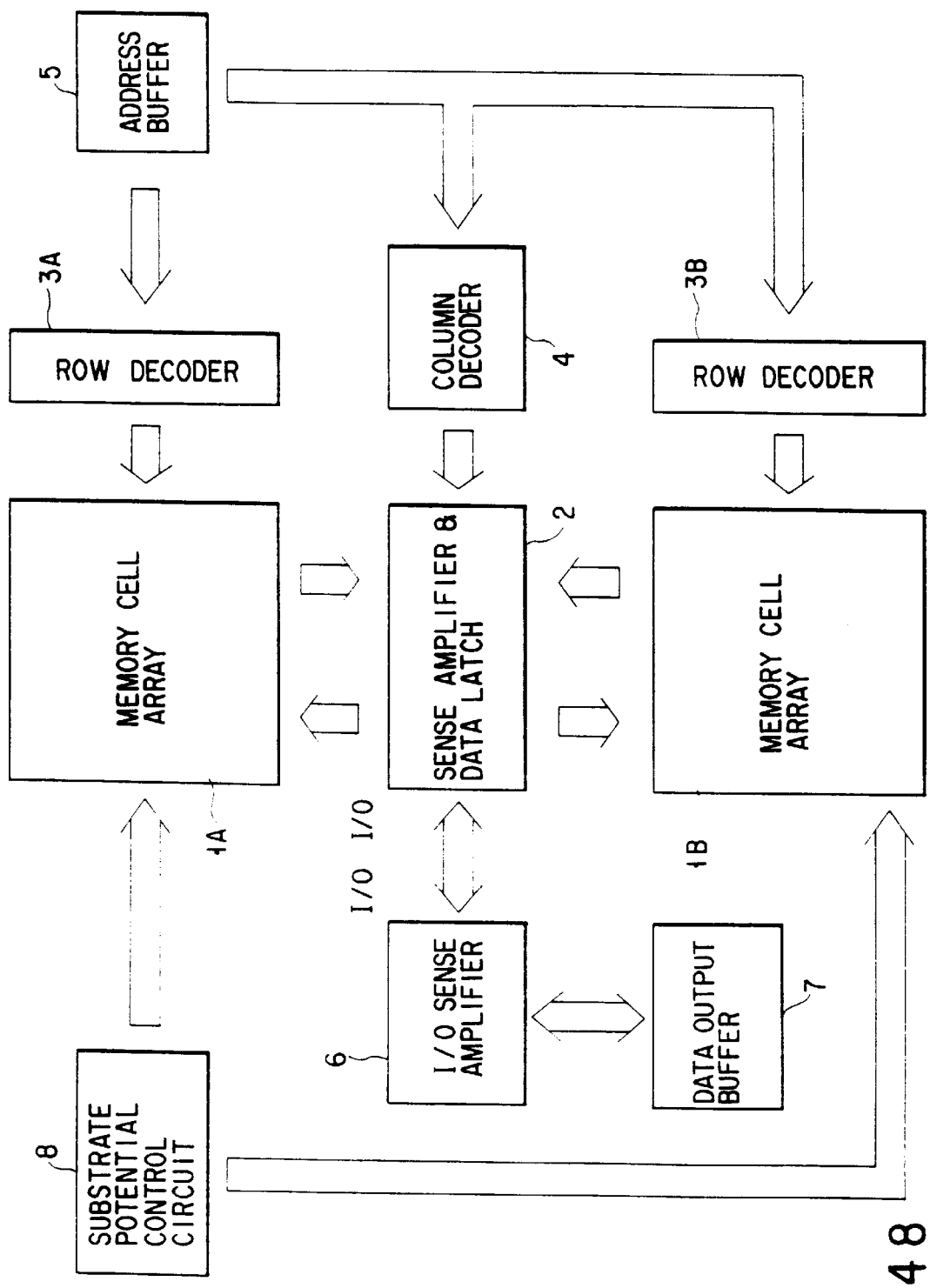
FIG. 48 is a block diagram of a NAND-cell EEPROM according to a seventh embodiment of the present invention.

FIG. 48 is a block diagram of a NAND-cell EEPROM according to a seventh embodiment of the present invention. In FIG. 48, the same parts as those in FIG. 10 are indicated by the same reference symbols and a detailed explanation of them will not be given. In FIG. 48, a memory cell array is of the open bit line system and divided into two, memory cell array 1A and memory cell 1B. The remaining configuration is almost the same as that of FIG. 10.

Figure 3:
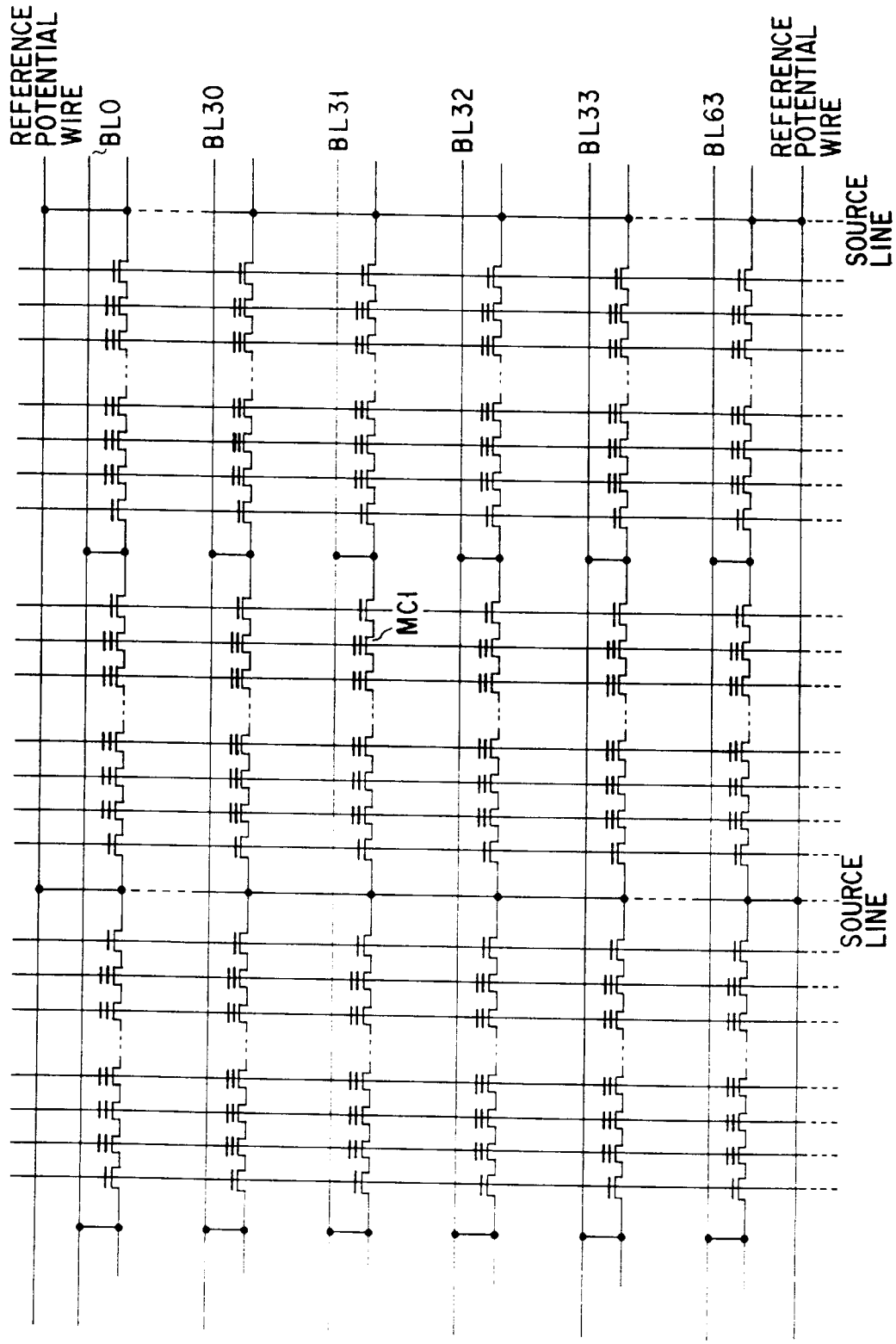
FIG. 3 is an equivalent circuit diagram of a memory cell array in a conventional NAND EEPROM.
Figure 5:
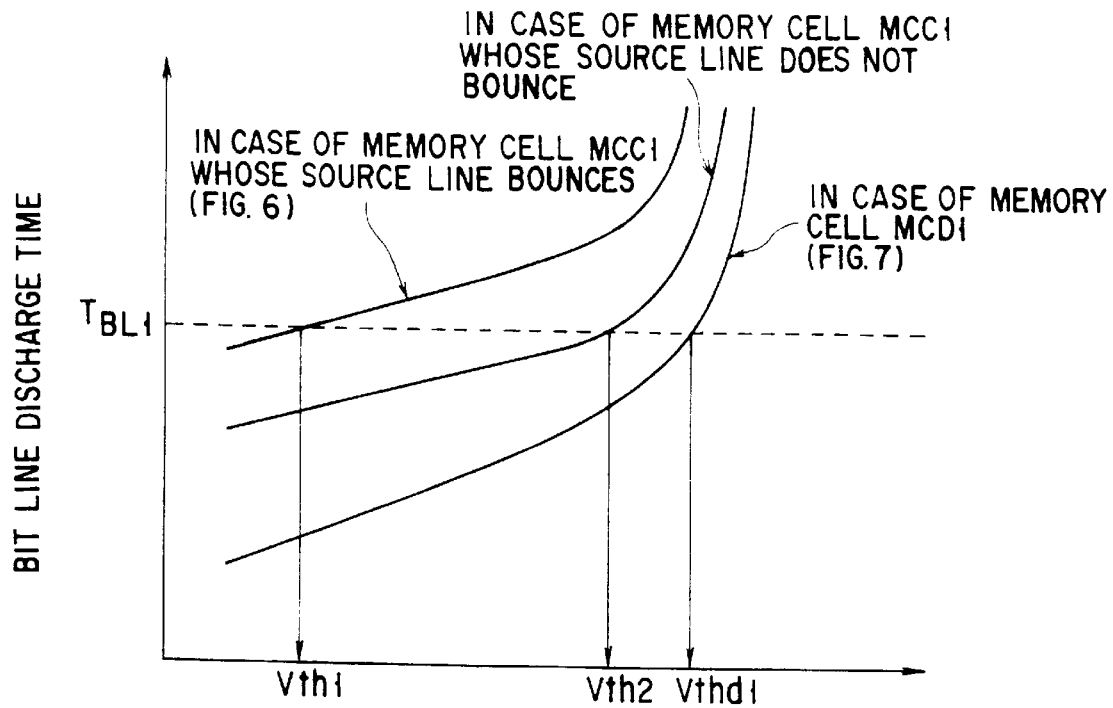
FIG. 5 shows the relationship between the threshold voltage and the bit-line discharging time in a memory cell with the intention of explaining a problem with a conventional EEPROM.
Figure 6:
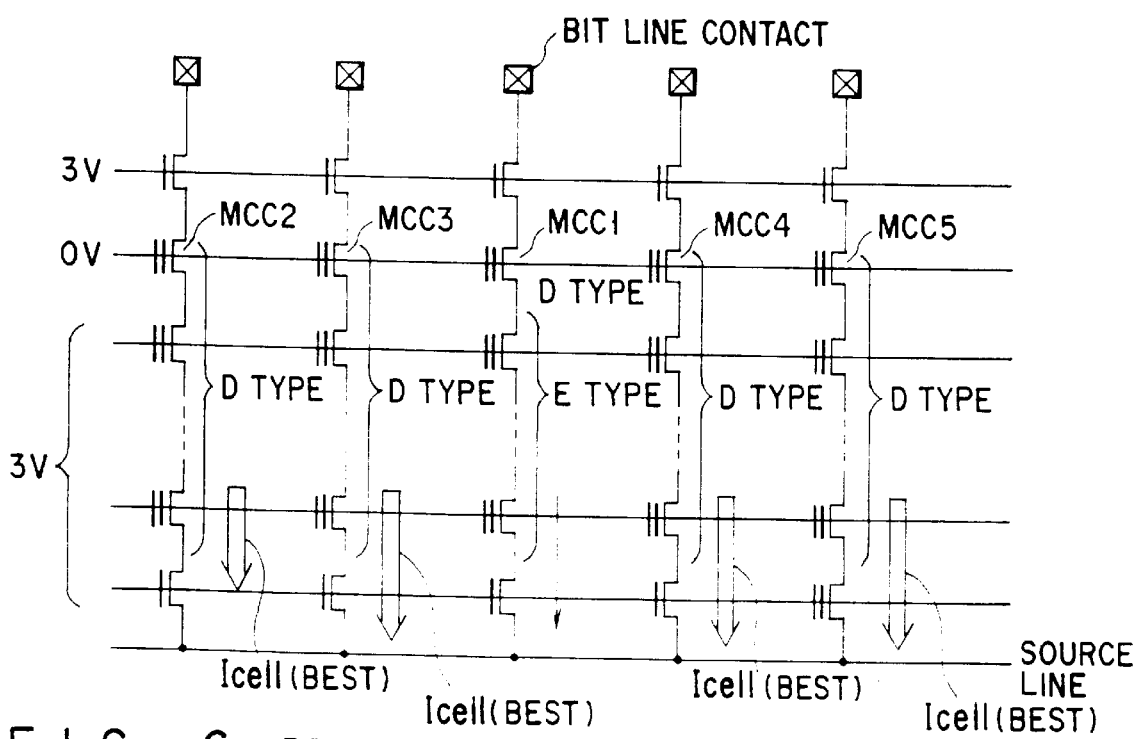
FIG. 6 shows a memory cell array structure with the intention of explaining a problem with a conventional EEPROM.
Figure 7:
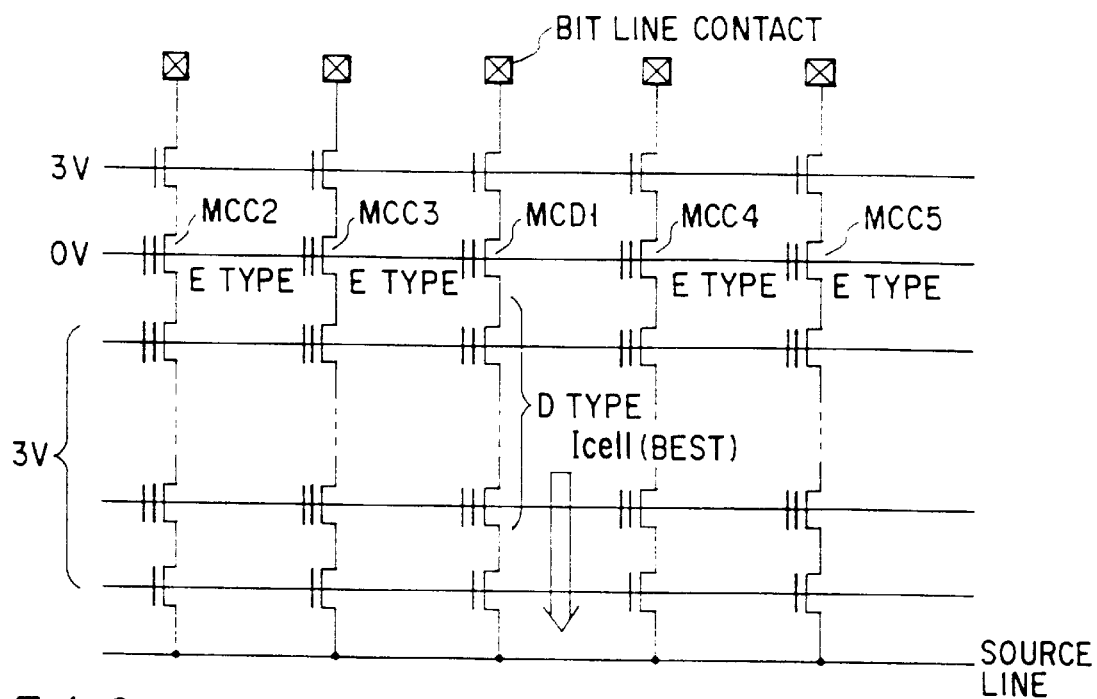
FIG. 7 shows a memory cell array structure with the intention of explaining a problem with a conventional EEPROM.
Figure 8:
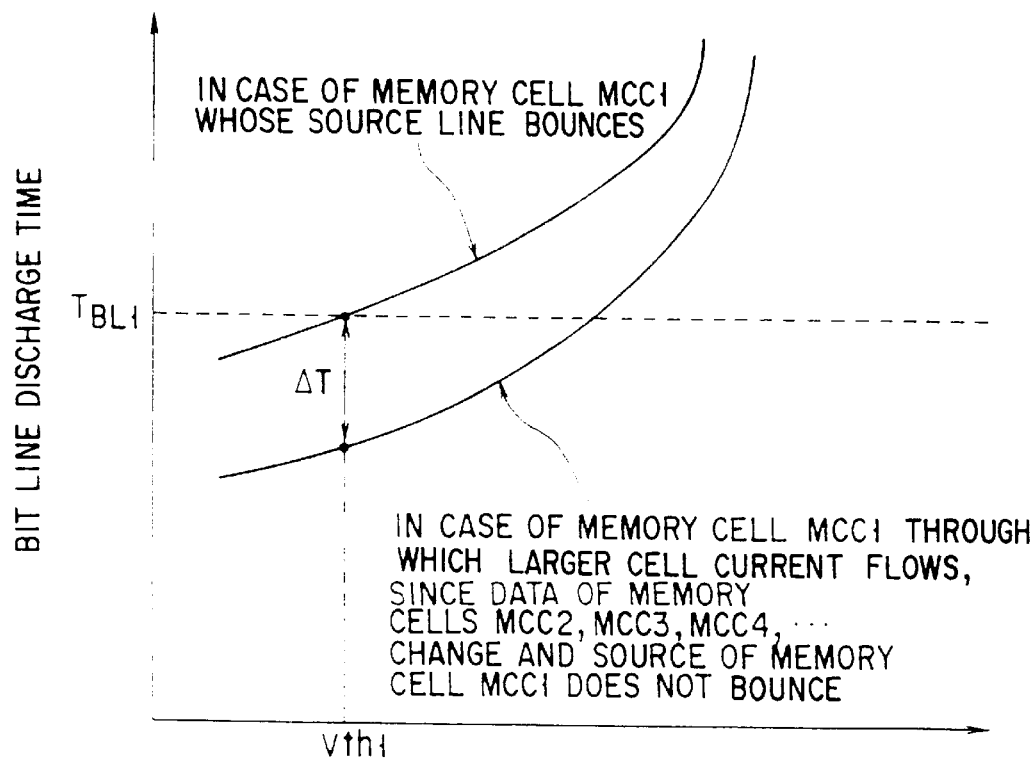
FIG. 8 shows the relationship between the threshold voltage and the bit-line discharging time in a memory cell with the intention of explaining a problem with a conventional EEPROM.
Figure 49A:
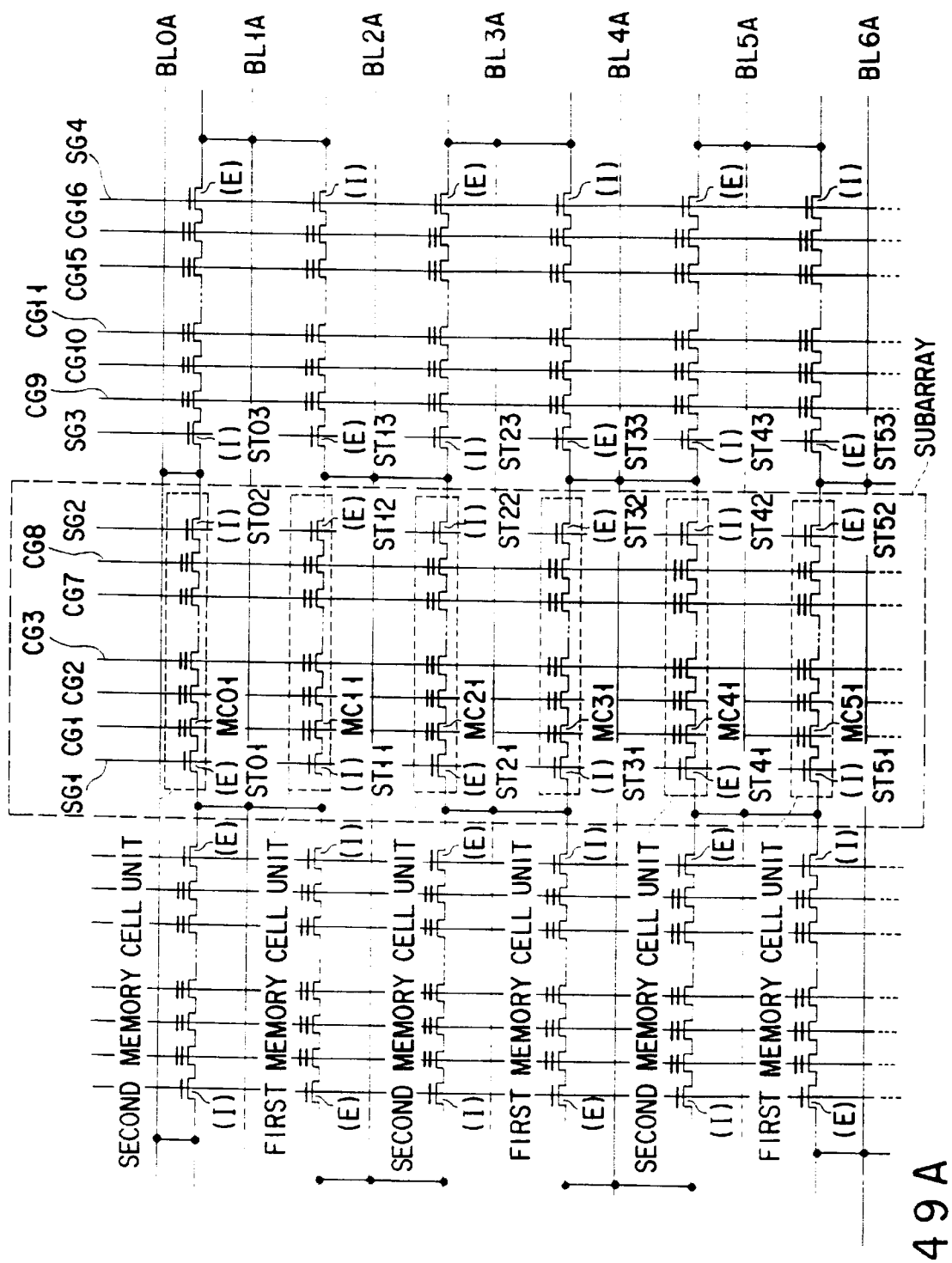
FIGS. 49A and 49B show memory cell array structures in the seventh embodiment.
Figure 49B:
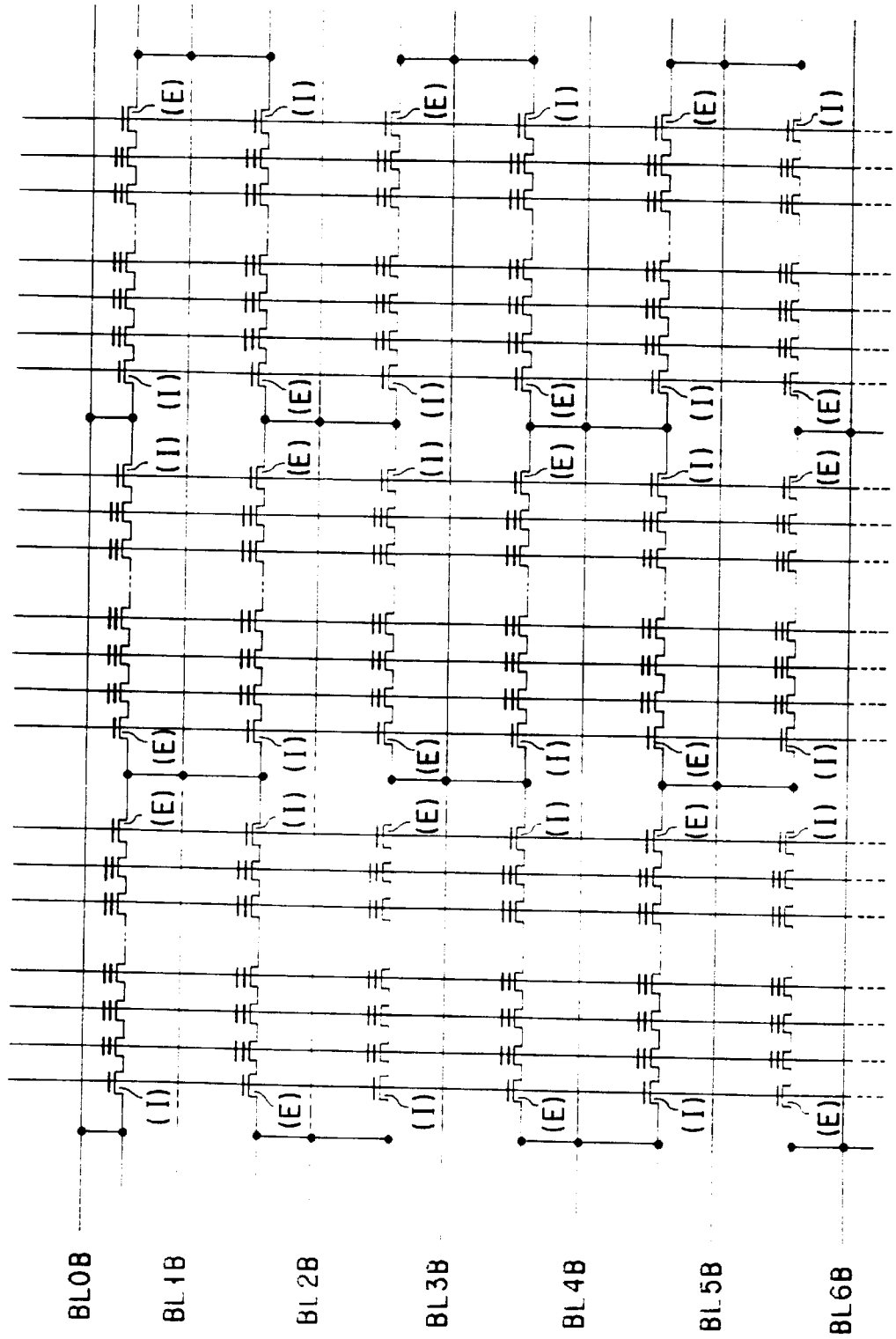

FIG. 49A shows the structure of memory cell array 1A and FIG. 49B shows the structure of memory cell array 1B. Unlike the conventional memory cell array (FIG. 3) where the source-side select gate (the second select gate) is connected to the source line of an n-type diffusion layer, the memory cell arrays of the present embodiment (FIGS. 49A and 49B) have the source-side select gates brought into contact with the bit lines. Furthermore, while in the conventional memory cell, two NAND cell columns share a single bit line contact, in the memory cell arrays of the seventh embodiment, however, four NAND cell columns share a single bit line contact, preventing the number of bit line contacts in the entire memory cell array from increasing from that in the conventional memory cell array.

Furthermore, in FIG. 49A, too, as in FIG. 11, a subarray composed of a plurality of memory cell units (NAND cells) is constructed in such a manner that first memory cell units where an I-type select MOS transistor STn1 (n=0, 1, 2, . . . ) is used at one end and an E-type select MOS transistor STn2 is used at the other end and second memory cell units where an E-type select MOS transistor STn1 is used at one end and an I-type select MOS transistor STn2 is used at the other end are arranged alternately in the word-line direction.

Figures 9A, 9B:
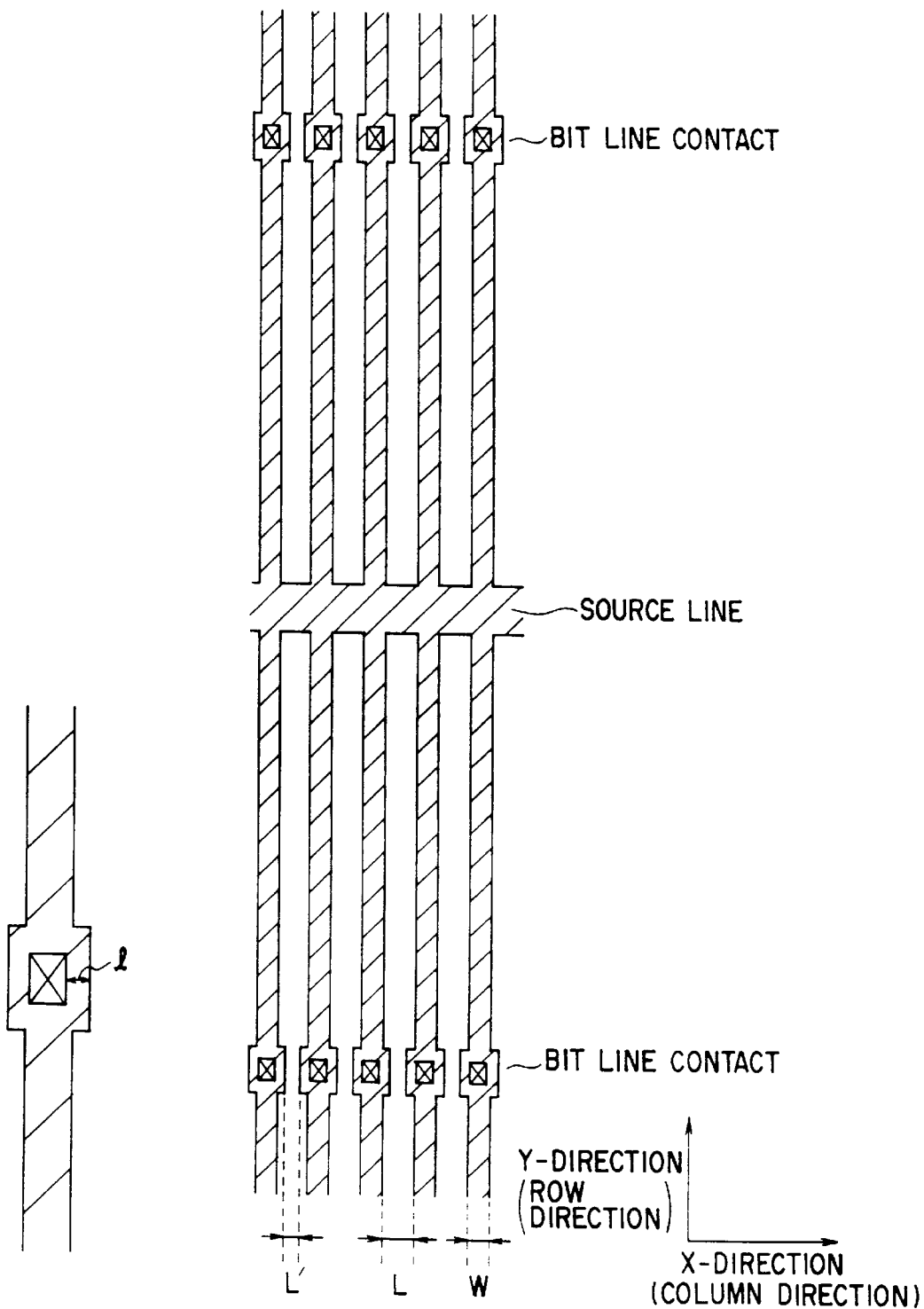
FIGS. 9A and 9B show the n-type diffusion layers, the source, gate, and drain regions of memory cells, and the contacts connecting n-type diffusion layers to bit lines in a memory cell array in a conventional NAND EEPROM.
Figure 50:
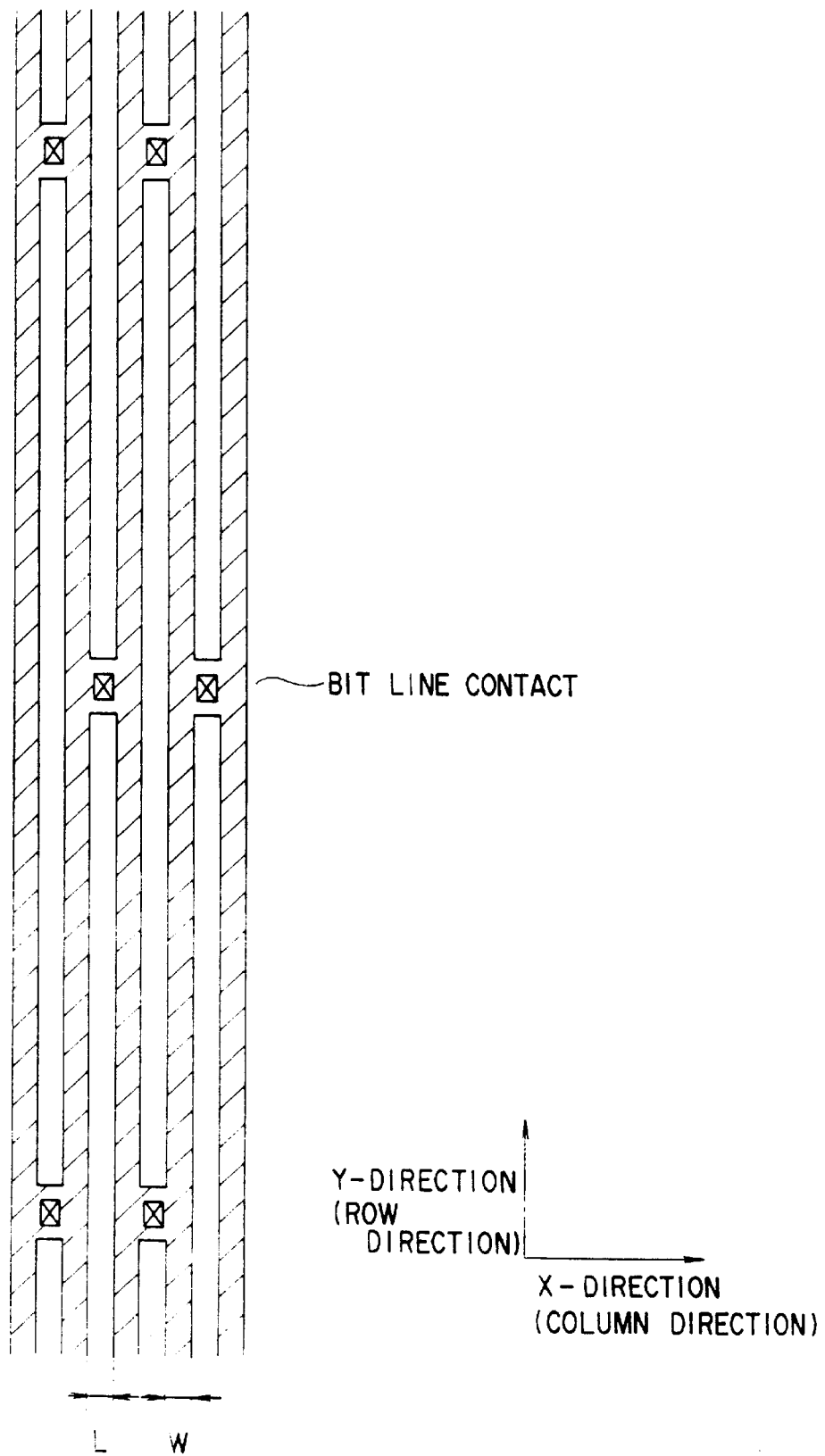
FIG. 50 shows the n-type diffusion layers, the source, gate, and drain regions of memory cells, and the contacts connecting n-type diffusion layers to bit lines in a memory cell array in the seventh embodiment.

FIG. 50 shows element areas in the seventh embodiment, containing n-type diffusion layers, the source, gate, and drain regions of memory cells, and contacts (bit line contacts) connecting the n-type diffusion layers to bit lines (e.g., Al). In the conventional memory cell array, bit-line contacts for adjacent bit lines are arranged adjacently as shown in FIG. 9, so that it is difficult to reduce the size in the column direction (the X direction in FIG. 9). With the memory cell array of the seventh embodiment, however, since bit-line contacts for adjacent bit lines are not arranged adjacently as shown in FIG. 50, the size of the element isolating area between bit-line contacts is not a problem in reducing the size of the memory cell array in the column direction (X direction). Therefore, the element isolation width between memory cells can be reduced to the minimum element isolating area width L0 determined by the field inversion withstand voltage between adjacent NAND cell columns and element isolation technology. Furthermore, select MOS transistors are used at a rate of two for a single NAND column as in the conventional equivalent, so that the area does not increase as a result of an increase in the number of select MOS transistors.

In the memory cell array of the seventh embodiment, there are provided two threshold voltages Vth1 and Vth2 (Vth1>Vth2) of select MOS transistors that connect a single NAND cell column to the bit lines. A select MOS transistor with a high threshold voltage of Vth1 (e.g., 2 V) is determined to be of the E-type and a select MOS transistor with a low threshold voltage of Vth2 (e.g., 0.5 V) is determined to be of the I-type. A voltage applied to the select gate that turns on both of the I-type transistor and the E-type transistor is determined to be a voltage of Vsgh (e.g., 3 V) (Vsgh>Vt1, Vt2). A voltage applied to the select gate that turns on the I-type transistor but turns off the E-type transistor is determined to be a voltage of Vsgl (e.g., 1.5 V) (Vt1>Vsgl>Vt2).

As described above, by providing two threshold voltages of select MOS transistor and two voltages applied to the select gate, one of adjacent NAND cell columns can be made conducting and the other be made nonconducting in a program operation or a read operation.

Using FIG. 49A, the read operation and the program operation will be explained concretely. <Read Operation>

When the data in memory cells $MC_{11}$, $MC_{31}$, $MC_{51}$, . . . in the first memory cell unit is read onto 10 bit lines $BL_{1A}$, $BL_{3A}$, $BL_{5A}$, . . . , bit line $BL_{1A}$, $BL_{3A}$, $BL_{5A}$, . . . are first precharged to a bit-line read potential of $V_A$ (e.g., 1.8 V) and bit lines $BL_{0A}$, $BL_{2A}$, $BL_{4A}$, $BL_{6A}$, . . . are grounded to 0 V. After the precharging has been completed, bit lines $BL_{1A}$, $BL_{3A}$, $BL_{5A}$, . . . are brought into the floating state.

Next, control gate CG1 is placed at 0 V, and CG2 to CG8 are placed at Vcc (e.g., 3 V). Then, control gate $SG_1$ is placed at Vsgl and select gate $SG_2$ is placed at Vsgh. The other select gates and control gates are placed at 0 V. In this case, the select MOS transistors ($ST_{02}$, $ST_{12}$, $ST_{22}$, $ST_{32}$, $ST_{42}$, $ST_{52}$, . . . ) connected to bit lines $BL_{0A}$, $BL_{2A}$, $BL_{4A}$, . . . turn on. On the other hand, the I-type select MOS transistors $ST_{11}$, $ST_{31}$, $ST_{51}$, . . . connected to bit lines $BL_{1A}$, $BL_{3A}$, $BL_{5A}$, . . . turn on, but the E-type select MOS transistors $ST_{01}$, $ST_{21}$, $ST_{41}$, . . . turn off.

Therefore, the data programmed into memory cells $MC_{11}$, $MC_{31}$, $MC_{51}$, . . . is "1", the precharged bit lines $BL_{1A}$, $BL_{3A}$, $BL_{5A}$, . . . discharge to the grounded bit lines $BL_{2A}$, $BL_{4A}$, $BL_{6A}$, . . . and drop from the precharge potential, thereby causing the data programmed in memory cells $MC_{11}$, $MC_{31}$, $MC_{51}$ . . . in the first memory cell unit to be read onto bit lines $BL_{1A}$, $BL_{3A}$, $BL_{5A}$, . . . On the other hand, when the data programmed into the memory cells is "0", bit lines $BL_{1A}$, $BL_{3A}$, $BL_{5A}$, . . . will not discharge and remain at the precharge potential.

On the other hand, because the E-type select MOS transistors $ST_{01}$, $ST_{21}$, $ST_{41}$, . . . connected to bit lines $BL_{1A}$, $BL_{3A}$, $BL_{5A}$, . . . turn off, the data in the memory cells $MC_{01}$, $MC_{21}$, $MC_{41}$. . . in the second memory cell unit is not read onto bit lines $BL_{1A}$, $BL_{3A}$, $BL_{5A}$, . . . .

When the data in the memory cells $MC_{01}$, $MC_{21}$, $MC_{41}$ lines $BL_{0A}$, $BL_{2A}$, $BL_{4A}$, $BL_{6A}$, . . . , bit lines $BL_{0A}$, $BL_{2A}$, $BL_{4A}$, $BL_{6A}$, . . . are precharged to a bit-line read potential $V_A$ (e.g., 1.8 V) and bit lines $BL_{1A}$, $BL_{3A}$, $BL_{5A}$, . . . are grounded to 0 V. After the precharging has been completed, lines $BL_{0A}$, $BL_{2A}$, $BL_{4A}$, $BL_{6A}$, . . . are brought into the floating state.

Next, control gate CG1 is placed at 0 V, and CG2 to CG8 are placed at Vcc (e.g., 3 V). Then, control gate $SG_1$ is placed at Vsgh and select gate is placed at Vsgl. The other select gates and control gates are placed at 0 V. In this case, the select MOS transistors ($ST_{01}$, $ST_{11}$, $ST_{21}$, $ST_{31}$, $ST_{41}$, $ST_{51}$, . . . ) connected to bit lines $BL_{1A}$, $BL_{3A}$, $BL_{5A}$, . . . turn on. The I-type select MOS transistors $ST_{02}$, $ST_{22}$, $ST_{42}$, . . . connected to bit lines $BL_{0A}$, $BL_{2A}$, $BL_{4A,\ BL_{6A}}$, . . . turn on, whereas the E-type select MOS transistors $ST_{12}$, $ST_{32}$, $ST_{52}$, . . . turn off.

When the data programmed into memory cells $MC_{01}$, $MC_{21}$, $MC_{41}$, . . . in the second memory cell unit is "1" the precharged bit lines $BL_{0A}$, $BL_{2A}$, $BL_{4A}$, $BL_{6A}$, . . . discharge to the grounded bit lines $BL_{1A}$, $BL_{3A}$, $BL_{5A}$, . . . and drop from the precharge potential, thereby causing the data programmed in memory cells $MC_{01}$, $MC_{21}$, $MC_{41}$... to be read onto bit lines $BL_{0A}$, $BL_{2A}$, $BL_{4A}$, ... On the other hand, when the data programmed into the memory cells is "0", bit lines $BL_{0A}$, $BL_{2A}$, $BL_{4A}$, ... will not discharge and remain at the precharge potential.

On the other hand, because the E-type select MOS transistors $ST_{12}$, $ST_{32}$, $ST_{52}$, ... connected to bit lines $BL_{2A}$, $BL_{4A}$, $BL_{6A}$, ... turn off, the data in the memory cells $MC_{11}$, $MC_{31}$, $MC_{51}$... in the first memory cell unit is not read onto bit lines $BL_{0A}$, $BL_{2A}$, $BL_{4A}$, As described above, in the seventh embodiment, the source lines (n-type diffusion layers) found in the conventional memory cell array are eliminated and instead, half of the bit lines are grounded in a read operation and play the same role as the conventional source lines, thereby reading the data in the memory cells onto the remaining half of the bit lines. By using bit lines formed of low-resistance A1 in place of conventional source lines formed of high-resistance n-type diffusion layers, the source-floating problem can be solved.

Using a timing chart, the read operation will be explained in more detail.

Figure 51:
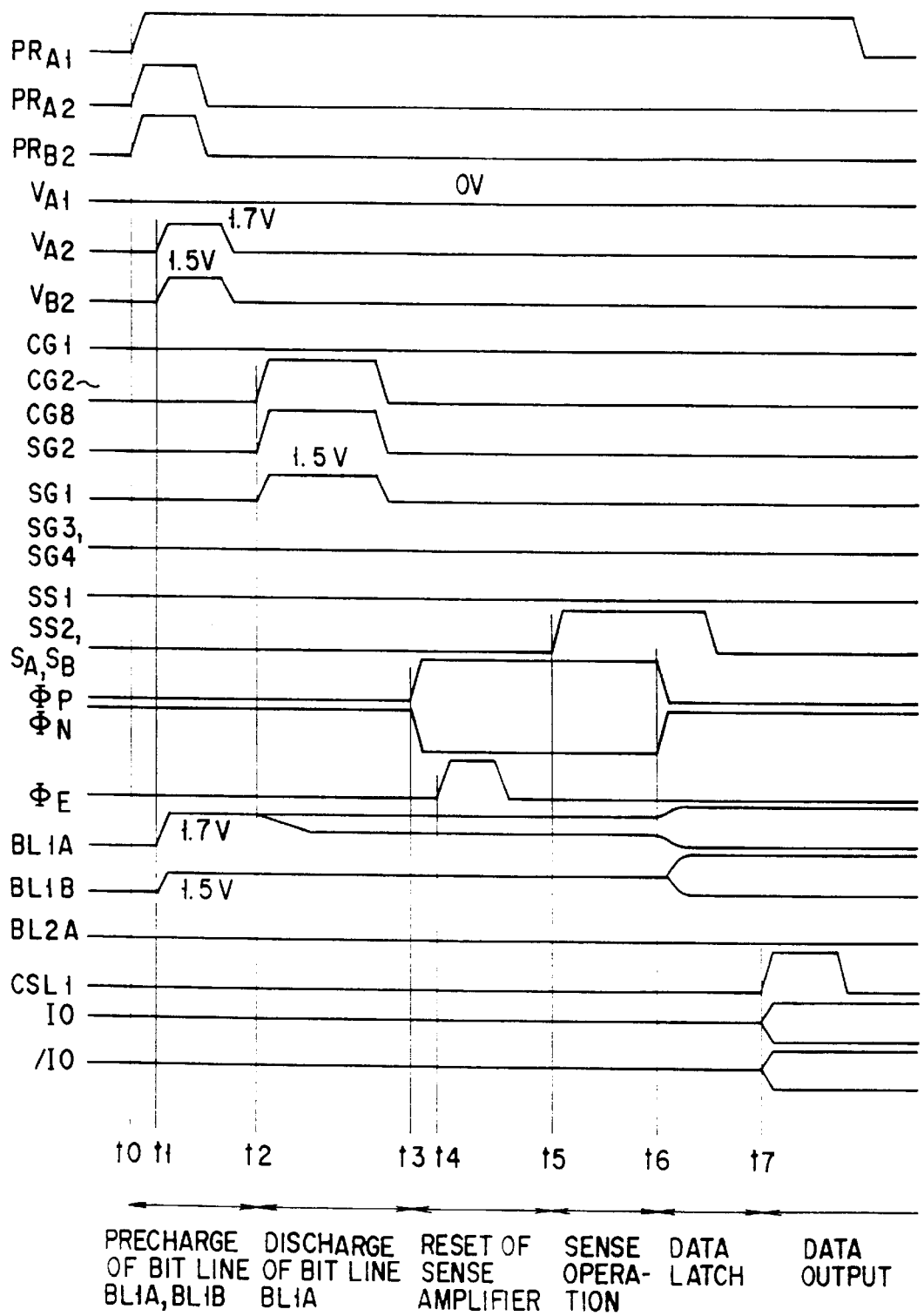
FIG. 51 is a timing chart to help explain the data read operation in the seventh embodiment.

FIG. 51 is a timing chart for reading the data programmed into the memory cells $MC_{11}$, $MC_{31}$, $MC_{51}$... in the first memory cell unit of FIG. 49A.

Figure 52A:
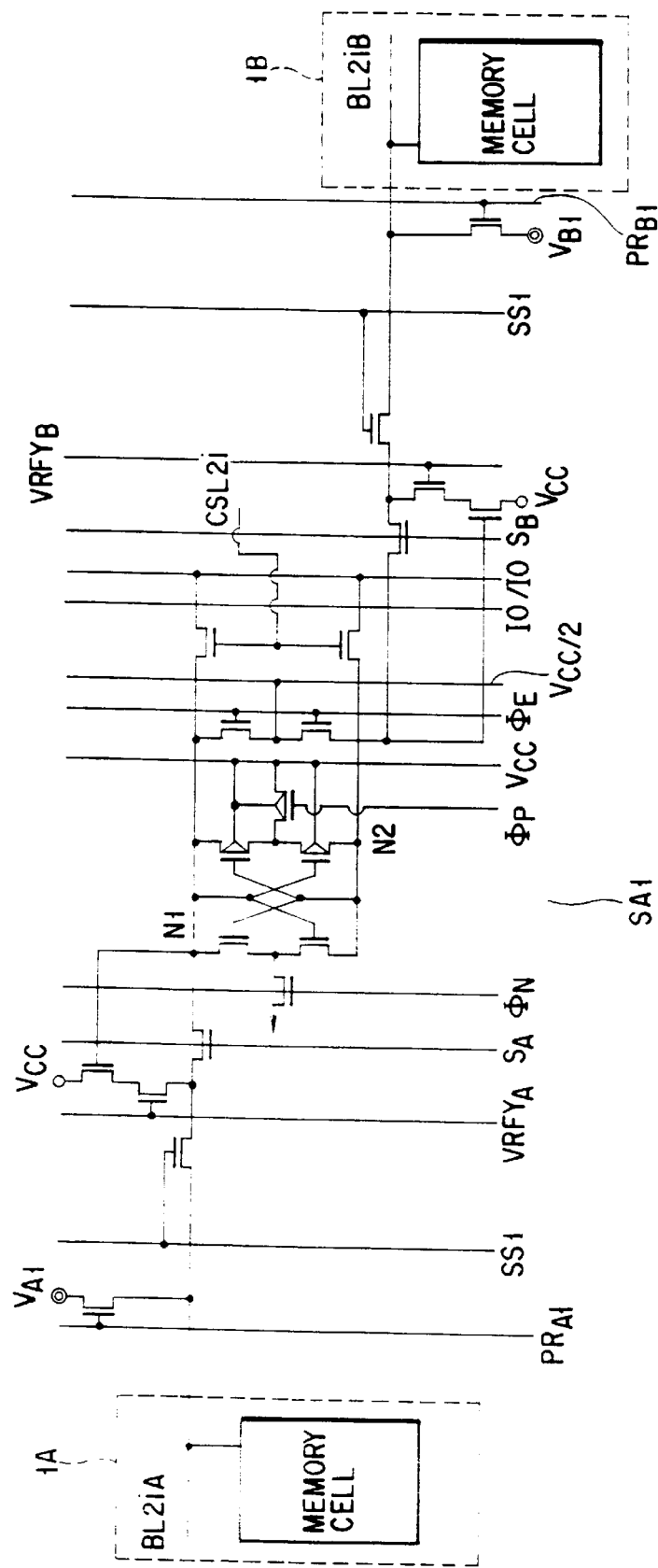
FIGS. 52A and 52B is circuit diagrams of the sense amplifier in the seventh embodiment.

Bit lines $BL_{0A}$, $BL_{2A}$, $BL_{4A}$, $BL_{6A}$, ... are connected to sense amplifier SA1 of FIG. 52A. Bit lines $BL_{1A}$, $BL_{3A}$, $BL_{5A}$, ... are connected to sense amplifier SA2 of FIG. 52B. The sense amplifiers are composed of CMOS flip-flops controlled by control signals $\phi_P$, $\phi_N$.

First, precharge signals $PR_{A1}$, $PRA_2$, $PR_{B2}$ change from Vss to Vcc (time t0), bit lines $BL_{1A}$, $BL_{3A}$, $BL_{5A}$, ... go to $V_{A2}$ (e.g., 1.7 V), and (dummy) bit lines $BL_{1B}$, $BL_{3B}$, $BLa_{5B}$, ... are precharged to $V_{B2}$ (e.g., 1.5 V) (time t1). $V_{A1}$, is 0 V and bit lines $BL_{0A}$, $BL_{2A}$, $BL_{4A}$, $BL_{6A}$, ... are grounded.

After the precharging has been completed, $PR_{A2}$, $PR_{B2}$ go to Vss, bringing bit lines $BL_{1A}$, $BL_{3A}$, $BL_{5A}$, ... into the floating state. Thereafter, row decoder 3 applies specified voltages to the select gate and the control gate (time 2). Control gate CG1 is at 0 V, CG2 to CG8 are at Vcc (e.g., 3 V), $SG_2$ is at 3 V (Vsgh), and $SG_1$ is at 1.5 V (Vsgl).

When the data programmed in the memory cells $MC_{11}$, $MC_{31}$, $MC_{51}$, ... is "0", the threshold voltages of the memory cells will be positive, so that no current will flow and the potential of bit lines $BL_{1A}$, $BL_{3A}$, $BL_{5A}$, current will flow, causing the potential of bit lines $BL_{1A}$, $BL_{3A}$, $BL_{5A}$, ... to drop to 1.5 V or below. Because select gate $SG_1$ is at 1.5 V, E-type select MOS transistors $ST_{01}$, $ST_{21}$, $ST_{41}$ turn off, preventing the data in the memory cells $MC_{01}$, $MC_{21}$, $MC_{41}$, ... in the second memory cell unit are not transferred to the bit lines. In the meantime, (dummy) bit lines $BL_{1B}$, $BL_{3B}$, $BL_{5B}$, ... are kept at the precharge potential of 1.5 V.

Thereafter, at time t3, $\phi_P$ goes to 3 V and $\phi_N$ goes to 0 V, deactivating CMOS flip-flop FF. At time t4, $\phi_E$ goes to 3 V, thereby equalizing CMOS flip-flop FF in sense amplifier SA2, placing nodes N1, N2 at Vcc/2 (e.g., 1.5 V). At time t5, $SS_2$, $S_A$, $S_B$ go to 3 V, connecting the bit line to the sense amplifier, and thereafter $\phi_{6\ N}$ rises from 0 V to 3 V and $\phi_P$ drops from 3 V to 0 V, causing the potential difference between bit lines $BL_{1A}$, $BL_{3A}$, $BL_{5A}$, ... and bit lines $BL_{1B}$, $BL_{3B}$, $BL_{5B}$, ... to be amplified (time t6).

Specifically, if "0" is programmed in memory cells $MC_{11}$, $MC_{31}$, $MC_{51}$, ..., node N1 in sense amplifier SA2 will be at 3 V and node N2 will be at 0 V. If "1" is programmed in memory cells $MC_{11}$, $MC_{31}$, $MC_{51}$, ..., node N1 will be at 0 V and node N2 will be at 3 V. Thereafter, when column select signal CSL rises from 0 V to 3 V, the data latched in the CMOS flip-flop is outputted to I/O, I/O' (time 7).

Bit lines $BL_{0A}$, $BL_{2A}$, $BL_{4A}$, $BL_{6A}$, ... are grounded to 0 V through the read operation. Namely, every other bit line is grounded. Therefore, the distance between reading bit lines is twice that in the case where the bit lines are not grounded, reducing noise attributable to the capacitive coupling between bit lines remarkably (Japanese Patent Application No. 4-276393). Furthermore, bit lines $BL_{0B}$, $BL_{2B}$, $BL_{4B}$, $BL_{6B}$, ... may be grounded by placing $PR_{B1}$ at Vcc and $V_{B1}$ at 0 V through a read operation. This makes it possible to reduce noise due to the capacitive coupling between bit lines in amplifying the potential of the bit line.

FIG. 53 is a timing chart for reading the data programmed into the memory cells $MC_{01}$, $MC_{21}$, $MC_{41}$, $MC_{61}$, ... in the second memory cell unit of FIG. 49A.

First, precharge signals $PR_{A1}$, $PRA_2$, $PR_{B1}$ change from Vss to Vcc (time t0), bit lines $BL_{0A}$, $BL_{2A}$, $BL_{4A}$, ... go to $V_{A1}$ (e.g., 1.7 V), and (dunuy) bit lines $BL_{0B}$, $BL_{2B}$, $BLa_{4B}$, ... are precharged to VBI (e.g., 1.5 V) (time t1). $V_{A2}$ is 0 V and Bit lines $BL_{1A}$, $BL_{3A}$, $BL_{5A}$, ... are grounded.

After the precharging has been completed, $PR_{A1}$, $PR_{B1}$ go to Vss, bringing bit lines $BL_{0A}$, $BL_{2A}$, $BL_{4A}$, ... into the floating state. Thereafter, row decoder 3 applies specified voltages to the select gate and the control gate (time 2). Control gate CG1 is at 0 V, CG2 to CG8 are at Vcc (e.g., 3 V), $SG_1$ is at 3 V (Vsgh), and $SG_2$ is at 1.5 V (Vsgl).

When the data programmed in the memory cells $MC_{01}$, $MC_{21}$, $MC_{41}$, ... is "0", the threshold voltages of the memory cells will be positive, so that no current will flow and the potential of bit lines $BL_{0A}$, $BL_{2A}$, $BL_{4A}$, current will flow, causing the potential of bit lines $BL_{0A}$, $BL_{2A}$, $BL_{4A}$, ... to drop to 1.5 V or below. Because select gate $SG_2$ is at 1.5 V, E-type select MOS transistors $ST_{12}$, $ST_{32}$, $ST_{52}$ turn off, preventing the data in the memory cells $MC_{11}$, $MC_{31}$, $MC_{51}$, ... in the first memory cell unit are not transferred to the bit lines. In the meantime, (dummy) bit lines $BL_{0B}$, $BL_{2B}$, $BL_{4B}$, ... are kept at the precharge potential of 1.5 V.

Thereafter, at time t3, $\phi_P$ goes to 3 V and $\phi_N$ goes to 0 V, deactivating CMOS flip-flop FF. At time t4, $\phi_E$ goes to 3 V, thereby equalizing CMOS flip-flop FF in sense amplifier SA1, placing nodes N1, N2 at Vcc/2 (e.g., 1.5 V). At time t5, $SS_1$, $S_A$, $S_B$ go to 3 V, connecting the bit line to the sense amplifier, and thereafter $\phi_N$ rises from 0 V to 3 V and $\phi_P$ drops from 3 V to 0 V, causing the potential difference between bit lines $BL_{0A}$, $BL_{2A}$, $BL_{4A}$, ... and bit lines $BL_0$B, $BL_{2B}$, $BL_{4B}$, ... to be amplified (time t6).

If "0" is programmed in memory cells $MC_{01}$, $MC_{21}$, $MC_{41}$, ..., node N1 in sense amplifier SA1 will be at 3 V and node N2 will be at 0 V. If "1" is programmed in memory cells MCOI, $MC_{21}$, $MC_{41}$, ..., node N1 will be at 0 V and node N2 will be at 3 V. Thereafter, when column select signal CSL rises from 0 V to 3 V, the data latched in the CMOS flip-flop is outputted to I/O, I/O' (time 7).

Bit lines $BL_{1A}$, $BL_{3A}$, $BL_{5A}$, . are grounded to 0 V through the read operation, thereby reducing noise stemming from the capacitive coupling between bit lines.

Figure 54:
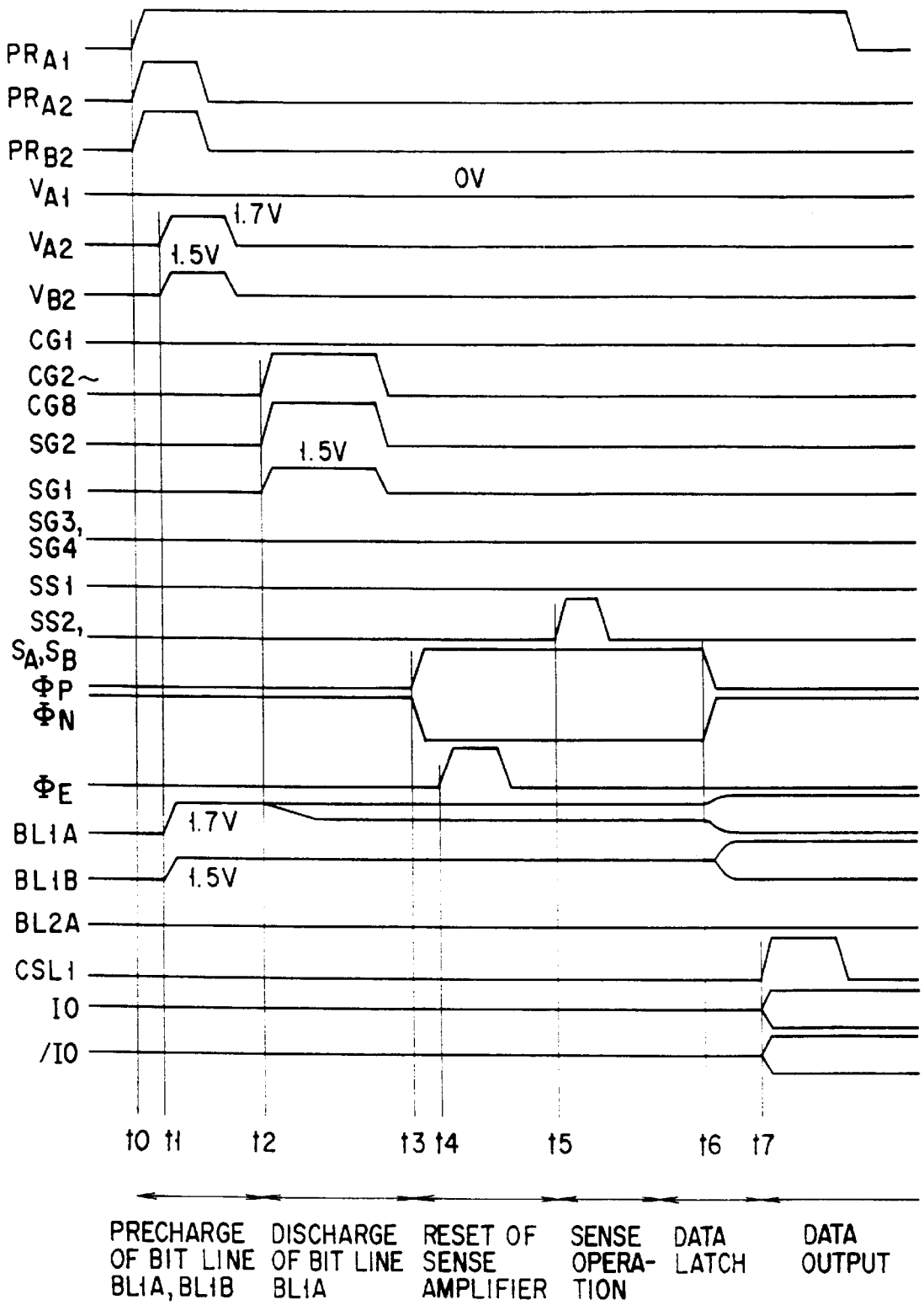
FIG. 54 is a timing chart to help explain the data read operation in the seventh embodiment.

The timing for reading is arbitrary. For example, at time t5, as shown in FIG. 54, the transfer gate connecting the bit lines to the sense amplifier may be turned on to transfer the potentials of the bit lines and dummy bit lines to nodes N1, N2 and then be turned off. In this case, because the bit lines and dummy bit lines are disconnected from the sense amplifier, the load capacity of the sense amplifier decreases, so that the potential of nodes N1, N2 is determined rapidly at the time of sensing and latching.

In the seventh embodiment, for example, when memory cells $MC_{11}$, $MC_{31}$, $MC_{51}$, . . . are read from, bit lines $BL_{1A}$, $BL_{3A}$, $BL_{5A}$, . . . are precharged and bit lines $BL_{0A}$, $BL_{2A}$, $BL_{4A}$, . . . are grounded, thereby causing the data in the memory cells to be read onto bit lines $BL_{1A}$, $BL_{3A}$, $BL_{5A}$, . . . Which of the bit lines connected to both ends of the memory cell unit the data is read onto is arbitrary. For example, when memory cells $MC_{11}$, $MC_{31}$, $MC_{51}$, . . . are read from, bit lines $BL_{2A}$, $BL_{4A}$, $BL_{6A}$, . . . are precharged and bit lines $BL_{1A}$, $BL_{3A}$, $BL_{5A}$, . . . are grounded, thereby causing the data in the memory cells to be read onto bit lines $BL_{2A}$, $BL_{4A}$, $BL_{6A}$, . . .

<Program Operation>

Hereinafter, the program operation in the seventh embodiment will be described.

Explanation will be given about the procedure for programming the data into memory cells $MC_{11}$, $MC_{31}$, $MC_{51}$, . . . in the first memory cell unit of FIG. 49A.

Select gate $SG_2$ is placed at 0 V, causing all of the select MOS transistors using select gate $SG_2$ as an gate electrode to turn off. $SG_1$, $CG_1$ to $CG_8$ are placed at Vcc and bit lines $BL_{1A}$, $BL_{3A}$, $BL_{5A}$, . . . are placed at Vcc, precharging the channel for the page to be written into to Vcc–Vth (lower than the bit-line potential Vcc because of a drop in the threshold voltage of the select MOS transistor). In this case, channel may be charged by setting the potential of select gate $SG_1$ to the potential larger than Vcc. Bit lines $BL_{0A}$, $BL_{2A}$, $BL_{4A}$, . . . may be placed at Vcc or 0 V, or may be placed at a given potential.

Thereafter, when select gate $SG_1$ is placed at Vsgl (e.g., 1.5 V), the I-type select MOS transistors $ST_{11}$, $ST_{31}$, $ST_{51}$, . . . turn on, but the E-type select MOS transistors $ST_{01}$, $ST_{21}$, $ST_{41}$, . . . turn off, bringing the channels of thememory cells $MC_{01}$, $MC_{21}$, $MC_{41}$, . . . into the floating state at a potential of Vcc–Vth. The data programmed into the memory cells $MC_{11}$, $MC_{31}$, $MC_{51}$, . . . is supplied from bit lines $BL_{1A}$, $BL_{3A}$, $BL_{5A}$, For example, when "0" is programmed into memory cell $MC_{11}$, bit line $BL_{1A}$ is placed at 0 V, turning on I-type select MOS transistor $ST_{11}$, placing the channel of memory cell $MC_{11}$ at 0 V. When "1" is programmed into memory cell $MC_{11}$, bit line $BL_{1A}$ is placed at 3 V, turning off I-type select MOS transistor $ST_{11}$, bringing the channel of memory cell $MC_{11}$ into the floating state at Vcc–Vth. Bit lines $BL_{0A}$, $BL_{2A}$, $BL_{4A}$, . . . may be place at Vcc or 0 V or may be placed at a given voltage.

After select gate $SG_1$ has been changed from Vcc to Vsgl (a voltage higher than the threshold voltage of the I-type select MOS transistor but lower than the threshold voltage of the E-type select MOS transistor, for example, 1.5 V), control gates $CG_1$ to $CG_8$ are changed from vcc to an intermediate potential $V_M$ (about 10 V). Since the channels of memory cells $MC_{01}$, $MC_{21}$, $MC_{41}$, . . . not to be programmed into and the channels of memory cells $MC_{11}$, $MC_{31}$, $MC_{51}$, . . . to be programmed into are in the floating state, they are raised from Vcc–Vth to the intermediate potential (about 10 V) through the capacitive coupling between the control gate and the channel. The channels of memory cells $MC_{11}$, $MC_{31}$, $MC_{51}$, .;. into which "0" is programmed are at 0 V because the bit lines are at 0 V.

After the channels of unselected memory cells in programming and memory cells into which "1" is programmed have risen from Vcc–Vth to the intermediate potential, control gate $CG_1$ is raised from the intermediate potential of $V_M$ to a program voltage of Vpp (20 V). Then, because the channels of memory cells $MC_{01}$, $MC_{21}$, $MC_{41}$, . . . . not to be programmed into in the second memory cell unit and the channels of memory cells $MC_{11}$, $MC_{31}$, $MC_{51}$, . . . to be programmed into are at the intermediate potential (about 10 V) and the control gate $CG_1$ is at Vpp (about 20 V), these memory cells are not programmed into. However, the channels of memory cells $MC_{11}$, $MC_{31}$, $MC_{51}$, . . . into which "0" is programmed are at 0 V and the control gate is at Vpp (about 20 V), electrons are injected from the substrate into the floating gate, thereby programming "0".

Using a timing chart, the program operation in the seventh embodiment will be explained in more detail. FIGS. 55A and 55B are timing charts for programming the data into memory cell $MC_{11}$ (and memory cells $MC_{31}$, $MC_{51}$, . . . ).

Figure 52B:
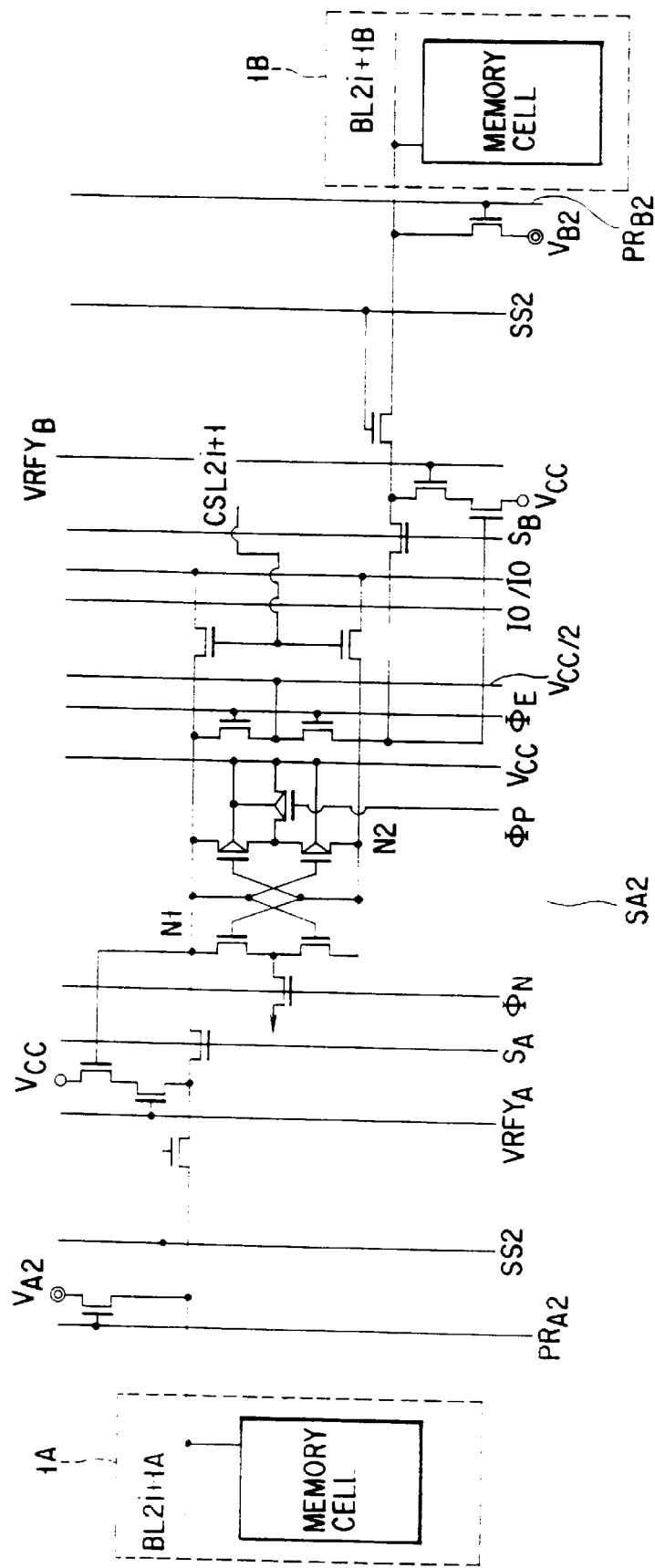

The data programmed into memory-cells $MC_{11}$, $MC_{31}$, $MC_{51}$, . . . in the first memory cell unit is latched in a sense amplifier circuit (SA2 of FIG. 52B). Namely, when "0" is programmed, node N1 is at 0 V and node N2 is at 3 V. When "1" is programmed, node N1 is at 3 V, and node N2 is at 0 V.

When a program operation starts, $SG_1$ is placed at Vss, and $SG_2$, $CG_1$ to $CG_8$ are placed at Vcc. In the seventh embodiment, when the data is programmed into memory cells $MC_{11}$, $MC_{31}$, $MC_{51}$, . . . in the first memory cell unit, the data will not be programmed into memory cells $MC_{01}$, $MC_{21}$, $MC_{41}$, . . . in the second memory cell unit. To achieve this, the channels of memory cells $MC_{01}$, $MC_{21}$, $MC_{41}$, . . . must be charged from bit lines $BL_{0A}$, $BL_{2A}$, $BL_{4A}$, . . .

In the seventh embodiment, bit lines $BL_{0A}$, $BL_{2A}$, $BL_{4A}$, . . . are charged from $V_{A1}$ of sense amplifier SA1 of FIG. 52A to Vcc. As a result, the channels of memory cells $MC_1$, $MC_{21}$, $MC_{41}$, . . . are charged to Vcc–Vth. At this time, the channels of memory cells $MC_{11}$, $MC_{31}$, $MC_{51}$, . . . are also charged to Vcc–Vth. In this way, the channel of the memory cells in the second memory cell unit may be charged to Vcc (–Vth) from bit lines $BL_{0A}$, $BL_{2A}$, $BL_{4A}$, . . . or from bit lines $BL_{1A}$, $BL_{3A}$, $BL_{5A}$, . . .

On the other hand, either Vcc or Vss (0 V) is applied to bit lines $BL_{1A}$, $BL_{3A}$, $BL_{5A}$, . . . according to the data latched in the sense amplifier circuit SA2. With this, when "0" is programmed into memory cell $MC_{11}$, bit line $BL_{1A}$ is placed at 0 V, placing the channel of memory cell $MC_1$, at 0 V. When "1" is programmed into memory cell $MC_{11}$, bit line $BL_{1A}$ is placed at Vcc (e.g., 3 V), charging the channel of memory cell $MC_{11}$ at Vcc–Vth.

After the bit line has been charged. select gate $SG_1$ is placed at Vsgl (e.g., 1.5 V) and $SG_2$ is at Vss (e.g., 0 V). All of the select MOS transistors whose gate electrode is select gate $SG_2$ are turned off. Since the select MOS transistors connected to memory cells $MC_{01}$, $MC_{21}$, $MC_{41}$, . . . not to be programmed into are of the E-type, they are off, bringing the channels of memory cells $MC_{01}$, $MC_{21}$, $MC_{41}$, . . . into the floating state at Vcc–Vth.

Because the memory cell-side drains of the select MOS transistors $ST_{11}$, $ST_{31}$, $ST_{51}$, . . . of the memory cells $MC_{11}$, $MC_{31}$, $MC_{51}$, . . . into which "1" is programmed are at Vcc–Vth (e.g., if the threshold voltage including the substrate bias effect of the I-type transistor is 0.8 V, 3–0.8=2.2 V will be given), the bit-line contact-side sources are at Vcc (e.g., 3 V), and select gate $SG_1$ is at Vsgl (e.g., 1.5 V), select MOS transistors $ST_{11}$, $ST_{31}$, $ST_{51}$, . . . turn off. As a result, like the unselected cells in programming, the channels of memory cells $MC_{11}$, $MC_{31}$, $MC_{51}$, . . . are in the floating state.

When "0" is programmed into memory cells $MC_{11}$, $MC_{31}$, $MC_{51}$, . . . , because the select gates $SG_1$ of select MOS transistors $ST_{11}$, $ST_{31}$, $ST_{51}$, . . . are at Vsgl (e.g., 1.5

V) and the sources and drains are at 0 V, select MOS transistors $ST_{11}$, $ST_{31}$, $ST_{51}$ turn on, keeping the channels of the memory cells at 0 V.

After select gate $SG_1$ has been placed at Vsgl (about 1.5 V), control gates $CG_1$ to $CG_8$ are changed from Vcc to an intermediate potential $V_M$ (about 10 V) at time t2. Since the channels of memory cells $MC_{01}$, $MC_{21}$, $MC_{41}$, ... not to be programmed into and the channels of memory cells $MC_{11}$, $MC_{31}$, $MC_{51}$, ... into which "1" is programmed are in the floating state, they are raised from Vcc–Vth to the intermediate potential (about 10 V) through the capacitive coupling between the control gate and the channel. The channels of memory cells $MC_{11}$, $MC_{31}$, $MC_{51}$, ... into which "0" is programmed are at 0 V because the bit lines are at 0 V.

After the channels of unselected memory cells in programming and memory cells into which "1" is programmed have risen from Vcc–Vth to the intermediate potential, control gate $CG_1$ is raised from the intermediate potential of $V_M$ to a program voltage of Vpp (20 V) at time 3. Then, because the channels of memory cells $MC_{01}$, $MC_{21}$, $MC_{41}$, ... not to be programmed into and the channels of memory cells $MC_{11}$, $MC_{31}$, $MC_{51}$, ... into which "1" is programmed are at the intermediate potential (about 10 V) and the control gate $CG_1$ is at Vpp (about 20 V), these memory cells are not programmed into. However, the channels of memory cells $MC_{11}$, $MC_{31}$, $MC_{51}$, ... into which "0" is programmed are at 0 V and the control gate is at Vpp (about 20 V), electrons are injected from the substrate into the floating gate, thereby programming "0".

After the programming has been completed, the control gates, select gates, and bit lines are discharged one after another, which completes the program operation.

After the programming, the following verify operation will be carried out to see if the programming has been done sufficiently.

Precharge signals $PR_A$, $PRA_2$, $PRB_2$ change from Vss to Vcc (time t4), bit lines $BL_{1A}$, $BL_{3A}$, $BL_{5A}$, ... go to $V_{A2}$ (e.g., 1.7 V), and (dummy) bit lines $BL_{1B}$, $BL_{3B}$, $BLa_{5A}$, ... are precharged to $VB_2$ (e.g., 1.5 V) (time t5). $V_A$, is 0 V and bit lines $BL_{0A}$, $BL_{2A}$, $BL_{4A}$, $BL_{6A}$, After the precharging has been completed, $PR_{A2}$, PRB2 go to Vss, bringing bit lines $BL_{1A}$, $BL_{3A}$, $BL_{5A}$, applies specified voltages to the select gate and the control gate (time t6). Control gate CG1 is at 0 V, CG2 to CG8 are at Vcc (e.g., 3 V), $SG_2$ is at 3 V (Vsgh), and $SG_1$ is at 1.5 V (Vsgl). When the data programmed in the memory cells $MC_{11}$, $MC_{31}$, $MC_{51}$, ... is "0", the threshold voltages of the memory cells will be positive, so that no current will flow and the potential of bit lines $BL_{1A}$, $BL_{3A}$, $BL_{5A}$, ... will remain at 1.7 V. When the data is "1", a cell current will flow, causing the potential of bit lines $BL_{1A}$, $BL_{3A}$, $BL_{5A}$, ... to drop to 1.5 V or below. Because select gate $SG_1$ is at 1.5 V, E-type select MOS transistors $ST_{01}$, $ST_{21}$, $ST_{41}$ turn off, preventing the data in the memory cells $MC_{01}$, $MC_{21}$, $MC_{41}$, ... are not transferred to the bit lines.

After the bit lines have discharged, verify signal $VRFY_A$ goes to 3 V (time t7). When the data to be programmed into memory cells $MC_{11}$, $MC_{31}$, $MC_{51}$, . is "1", bit lines $BL_{1A}$, $BL_{3A}$, $BL_{5A}$, ... are charged to about 3 V. Here, the voltage level of charging by the verify signal is equal to or higher than the precharge voltage of 1.5 V for bit lines $BL_{jB}$ (j=1, 3, 5, . . . ).

In the meantime, (dummy) bit lines $BL_{1B}$, $BL_{3B}$, $BL_{5B}$, ... are precharged to the precharge voltage of 1.5 V.

Thereafter, at time t8, $\phi_P$ goes to 3 V and $\phi_N$ goes to 0 V, deactivating CMOS flip-flop FF. At time t9, ... $\phi_E$ goes to 3 V, thereby equalizing CMOS flip-flop FF in sense amplifier SA2, placing nodes N1, N2 at Vcc/2 (e.g., 1.5 V). At time t10, $SS_2$, $S_A$, $S_B$ go to 3 V, connecting the bit line to the sense amplifier, and thereafter $\phi_N$ rises from 0 V to 3 V and $\phi_P$ drops from 3 V to 0 V, causing the potential difference between bit lines $BL_{1A}$, $BL_{3A}$, $BL_{5A}$, ... and bit lines $BL_{1B}$, $BL_{3B}$, $BL_{5B}$, ... to be amplified (time t6). Then, the reprogramming data is latched in the sense amplifier (time t11).

Bit lines $BL_{0A}$, $BL_{2A}$, $BL_{4A}$, $BL_{6A}$. .. are grounded to 0 V through the verify read operation. Namely, every other bit line is grounded.

As described above, with the present invention, because low-resistance bit lines are used as source lines, the floating of the source lines reduces remarkably, which not only shortens the random access time, but also reduces variations in the threshold voltage in a program operation due to circuit factors. Furthermore, since adjacent NAND cell columns share no source lines, the data in the memory cell cannot be read erroneously on account of the data in the adjacent memory cells.

As described in the above embodiment, the channels of the memory cells are charged to Vcc–Vth at the beginning of writing. The charging method is arbitrary. In the above embodiment, when the data is programmed into memory cells $MC_{11}$, $MC_{31}$, $MC_{51}$, select gate $SG_1$ is place at Vss, $SG_2$ is placed at Vcc, bit lines $BL_{0A}$, $BL_{2A}$, $BL_{4A}$, ... are placed at Vcc, allowing bit lines $BL_{0A}$, $BL_{2A}$, $BL_{4A}$, ... to charge memory cells $MCO_{01}$, $MC_{21}$, $MC_{31}$, $MC_{41}$, $MC_{51}$, ... In addition to this method, for example, by charging bit lines $BL_{0A}$, $BL_{1A}$, $BL_{2A}$, $BL_{3A}$, ... to Vcc to place $SG_1$, $SG_2$, $CG_1$ to $CG_8$ at Vcc, the channels of memory cells $MC_{01}$, $MC_{11}$, $MC_{21}$, $MC_{31}$, ... may be charged to Vcc (–Vth) from the bit lines at both ends to which the NAND column is connected.

By placing bit lines $BL_{1A}$, $BL_{3A}$, $BL_{5A}$, ... at Vcc, $SG_2$ at Vss, and $SG_1$ and $CG_1$ to $CG_8$ at Vcc, the channels of memory cells $MC_{01}$, $MC_{11}$, $MC_{21}$, $MC_{31}$, . . . may be charged from bit lines $BL_{1A}$, $BL_{3A}$, $BL_{5A}$, ...

Furthermore, $SG_1$ and $SG_2$ may be both placed at Vsgl and bit lines $BL_{0A}$, $BL_{2A}$, $BL_{4A}$, ... be placed at Vcc. In this case, the I-type select MOS transistors of $SG_1$ and $SG_2$ turn on, whereas the E-type select MOS transistors of $SG_1$ and $SG_2$ turn off. This enables bit lines $BL_{0A}$, $BL_{2A}$, $BL_{4A}$, ... to transfer a writing potential (Vcc for "1" programming and Vss for "0" programming) to memory cell unit 2 and bit lines $BL_{1A}$, $BL_{3A}$, $BL_{5A}$, ... of the unselected potential (Vcc) for writing to transfer a writing potential to memory cell unit 1 almost at the same time.

In the above embodiment, the data is programmed into a half page of memory cells simultaneously. For example, when the data is programmed into memory cells $MC_{11}$, $MC_{31}$, $MC_{51}$, ..., the programming data is transferred from bit lines $BL_{1A}$, $BL_{3A}$, $BL_{5A}$, ..., memory cells $MC_{01}$, $MC_{21}$, $MC_{41}$, ... are not programmed into, bit lines $BL_{0A}$, $BL_{2A}$, $BL_{4A}$, ... are kept at a constant potential, such as Vcc or 0 V. On the other hand, when the data is programmed into memory cells $MC_{01}$, $MC_{21}$, $MC_{41}$, ..., the programming data is transferred from bit lines $BL_{0A}$, $BL_{2A}$, $BL_{4A}$, ..., memory cells $MC_{11}$, $MC_{31}$, $MC_{51}$, ... are not programmed into, bit lines $BL_{1A}$, $BL_{3A}$, $BL_{5A}$, ... are kept at a constant potential, such as Vcc or 0 V.

Figure 56:
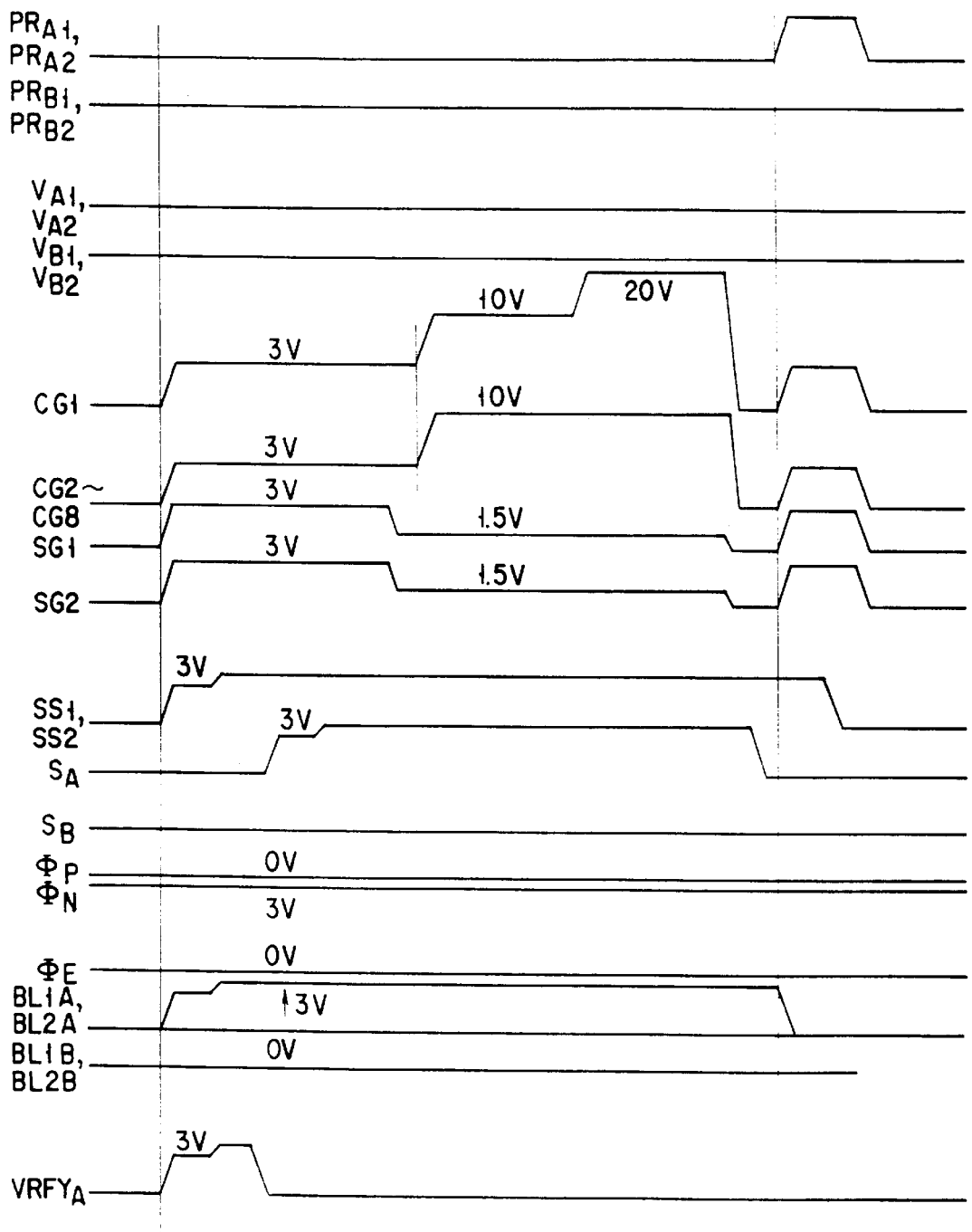
FIG. 56 is a timing chart to help explain the data program operation in the seventh embodiment.

While in the above embodiment, the data can be programmed into a half page of memory cells almost at the same time, the present invention also enables a page of memory cells almost at the same time. For example, select gates $SG_1$, $SG_2$ may be placed at Vsgl (e.g., 1.5 V) (FIG. 56). Then, the E-type select MOS transistors using select gates $SG_1$, $SG_2$ as gate electrodes turn off, whereas the I-type select MOS transistors turn on. The programming data in memory cells $MC_{11}$, $MC_{31}$, $MC_{51}$, . . . is transferred from bit lines $BL_{1A}$, $BL_{3A}$, $BL_{5A}$, . . . That is, when "0" is programmed, the bit lines and the channels of the memory cells to be programmed into are placed at 0 V. When "1" is programmed, the bit lines are placed at Vcc and the channels are in the floating state at Vcc–Vth. Similarly, the programming data in memory cells $MC_{01}$, $MC_{21}$, $MC_{41}$, . . . is transferred from bit lines $BL_{0A}$, $BL_{2A}$, $BL_{4A}$, . . .

As described above, in the embodiment, since the number of bit lines arranged in the column direction is almost the same as the number of NAND cell columns in the column direction, a page of data can be written almost simultaneously by supplying the data to be programmed into the memory cells to the bit lines. After the program operation, verify reading is effected to see if the programming has been done sufficiently. In the verify read operation, the data in a single memory cell is read out using two bit lines. That is, a half page of data is read out almost at the same time.

Therefore, in a method of writing a page of data almost simultaneously, two verify operations are carried out for each program operation. In a method of carrying out two verify operation for each program operation, the total time required to write a page of data is about Tpr+2Tvfy (where Tpr is the program pulse width and Tvfy is the time required for a verify read operation). On the other hand, in a method of writing a half page of data almost at the same time, the total write time required to write a page of data is about 2(Tpr+Tvfy). Therefore, the method of writing a page of data simultaneously enables a faster program operation.

Figure 57A:
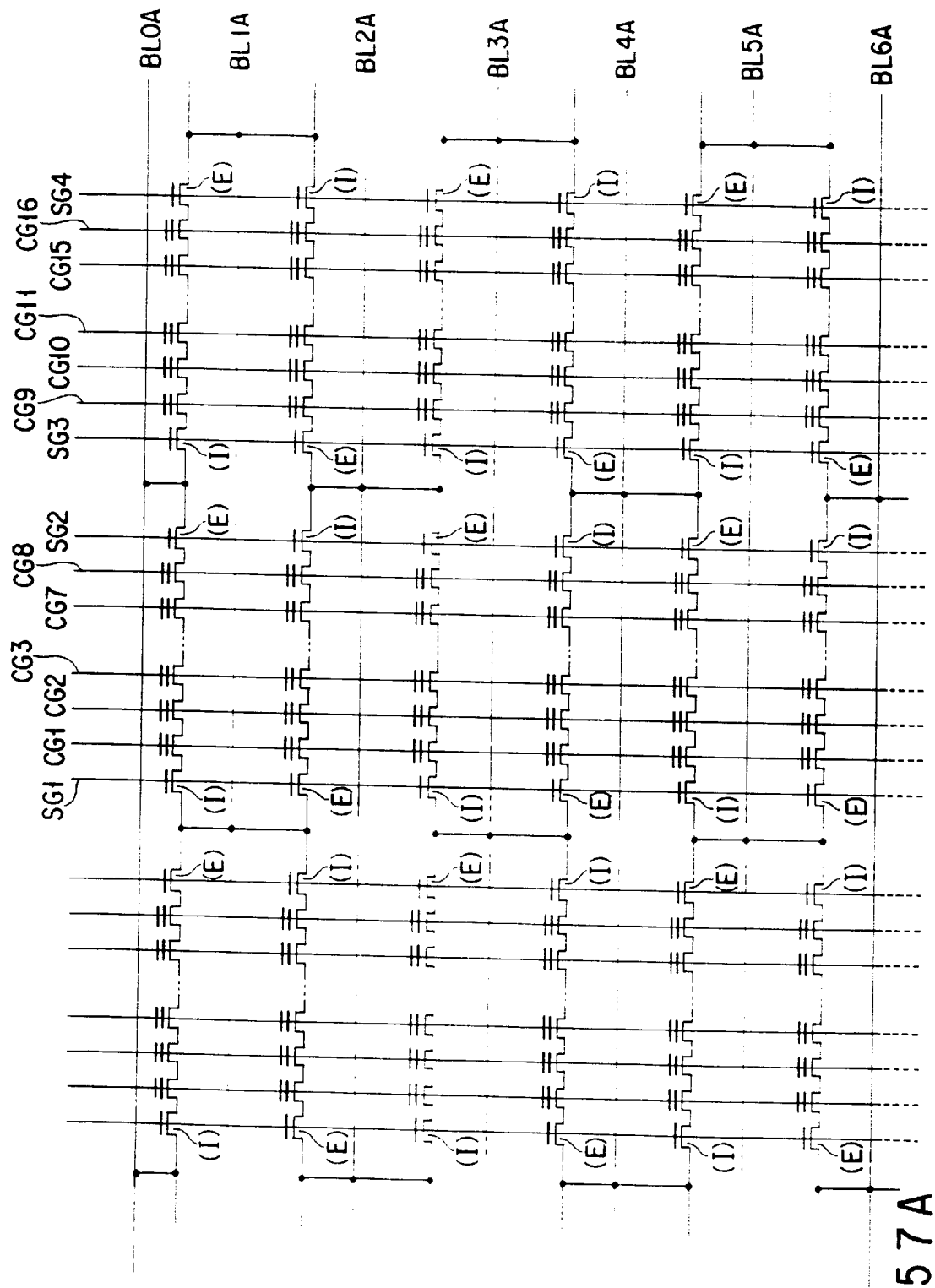
FIGS. 57A and 57B show memory cell array structures in the seventh embodiment.
Figure 57B:
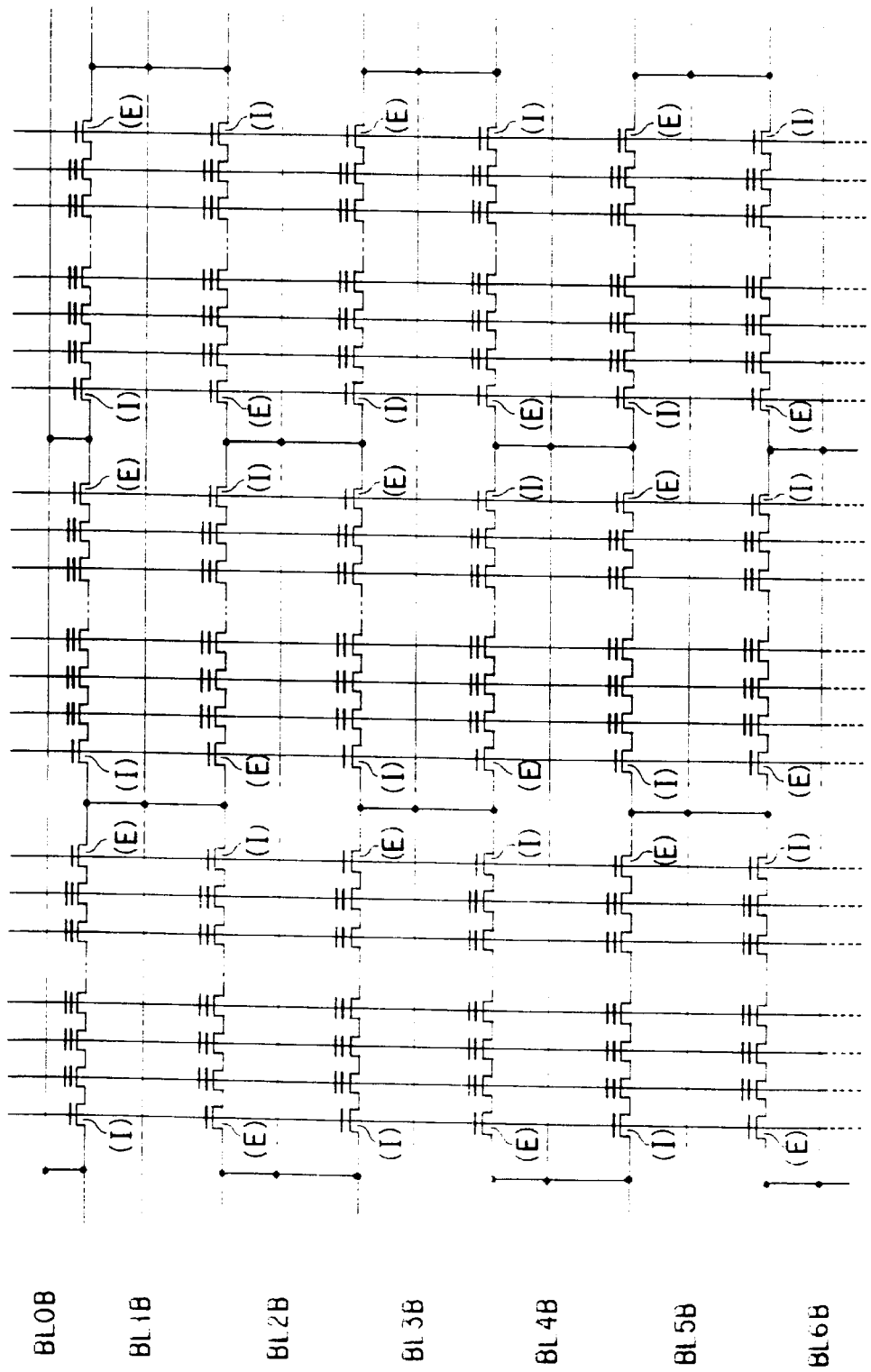

In the present invention, the select MOS transistors in two NAND columns sharing the bit-line contacts and select gates (e.g., the select MOS transistors $ST_{12}$ and $ST_{22}$, $ST_{32}$ and $ST_{42}$ shown in FIG. 49A) have only to have different threshold voltages. The way of setting the threshold voltages of select MOS transistors is arbitrary. While in FIGS. 49A and 49B, the threshold voltages of select MOS transistors $ST_{02}$, $ST_{03}$, $ST_{12}$, $ST_{13}$, $ST_{22}$, $ST_{23}$ are set at almost the same value, one select MOS transistor may be of the I-type and the other select MOS transistor may be of the E-type as shown in FIGS. 57A and 57B, for example.

Figure 58:
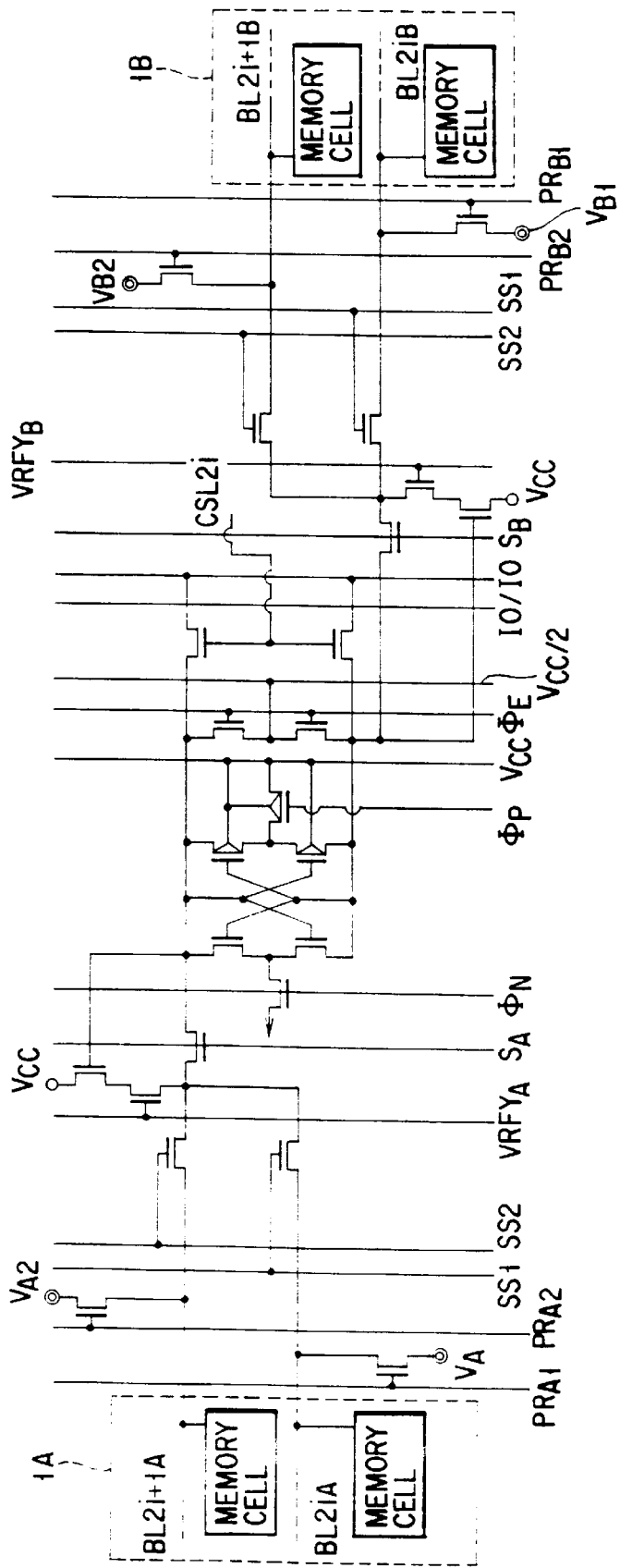
FIG. 58 is a circuit diagram of the sense amplifier in the seventh embodiment.

While in the above embodiment, a sense amplifier is provided for each bit line, a sense amplifier may be provided for every two bit lines, or of what is called a common sense amplifier system (FIG. 58). In this case, a timing chart for reading is almost the same as that in the above embodiment (e.g., FIG. 51, 55A, or 55B).

With the invention, some of the select MOS transistors sharing a single select gate are made conducting and the other are made nonconducting. Use of two such select gates makes it easy to realize selected memory cells and unselected memory cells among the memory cells sharing the same select gate.

Therefore, the threshold voltage of the select MOS transistor and the voltage applied to the select gate are arbitrary. The select MOS transistor at one end of the memory cell has two threshold voltages of Vtd1, Vtd2 (Vtd1>Vtd2) and two voltages applied to its select gate of Vsghd (Vsghd>Vtd1), Vsgld (Vtd1>Vsgld>Vtd2). The select MOS transistor at the other end of the memory cell has two threshold voltages of Vts1, Vts2 (Vts1>Vts2) and two voltages applied to its select gate of Vsghs (Vsghs>Vts1), Vsgls (Vts1>Vsgls>Vts2). Unlike the above embodiment, the equations Vtd1=Vts1, Vtd2=Vts2, Vsghd=Vsghs, and Vsgld=Vsgls may not be fulfilled.

For example, the threshold voltage of the select MOS transistor at one end of a memory cell may have threshold voltages of 2 V and 0.5 V and the threshold voltage of the select MOS transistor at the other end of the memory cell may have threshold voltages of 2.5 V and 1 V. Under these conditions, the voltages applied to the select gate at one end of the memory cell may be Vsgh=3 V and Vsgl=1.5 V, and the voltage applied to the select gate at the other end of the memory cell may be Vsgh=3 V and Vsgl=1.2 V.

Furthermore, the threshold voltages of two select MOS transistors connected to a single NAND column may be almost the same. For example, the threshold voltages of two select MOS transistors connected to a NAND column may be 0.8 V, the threshold voltage of the select MOS transistor at one end of an adjacent NAND cell sharing the gate electrode of the select MOS transistor with the NAND column may be 0.2 V, the threshold voltage of the select MOS transistor at the other end of the memory cell may be 1.4 V, the voltages applied to the select gate at one end of the NAND cell may be Vsgh=3 V and Vsgl=0.5 V, and the voltage applied to the select gate at the other end of the NAND cell may be Vsgh=3 V and Vsgl=1.2 V.

Making Vsgh higher than Vcc leads to an increase in the conductance of the select MOS transistor (that is, a decrease in the resistance), causing a current flowing through the NAND cell column to increase in a read operation. This shortens the bit-line discharging time, making the reading and the program verify reading faster. Vsgh may be raised from Vcc at the charge pump circuit within the chip, for example.

It is preferable that the voltage Vsgh of select gate that brings all of the select MOS transistors sharing a single select gate into the conducting state should be equal to or lower than the power supply voltage Vcc. When Vsgh is higher than Vcc, the chip needs a charge pump circuit, resulting in an increase in the chip area.

The larger one Vt1 of the threshold voltages of select MOS transistors may be set at a voltage (e.g., 3.5 V) equal to or higher than the power supply voltage Vcc. In this case, to turn on the select MOS transistor with the threshold voltage of Vt1 in a read operation or a verify read operation, for example, 4 V is applied to the select gate by, for example, using the charge pump circuit in the chip circuit.

To change the threshold voltage, the thickness of the gate oxide film of the select MOS transistor may be changed, or the concentration of impurities doped in the channel of the select MOS transistor may be changed. Furthermore, the threshold voltages may be varied, depending on whether or not impurities are doped in the channel of the select MOS transistor. By changing the channel length of the select MOS transistor, the threshold voltage can be changed. Namely, since a transistor with a short channel has a lower threshold voltage because of short channel effects, it may be used as an I-type transistor.

Furthermore, to change the gate oxide film thickness and the concentration of impurities in the channel, another manufacturing process, such as the channel doping of peripheral circuits, may be used instead of introducing an additional manufacturing process. In any method, the threshold voltages of select MOS transistors have only to be varied. Once the threshold voltages have been made different from each other, a specified threshold voltage can be obtained using the substrate bias.

Furthermore, with 0 V applied to the select gate at one end of the write block (e.g., $SG_2$ in programming the data into memory cells $MC_{11}$, $MC_{31}$, $MC_{51}$, . . . ), when a select MOS transistor using the gate electrode as the select gate is of the I-type and its threshold voltage Vtw is about 0.1 V (or a negative threshold voltage), the select MOS transistor is not cut off completely and a current flows. As a result, the channel of a memory cell unselected for writing or into which "1" is to be programmed is not raised from Vcc–Vth to the intermediate potential $V_M$. Even if it is raised, its potential will drop from $V_M$ because a cell current flows. In any case, the channel of a memory cell unselected for writing or into which "1" is programmed drops from $V_M$, "0" is programmed erroneously.

To improve the cut-off characteristic of the I-type transistor, a voltage of, for example, about 0.5 V is applied to the bit lines to which the programming data is not supplied in the read operation (bit lines $BL_{0A}$, $BL_{2A}$, $BL_{4A}$, . . . in programming the data into memory cells $MC_{11}$, $MC_{31}$, $MC_{51}$, . . . of FIG. 49A). By applying 0.5 V to the source of the select MOS transistor, the potential difference between the source and the substrate becomes –0.5 V, which increases the threshold voltage of the I-type transistor because of substrate bias effects, improving the cut-off characteristic of the I-type transistor whose gate is applied with 0 V.

To set the lower one (of the I-type) of the threshold voltages of the select MOS transistors at, for example, 0.5 V, the thinning of the substrate concentration can be considered. The I-type transistor whose substrate concentration is low has a problem: even if the gate voltage is not applied, applying the drain voltage causes the depletion layer between the drain and the substrate to get wider, so that the depletion layer between the drain and the substrate is liable to connect with the depletion layer between the source and the substrate (punch-through). To raise the punch-through withstand voltage of the I-type select MOS transistor, the channel length of the I-type select MOS transistor is made greater.

Figure 59A:
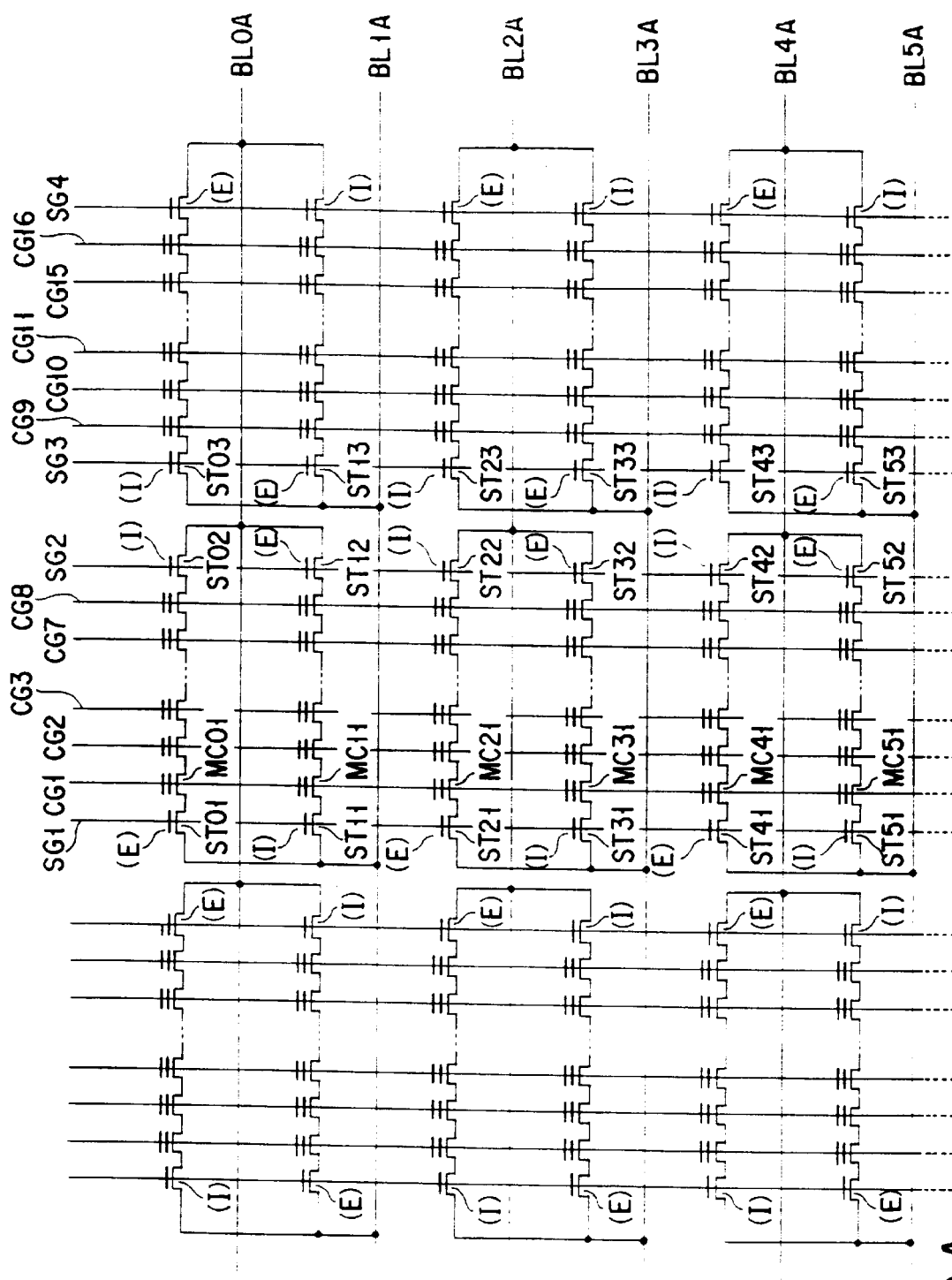
FIGS. 59A and 59B show memory cell array structures in an eighth embodiment of the present invention.
Figure 59B:

The configuration of a NAND-cell EEPROM according to an eighth embodiment of the present invention is the same as that of FIG. 48. Memory cell array 1A and memory cell 1B in the eighth embodiment are shown in FIG. 59A and FIG. 59B. The eighth embodiment is the same as the seventh embodiment in that two or more threshold voltages of the select MOS transistors are used. In the memory cell arrays (FIGS. 59A and 59B) of the eighth embodiment, four NAND cell columns share a single bit-line contact, with the result that the number of bit-line contacts does not increase in the whole memory cell array. FIG. 52A shows sense amplifier SA1 connected to bit lines $BL_{0A}$, $BL_{2A}$, $BL_{4A}$, to bit lines $BL_{1A}$, $BL_{3A}$, $BL_{5A}$, . . .

Figure 60:
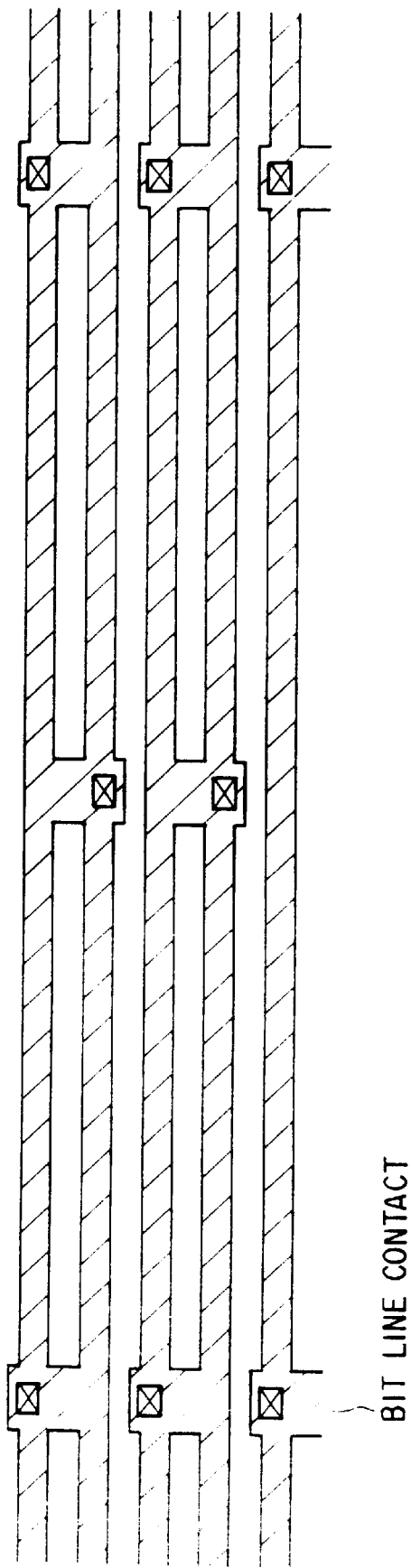
FIG. 60 shows the n-type diffusion layers, the source, gate, and drain regions of memory cells, and the contacts connecting n-type diffusion layers to bit lines in a memory cell array in the eighth embodiment.

FIG. 60 shows n-type diffusion layers, the source and drain regions of memory cells, and contacts (bit-line contacts) connecting n-type diffusion layers to bit lines (e.g., of Al) in the memory cell of the eight embodiment. As described earlier, in the conventional memory cell array, bit-line contacts for adjacent bit lines are arranged adjacently as shown in FIG. 9, so that it is difficult to reduce the size in the column direction (the X direction in FIG. 9). With the memory cell array of the eighth embodiment, however, since bit-line contacts for adjacent bit lines are not arranged adjacently as shown in FIG. 60, the size of the element isolating area between bit-line contacts is not a problem in reducing the size of the memory cell array in the column direction (X direction). Therefore, the element isolation width between memory cells can be reduced to the minimum element isolating area width L0 determined by the field inversion withstand voltage between adjacent NAND cell columns and element isolation technology.

<Read Operation>

Using a timing chart, the read operation will be explained.

FIG. 61 is a timing chart for reading the data programmed in memory cells $MC_{11}$, $MC_{31}$, $MC_{51}$, . . . of FIG. 59A.

First, precharge signals $PR_{A1}$, $PR_{A2}$, $PR_{B2}$ change from Vss to Vcc (time t0), bit lines $BL_{1A}$, $BL_{3A}$, $BL_{5A}$, . . . go to $V_{A2}$ (e.g., 1.7 V), and (dummy) bit lines $BL_{1B}$, $BL_{3B}$, $BLa_{5A}$, . . . are precharged to $VB_2$ (e.g., 1.5 V) (time t1). $V_{A1}$ is 0 V and bit lines $BL_{0A}$, $BL_{2A}$, $BL_{4A}$, $BL_{6A}$, . . . are grounded.

After the precharging has been completed, $PRA_{A2}$, $PR_{B2}$ go to Vss, bringing bit lines $BL_{1A}$, $BL_{3A}$, $BL_{5A}$, . . . into the floating state. Thereafter, row decoder 3 applies specified voltages to the select gate and the control gate (time 2). Control gate CG1 is at 0 V, CG2 to CG8 are at Vcc (e.g., 3 V), $SG_2$ is at 3 V (Vsgh), and $SG_1$ is at 1.5 V (Vsgl).

When the data programmed in the memory cells $MC_{11}$, $MC_{31}$, $MC_{51}$, . . . is "0", the threshold voltages of the memory cells will be positive, so that no current will flow and the potential of bit lines $BL_{1A}$, $BL_{3A}$, $BL_{5A}$, current will flow, causing the potential of bit lines $BL_{1A}$, $BL_{3A}$, $BL_{5A}$, . . . to drop to 1.5 V or below. Because select gate $SG_1$ is at 1.5 V, E-type select MOS transistors $ST_{01}$, $ST_{21}$, $ST_{41}$ turn off, preventing the data in the memory cells $MC_{01}$, $MC_{21}$, $MC_{41}$, . . . are not transferred to the bit lines. In the meantime, (dummy) bit lines $BL_{1B}$, $BL_{3B}$, $BL_{5B}$, . . . are kept at the precharge potential of 1.5 V.

Thereafter, at time t3, $\phi_P$ goes to 3 V and $\phi_N$ goes to 0 V, deactivating CMOS flip-flop FF. At time t4, $\phi_E$ goes to 3 V, thereby equalizing CMOS flip-flop FF in SA2, placing nodes N1, N2 at Vcc/2 (e.g., 1.5 V). At time t5, $SS_2$, $S_A$, $S_B$ go to 3 V, connecting the bit line to the sense amplifier, and thereafter $\phi_N$ rises from 0 V to 3 V and $\phi_P$ drops from 3 V to 0 V, causing the potential difference between bit lines $BL_{1A}$, $BL_{3A}$, $BL_{5A}$, . . . and bit lines $BL_{1B}$, $BL_{3B}$, $BL_{5A}$, . . . to be amplified (time t6).

Specifically, if "0" is programmed in memory cells $MC_{11}$, $MC_{31}$, $MC_{51}$, node N1 in SA2 will be at 3 V and node N2 will be at 0 V. If "1" is programmed in memory cells $MC_{11}$, $MC_{31}$, $MC_{51}$, . . . , node N1 will be at 0 V and node N2 will be at 3 V. Thereafter, when column select signal CSL rises from 0 V to 3 V, the data latched in the CMOS flip-flop is outputted to I/O, I/O' (time t7).

Bit lines $BL_{0A}$, $BL_{2A}$, $BL_{4A}$, $BL_{6A}$, . . . are grounded to 0 V through the read operation. Furthermore, bit lines $BL_{0B}$, $BL_{2B}$, $BL_{4B}$, $BL_{6B}$, . . . may be grounded by placing $PR_{B1}$ at Vcc and $V_{B1}$ at 0 V through a read operation. This makes it possible to reduce noise due to the capacitive coupling between bit lines in amplifying the potential of the bit line.

FIG. 62 is a timing chart for reading the data programmed in memory cells $MC_{01}$, $MC_{21}$, $MC_{41}$, . . . of FIG. 59A onto bit lines $BL_{0B}$, $BL_{2B}$, $BL_{4B}$, $BL_{6B}$, . . .

<Program Operation>

Figure 63B:
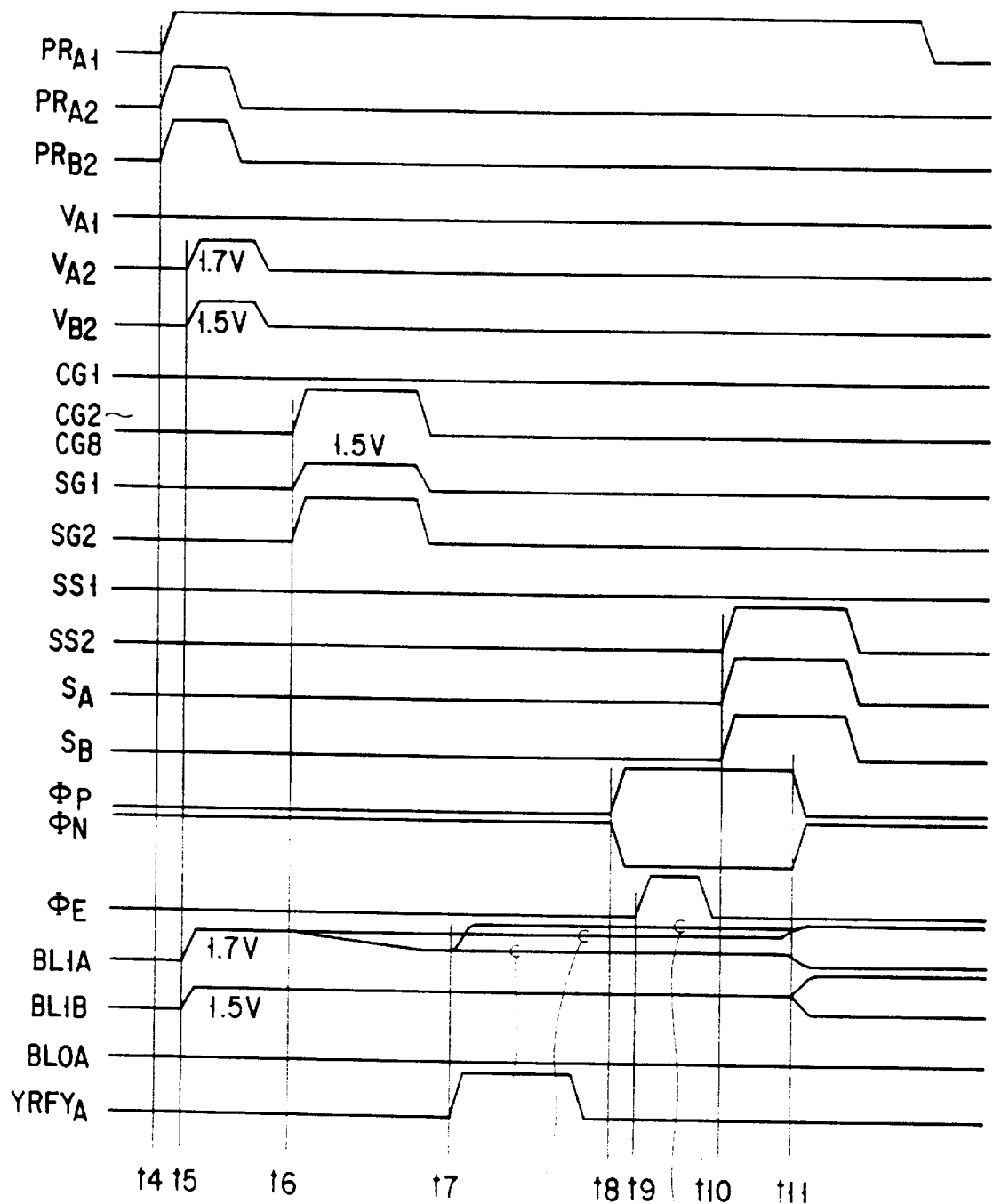

The program operation of the present invention will be explained. FIGS. 63A and 63B are timing charts for programming the data in memory cell $MC_{11}$ (and memory cells $MC_{31}$, $MC_{51}$, . . . ).

The data programmed into memory cells $MC_{11}$, $MC_{31}$, $MC_{51}$, . . . is latched in a sense amplifier circuit (SA2 of FIG. 52B). Namely, when "0" is programmed, node N1 is at 0 V and node N2 is at 3 V. When "1" is programmed, node N1 is at 3 V, and node N2 is at 0 V.

When a program operation starts, $SG_1$ is placed at Vss, and $SG_2$, $CG_1$ to $CG_8$ are placed at Vcc at time t1. In the eighth embodiment, when the data is programmed into memory cells $MC_{11}$, $MC_{31}$, $MC_{51}$, . . . , the data will not be programmed into memory cells $MC_{01}$, $MC_{21}$, $MC_{41}$, $MC_{01}$, $MC_{21}$, $MC_{41}$, ... must be charged from bit lines $BL_{0A}$, $BL_{2A}$, $BL_{4A}$, ... In the eighth embodiment, bit lines $BL_{0A}$, $BL_{2A}$, $BL_{4A}$, ... are charged from $V_{A1}$ of sense amplifier SA1 of FIG. 52A to Vcc. As a result, the channels of memory cells $MC_{01}$, $MC_{21}$, $MC_{41}$, ... are charged to Vcc–Vth. At this time, the channels of memory cells $MC_{11}$, $MC_{31}$, $MC_{51}$, ... are also charged to Vcc–Vth.

Either Vcc or Vss (0 V) is applied to bit lines $BL_{1A}$, $BL_{3A}$, $BL_{5A}$, ... according to the data latched in the sense amplifier circuit SA2. With this, when "0" is programmed into memory cell $MC_{11}$, bit line $BL_{1A}$ is placed at 0 V, placing the channel of memory cell $MC_{11}$ at 0 V. When "1" is programmed into memory cell $MC_{11}$, bit line $BL_{1A}$ is placed at Vcc (e.g., 3 V), charging the channel of memory cell $MC_{11}$ to Vcc–Vth. Select gate $SG_2$ is at 0 V and select MOS transistor using the gate electrode as $SG_2$ is off.

After the bit line has been charged. select gate $SG_1$ is placed at Vsgl (e.g., 1.5 V) and $SG_2$ is at Vss (e.g., 0 V). Since the select MOS transistors connected to memory cells $MC_{01}$, $MC_{21}$, $MC_{41}$, ... not to be programmed into are of the E-type, they are off, bringing the channels of memory cells $MC_{01}$, $MC_{21}$, $MC_{41}$, Because the memory cell-side drains of the select MOS transistors $ST_{11}$, $ST_{31}$, $ST_{51}$, ... of the memory cells $MC_{11}$, $MC_{31}$, $MC_{51}$, ... into which "1" is programmed are at Vcc–Vth (e.g., if the threshold voltage of the I-type transistor is 0.8 V, 3–0.8=2.2 V will be given), the bit-line contact-side sources are at Vcc (e.g., 3 V), and select gate $SG_1$ is at Vsgl (e.g., 1.5 V), select MOS transistors $ST_{11}$, $ST_{31}$, $ST_{51}$, programming, the channels of memory cells $MC_{11}$, $MC_{31}$, $MC_{51}$, ... are in the floating state.

When "0" is programmed into memory cells $MC_{11}$, $MC_{31}$, $MC_{51}$, ..., because the select gates $SG_1$ of select MOS transistors $ST_{11}$, $ST_{31}$, $ST_{51}$, ... are at Vsgl (e.g., 1.5 V) and the sources and drains are at 0 V, select MOS transistors $ST_{11}$, $ST_{31}$, $ST_{51}$ turn on, keeping the channels of the memory cells at 0 V.

After select gate $SG_1$ has been placed at Vsgl (about 1.5 V), control gates $CG_1$ to $CG_8$ are changed from Vcc to an intermediate potential of $V_M$ (about 10 V) at time t2. Since the channels of memory cells $MC_{01}$, $MC_{21}$, $MC_{41}$, ... not to be programmed into and the channels of memory cells $MC_{11}$, $MC_{31}$, $MC_{51}$, ... into which "1" is programmed are in the floating state, they are raised from Vcc–Vth to the intermediate potential (about 10 V) through the capacitive coupling between the control gate and the channel. The channels of memory cells $MC_{11}$, $MC_{31}$, $MC_{51}$, into which "0" is programmed are at 0 V because the bit lines are at 0 V.

After the channels of unselected memory cells in programming and memory cells into which "1" is programmed have risen from Vcc–Vth to the intermediate potential, control gate $CG_1$ is raised from the intermediate potential of $V_M$ to a program voltage of Vpp (20 V) at time 3. Then, because the channels of memory cells $MC_{01}$, $MC_{21}$, $MC_{41}$, ... not to be programmed into and the channels of memory cells $MC_{11}$, $MC_{31}$, $MC_{51}$, intermediate potential (about 10 V) and the control gate $CG_1$ is at Vpp (about 20 V), these memory cells are not programmed into. However, the channels of memory cells $MC_{11}$, $MC_{31}$, $MC_{51}$, ... into which "0" is programmed are at 0 V and the control gate is at Vpp (about 20 V), electrons are injected from the substrate into the floating gate, thereby programming "0".

After the programming has been completed, the control gates, select gates, and bit lines are discharged one after another, which completes the program operation.

After the programming, the following verify operation will be carried out to see if the programming has been done sufficiently.

Precharge signals $PR_{A1}$, $PR_{A2}$, $PR_{B2}$ change from Vss to Vcc (time t4), bit lines $BL_{1A}$, $BL_{3A}$, $BL_{5A}$, ... go to $V_{A2}$ (e.g., 1.7 V), and (dummy) bit lines $BL_{1B}$, $BL_{3B}$, $BLa_{5B}$, ... are precharged to $V_{B2}$ (e.g., 1.5 V) (time t5). $V_{A1}$ is 0 V and bit lines $BL_{0A}$, $BL_{2A}$, $BL_{4A}$, $BL_{6A}$, ... are grounded.

After the precharging has been completed, $PR_{A2}$, $PR_{B2}$ go to Vss, bringing bit lines $BL_{1A}$, $BL_{3A}$, $BL_{5A}$, ... into the floating state. Thereafter, row decoder 3 applies specified voltages to the select gate and the control gate (time t6). Control gate CG1 is at 0 V, CG2 to CG8 are at Vcc (e.g., 3 V), $SG_2$ is at 3 V (Vsgh), and $SG_1$ is at 1.5 V (Vsgl). When the data programmed in the memory cells $MC_{11}$, $MC_{31}$, $MC_{51}$, ... is "0", the threshold voltages of the memory cells will be positive, so that no current will flow and the potential of bit lines $BL_{1A}$, $BL_{3A}$, $BL_{5A}$, ... will remain at 1.7 V. When the data is "1", a cell current will flow, causing the potential of bit lines $BL_{1A}$, $BL_{3A}$, $BL_{5A}$, ... to drop to 1.5 V or below. Because select gate $SG_1$ is at 1.5 V, E-type select MOS transistors $ST_{01}$, $ST_{21}$, $ST_{41}$ turn off, preventing the data in the memory cells $MC_{01}$, $MC_{21}$, $MC_{41}$, ... is not transferred to the bit lines.

After the bit lines have discharged, verify signal $VRFY_A$ goes to 3 V (time t7). When the data to be programmed into memory cells $MC_{11}$, $MC_{31}$, $MC_{51}$, ... is "1", bit lines $BL_{1A}$, $BL_{3A}$, $BL_{5A}$, ... are charged to about 3 V. Here, the voltage level of charging by the verify signal is equal to or higher than the precharge voltage of 1.5 V for bit lines $BL_{jB}$ (j=0, 1, ... 127).

In the meantime, (dummy) bit lines $BL_{1B}$, $BL_{3B}$, $BL_{5B}$, ... are precharged to the precharge voltage of 1.5 V.

Thereafter, at time t8, $\phi_P$ goes to 3 V and $\phi_N$ goes to 0 V, deactivating CMOS flip-flop FF. At time t9, $\phi_E$ goes to 3 V, thereby equalizing CMOS flip-flop FF in SA2, placing nodes N1, N2 at Vcc/2 (e.g., 1.5 V). At time t10, $SS_2$, $S_A$, $S_B$ go to 3 V, connecting the bit lines to the sense amplifier, and thereafter $\phi_N$ rises from 0 V to 3 V and $\phi_P$ drops from 3 V to 0 V, causing the potential difference between bit lines $BL_{1A}$, $BL_{3A}$, $BL_{5A}$, ... and bit lines $BL_{1B}$, $BL_{3B}$, $BL_{5B}$, ... to be amplified (time t6). Then, the reprogramming data is latched in the sense amplifier (time t11).

Bit lines $BL_{0A}$, $BL_{2A}$, $BL_{4A}$, $BL_{6A}$, ... are grounded to 0 V through the read operation. Namely, every other bit line is grounded.

Figure 64B:
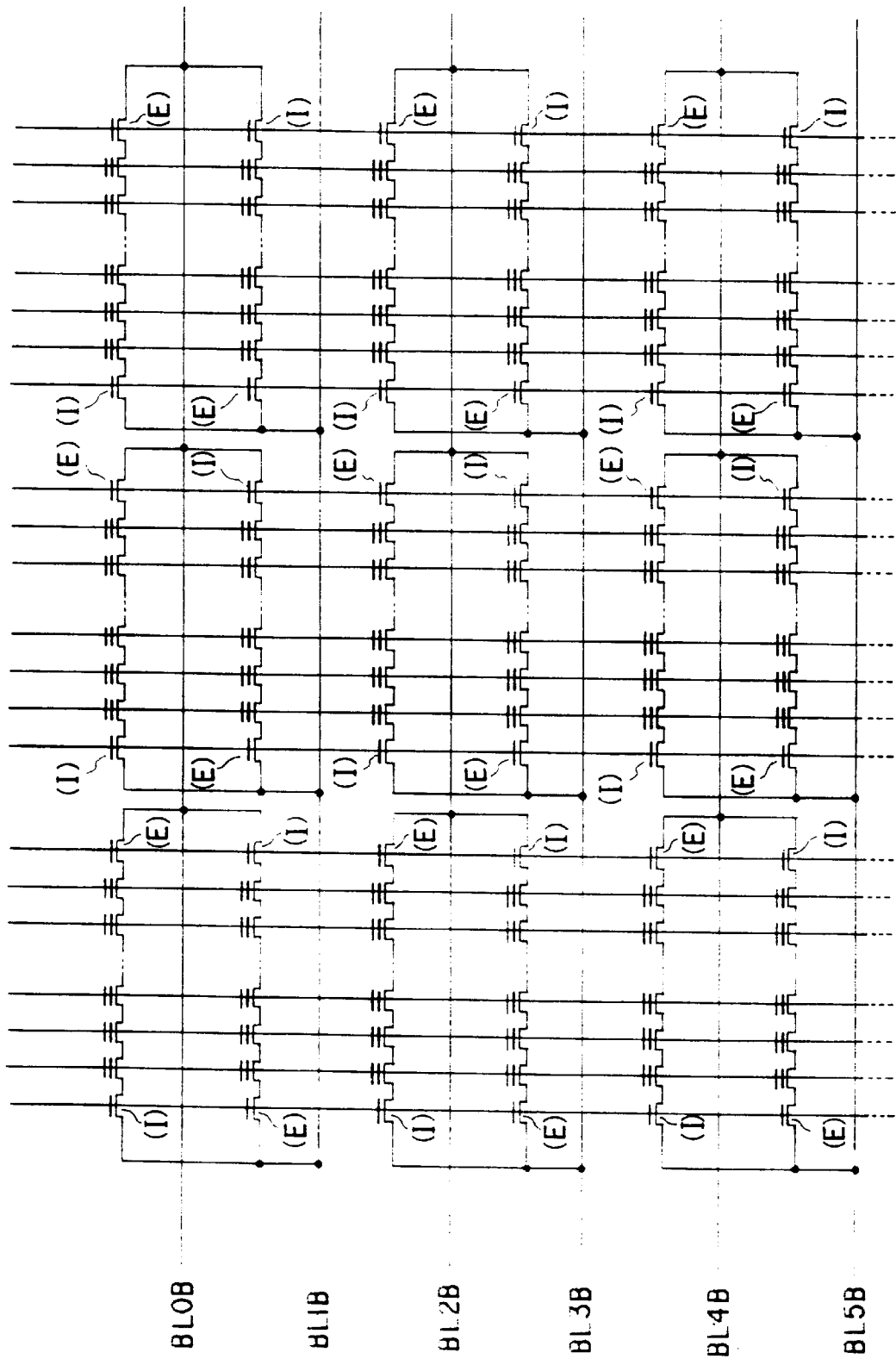

In the present invention, the select MOS transistors in two NAND columns sharing the bit-line contacts and select gates (e.g., the select MOS transistors $ST_{02}$ and $ST_{12}$, $ST_{22}$ and $ST_{32}$ of FIG. 59A) have only to have different threshold voltages. The way of setting the threshold voltages of select MOS transistors is arbitrary. While in FIG. 59A, the threshold voltages of select MOS transistors $ST_{02}$, $ST_{03}$, $ST_{12}$, $ST_{13}$, $ST_{22}$, $ST_{23}$ are set at almost the same value, one select MOS transistor may be of the I-type and the other select MOS transistor may be of the E-type as shown in FIGS. 64A and 64B, for example.

While in the above embodiment, a sense amplifier is connected to each bit line, a common sense amplifier system (FIG. 58) may be used where a sense amplifier is provided for every two bit lines. In this case, write and read timing charts are almost the same as those in the above embodiment (FIG. 61, FIG. 63A, and FIG. 64A). Furthermore, as in the seventh embodiment, a page of data can be written almost simultaneously.

Figure 65:
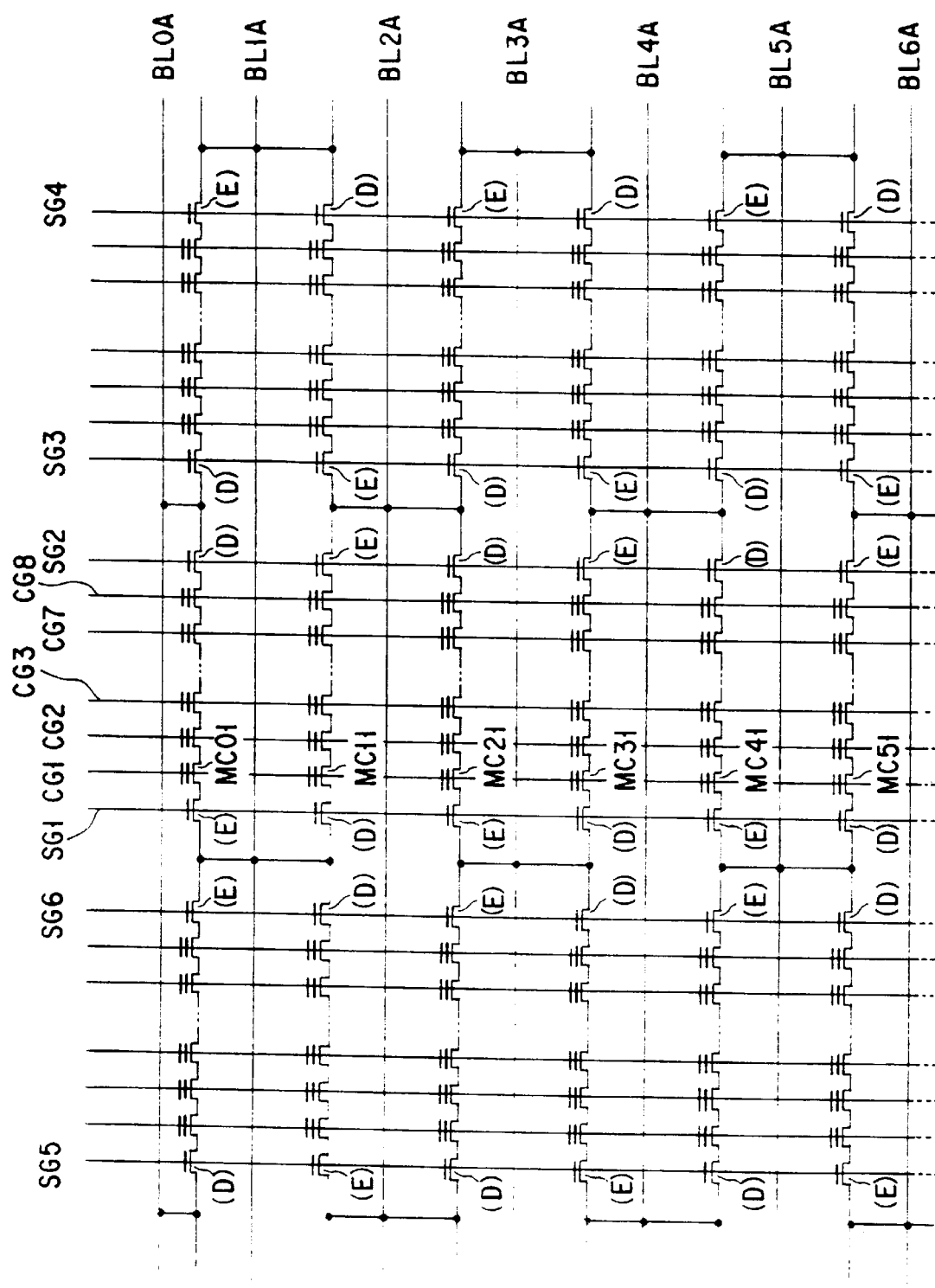
FIG. 65 shows a memory cell array structure in a ninth embodiment of the present invention.

With the invention, one of the select MOS transistors sharing a single select gate is made conducting and the other is made nonconducting. Therefore, sa described above, three kinds of E-type, I-type and D-type transistors may be used as the select MOS transistor. Furthermore, the lower threshold voltage Vt2 of the select MOS transistors may be a negative threshold voltage (e.g., −1 V). FIG. 65 shows the structure of the memory cell of this case (of a ninth embodiment of the present invention). In FIG. 65, a select MOS transistor having a negative threshold voltage is determined to be of the D type.

In the previous embodiment, voltage Vsgl (e.g., 1.5 V) that turns off an E-type select MOS transistor but turns on an I-type select MOS transistor in a write or a read operation is applied to the select gate. In the ninth embodiment, however, since E-type select MOS transistors and D-type select MOS transistors are used, Vsgl=0 V, a positive voltage (e.g., 0.5 V), or a negative voltage (e.g., −0.5 V) may be applied to the select gate.

Furthermore, while in the above embodiment, 0 V is applied to the select gates of the unselected blocks into which neither reading nor writing is effected in a read or a program operation (e.g., corresponding to select gates $SG_3$, $SG_4$, $SG_5$, $SG_6$, ... in programming the data into memory cells $MC_{11}$, $MC_{31}$, $MC_{51}$, ... of FIG. 65), a negative voltage (e.g., −2 V) may be applied so that a D-type select MOS transistor may turn off. When the D-type select MOS transistors in the unselected blocks turn off, the bit-line potential will be prevented from being applied to the drain or channel of the memory cell via the select MOS transistor, preventing the memory cell from being erased erroneously, and further prevent the charge on the bit lines from leaking out to the unselected blocks, preventing the bit-line precharging time from getting longer in a read or a program operation.

Figure 66:
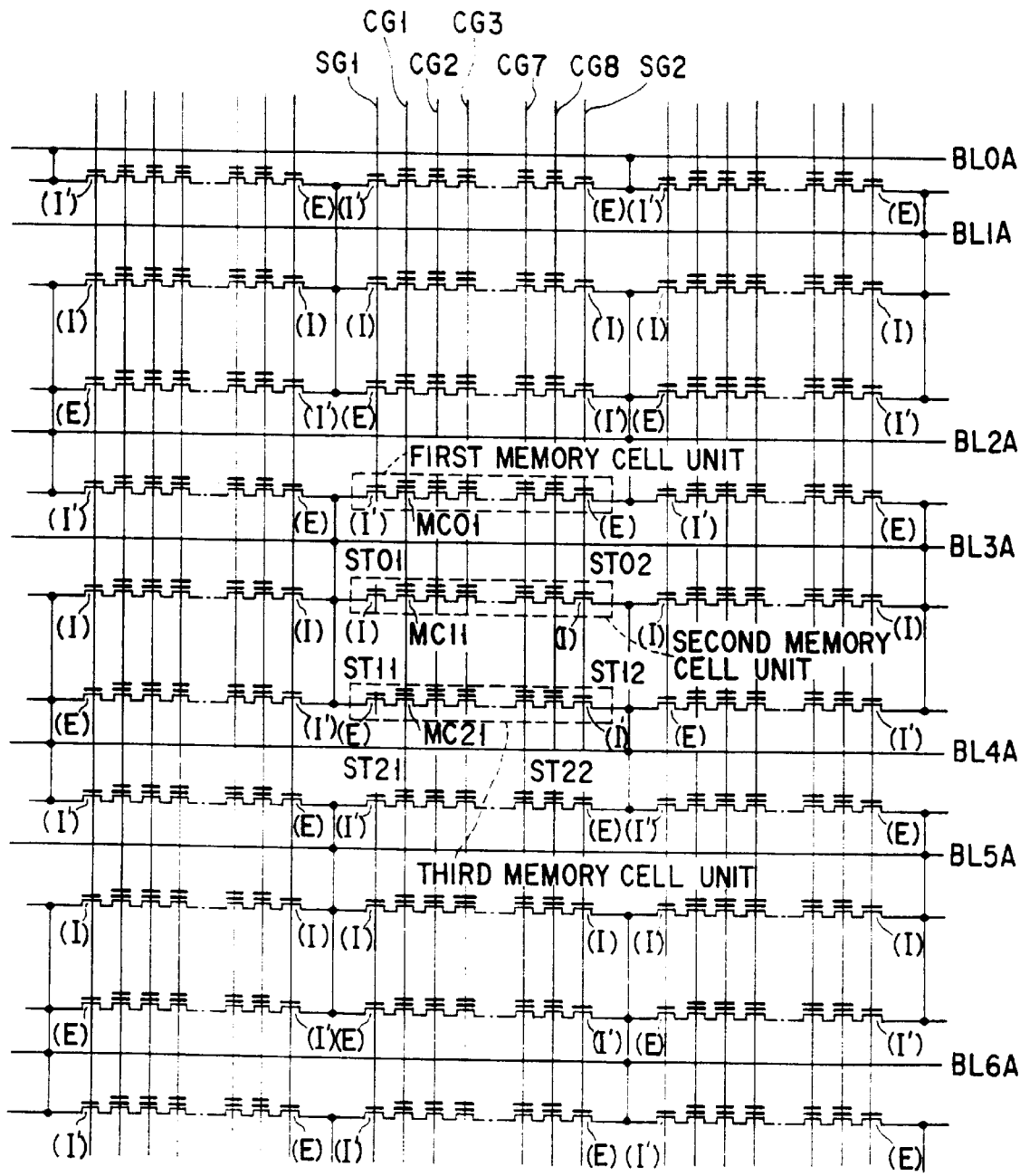
FIG. 66 shows a memory cell array structure in a tenth embodiment of the present invention.

While in the above embodiment, two threshold voltages of the select MOS transistors are used, more than two may be used. For example, the select MOS transistors may have three threshold voltages. FIG. 66 shows the configuration of a memory cell according to a tenth embodiment of the present invention, where the select MOS transistors have three threshold voltages. If the threshold voltage of the E-type transistor is Vth1, the threshold voltage of the I-type transistor is Vth2, and the threshold voltage of the I'-type transistor is Vth3, these threshold voltages will be set so as to fulfill the expression: Vth1>Vth2>Vth3. Furthermore, there are provided three voltages applied to the select gates, Vsgh (Vsgh>Vth1), Vsgm (Vth1>Vsgm>Vth2), and Vsgl (Vth2>Vsgl>Vth3). By applying these three voltages, both ends of one of a first memory cell unit, a second memory cell unit, a third memory cell unit of FIG. 66 can be connected to the bit lines.

When the data programmed in memory cells $MC_{01}$, $MC_{11}$, $MC_{21}$ of FIG. 66 is read out, control gate CG1 is placed at 0 V and Vcc is applied to CG2 to CG8. When the first memory cell unit in which memory cell $MC_{01}$ is provided is read from, select gate $SG_1$ is placed at Vsgl and $SG_2$ is placed at Vsgh, only the select MOS transistors (e.g., $St_{01}$) belonging to the first memory cell unit of the select MOS transistors whose gate electrode is select gate $SG_1$ become conducting. All of the select MOS transistors whose gate electrode is select gate $SG_2$ are on. Therefore, a current path connecting between bit lines $BL_{2A}$ and $BL_{3A}$ is formed through the first memory cell unit, enabling memory cell $MC_{01}$ to be read from.

When the second memory cell unit in which memory cell $MC_{11}$ is provided is read from, select gate $SG_1$ is placed at Vsgm and $SG_2$ is placed at Vsgm, both of the select MOS transistor whose gate electrode is select gate $SG_1$ and the select MOS transistor whose gate electrode is select gate $SG_2$ become conducting only in the second memory cell unit. Therefore, a current path connecting between bit lines $BL_{3A}$ and $BL_{4A}$ is formed through the second memory cell unit, enabling memory cell $MC_{11}$ to be read from.

When the third memory cell unit in which memory cell $MC_{21}$ is provided is read from, select gate $SG_1$ is placed at Vsgh and $SG_2$ is placed at vsgl, only the select MOS transistors (e.g., $St_{22}$) belonging to the third memory cell unit of the select MOS transistors whose gate electrode is select gate $SG_2$ become conducting. All of the select MOS transistors whose gate electrode is select gate $SG_1$ are on. Therefore, a current path connecting between bit lines $BL_{3A}$ and $BL_{4A}$ is formed through the third memory cell unit, enabling memory cell $MC_{21}$ to be read from.

As described above, even when three or more threshold voltages of the select MOS transistors are used, one of three or more memory cell units can be brought into the selected state by providing three voltages applied to the select gates. This increases not only an allowance for bit-line contacts, but also an allowance for bit-line wiring itself. For example, in the embodiment of FIG. 66, two bit lines are provided for the pitches of three memory cells, so that the number of bit lines is two thirds that of the conventional memory cell, facilitating bit-line wiring.

Figure 67:
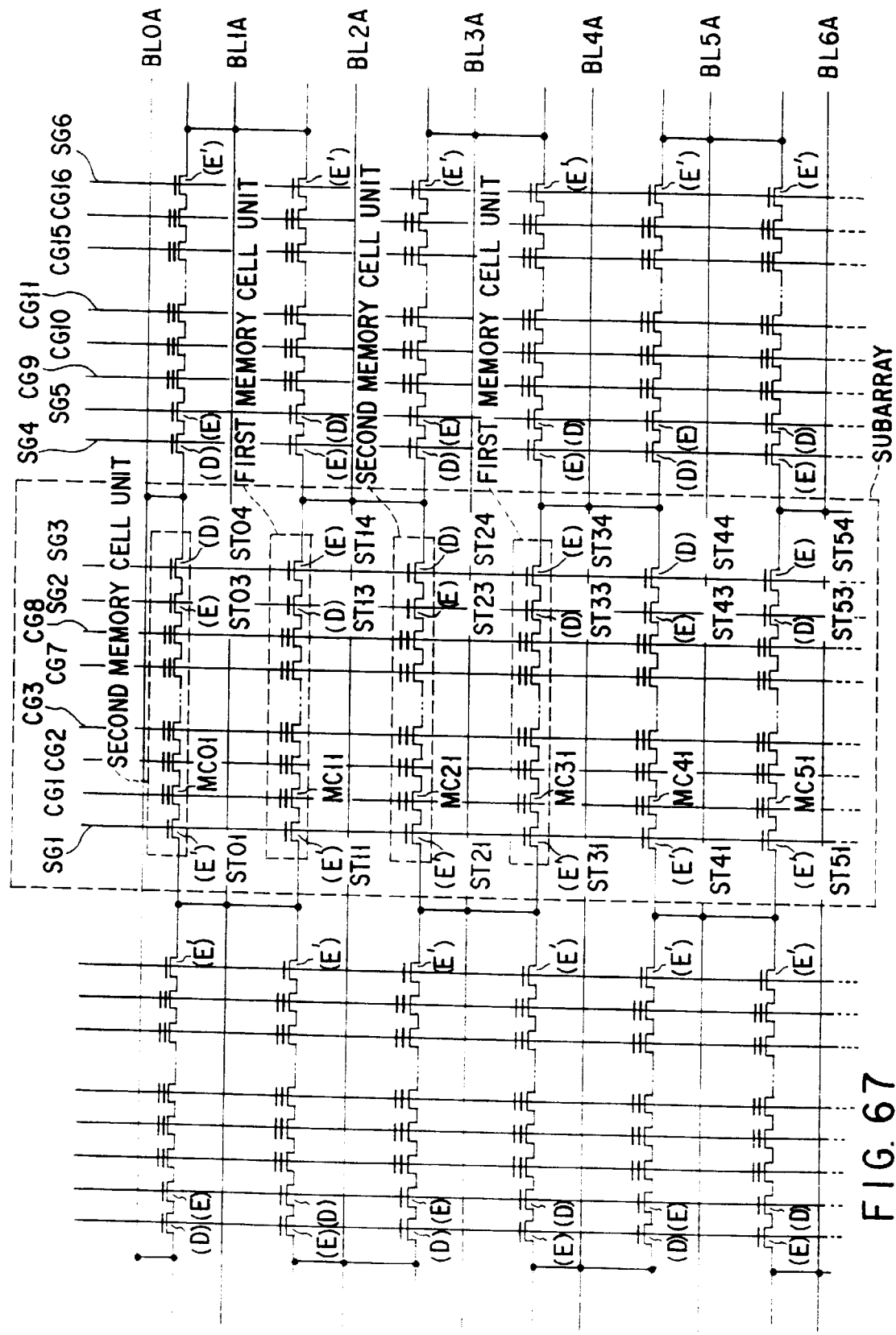
FIG. 67 shows a memory cell array structure in an eleventh embodiment of the present invention.

In the above embodiment, two select MOS transistors are provided for each NAND cell column where memory cells are connected in series. For example, as shown in FIG. 67 (an eleventh embodiment of the present invention), a memory cell unit may be formed by providing three select MOS transistors for each NAND cell column. Hereinafter, explanation will be given taking the first memory cell unit containing memory cell $MC_{11}$ and the second memory cell unit containing memory cell $MC_{21}$ as an example.

One end of a NAND cell column is connected to a bit line (e.g., bit line $BL_{2A}$) via two select MOS transistors (e.g., $ST_{13}$, $ST_{14}$), and the other end is connected to a bit line (e.g., bit line $BL_{1A}$) via a single select MOS transistor (e.g., $ST_{11}$). The two select MOS transistors connected in series are of the E-type (threshold voltage Vth1>0) and of the D type (threshold voltage Vth2<0). The select MOS transistor (e.g., $ST_{13}$) of the first memory cell unit whose gate electrode is select gate $SG_2$ is of the D type, and the select MOS transistor (e.g., $ST_{23}$) of the second memory cell unit is of the E-type. The select MOS transistor (e.g., $ST_{24}$) of the second memory cell unit whose gate electrode is select gate $SG_3$ is of the D type, and the select MOS transistor (e.g., $ST_{14}$) of the first memory cell unit is of the E-type.

Furthermore, the select MOS transistor (e.g., $ST_{11}$, $ST_{21}$) of the other end of the NAND cell is of the E' type (threshold voltage Vth3). Vth3 may be equal to either Vth1 or Vth2 or differ from them. For example, Vth3 may be 0.7 V.

The read operation and program operation in the present embodiment will be explained.

<Read Operation>

When the data in memory cells $MC_{11}$, $MC_{31}$, $MC_{51}$, ... in the first memory cell unit is read onto bit lines $BL_{2A}$, $BL_{4A}$, $BL_{6A}$, ..., bit line $BL_{2A}$, $BL_{4A}$, $BL_{6A}$, ... are first precharged to a bit-line read potential of $V_A$ (e.g., 1.8 V) and bit lines $BL_{1A}$, $BL_{3A}$, $BL_{5A}$, ... are grounded to 0 V. After the precharging has been completed, bit lines $BL_{2A}$, $BL_{4A}$, $BL_{6A}$, ... are brought into the floating state.

Next, control gate CG1 is placed at 0 V, and CG2 to CG8 are placed at Vcc (e.g., 3 V). Then, control gates $SG_1$, $SG_3$ are placed at Vcc and select gate $SG_2$ is placed at Vss. The other select gates and control gates are placed at 0 V. In this case, all of the select MOS transistors ($ST_{01}$, $ST_{11}$, $ST_{21}$, . . . , $ST_{04}$, $ST_{14}$, $ST_{24}$, . . . . whose gate electrode is $SG_3$ turn on. The D-type select MOS transistors whose gate electrode is select gate $SG_2$ ($ST_{13}$, $ST_{33}$, $ST_{53}$, . . . ) turn on, whereas the E-type select MOS transistors ($ST_{03}$, $ST_{23}$, $ST_{43}$, . . . ) turn off.

Therefore, the data programmed into memory cells $MC_{11}$, $MC_{31}$, $MC_{51}$, . . . is "1", the precharged bit lines $BL_{2A}$, $BL_{4A}$, $BL_{6A}$, . . . discharge to the grounded bit lines $BL_{1A}$, $BL_{3A}$, $BL_{5A}$, . . . and drop from the precharge potential, thereby causing the data programmed in memory cells $MC_{11}$, $MC_{31}$, $MC_{51}$. . . in the first memory cell unit to be read onto bit lines $BL_{2A}$, $BL_{4A}$, $BL_{6A}$, the memory cells is "0", bit lines $BL_{2A}$, $BL_{4A}$, $BL_{6A}$, potential.

While in the above embodiment, bit lines $BL_{2A}$, $BL_{4A}$, $BL_{6A}$, . . . have been precharged and bit lines $BL_{1A}$, $BL_{3A}$, $BL_{5A}$, . . . are grounded, the data in the memory cells may be read onto bit lines $BL_{1A}$, $BL_{3A}$, $BL_{5A}$, . . . by grounding bit lines $BL_{2A}$, $BL_{4A}$, $BL_{6A}$, . . . and precharging bit lines $BL_{1A}$, $BL_{3A}$, $BL_{5A}$, . . .

On the other hand, because the E-type select MOS transistors $ST_{03}$, $ST_{23}$, $ST_{43}$, . . . whose gate electrode is $SG_2$ turn off, the data in the memory cells $MC_{01}$, $MC_{21}$, $MC_{41}$. . . in the second memory cell unit is not read onto bit lines.

When the data in memory cells $MC_{01}$, $MC_{21}$, $MC_{41}$, lines $BL_{0A}$, $BL_{2A}$, $BL_{4A}$, $BL_{6A}$, . . . , select gates $SG_1$, $SG_2$ are placed at Vcc, and select gate $SG_3$ is placed at Vss. Control gate CG1 is placed at 0 V, and CG2 to CG8 are placed at Vcc. In this case, all of the select MOS transistors ($ST_{01}$, $ST_{11}$, $ST_{21}$, . . . , $ST_{03}$, $ST_{13}$, $ST_{23}$, turn on. The D-type select MOS transistors whose gate electrode is select gate $SG_3$ ($ST_{04}$, $ST_{24}$, $ST_{44}$, . . . ) turn on, whereas the E-type select MOS transistors ($ST_{14}$, $ST_{34}$, $ST_{54}$, . . . ) turn off.

Therefore, because all of the select MOS transistors connecting the memory cells to the bit lines in the second memory cell unit turn on, the data in memory cells $MC_{01}$, $MC_{21}$, $MC_{41}$, . . . in the second memory cell unit is read onto the bit lines. In the first memory cell unit, because the select MOS transistors whose gate electrode is select gate $SG_3$ turn off, the data is not read onto the bit lines.

<Program Operation>

Explanation will be given about the procedure for programming the data into memory cells $MC_{11}$, $MC_{31}$, $MC_{51}$, . . . in the first memory cell unit.

Select gate $SG_1$ is placed at 0 V, causing all of the select MOS transistors whose gate electrode is select gate $SG_1$ to turn off. $SG_2$, $SG_3$, CG1 to CG8 are placed at Vcc and bit lines $BL_{0A}$, $BL_{1A}$, $BL_{2A}$, $BL_{3A}$, . . . are placed at Vcc, precharging the channels of the memory cells in the blocks in a page to be programmed into to Vcc–Vth (lower than the bit-line potential Vcc because of a drop in the threshold voltage of the select MOS transistor).

Thereafter, when select gate $SG_2$ is placed at Vss (0 V), the D-type select MOS transistors $ST_{13}$, $ST_{33}$, $ST_{53}$, . . . turn on, but the E-type select MOS transistors $ST_{03}$, $ST_{23}$, $ST_{43}$, . . . turn off, bringing the channels of the memory cells $MC_{01}$, $MC_{21}$, $MC_{41}$, . . . not to be programmed into in the floating state at a potential of Vcc–Vth charged from the bit lines. At this time, select gate $SG_3$ remains at 3 V.

The data programmed into the memory cells $MC_{11}$, $MC_{31}$, $MC_{51}$, . . . in the first memory cell unit is supplied from bit lines $BL_{2A}$, $BL_{4A}$, $BL_{6A}$, . . . For example, when "0" is programmed into memory cell $MC_{11}$, bit line $BL_{2A}$ is placed at 0 V, turning on E-type select MOS transistor $ST_{14}$ because $SG_3$ is at Vcc, placing the channel of memory cell $MC_{11}$ at 0 V. When "1" is programmed into memory cell $MC_{11}$, bit line $BL_{2A}$ is placed at 3 V, turning off E-type select MOS transistor $ST_{14}$, bringing the channel of memory cell $MC_{11}$ into the floating state at Vcc–Vth. Bit lines $BL_{1A}$, $BL_{3A}$, $BL_{5A}$, . . . may be place at Vcc or 0 V or may be placed at a given voltage.

After select gate $SG_2$ has been changed from Vcc to Vss, control gates CG1 to CG8 are changed from Vcc to an intermediate potential of $V_M$ (about 10 V). Since the channels of memory cells $MC_{01}$, $MC_{21}$, $MC_{41}$, . . . not to be programmed into and the channels of memory cells $MC_{11}$, $MC_{31}$, $MC_{51}$, . . . to be programmed into are in the floating state, they are raised from Vcc–Vth to the intermediate potential (about 10 V) through the capacitive coupling between the control gates and the channels. The channels of memory cells $MC_{11}$, $MC_{31}$, $MC_{51}$, . . . into which "0" is programmed are at 0 V because the bit lines are at 0 V.

After the channels of unselected memory cells in programming and memory cells into which "1" is programmed have risen from Vcc–Vth to the intermediate potential, control gate $CG_1$ is raised from the intermediate potential of $V_M$ to a program voltage of Vpp (20 V). Then, because the channels of memory cells $MC_{01}$, $MC_{21}$, $MC_{41}$, . . . not to be programmed into in the second memory cell unit and the channels of memory cells $MC_{11}$, $MC_{31}$, $MC_{51}$, . . . to be programmed into are at the intermediate potential (about 10 V) and the control gate $CG_1$ is at Vpp (about 20 V), these memory cells are not written into. However, the channels of memory cells $MC_{11}$, $MC_{31}$, $MC_{51}$, . . . into which "0" is programmed are at 0 V and the control gate is at Vpp (about 20 V), electrons are injected from the substrate into the floating gate, thereby programming When the data is programmed into the second memory cell unit, select gate $SG_2$ is placed at Vcc and $SG_1$, $SG_3$ are placed at Vss after the channel of the first memory cell unit has been precharged to Vcc–Vth. In is this case, the programming data is transferred from bit lines $BL_{0A}$, $BL_{2A}$, $BL_{4A}$, $BL_{6A}$, . . . to the second memory cell unit. Furthermore, by placing $SG_1$ at Vcc and $SG_2$, $SG_3$ at Vss, bit lines $BL_{1A}$, $BL_{3A}$, $BL_{5A}$, . . . may transfer programming unselected potential or threshold voltage to the memory cells in the first memory cell unit not to be programmed into.

With the present embodiment, when Vss is applied to the select gates in a read and a program operation, of the select MOS transistors whose gate electrode is the select gate, the E-type select MOS transistors turn off and the D-type select MOS transistors turn on. The D-type select MOS transistors may be of the I-type (whose threshold voltage is positive). In this case, instead of Vss applied to the select gate, Vsgl that turns off the E-type select MOS transistor but turns on the I-type select MOS transistor is applied.

Figure 68:
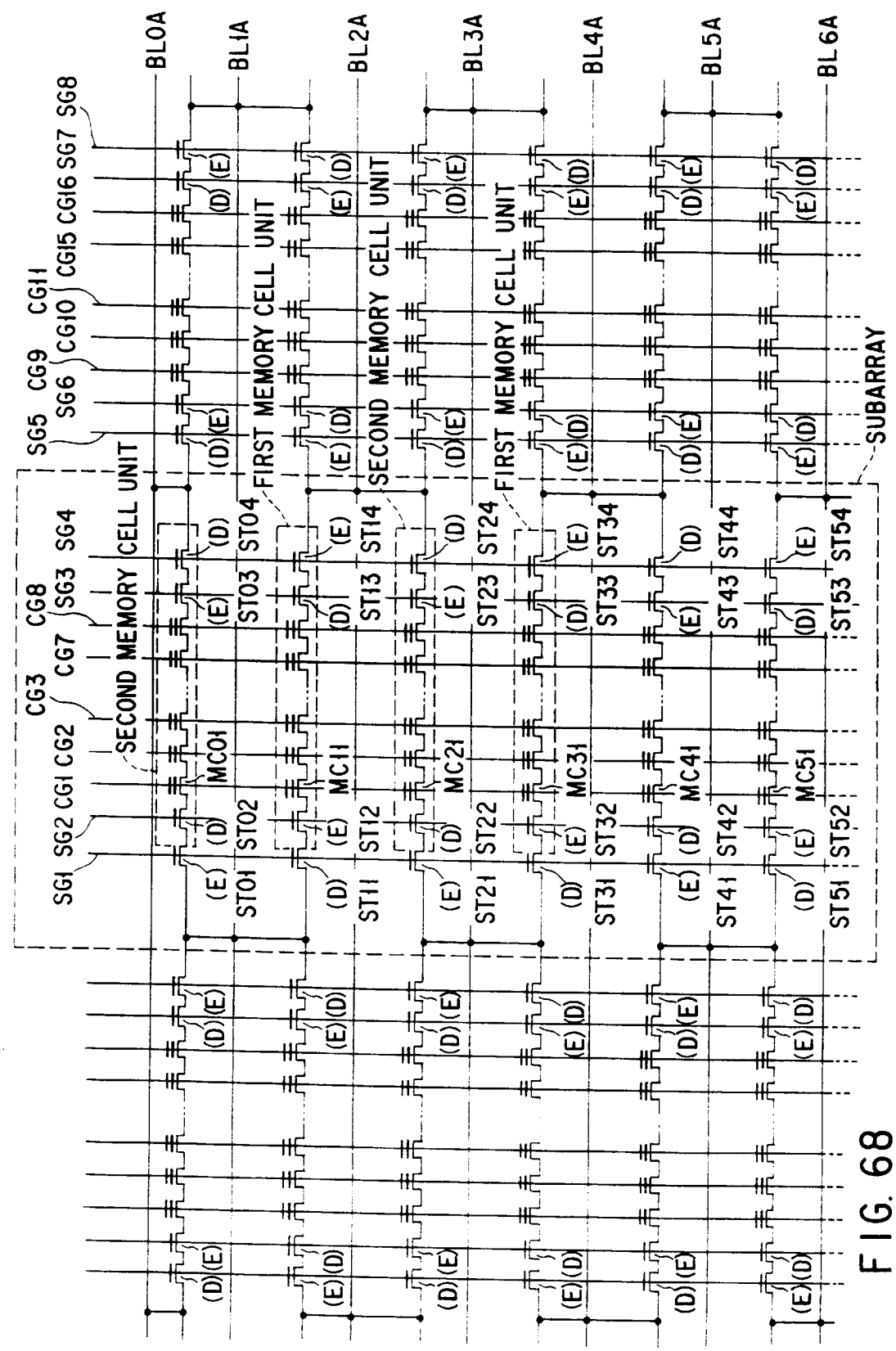
FIG. 68 shows a memory cell array structure in a twelfth embodiment of the present invention.

A memory cell unit may be formed by providing four select MOS transistors for each NAND cell column as shown in FIG. 68. Hereinafter, explanation will be given taking the first memory cell unit containing memory cell $MC_{11}$ and the second memory cell unit containing memory cell $MC_{21}$ of FIG. 68 as an example.

One end of a NAND cell column is connected to a bit line (e.g., bit line $BL_{2A}$) via two select MOS transistors (e.g., $ST_{13}$, $ST_{14}$), and the other end is connected to a bit line (e.g., bit line $BL_{1A}$) via two select MOS transistors (e.g., $ST_{11}$, $ST_{12}$). The two select MOS transistors connected in series are of the E-type (threshold voltage Vth1>0) and of the D type (threshold voltage Vth2<0). The select MOS transistors (e.g., $ST_{11}$, $ST_{13}$) of the first memory cell unit whose gate electrodes are select gates $SG_1$, $SG_3$ are of the D type, and the select MOS transistors (e.g., $ST_{21}$, $ST_{23}$) of the second memory cell unit are of the E-type. The select MOS transistors (e.g., $ST_{22}$, $ST_{24}$) of the second memory cell unit whose gate electrodes are select gate $SG_2$, $SG_4$ are of the D type, and the select MOS transistors (e.g., $ST_{12}$, $ST_{14}$) of the first memory cell unit are of the E-type.

The read operation and program operation in a twelfth embodiment of the present invention will be explained.

<Read Operation>

When the data in memory cells $MC_{11}$, $MC_{31}$, $MC_{51}$, ... in the first memory cell unit is read onto bit lines $BL_{2A}$, $BL_{4A}$, $BL_{6A}$, ..., bit line $BL_{2A}$, $BL_{4A}$, $BL_{6A}$, ... are first precharged to a bit-line read potential of $V_A$ (e.g., 1.8 V) and bit lines $BL_{1A}$, $BL_{3A}$, $BL_{5A}$, ... are grounded to 0 V. After the precharging has been completed, bit lines $BL_{2A}$, $BL_{4A}$, $BL_{6A}$, ... are brought into the floating state.

Next, control gate CG1 is placed at 0 V, and CG2 to CG8 are placed at Vcc (e.g., 3 V). Then, select gates $SG_2$, $SG_4$ are placed at Vcc and one or both of select gates $SG_1$ and $SG_3$ are placed at Vss. The other select gates and control gates are placed at 0 V. In this case, all of the select MOS transistors whose gate electrodes are $SG_2$, $SG_4$ turn on. The D-type select MOS transistors whose gate electrodes are select gates $SG_1$, $SG_3$ ($ST_{11}$, $ST_{13}$, $ST_{31}$, $ST_{33}$, ...) turn on. Of the E-type select MOS transistors whose gate electrodes are select gates $SG_1$, $SG_3$, the E-type select MOS transistors whose select gate is at Vss turn off.

Therefore, the data programmed into memory cells $MC_{11}$, $MC_{31}$, $MC_{51}$,... is "1", the precharged bit lines $BL_{2A}$, $BL_{4A}$, $BL_{6A}$, ... discharge to the grounded bit lines $BL_{1A}$, $BL_{3A}$, $BL_{5A}$, ... and drop from the precharge potential, thereby causing the data programmed in memory cells $MC_{11}$, $MC_{31}$, $MC_{51}$... in the first memory cell unit to be read onto bit lines $BL_{2A}$, $BL_{4A}$, $BL_{6A}$, ... On the other hand, when the data programmed into the memory cells is "0", bit lines $BL_{2A}$, $BL_{4A}$, $BL_{6A}$, ... will not discharge and remain at the precharge potential.

While in the above embodiment, bit lines $BL_{2A}$, $BL_{4A}$, $BL_{6A}$, ... have been precharged and bit lines $BL_{1A}$, $BL_{3A}$, $BL_{5A}$, ... are grounded, the data in the memory cells may be read onto bit lines $BL_{1A}$, $BL_{3A}$, $BL_{5A}$, ... by grounding bit lines $BL_{2A}$, $BL_{4A}$, $BL_{6A}$, and precharging bit lines $BL_{1A}$, $BL_{3A}$, $BL_{5A}$, ...

On the other hand, because one group (when one of $SG_1$ and $SG_3$ is placed at Vss) or both groups (when both of $SG_1$ and $SG_3$ are placed at Vss) of the E-type select MOS transistors whose gate electrodes are $SG_1$, $SG_3$ turn off, the data in the memory cells $MC_{01}$, $MC_{21}$, $MC_{41}$... is not read onto the bit lines.

<Program Operation>

Explanation will be given about the procedure for programming the data into memory cells $MC_{11}$, $MC_{31}$, $MC_{51}$, ... in the first memory cell unit.

Select gates $SG_1$, $SG_2$ are placed at Vss, causing one group of the select MOS transistors whose gate electrodes are select gates $SG_1$, $SG_2$, or the E-type select MOS transistors to turn off. $SG_3$, $SG_4$, CG1 to CG8 are placed at Vcc and bit lines $BL_{0A}$, $BL_{1A}$, $BL_{2A}$, $BL_{3A}$, ... are placed at Vcc, precharging the channels of the blocks to be written into to Vcc–Vth (lower than the bit-line potential vcc because of a drop in the threshold voltage of the select MOS transistor).

Thereafter, when select gate $SG_3$ is placed at Vss (0 V), the D-type select MOS transistors $ST_{13}$, $ST_{33}$, $ST_{53}$, ... whose gate electrode is select gate $SG_3$ turn on, but the E-type select MOS transistors $ST_{03}$, $ST_{23}$, $ST_{43}$, ... turn off, bringing the channels of the memory cells $MC_{011}$ $MC_{21}$, $MC_{41}$, ... not to be programmed into in the floating state at a potential of Vcc–Vth charged from the bit lines. At this time, select gate $SG_4$ remains at Vcc.

The data programmed into the memory cells $MC_{11}$, $MC_{31}$, $MC_{51}$, ... in the first memory cell unit is supplied from bit lines $BL_{2A}$, $BL_{4A}$, $BL_{6A}$, ... For example, when "0" is programmed into memory cell $MC_{11}$, bit line $BL_{2A}$ is placed at 0 V, turning on E-type select MOS transistor $ST_{14}$ because $SG_4$ is at Vcc, placing the channel of memory cell $MC_{11}$ at 0 V. When "1" is programmed into memory cell $MC_{11}$, bit line $BL_{2A}$ is placed at 3 V, turning off E-type select MOS transistor $ST_{14}$, bringing the channel of memory cell $MC_{11}$ into the floating state at Vcc–Vth. Bit lines $BL_{1A}$, $BL_{3A}$, $BL_{5A}$,... may be place at Vcc or 0 V or may be placed at a given voltage.

After select gate $SG_3$ has been changed from Vcc to Vss, control gates CG1 to CG8 are changed from Vcc to an intermediate potential of $V_M$ (about 10 V). Since the channels of memory cells $MC_{01}$, $MC_{21}$, $MC_{41}$, ... not to be programmed into and the channels of memory cells $MC_{11}$, $MC_{31}$, $MC_{51}$, ... into which "1" programmed are in the floating state, they are raised from Vcc–Vth to the intermediate potential (about 10 V) through the capacitive coupling between the control gates and the channels. The channels of memory cells $MC_{11}$, $MC_{31}$, $MC_{51}$, ... into which "0" is programmed are at 0 V because the bit lines are at 0 V.

After the channels of unselected memory cells in programming and memory cells into which "1" is programmed have risen from Vcc–Vth to the intermediate potential, control gate CG1 is raised from the intermediate potential of $V_M$ to a program voltage of Vpp (20 V). Then, because the channels of memory cells $MC_{01}$, $MC_{21}$, $MC_{41}$, ... not to be programmed into in the second memory cell unit and the channels of memory cells $MC_{11}$, $MC_{31}$, $MC_{51}$, ... into which "1" is programmed are at the intermediate potential (about 10 V) and the control gate CG1 is at Vpp (about 20 V), these memory cells are not written into. However, the channels of memory cells $MC_{11}$, $MC_{31}$, $MC_{51}$, ... into which "0" is programmed are at 0 V and the control gate is at Vpp (about 20 V), electrons are injected from the substrate into the floating gate, thereby programming "0".

By placing $SG_1$, $SG_4$ at Vcc and $SG_2$, $SG_3$ at Vss, bit lines $BL_{1A}$, BL3A, $BL_{5A}$, ... may be placed at Vcc. In this case, bit lines $BL_{1A}$, $BL_{3A}$, $BL_{5A}$, ... can transfer a program unselected potential (Vcc) to the second memory cell unit and bit lines $BL_{2A}$, $BL_{4A}$, $BL_{6A}$, programming "1" and Vss for programming "0") almost simultaneously.

When the data is programmed into the second memory cell unit, select gate $SG_3$ is placed at Vcc and $SG_1$, $SG_2$, $SG_4$ are placed at Vss after the channel of the first memory cell unit has been precharged to Vcc–Vth. In this case, the programming data is transferred from bit lines $BL_{0A}$, $BL_{2A}$, $BL_{4A}$, $BL_{6A}$, ... to the second memory cell unit. Furthermore, by placing $SG_1$ at Vcc and $SG_2$, $SG_3$, $SG_4$ at Vss, the programming data may be transferred from bit lines $BL_{1A}$, $BL_{3A}$, $BL_{5A}$, ... to the second memory cell unit.

Furthermore, when the data is written into the first memory cell unit, the second memory cell unit may be programmed into almost at the same time. At this time, by placing $SG_1$, $SG_4$ at Vcc and $SG_2$, $SG_3$ at Vss, the data to be programmed into the first memory cell unit is transferred from bit lines $BL_{2A}$, $BL_{4A}$, $BL_{6A}$, memory cell unit is transferred from bit lines $BL_{1A}$, $BL_{3A}$, $BL_{5A}$, ...

Furthermore, the data can also be programmed into the first and second memory cell units almost simultaneously by setting the voltages of the select gates as follows. By placing $SG_1$, $SG_4$ at Vss and $SG_2$, $SG_3$ at Vcc, the data to be programmed into the second memory cell unit is transferred from bit lines $BL_{0A}$, $BL_{2A}$, $BL_{4A}$, $BL_{6A}$, ..., and the data to be programmed into the first memory cell unit is transferred from bit lines $BL_{1A}$, $BL_{3A}$, $BL_{5A}$, ...

With the present embodiment, when Vss is applied to the select gates in a read and a program operation, of the select MOS transistors whose gate electrode is the select gate, the E-type select MOS transistors turn off and the D-type select MOS transistors turn on. The D-type select MOS transistors may be of the I-type (whose threshold voltage is positive). In this case, instead of Vss applied to the select gate, Vsgl that turns off the E-type select MOS transistor but turns on the I-type select MOS transistor is applied.

Another writing method of the present embodiment will be explained.

When the data is programmed into memory cells $MC_{11}$, $MC_{31}$, $MC_{51}$, ... in the first memory cell unit, select gates $SG_1$, $SG_4$ are placed at the intermediate potential $V_M$, select gates $SG_2$, $SG_3$ at 0 V, control gate CG1 at Vpp, and CG2 to CG8 at $V_M$. The E-type select MOS transistors ($ST_{12}$, $ST_{32}$, $ST_{52}$, ..., $ST_{03}$, $ST_{23}$, $ST_{43}$, ...) whose gate electrodes are select gates $SG_2$, $SG_3$ turn on. Therefore, the first memory cell unit become conducting to bit lines $BL_{2A}$, $BL_{4A}$, $BL_{6A}$, become nonconducting to bit lines $BL_{0A}$, $BL_{2A}$, $BL_{4A}$, $BL_{6A}$, ... and conducting to bit lines $BL_{1A}$, $BL_{3A}$, $BL_{5A}$, ...

Therefore, the programming data to memory cells $MC_{11}$, $MC_{31}$, $MC_{51}$, ... is supplied from bit lines $BL_{2A}$, $BL_{4A}$, $BL_{6A}$, ... Namely, when "0" is programmed, the bit lines are placed at 0 V. When "1" is programmed, the bit lines are placed at the intermediate potential $V_M$. If the threshold voltage of the C-type select MOS transistor is, for example, at −15 V, the potential $V_M$ of the bit lines in programming "1" can be transferred to the channel of the memory cell.

On the other hand, when the data is programmed into memory cells $MC_{11}$, $MC_{31}$, $MC_{51}$, ..., the data may or nay not be programmed into memory cells $MC_{01}$, $MC_{21}$, $MC_{41}$, ... in the second memory cell unit. When the data is not programmed into memory cells $MC_{01}$, $MC_{21}$, $MC_{41}$, ..., lines $BL_{1A}$, $BL_{3A}$, $BL_{5A}$, ... are placed at $V_M$. When the data is written, 0 V (in programming "0") or $V_M$ (in programming "1") is applied.

As described in the seventh embodiment, with the present invention, of the select MOS transistors sharing a single select gate, some are made conducting and the other are made nonconducting. Therefore, the threshold voltages of the select MOS transistors and the voltages applied to the select gates are arbitrary.

For example, the threshold voltage of the select MOS transistor whose gate electrode is select gate $SG_1$ may be 0.7 V and −0 V, the threshold voltage of the select MOS transistor whose gate electrode is select gate $SG_2$ may be −0.5 V and −1.5 V, the threshold voltage of the select MOS transistor whose gate electrode is select gate $SG_3$ may be 1.5 V and 3.3 V, and the threshold voltage of the select MOS transistor whose gate electrode is select gate $SG_4$ may be 3.1 V and 3.6 V. In this case, for example, $SG_1$ is at 0 V, $SG_2$ is at −1 V, $SG_3$ is at 2 V, and $SG_4$ is at 3.3 V as voltages that turn on half of the select MOS transistors whose gate electrodes are the select gates and turn off the remaining half in a read or a program operation. For a voltage that turns on all of the select MOS transistors whose gate electrodes are the select gates, for example, $SG_1$ is at 2.8 V, $SG_2$ is at −0.2 V, $SG_3$ is at 3.6 V, and $SG_4$ is at 4 V.

Figure 70:
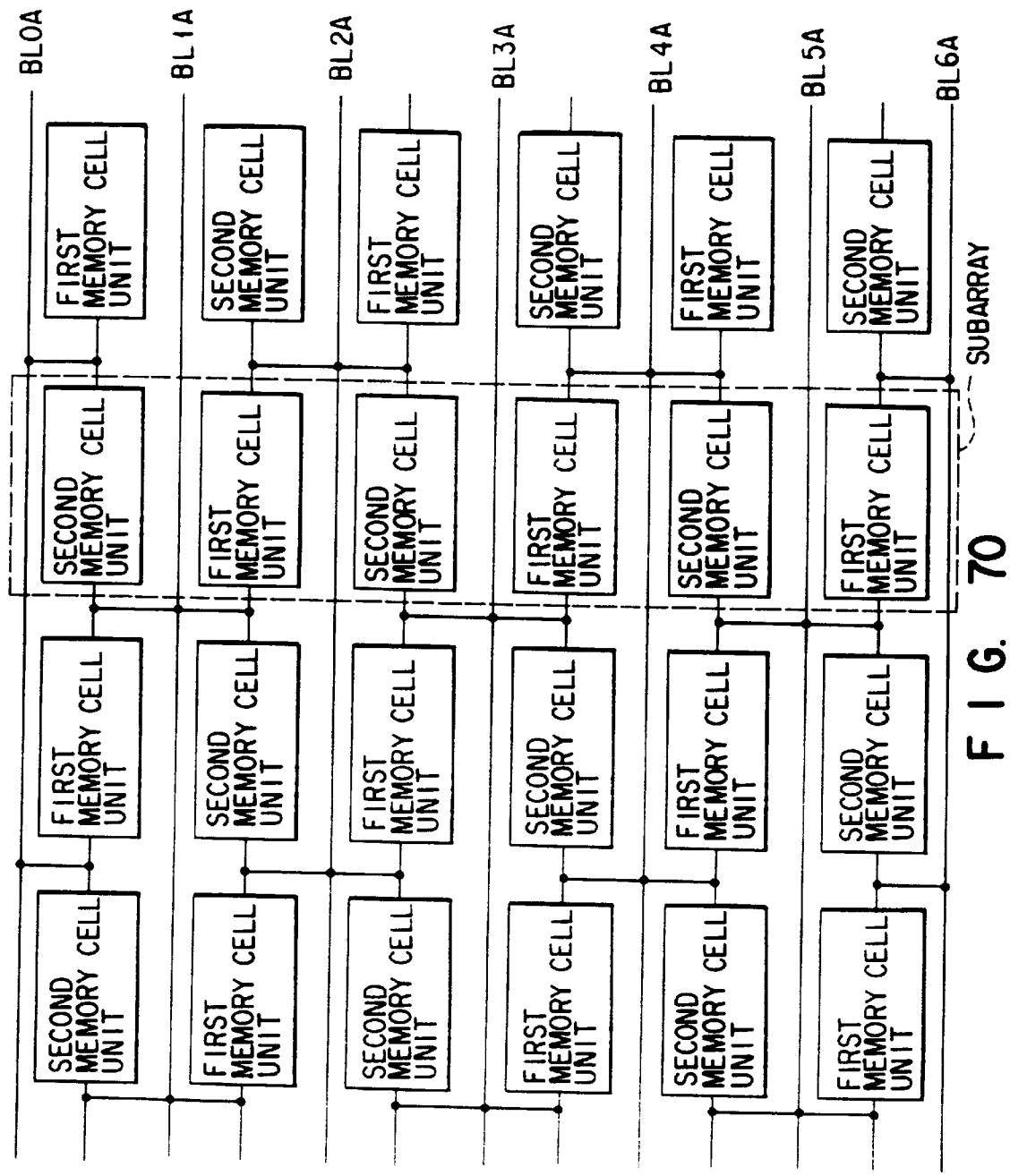
FIG. 70 shows a memory cell array structure of the present invention.

As shown in the seventh to twelfth embodiments, with the present invention, the first and second memory cell units composed of memory cell sections and select MOS transistors share one end of each memory cell unit as shown in FIG. 69 to form a subarray. One end of the first memory cell unit and that of the second memory cell unit share a contact and connect to the bit lines as shown in FIG. 70. Furthermore, both ends of the first and second memory cell units are shared as shown in FIG. 71 to form a subarray. In this case, for example, both ends of the memory cell units share contacts and connect to the bit lines.

Figure 73:
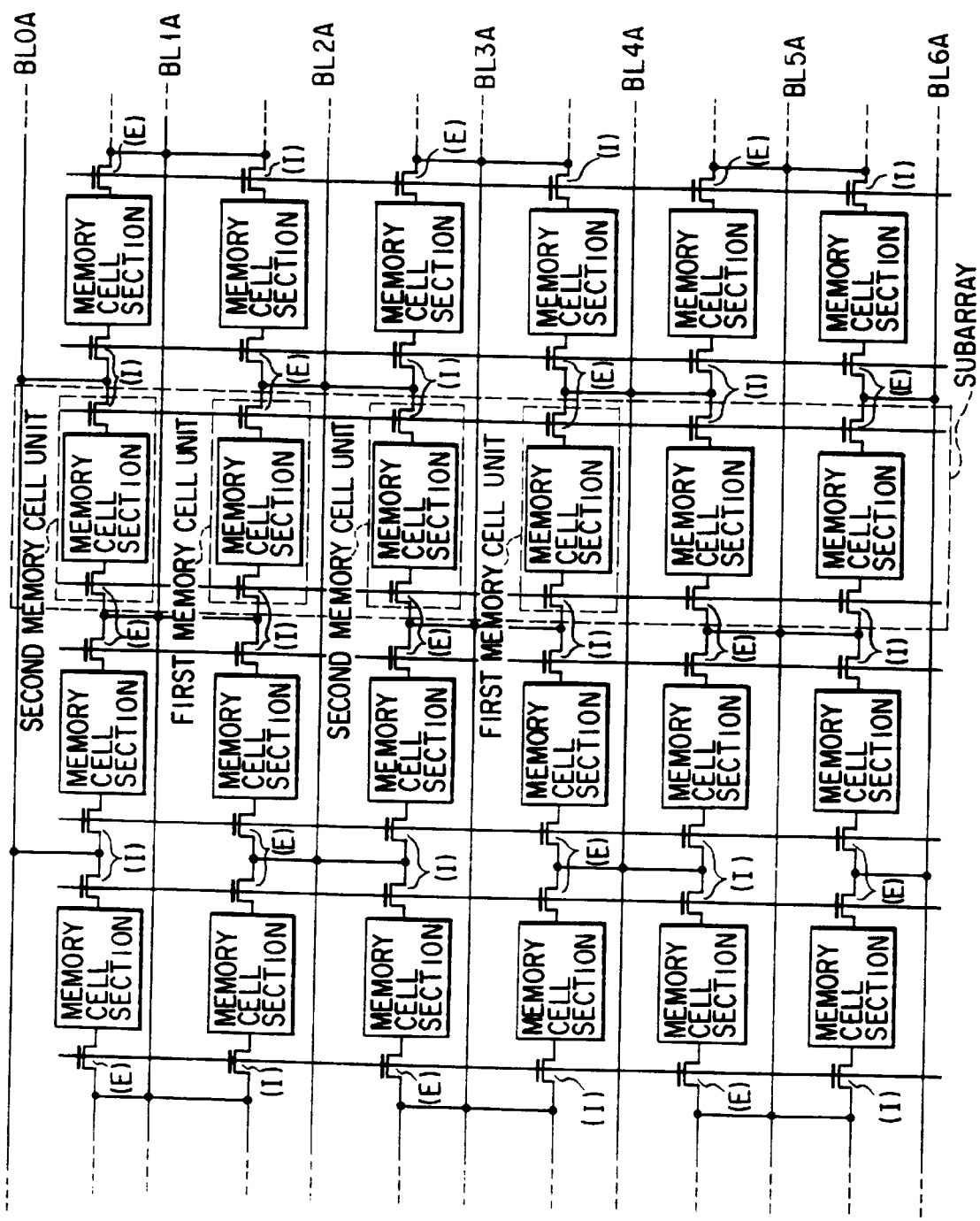
FIG. 73 shows a memory cell array structure of the present invention.

For means for selecting either the first memory cell unit or the second memory cell unit in a read or a program operation, for example, select MOS transistors are each provided at both ends of the memory cell section as shown in FIG. 73. By making different the threshold voltages of the select MOS transistors sharing the gate electrode between the first memory cell unit and the second memory cell unit, one is made conducting and the other is made nonconducting. Furthermore, as described above, three or four select MOS transistors may be provided in the memory cell unit, and three or more threshold voltages of the select MOS transistors may be used. There may be no select MOS transistor on one side. Examples of the memory cell unit are shown in FIGS. 74A to 76.

Furthermore, in the present embodiment, a NAND cell (FIG. 77C) where adjacent memory cells share the source and drain has been explained. The present invention is not limited to the NAND cell, but may be applied to any type of cells, provided that the memory cell section is made of nonvolatile memory cells. The invention may be applied to, for example, a memory cell section composed of a NOR EEPROM as shown in FIG. 77A, an AND-cell EEPROM (H. Kume et al., IEDM Tech. Dig., December 1992, pp. 991–993) as shown in FIG. 77B, or what is called a mask ROM.

A thirteenth embodiment of the present invention will be explained.

Figure 78:
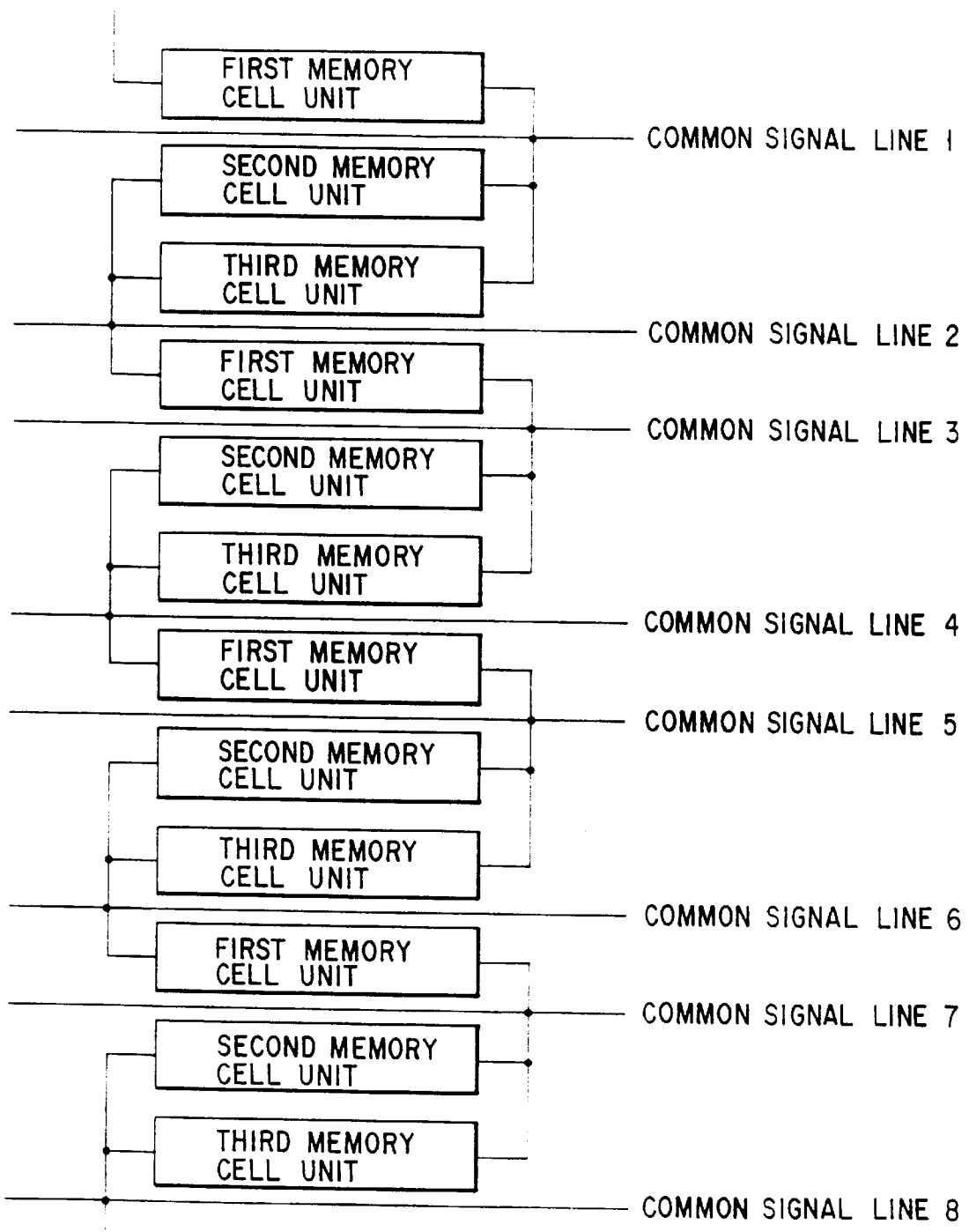
FIG. 78 shows the structure of a subarray associated with a thirteenth embodiment of the present invention.
Figure 79:
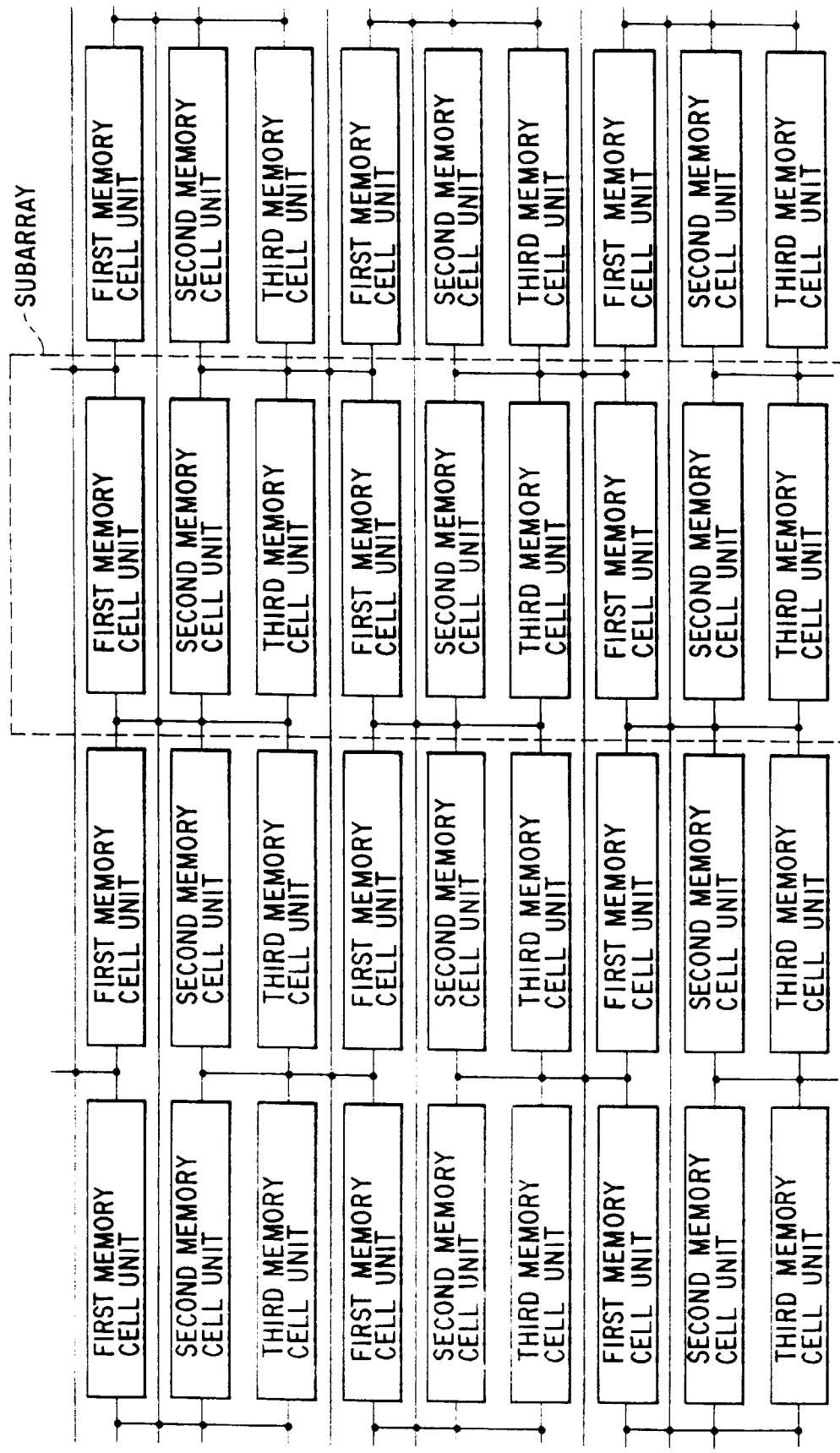
FIG. 79 shows the structure of a memory cell array associated with the thirteenth embodiment.

In the thirteenth embodiment, memory cell units composed of memory cells or of memory cells and select transistors are arranged as shown in FIG. 78 to form subarrays. Specifically, three memory cell units share a contact at one end of each memory cell unit, which is connected to a common signal line. The three memory cell units also share a contact at the other end of each memory cell unit, which is connected to a common signal line. Then, subarrays are arranged side by side to form a memory cell array as shown in FIG. 79.

Figure 80A:
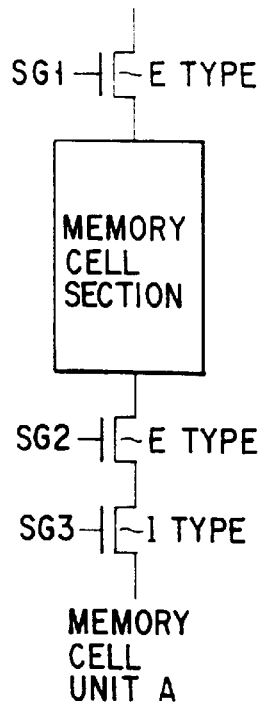
FIGS. 80A to 80C show structures of the memory cell unit of the thirteen embodiment.
Figure 80B:
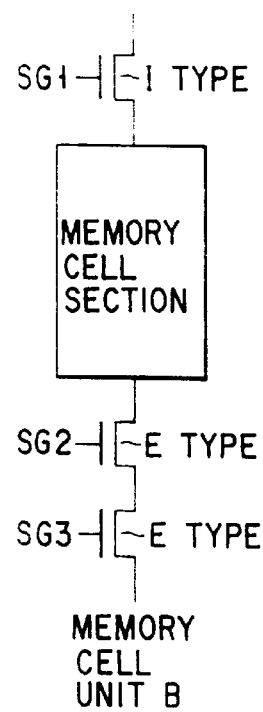
Figure 80C:
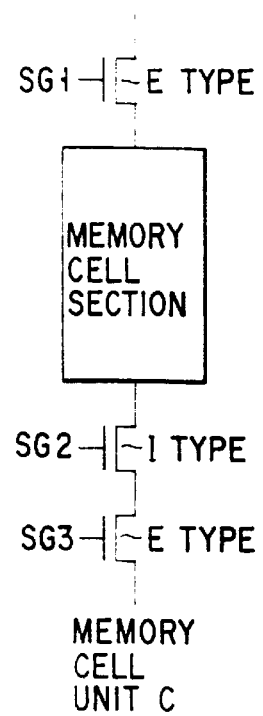
Figure 81A:
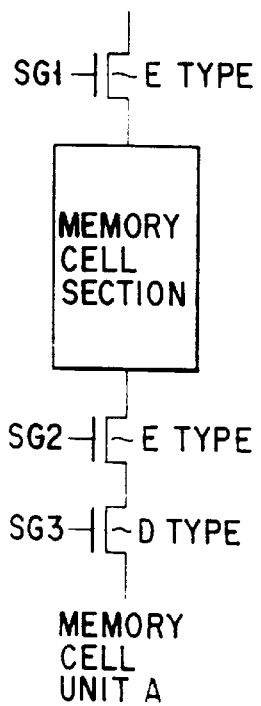
FIGS. 81A to 81C show other structures of the memory cell unit of the thirteen embodiment.
Figure 81B:
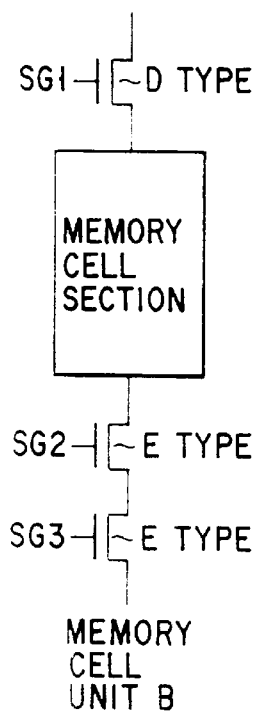
Figure 81C:
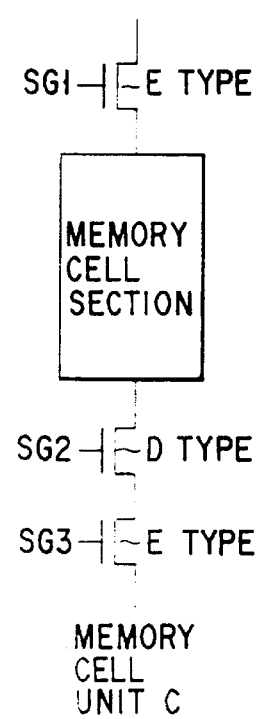

The memory cell unit is composed of select transistors and a memory cell section made up of memory cells as shown in FIGS. 80A to 81C. Memory cell units A, B, and C correspond to any one of the memory cell units in FIGS. 78 and 79. Since the former correspond to the latter arbitrarily, there are six combinations (e.g., A:1, B:2, C:3 and A:2, B:3, C:1). In FIGS. 80A to 80C, the threshold voltage Vt1 of the E-type select gate is higher than the threshold voltage Vt2 of the I-type select gate: for example, Vt1=2 V and Vt2=0.5 V. In FIGS. 81A to 81C, the threshold voltage of the C-type select gate is −0.8 V, for example.

When the memory cells in FIGS. 80A to 80C are selected, two voltages applied to select gates $SG_1$, $SG_2$, $SG_3$ in the selected block are used: voltage Vsgh (e.g., 3 V) that turns on both the E-type and the I-type and Vsgl (e.g., 1.5 V) that turns on the I-type but turns off the E-type. Of the three memory cells, for example, $SG_1$ and $SG_2$ are placed at Vsgh and $SG_3$ is placed at Vsgl to select memory cell unit A; $SG_1$ is placed at Vsgl, $SG_2$ and $SG_3$ is placed at Vsgh to select memory cell unit B. Similarly, $SG_1$ and $SG_3$ are placed at Vsgh and $SG_2$ is placed at Vsgl to select memory cell unit C.

When 0 V is applied to the select gates in the unselected block, all of the select transistors in the unselected block turn on, preventing the bit lines from leaking via the unselected block.

In the case of the memory cell units of FIGS. 81A to 81C, the way of selecting memory cell units is almost the same as in FIGS. 80A to 80C except that Vsgl applied in the selected block is 0 V. With the Vsgl, the E-type select gate turns off and the D-type select gate turns on. Furthermore, because it is desirable that the select gates should be turned off to prevent the bit lines from leaking, a negative voltage (e.g., –1 V) may be applied to the select gates in the unselected block to turn off the D-type select gate.

The memory cell section has a wide variety of arrangements and can employ examples shown in FIG. 76 and FIGS. 77A to 77C. Furthermore, the present invention is not limited to EEPROMs. It may be applied to EEPROMs and mask ROMs.

Hereinafter, the thirteenth embodiment will be described in detail, taking a NAND-cell EEPROM as an example.

The configuration of a NAND-cell EEPROM associated with the present embodiment is the same as that of FIG. 48, and will be omitted here.

Figure 82A:
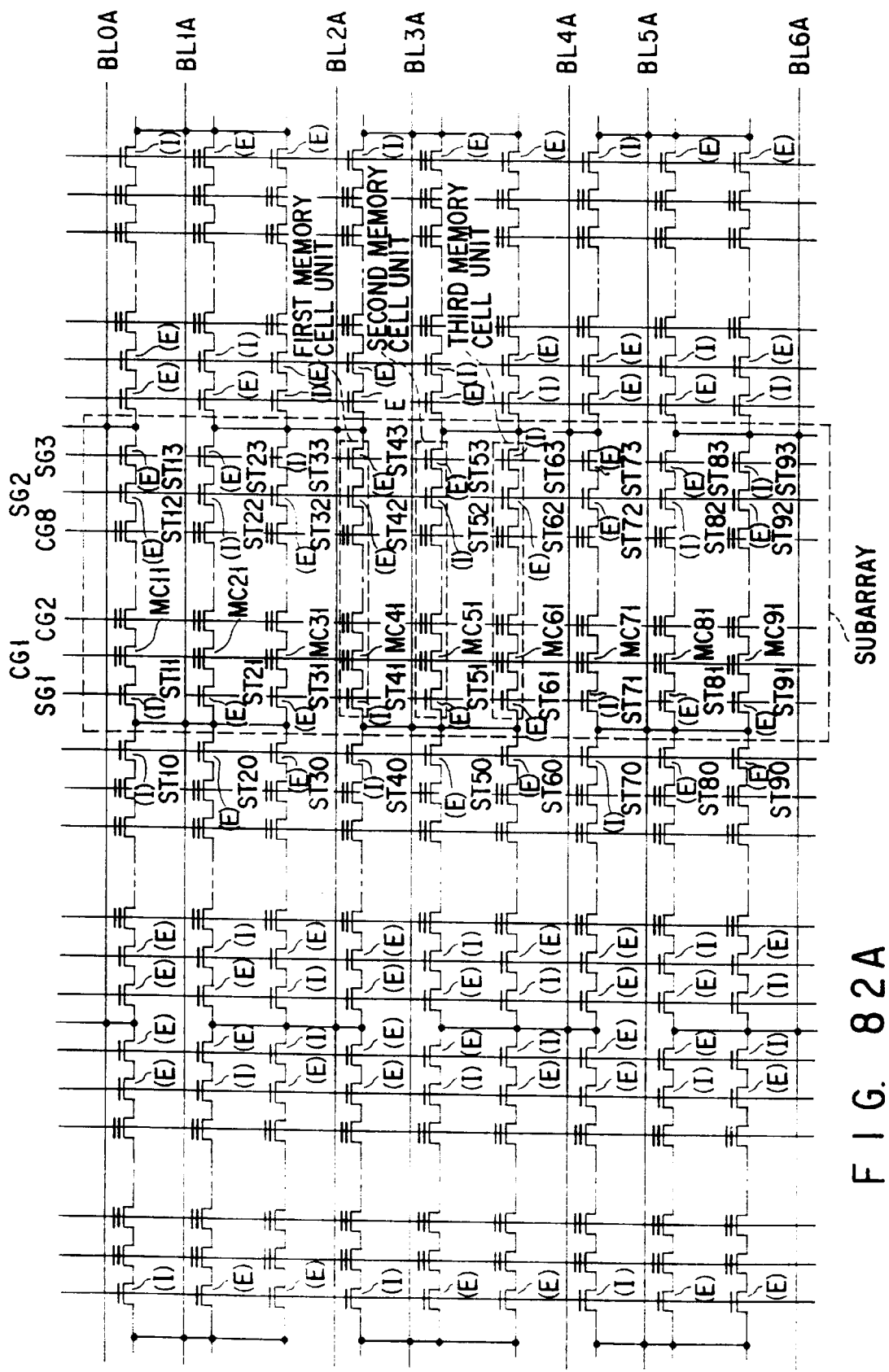
FIGS. 82A and 82B show structures of the memory cell section of the thirteenth embodiment.
Figure 82B:
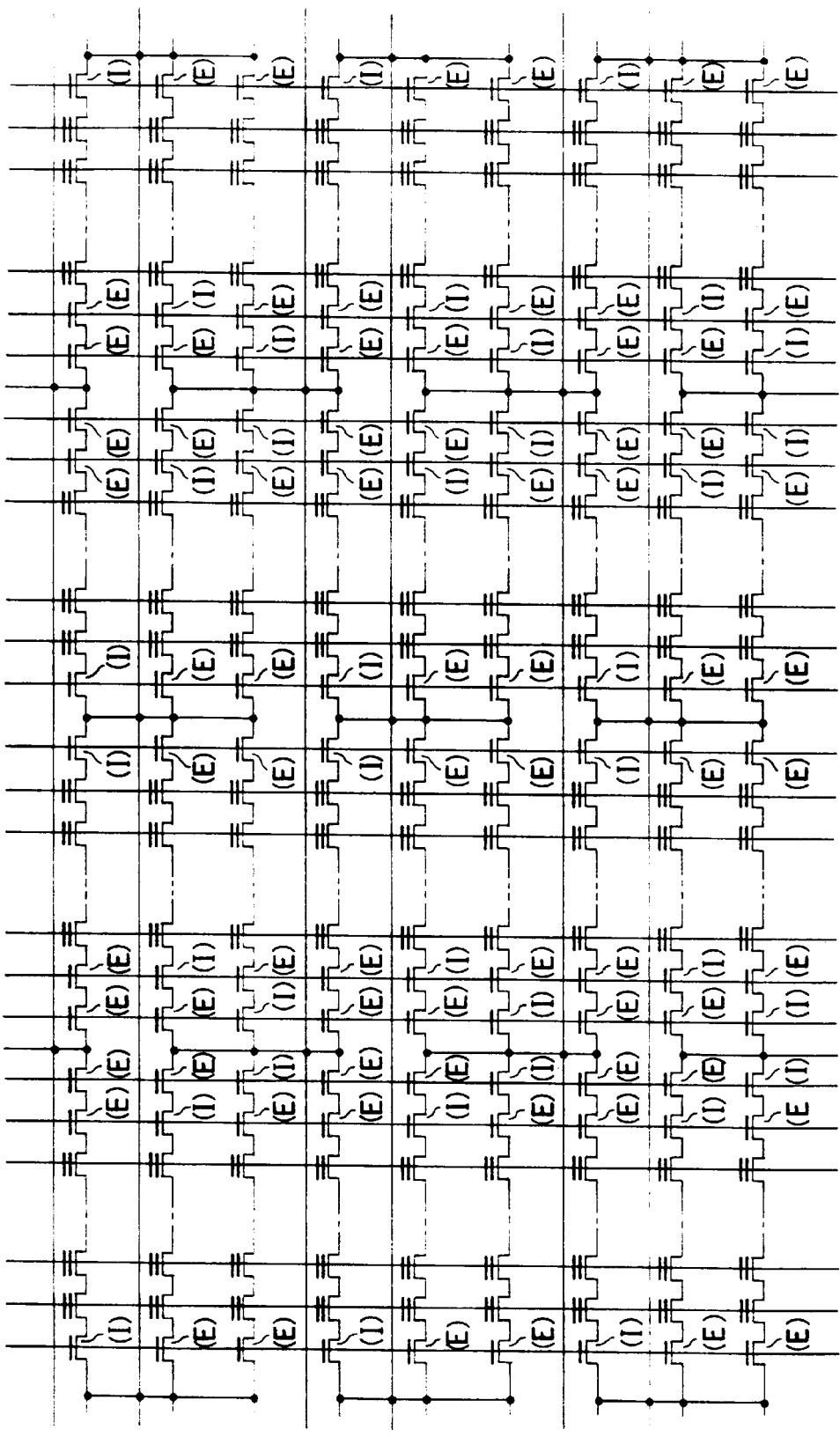

FIG. 82A shows memory cell array 1A and FIG. 82B shows memory cell array 1B. In the thirteenth embodiment, the memory cell arrays (FIGS. 82A and 82B) are brought into contact with the bit lines, unlike the memory cell array of FIG. 3 where the source-side select gate (the second select gate) is not connected to the source line of an n-type diffusion layer. Namely, because the low-resistance bit lines play a role of the source lines in a read operation, the reading speed becomes faster. Furthermore, every three memory cell columns share two bit lines, so that the pitch of bit lines is 1.5 times that of the conventional equivalent, facilitating the working of bit lines.

in the memory cell array of the thirteenth embodiment, there are provided two threshold voltages Vth1, Vth2 (Vth>Vth2) of the select MOS transistor connecting a single NAND cell column to the bit lines. A select MOS transistor with a high threshold voltage of Vth1 (e.g., 2 V) is determined to be of the E-type, and a select MOS transistor with a low threshold voltage of Vth2 (e.g., 0.5 V) is determined to be the I-type. Voltages applied to the select gates are voltage Vsgh (e.g., 3 V) (Vsgh>Vt1, Vt2) that turns on both the I-type transistor and the E-type transistor and voltage Vsgl (e.g., 1.5 V) (Vt1>Vsgl>Vt2) that turns on the I-type transistor and turns off the E-type transistor.

By using two threshold voltages of the select MOS transistors and two voltages applied to the select gates as noted above, it is possible to make both ends of one of three NAND cell units sharing a contact conductive to two bit lines and the other memory cell units nonconductive.

The read and program operations will be described concretely.

<Read Operation>

When the data in memory cells $MC_{11}$, $MC_{41}$, $MC_{71}$, onto bit lines $BL_{1A}$, $BL_{3A}$, $BL_{5A}$, . . . , bit line $BL_{1A}$, $BL_{3A}$, $BL_{5A}$, . . . are first precharged to a bit-line read potential of $V_A$ (e.g., 1.8 V) and bit lines $BL_{0A}$, $BL_{2A}$, $BL_{4A}$, $BL_{6A}$, . . . are grounded to 0 V. After the precharging has been completed, bit lines $BL_{1A}$, $BL_{3A}$, $BL_{5A}$, . . . are brought into the floating state.

Next, control gate CG1 is placed at 0 V, and CG2 to CG8 are placed at Vcc (e.g., 3 V). Then, select gate $SG_1$ is placed at Vsgl, and select gates $SG_2$, $SG_3$ are placed at Vsgh. The other select gates and control gates are placed at 0 V. In this case, the select MOS transistors connected to bit lines $BL_{0A}$, $BL_{2A}$, $BL_{4A}$, . . . ($ST_{12}$, $ST_{13}$, $ST_{22}$, $ST_{23}$, $ST_{32}$, $ST_{33}$, $ST_{42}$, $ST_{43}$, $ST_{52}$, $ST_{53}$, . . . ) turn on. The I-type select MOS transistors connected to bit lines $BL_{1A}$, $BL_{3A}$, $BL_{5A}$, select MOS transistors ($ST_{21}$, $ST_{31}$, $ST_{51}$, $ST_{61}$, $ST_{81}$, Therefore, the data programmed into memory cells $MC_{11}$, $MC_{41}$, $MC_{71}$, . . . is "1", the precharged bit lines $BL_{1A}$, $BL_{3A}$, $BL_{5A}$, . . . discharge to the grounded bit lines $BL_{0A}$, $BL_{2A}$, $BL_{4A}$, . . . and drop from the precharge potential, thereby causing the data programmed in memory cells $MC_{11}$, $MC_{41}$, $MC_{71}$. . . in the first memory cell unit to be read onto bit lines $BL_{1A}$, $BL_{3A}$, $BL_{5A}$, . . . On the other hand, when the data programmed into the memory cells is "0", bit lines $BL_{1A}$, $BL_{3A}$, $BL_{5A}$, . . . will not discharge and remain at the precharge potential.

On the other hand, because the E-type select MOS transistors connected to bit lines $BL_{1A}$, $BL_{3A}$, $BL_{5A}$, memory cells $MC_{21}$, $MC_{31}$, $MC_{51}$, $MC_{61}$, . . . in the second and third memory cell units is not read onto bit lines $BL_{1A}$, $BL_{3A}$, $BL_{5A}$, . . .

When the data in memory cells $MC_{21}$, $MC_{51}$, $MC_{81}$, lines $BL_{2A}$, $BL_{4A}$, $BL_{6A}$, . . . , select gates $SG_1$, $SG_3$ are placed at Vsgh and $SG_2$ is placed at Vsgl. When the data in memory cells $MC_{31}$, $MC_{61}$, $MC_{91}$, . . . in the third memory cell unit is read onto bit lines $BL_{2A}$, $BL_{4A}$, $BL_{6A}$, . . . . select gates $SG_1$, $SG_2$ are placed at Vsgh and $SG_3$ is placed at Vsgl.

As described above, with the present embodiment, the source lines (n-type diffusion layers) in the conventional memory cell array are eliminated, and half of the bit lines are grounded in a read operation and play the same role as the conventional source lines and the data in the memory cells is read onto the remaining half of the bit lines. By using the bit lines formed of, for example, low-resistance polysilicon or Al in place of the conventional high-resistance n-type diffusion layers, the problem of source-line bouncing can be solved.

Using a timing chart, the read operation will be explained in more detail.

FIG. 83 is a timing chart for reading the data programmed in memory cells $MC_{11}$, $MC_{41}$, $MC_{71}$, . . . in the first memory cell unit of FIG. 82A.

Bit lines $BL_{0A}$, $BL_{2A}$, $BL_{4A}$, $BL_{6A}$, . . . are connected to sense amplifier SA1 of FIG. 52A, and bit lines $BL_{1A}$, $BL_{3A}$, $BL_{5A}$, . . . are connected to sense amplifier SA2 of FIG. 52B. The sense amplifiers are composed of CMOS flip-flops controlled by control signals $\phi_P$, $\phi_N$.

First, precharge signals $PR_{A1}$, $PR_{A2}$, $PR_{B2}$ change from Vss to Vcc (time t0), bit lines $BL_{1A}$, $BL_{3A}$, $BL_{5A}$, . . . go to $V_{A2}$ (e.g., 1.7 V), and (dummy) bit lines $BL_{1B}$, $BL_{3B}$, $BLa_{5B}$, . . . are precharged to $VB_2$ (e.g., 1.5 V) (time t1). $V_{A1}$ is 0 V and bit lines $BL_{0A}$, $BL_{2A}$, $BL_{4A}$, $BL_{6A}$, . . . are grounded.

After the precharging has been completed, $PR_{A2}$, $PR_{B2}$ go to Vss, bringing bit lines $BL_{1A}$, $BL_{3A}$, $BL_{5A}$, . . . into the floating state. Thereafter, row decoder 3 applies specified voltages to the select gate and the control gate (time 2). Control gate CG1 is at 0 V, CG2 to CG8 are at Vcc (e.g., 3 V), $SG_2$ and $SG_3$ are at 3 V (Vsgh), and $SG_1$ is at 1.5 V (Vsgl).

When the data programmed in the memory cells $MC_{11}$, $MC_{41}$, $MC_{71}$, . . . is "0", the threshold voltages of the memory cells will be positive, so that no current will flow and the potential of bit lines $BL_{1A}$, $BL_{3A}$, $BL_{5A}$, current will flow, causing the potential of bit lines $BL_{1A}$, $BL_{3A}$, $BL_{5A}$, . . . to drop to 1.5 V or below. Because select gate $SG_1$ is at 1.5 V, the E-type select MOS transistors whose gate electrode is $SG_1$ turn off, preventing the data in the memory cells in the second and third memory cell units are not transferred to the bit lines. In the meantime, (dummy) bit lines $BL_{1B}$, $BL_{3B}$, $BL_{5B}$, . . . are kept at the precharge potential of 1.5 V.

Thereafter, at time t3, $\phi_P$ goes to 3 V and $\phi_N$ goes to 0 V, deactivating CMOS flip-flop FF. At time t4, $\phi_E$ goes to 3 V, thereby equalizing CMOS flip-flop FF in SA2, placing nodes N1, N2 at Vcc/2 (e.g., 1.5 V). At time t5, $SS_2$, $S_A$, $S_B$ go to 3 V, connecting the bit line to the sense amplifier, and thereafter $\phi_N$ rises from 0 V to 3 V and $\phi_P$ drops from 3 V to 0 V, causing the potential difference between bit lines $BL_{1A}$, $BL_{3A}$, $BL_{5A}$, . . . and bit lines $BL_{1B}$, $BL_{3B}$, $BL_{5B}$, . . . to be amplified (time t6).

Specifically, if "0" is programmed in memory cells $MC_{11}$, $MC_{41}$, $MC_{71}$, . . . , node N1 in SA2 will be at 3 V and node N2 will be at 0 V. If "1" is programmed in memory cells $MC_{11}$, $MC_{31}$, $MC_{51}$, . . . , node N1 will be at 0 V and node N2 will be at 3 V. Thereafter, when column select signal CSL rises from 0 V to 3 V, the data latched in the CMOS flip-flop is outputted to I/O, I/O' (time t7).

Bit lines $BL_{0A}$, $BL_{2A}$, $BL_{4A}$, $BL_{6A}$, . . . are grounded to 0 V through the read operation. Namely, every other bit line is grounded. Therefore, the distance between reading bit lines is twice that when the bit lines are not grounded, reducing noise attributable to the capacitive coupling between bit lines. Furthermore, bit lines $BL_{0B}$, $BL_{2B}$, $BL_{4B}$, $BL_{6B}$, . . . may be grounded by placing $PR_{B1}$ at Vcc and $V_{B1}$ at 0 V through a read operation. This makes it possible to reduce noise due to the capacitive coupling between bit lines in amplifying the potential of the bit line.

Figure 84:
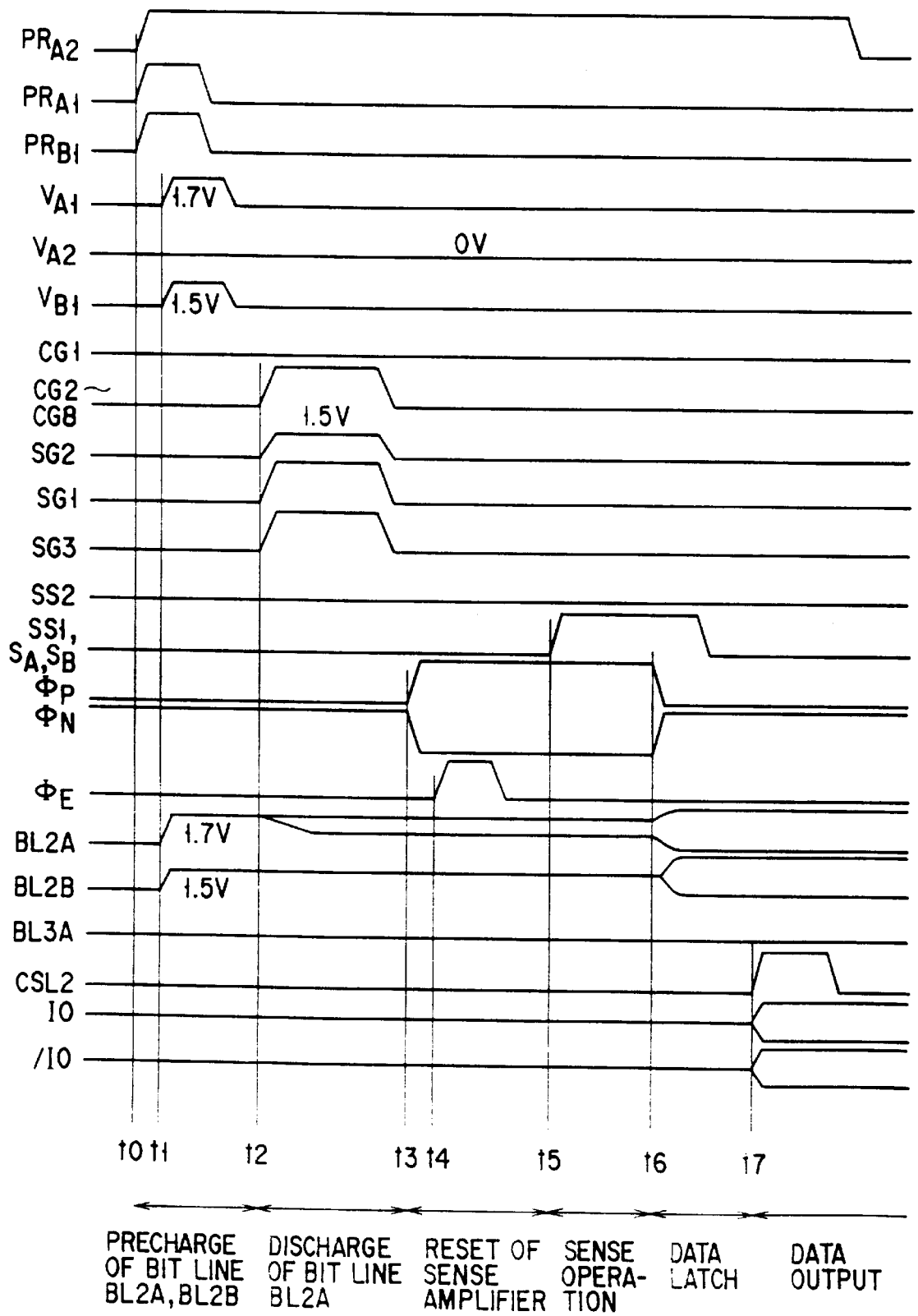
FIG. 84 is a timing chart to help explain the data read operation in the thirteenth embodiment.

FIG. 84 is a timing chart for reading the data programmed in memory cells $MC_{21}$, $MC_{51}$, $MC_{81}$, . . . in the second memory cell unit of FIG. 82A.

First, precharge signals $PR_{A1}$, $PRA_{A2}$, $PR_{B2}$ change from Vss to Vcc (time t0), bit lines $BL_{2A}$, $BL_{4A}$, . . . go to $V_A$ (e.g., 1.7 V), and (dummy) bit lines $BL_{2B}$, $BL_{4B}$, is 0 V and bit lines $BL_{1A}$, $BL_{3A}$, $BL_{5A}$, . . . are grounded.

After the precharging has been completed, $PR_{A1}$, $PR_{B1}$ go to Vss, bringing bit lines $BL_{2A}$, $BL_{4A}$, . . . into the floating state. Thereafter, row decoder 3 applies specified voltages to the select gate and the control gate (time 2). Control gate CG1 is at 0 V, CG2 to CG8 are at Vcc (e.g., 3 V), $SG_2$ and $SG_3$ are at 3 V (Vsgh), and $SG_2$ is at 1.5 V (Vsgl).

When the data programmed in the memory cells $MC_{21}$, $MC_{51}$, $MC_{81}$, . . . is "0", the threshold voltages of the memory cells will be positive, so that no current will flow and the potential of bit lines $BL_{2A}$, $BL_{4A}$, . . . will remain at 1.7 V. When the data is "1", a cell current will flow, causing the potential of bit lines $BL_{2A}$, $BL_{4A}$, . . . to drop to 1.5 V or below. Because select gate $SG_2$ is at 1.5 V, the E-type select MOS transistors whose gate electrode is $SG_2$ turn off, preventing the data in the memory cells in the first and third memory cell units are not transferred to the bit lines. In the meantime, (dummy) bit lines $BL_{2B}$, $BL_{3B}$, $BL_{4B}$, . . . are kept at the precharge potential of 1.5 V.

Thereafter, at time t3, $\phi_P$ goes to 3 V and $\phi_N$ goes to 0 V, deactivating CMOS flip-flop FF. At time t4, $\phi_E$ goes to 3 V, thereby equalizing CMOS flip-flop FF in SA1, placing nodes N1, N2 at Vcc/2 (e.g., 1.5 V). At time t5, $SS_1$, $S_A$, $S_B$ go to 3 V, connecting the bit line to the sense amplifier, and thereafter $\phi_N$ rises from 0 V to 3 V and $\phi_P$ drops from 3 V to 0 V, causing the potential difference between bit lines $BL_{2A}$, $BL_{4A}$, t6).

Specifically, if "0" is programmed in memory cells $MC_{21}$, $MC_{51}$, $MC_{81}$, . . . , node N1 in SA1 will be at 3 V and node N2 will be at 0 V. If "1" is programmed in the memory cells, node N1 will be at 0 V and node N2 will be at 3 V. Thereafter, when column select signal CSL rises from 0 V to 3 V, the data latched in the CMOS flip-flop is outputted to I/O, I/O' (time t7).

Because bit lines $BL_{1A}$, $BL_{3A}$, $BL_{5A}$, . . . are grounded to 0 V through the read operation, noise due to the capacitive coupling between bit lines is reduced.

Figure 85:
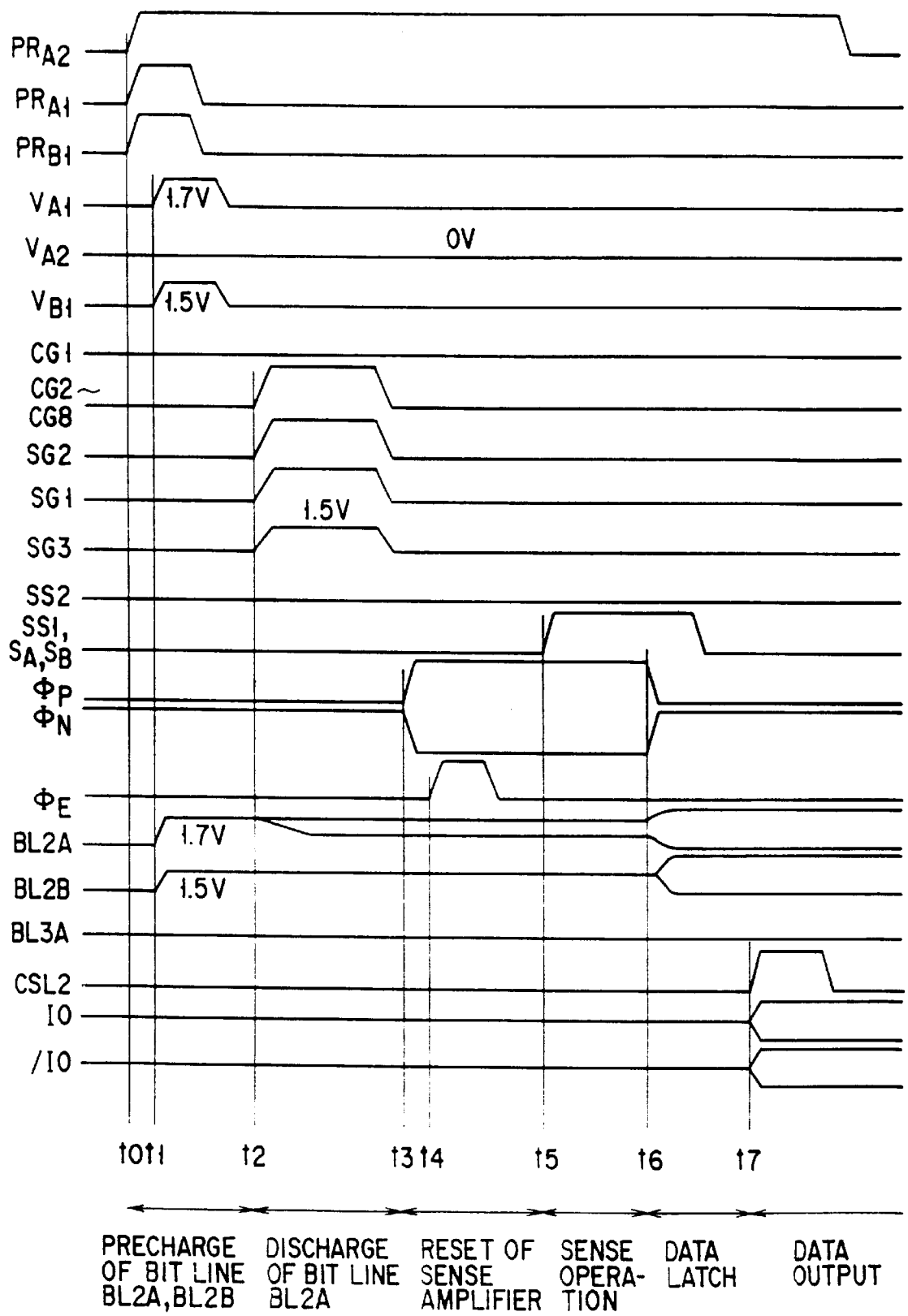
FIG. 85 is a timing chart to help explain the data read operation in the thirteenth embodiment.
Figure 86:
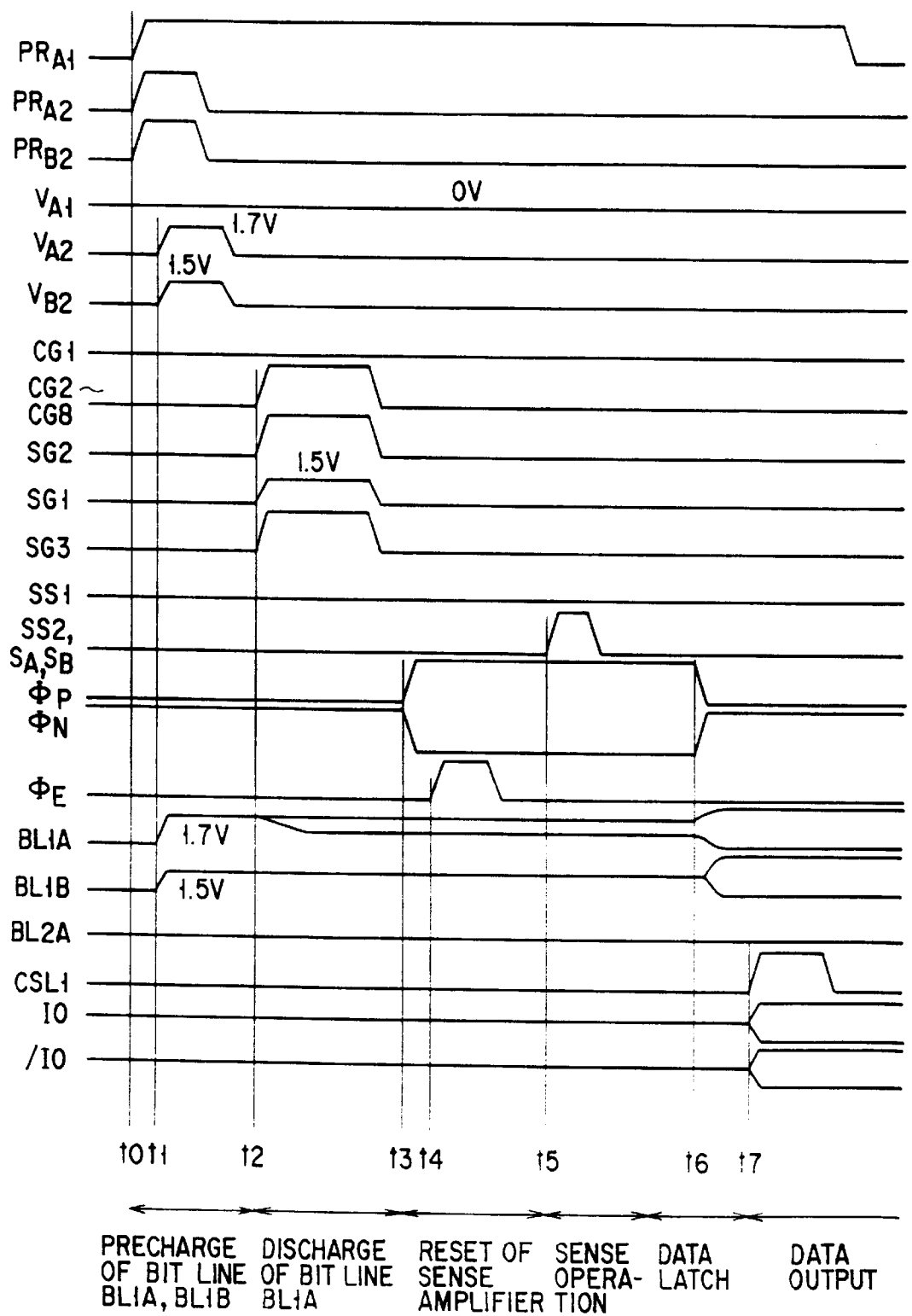
FIG. 86 is a timing chart to help explain the data read operation in the thirteenth embodiment.

Similarly, FIG. 85 is a timing chart for reading the data in memory cells $MC_{31}$, $MC_{61}$, $MC_{91}$, . . . in the third memory cell unit onto bit lines $BL_{2A}$, $BL_{4A}$, $BL_{6A}$, possible to make the third memory cell unit selected and the first and second memory cell units unselected.

The timing for reading is arbitrary. For example, after the transfer gate connecting the bit lines to the sense amplifier has been turned on at time t5 to transfer the potentials of the bit lines and dummy bit lines to nodes N1, N2 of the sense amplifier, the transfer gate may be turned off. In this case, because the bit lines and dummy bit lines are disconnected from the sense amplifier, the load capacitance of the sense amplifier reduces, enabling the potentials of nodes N1, is N2 to be determined rapidly in sensing and latching data.

In the above embodiment, when memory cells $MC_{11}$, $MC_{41}$, $MC_{71}$, . . . are read from, bit lines $BL_{1A}$, $BL_{3A}$, $BL_{5A}$, . . . are precharged and bit lines $BL_{0A}$, $BL_{2A}$, $BL_{4A}$, . . . are grounded, thereby causing the data in the memory cells to be read onto bit lines $BL_{1A}$, $BL_{3A}$, $BL_{5A}$, . . . Which of the bit lines connected to both ends of the memory cell unit the data is read onto is arbitrary. For example, when memory cells $MC_{11}$, $MC_{41}$, $MC_{71}$, . . . are read from, bit lines $BL_{0A}$, $BL_{2A}$, $BL_{4A}$, . . . may be precharged and bit lines $BL_{1A}$, $BL_{3A}$, $BL_{5A}$, . . . be grounded, thereby causing the data in the memory cells to be read onto bit lines $BL_{0A}$, $BL_{2A}$, $BL_{4A}$, . . .

<Program Operation>

The program operation of the present embodiment will be explained.

Explanation will be given about the procedure for programming the data into memory cells $MC_{11}$, $MC_{41}$, $MC_{71}$, . . . in the first memory cell unit of FIG. 82A.

Select gates $SG_2$, $SG_3$ are placed at 0 V, causing all of the select MOS transistors whose gate electrode is select gate $SG_2$ to turn off. $SG_1$, CG1 to CG8 are placed at Vcc and bit lines $BL_{1A}$, $BL_{3A}$, $BL_{5A}$, . . . are placed at Vcc, precharging the channels in a page to be written into to Vcc-Vth (lower than the bit-line potential Vcc because of a drop in the threshold voltage of the select MOS transistor). Bit lines BLiAl $BL_{3A}$, $BL_{5A}$, . . . may be placed at Vcc or 0 V, or may be placed at a given voltage.

Thereafter, when select gate $SG_1$ is placed at Vsgl (e.g., 1.5 V), the I-type select MOS transistors $ST_{11}$, $ST_{41}$, $ST_{71}$, . . . turn on, but the E-type select MOS transistors turn off, bringing the channels of the memory cells $MC_{21}$, $MC_{31}$, $MC_{51}$, $MC_{61}$, . . . not to be programmed into in the floating state at a potential of Vcc-Vth charged from the bit lines.

The data programmed into the memory cells $MC_{11}$, $MC_{41}$, $MC_{71}$, . . . in the first memory cell unit is supplied from bit lines $BL_{1A}$, $BL_{3A}$, $BL_{5A}$, . . . For example, when "0" is programmed into memory cell $MC_{11}$, bit line $BL_{1A}$ is placed at 0 V, turning on I-type select MOS transistor $ST_{11}$, placing the channel of memory cell $MC_1$, at 0 V. When "1" is programmed into memory cell $MC_{11}$, bit line $BL_{1A}$ is placed at 3 V, turning off I-type select MOS transistor $ST_{11}$, bringing the channel of memory cell $MC_{11}$ into the floating state at Vcc–Vth. Bit lines $BL_{0A}$, $BL_{2A}$, $BL_{4A}$, ... may be place at Vcc or 0 V or may be placed at a given voltage.

After select gate $SG_1$ has been changed from Vcc to Vsgl (a voltage higher than the threshold voltage of the I-type select MOS transistors but lower than the threshold voltage of the E-type select MOS transistors, for example, 1.5 V), control gates CG1 to CG8 are changed from Vcc to an intermediate potential of $V_M$ (about 10 V). Since the channels of memory cells $MC_{21}$, $MC_{31}$, $MC_{51}$, ... not to be programmed into and the channels of memory cells $MC_{11}$, $MC_{41}$, $MC_{71}$, ... into which "1" is written are in the floating state, they rise from Vcc–Vth to the intermediate potential (about 10 V) through the capacitive coupling between the control gates and the channels. The channels of memory cells $MC_{11}$, $MC_{41}$, $MC_{71}$, ... into which "0" is programmed are at 0 V because the bit lines are at 0 V.

After the channels of unselected memory cells in programming and memory cells into which "1" is programmed have risen from Vcc–Vth to the intermediate potential, control gate $CG_1$ is raised from the intermediate potential of $V_M$ to a program voltage of Vpp (20 V). Then, because the channels of the memory cells not to be programmed into in the second and third memory cell units and the channels of the memory cells into which "1" is programmed in the first memory cell unit at the intermediate potential (about 8 V) and the control gate $GC_1$ is at Vpp (about 20 V), these memory cells are not programmed into. However, the channels of the memory cells into which "0" is programmed are at 0 V and the control gate is at Vpp (about 20 V), electrons are injected from the substrate into the floating gate, thereby programming "0".

Figure 87:
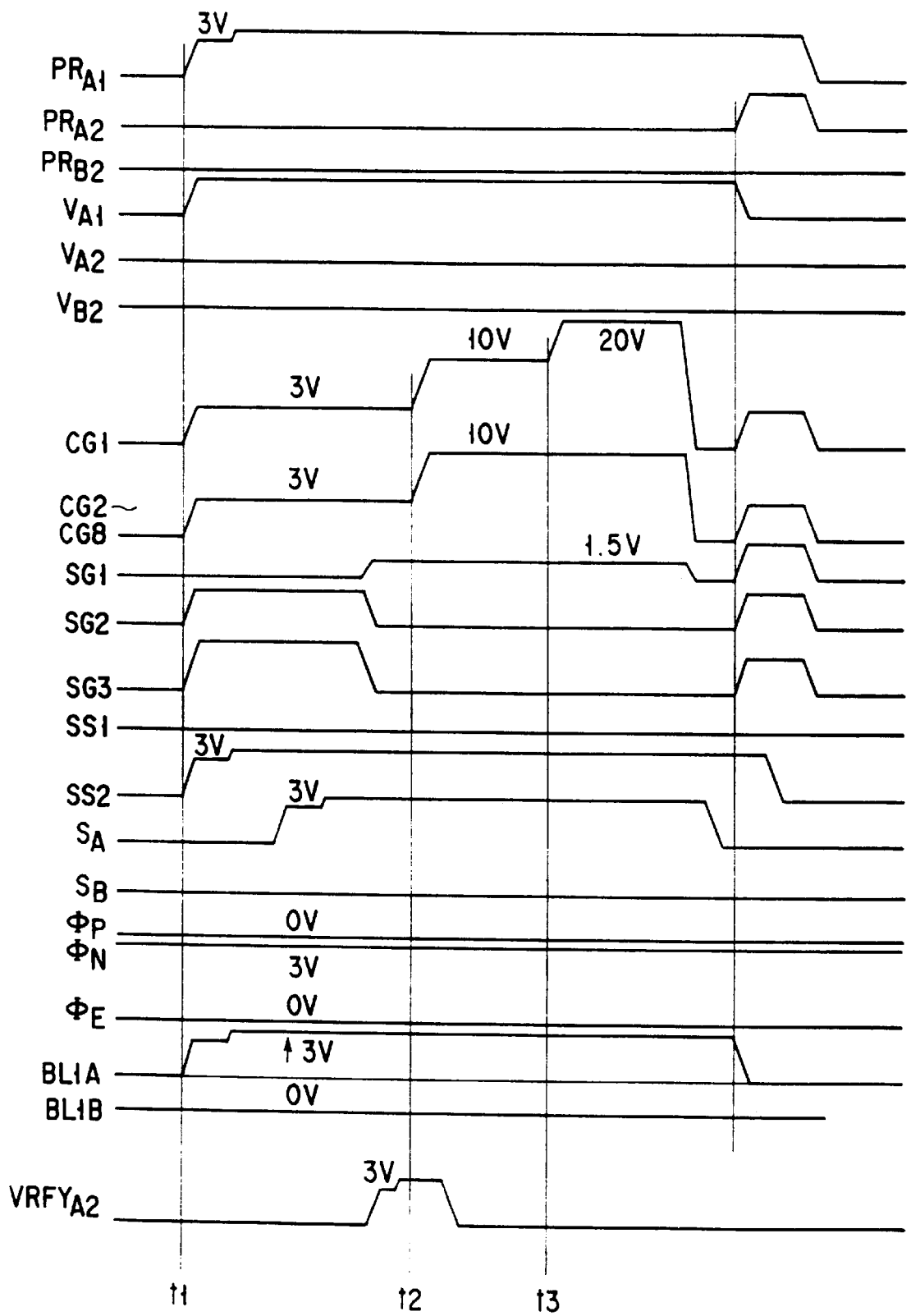
FIG. 87 is a timing chart to help explain the data program operation in the thirteenth embodiment.

Using a timing chart, the program operation of the present embodiment will be described in more detail. FIG. 87 is a timing chart for programming the data in memory cell $MC_{11}$ (and $MC_{41}$, $MC_{71}$, ... ).

The data programmed into memory cells $MC_{11}$, $MC_{41}$, $MC_{71}$, ... is latched in a sense amplifier circuit (SA2 of FIG. 52B). Namely, when "0" is programmed, node N1 is at 0 V and node N2 is at 3 V. When "1" is programmed, node N1 is at 3 V, and node N2 is at 0 V.

When a program operation starts, $SG_1$ is placed at Vss, and $SG_2$, $SG_3$, $CG_1$ to $CG_8$ are placed at Vcc at time t1. In the present embodiment, when the data is programmed into memory cells $MC_{11}$, $MC_{41}$, $MC_{71}$, ..., the data will not be written into the memory cells in the second and third memory cell units. To achieve this, the channels of memory cells $MC_{21}$, $MC_{31}$, $MC_{51}$, $MC_{61}$, ... are charged from bit lines $BL_{0A}$, $BL_{2A}$, $BL_{4A}$, ...

In the present embodiment, bit lines $BL_{0A}$, $BL_{2A}$, $BL_{4A}$, ... are charged from $V_{A1}$, of sense amplifier SA1 of FIG. 52A to Vcc. As a result, the channels of the unselected memory cells are charged to Vcc–Vth. At this time, the channels of the memory cells to be programmed into are also charged to Vcc–Vth. To charge the channels of the memory cells in the second and third memory cell units, they may be charged from bit lines $BL_{0A}$, $BL_{2A}$, $BL_{4A}$, ... or from bit lines $BL_{1A}$, $BL_{3A}$, $BL_{5A}$, Either Vcc or Vss (0 V) is applied to bit lines $BL_{1A}$, $BL_{3A}$, $BL_{5A}$, ... according to the data latched in the sense amplifier circuit SA2. With this, when "0" is programmed into memory cell $MC_{11}$, bit line $BL_{1A}$ is placed at 0 V, placing the channel of memory cell $MC_{11}$ at 0 V. When "1" is programmed into memory cell $MC_{11}$, bit line $BL_{1A}$ is placed at Vcc (e.g., 3 V), charging the channel of memory cell $MC_{11}$ to Vcc–Vth.

After the bit lines have been charged, select gate $SG_1$ is placed at Vsgl (e.g., 1.5 V) and select gates $SG_2$, $SG_3$ are placed at vss (e.g., 0 V). All of the select MOS transistors whose gate electrodes are select gates $SG_2$, $SG_3$ turn off. Since the select MOS transistors whose gate electrode is $SG_1$ in the second and third memory cell units not to be programmed into are of the E-type, they are off, bringing the channels of the memory cells in the second and third memory cell units into the floating state at Vcc–Vth.

Because the memory cell-side drains of the select MOS transistors $ST_{11}$, $ST_{41}$, $ST_{71}$, ... of the memory cells $MC_{11}$, $MC_{41}$, $MC_{71}$, ... into which "1" is programmed are at Vcc–Vth (e.g., if the threshold voltage of the I-type transistor is 0.5 V, 3–0.5=2.5 V will be given), the bit-line contact-side sources are at Vcc (e.g., 3 V), and select gate $SG_1$ is at Vsgl (e.g., 1.5 V), select MOS transistors $ST_{11}$, $ST_{41}$, $ST_{71}$, programming, the channels of memory cells $MC_{11}$, $MC_{41}$, $MC_{71}$, ... are in the floating state.

When "0" is programmed into memory cells $MC_{11}$, $MC_{41}$, $MC_{71}$, ... , because the select gates $SG_1$ of select MOS transistors $ST_{11}$, $ST_{41}$, $ST_{71}$ are at Vsgl (e.g., 1.5 V) and the sources and drains are at 0 V, select MOS transistors $ST_{11}$, $ST_{41}$, $ST_{71}$ turn on, keeping the channels of the memory cells at 0 V.

After select gate $SG_1$ has been placed at Vsgl (about 1.5 V), control gates $CG_1$ to $CG_8$ are changed from Vcc to an intermediate potential of $V_M$ (about 10 V) at time t2. Since the channels of the unselected memory cells in programming and the channels of memory cells $MC_{11}$, $MC_{41}$, $MC_{71}$, ... into which "1" is programmed are in the floating state, they rise from Vcc–Vth to the intermediate potential (about 8 V) through the capacitive coupling between the control gate and the channel. The channels of memory cells $MC_{11}$, $MC_{41}$, $MC_{71}$, ... into which "0" is programmed are at 0 V because the bit lines are at 0 V.

After the channels of unselected memory cells in programming and memory cells into which "1" is programmed have risen from Vcc–Vth to the intermediate potential, control gate $CG_1$ is raised from the intermediate potential of $V_M$ to a program voltage of Vpp (20 V) at time 3. Then, because the channels of the memory cells in the second and third memory cell units not to be programmed into and the channels of memory cells $MC_{11}$, $MC_{41}$, $MC_{71}$, ... into which "1" is programmed are at the intermediate potential (about 10 V) and the control gate $GC_1$ is at Vpp (about 20 V), these memory cells are not programmed into. However, the channels of memory cells $MC_{11}$, $MC_{41}$, $MC_{71}$, ... into which "0" is programmed are at 0 V and the control gate is at Vpp (about 20 V), electrons are injected from the substrate into the floating gate, thereby programming "0".

After the programming has been completed, the control gates, select gates, and bit lines are discharged one after another, which completes the program operation.

When the data is programmed into memory cells $MC_{21}$, $MC_{51}$, $MC_{81}$, ... in the second memory cell unit, after the channels of the memory cells in the first and third memory cell units have been charged to Vcc (or Vcc–Vth), select gate $SG_1$ is placed at Vss, $SG_2$ is placed at Vsl, and $SG_3$ is placed at Vsgh, and bit lines $BL_{2A}$, $BL_{4A}$, $BL_{6A}$, ... are placed at Vcc or Vss, thereby causing the data to be transferred to memory cells $MC_{21}$, $MC_{51}$, $MC_{81}$, ...

When the data is programmed into memory cells $MC_{31}$, $MC_{61}$, $MC_{91}$, ... in the third memory cell unit, after the channels of the memory cells in the first and second memory cell units have been charged to Vcc (or Vcc–Vth), select gate $SG_1$ is placed at Vss, $SG_3$ is placed at Vsgl, and $SG_2$ is placed at Vsgh, and bit lines $BL_{2A}$, $BL_{4A}$, $BL_{6A}$, . . . are placed at Vcc or Vss, thereby causing the data to be transferred to memory cells $MC_{31}$, $MC_{61}$, $MC_{91}$, . . .

Figure 88:
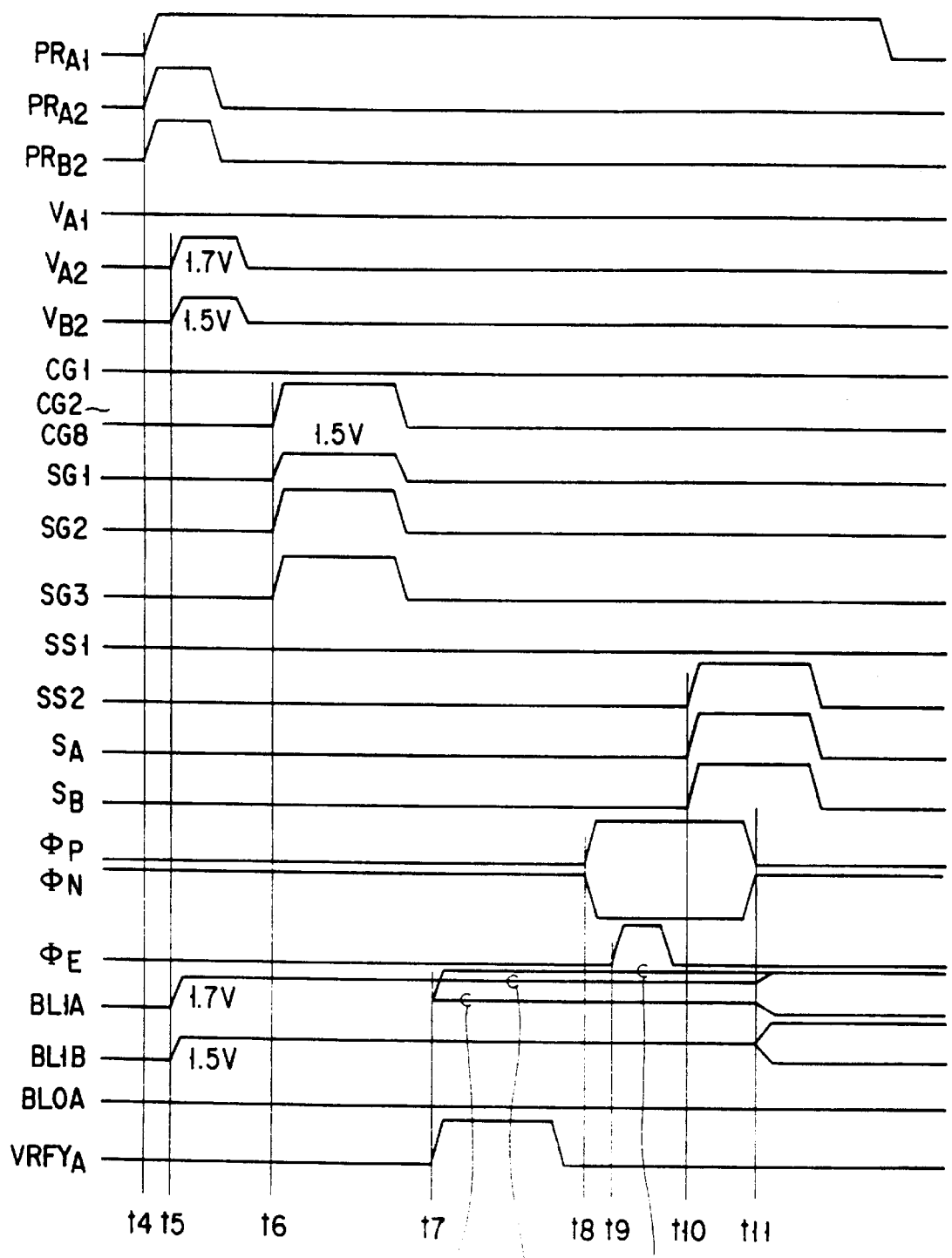
FIG. 88 is a timing chart to help explain the program verify read operation in the thirteenth embodiment.

After the programming has been completed, a program verify operation is carried out to see if the programming has been done sufficiently (FIG. 88). As in a read operation, in a verify read operation of the first memory cell unit, select gate $SG_1$ is placed at Vsgl, and $SG_2$ and $SG_3$ are placed at Vsgh. In the verify read operation, after the bit lines have been discharged from the precharge potential, the bit lines are charged again by the programming data. Thereafter, by sensing the bit-line potential, the reprogramming data is latched in the sense amplifier. The details of the operation of a sense amplifier and the recharging of bit lines have been described in, for example, the following technical document: T. Tanaka et al., IEEE J. Solid-state Circuit, vol. 29, pp. 2366–1373, 1994.

In the above embodiment, one third of the memory cells in the column direction are written into simultaneously. That is, of the three memory cell units, only one memory cell unit is programmed into simultaneously.

With the present embodiment, however, of the three memory cell units, two memory cell units can be programmed into simultaneously. For example, by placing both select gates $SG_1$ and $SG_2$ at Vsgl (e.g., 1.5 V), and $SG_3$ at Vsgh, the E-type select MOS transistors whose gate electrodes are select gates $SG_1$, $SG_2$ turn off and the I-type select MOS transistors turn on. The programming data in memory cells $MC_{11}$, $MC_{41}$, $MC_{71}$, . . . in the first memory cell unit is transferred from bit lines $BL_{1A}$, $BL_{3A}$, $BL_{5A}$, . . .

Namely, when "0" is programmed, the bit lines and the channel of a memory cell to be programmed into are at 0 V. When "1" is programmed, the bit lines are at Vcc and the channel is in the floating state at Vcc–Vth. Similarly, the programming data in memory cells $MC_{21}$, $MC_{51}$, $MC_{81}$, . . . in the second memory cell unit is transferred from bit lines $BL_{2A}$, $BL_{4A}$, $BL_{6A}$, . . .

Same as described above, by placing $SG_1$ and $SG_3$ at Vsgl and $SG_2$ at Vsgh, the first and third memory cell units can be programmed into almost simultaneously. In this case, the data is transferred from bit lines $BL_{1A}$, $BL_{3A}$, $BL_{5A}$, . . . to the memory cells in the first memory cell unit and from bit lines $BL_{2A}$, $BL_{4A}$, $BL_{6A}$, . . . to the memory cells in the third memory cell unit.

After the programming has been completed, a verify read operation is carried out to see if the programming has been done sufficiently. In the verify read operation in the above embodiment, two bit lines are used to read the data from a single memory cell. That is, of the three memory cell units, the data in one memory cell unit is read out almost simultaneously. Therefore, when the data is programmed into two memory cell units almost at the same time, two verify read operations are performed for a single program operation.

With a method of programming the data into two memory cell units almost simultaneously, verify reading is effected for each memory cell unit, the total time required to program the data into two memory cell units is about Tpr+2Tvfy (Tpr is the program pulse width and Tvfy is the time required for a single verify read operation). Since with the method of programming the data in a single memory cell unit almost simultaneously, the total time required to write two memory cell units of data is about 2(Tpr+Tvfy), the method of programming the data into two memory cell units simultaneously has a faster programming speed.

Figure 89:
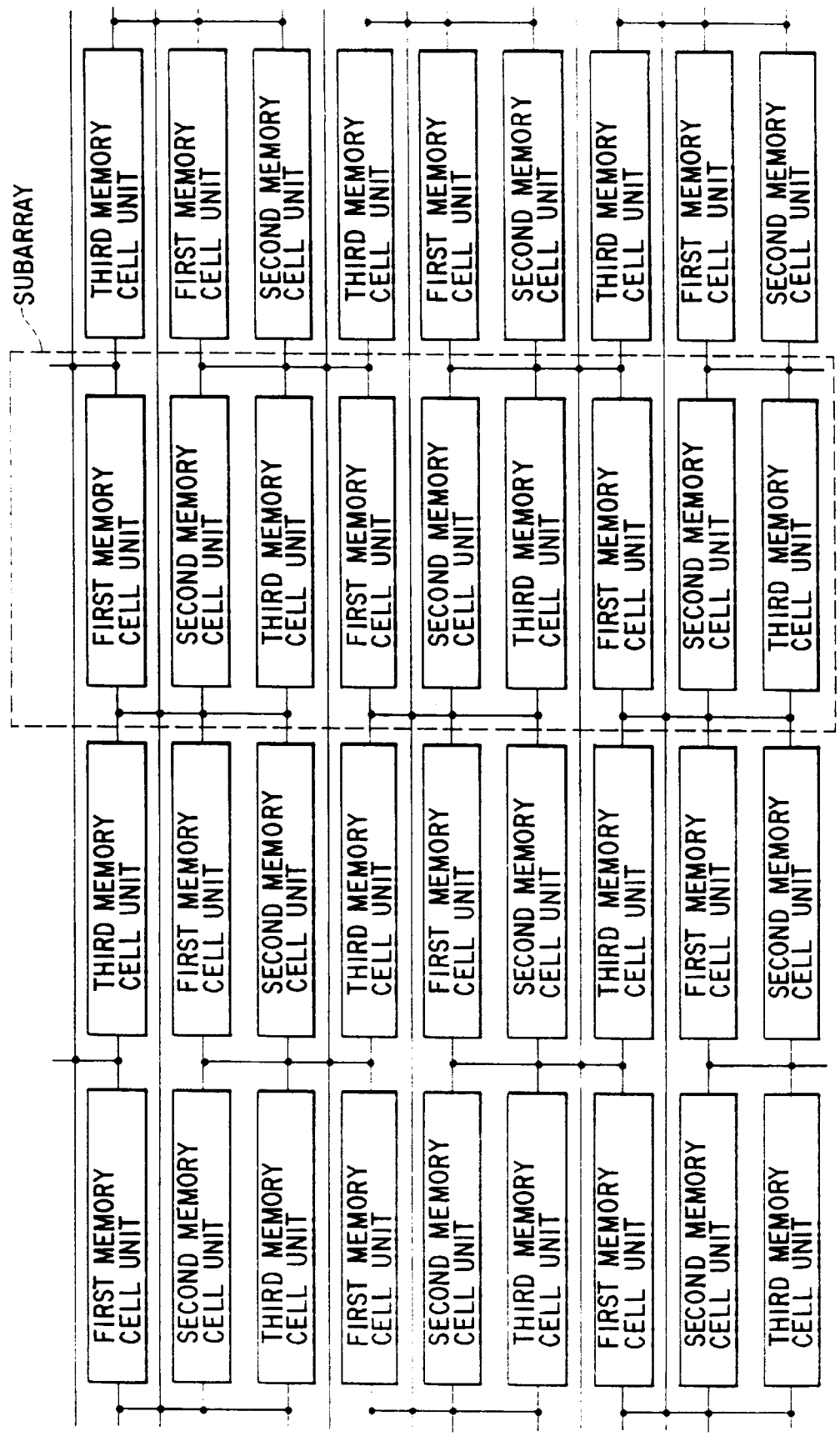
FIG. 89 shows another structure of a memory cell array associated with the thirteenth embodiment.

While in the above embodiment, a sense amplifier is provided for each bit line, a sense amplifier may be provided for every two bit lines, or what is called a common sense amplifier system (FIG. 58) may be used. In this case, timing charts for programming and reading are almost the same as those in the above embodiment. Furthermore, the arrangement of the memory cells in the memory cell array may be as shown in FIG. 89, for example.

With the invention, some of the select MOS transistors sharing a single select gate are made conducting and the other are made nonconducting. Use of three such select gates makes it easy to realize selected ones and unselected ones among the memory cells sharing the same select gate.

Therefore, the threshold voltage of the select MOS transistor and the voltage applied to the select gate are arbitrary. The select MOS transistor at one end of the memory cell has two threshold voltages of Vtd1, Vtd2 (Vtd1>Vtd2) and two voltages applied to its select gate of Vsghd (Vsghd>Vtd1), Vsgld (Vtd1>Vsgld>Vtd2). One of the select MOS transistors connected in series at the other end of the memory cell has two threshold voltages of Vts1, Vts2 (Vts1>Vts2) and two voltages applied to its select gate of Vsghs (Vsghs>Vts1), Vsgls (Vts1>Vsgls>Vts2). The other of the select MOS transistors connected in series has two threshold voltages of Vtp1, Vtp2 (Vtp1>Vtp2) and two voltages applied to its select gate of Vsghs (Vsghs>Vtp1), Vsglp (Vtp1 >Vsglp>Vtp2).

Unlike the above embodiment, the equations Vtd1=Vts1= Vtp1, Vtd2 Vts2=Vtp2, Vsghd=Vsghs=Vsghp, and Vsgld= Vsgls=Vsglp may not be fulfilled. The way of setting the threshold voltage and the voltage applied to the select gate are arbitrary. For example, the threshold voltage of the select MOS transistor at one end of a memory cell may have threshold voltages of 2 V and 0.5 V; the threshold voltage of one of the select MOS transistors connected in series at the other end of the memory cell may have threshold voltages of 2.5 V and 1 V; the threshold voltage of the other of the select MOS transistors connected in series at the other end may have threshold voltages of 0.8 V and 3.5 V; a voltage applied to the select gate at one end of the memory cell may be Vsgh=3 V and Vsgl=1.5 V; a voltage applied to one of the select gates connected in series at the other end of the memory cell may be Vsgh=3 V and Vsgl=1.2 V; and a voltage applied to the other of the select gates connected in series at the other end may be Vsgh=4 V and Vsgl=3 V.

Furthermore, the threshold voltages of three select MOS transistors connected to a single NAND column may be almost the same. For example, the threshold voltages of three select MOS transistors connected to a NAND column may be 0.8 V; the threshold voltage of the select MOS transistor at one end of an adjacent NAND cell sharing the gate electrode of the select MOS transistor with the NAND column may be 0.2 V; the threshold voltage of the two select MOS transistors connected in series at the other end of the memory cell may be 1.4 V and 0.8 V; a voltage applied to the select gate at one end of the NAND cell may be Vsgh 3 V and Vsgl=0.5 V; and a voltage applied to the two select gates connected in series at the other end of the NAND cell may be Vsgh=3 V and Vsgl=1.2 V. Furthermore, the threshold voltage of the select gate may be negative or a voltage applied to the select gate may be negative.

Making Vsgh higher than Vcc leads to an increase in the conductance of the select MOS transistor (that is, a decrease in the resistance), causing a current flowing through the NAND cell column to increase in a read operation. This shortens the bit-line discharging time, making the reading and the program verify reading faster. Vsgh may be raised from Vcc at the charge pump circuit within the chip, for example.

The larger one of the threshold voltages of select MOS transistors may be set at a voltage (e.g., 3.5 V) equal to or higher than the power supply voltage Vcc. In this case, to turn on the select MOS transistor with the threshold voltage in a read operation or a verify read operation, for example, 4 V is applied to the select gate by, for example, using the charge pump circuit in the chip circuit.

To change the threshold voltage, the various methods explained in the seventh embodiment or first embodiment can be used.

In the above embodiment, when the second and third memory cell units are written into, 0 V is applied to $SG_1$. If a select MOS transistor whose gate electrode is the select gate is of the I-type and its threshold voltage Vt2 is about 0.1 V (or a negative voltage), the select MOS transistor will cut off completely, permitting a cell current to flow. As a result, the channels of the unselected memory cells in programming will not be raised from Vcc−Cth to the intermediate potential $V_M$. If they are raised, the flow of cell current causes their potential to drop from $V_M$. In any case, because the channels of the unselected memory cells in programming drops from $V_M$, "0" is programmed into them erroneously.

To improve the cut-off characteristic of the I-type transistor, a voltage of, for example, about 0.5 V is applied to the bit lines to which the programming data is not supplied in the read operation (bit lines $BL_{1A}$, $BL_{3A}$, $BL_{5A}$, . . . in programming-the data into the second and third memory cell units of FIG. 82A). By applying 0.5 V to the source of the select MOS transistor, the potential difference between the source and the substrate becomes −0.5 V, which increases the threshold voltage of the I-type transistor because of substrate bias effects, improving the cut-off characteristic of the I-type transistor whose gate is applied with 0 V.

To set the lower one (of the I-type) of the threshold voltages of the select MOS transistors at, for example, 0.5 V, the thinning of the substrate concentration can be considered. The I-type transistor whose substrate concentration is low has a problem: even if the gate voltage is not applied, applying the drain voltage causes the depletion layer between the drain and the substrate to get wider, so that the depletion layer between the drain and the substrate is liable to connect with the depletion layer between the source and the substrate (punch-through). To raise the punch-through withstand voltage of the I-type select MOS transistor, the channel length of the I-type select MOS transistor may be made greater.

Figure 90:
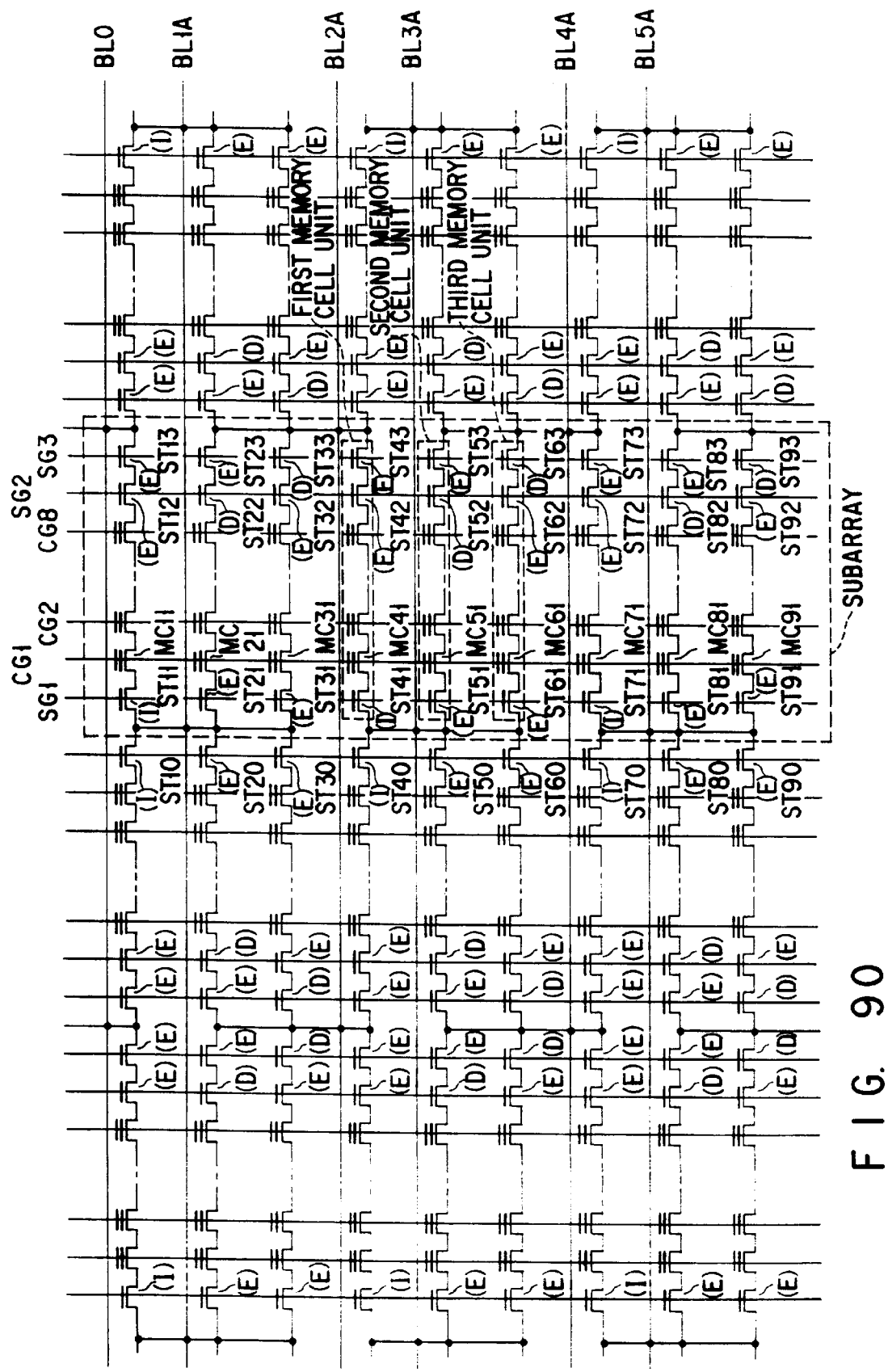
FIG. 90 shows the structure of a memory cell array associated with a fourteenth embodiment of the present invention.

The threshold voltages of select MOS transistors may be as shown in FIG. 90. The threshold voltage of the E-type select MOS transistor is placed at, for example, 2 V, the threshold voltage of the I-type select MOS transistor is placed at 0.5 V, and the threshold voltage of the D-type select MOS transistor is placed at −2 V. The method of reading and writing in the fourteenth embodiment is almost the same as that of the thirteenth embodiment, except that voltage Vsgl that turns on the D-type select MOS transistor but turns off the E-type select MOS transistor is 0 V. Specifically, when the first memory cell unit is selected in a read operation, $SG_1$ is placed at 1.5 V, and $SG_2$ and $SG_3$ are placed at 3 V; when the second memory cell unit is selected in a read operation, $SG_1$ and $SG_3$ are placed at 3 V, and $SG_2$ is placed at 3 V; and when the third memory cell unit is selected in a read operation, $SG_1$ and $SG_2$ are placed at 3 V, and $SG_3$ is placed at 3 V.

For a program operation, almost as in the seventh embodiment, when the first memory cell unit is programmed into, $SG_1$ is placed at 1.5 V and $SG_2$ and $SG_3$ are placed at 0 V; when the second memory cell unit is programmed into, $SG_1$ and $SG_2$ are placed at 0 V and $SG_3$ is placed at 0 V; and when the first memory cell unit is programmed into, $SG_1$ and $SG_3$ are placed at 0 V and $SG_3$ is placed at 3 V. Furthermore, with the threshold voltage of select MOS transistors being at about −8 V, when the second and third memory cell units are written into, writing can be effected in a similar manner described in the fourth and twelfth embodiments (where the channels of the unselected memory cell in writing are prevented from floating).

For example, when memory cell $MC_{51}$ is written into, $SG_1$ and $SG_2$ are placed at 0 V and $SG_3$ is placed at $V_{M10}$ (about 10 V), CG is placed at Vpp, and CG2 to CG8 are placed at $V_{M10}$. When "1" is programmed, $BL_{4A}$ is placed at $V_{M8}$ (about 8 V); when "0" is programmed, $BL_{4A}$ is placed at 0 V. Then, the channel of a memory cell into which "1" is programmed is charged from the bit line to the intermediate potential (about 8 V). On the other hand, for the first and third memory cell units not to be programmed into, the channels of memory cells may be brought into the floating at Vcc as shown in the thirteenth embodiment, placing the channels of memory cells at the unselected potential in writing ($V_{M8}$) through the coupling with the control gates.

The present invention may be applied to not only the nonvolatile semiconductor memory device but also the other semiconductor memory devices including such as DRAM (dynamic random access memory).

The present invention may be practiced or embodied in still other ways without departing from the spirit or essential character thereof.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A nonvolatile semiconductor memory device comprising:

a first and second common signal lines;

at least one word line; and a memory cell array in which a plurality of memory cell units are arranged in a matrix, said plurality of memory cell units comprising memory cell section having at least one nonvolatile memory cell and having a first end and a second end, wherein at said first end of each of said plurality of memory cell units, a plurality of memory cell units sharing at least one word line share a contact and are connected to said first common signal line; and said second end of each of said plurality of memory cell units are connected to said second common signal line, and when programming of said plurality of memory cell units is performed, a programming potential is applied from said first common signal line to said selected memory cell units to be programmed, after applying a programming unselected potential from one of said first common signal line and said second common signal line to another unselected memory cell unit sharing the contact with selected memory cell units.

2. A nonvolatile semiconductor memory device according to claim 1, wherein each of said plurality of memory cell units contains at least one select MOS transistor for making said memory cell section conducting to at least one of said first and second common signal lines.

3. A nonvolatile semiconductor memory device according to claim 2, wherein said plurality of memory cell units contains at least a first memory cell unit and a second memory cell unit, each of said first and second memory cell units containing two select MOS transistors connected in series for making said memory cell section conducting to said first select MOS transistor connected to said first common signal line, and a second select MOS transistor connected to said memory cell section, and constituting a subarray in such a manner that they share the gate electrodes of said first and second select MOS transistors as a first and second select gate, with the threshold voltage of said second select MOS transistor in said first memory cell unit being higher than the threshold voltage of said second select MOS transistor in said second memory cell unit when the threshold voltage of said first select MOS transistor in said first memory cell unit is lower than the threshold voltage of said first select MOS transistor in said second memory cell unit, and the threshold voltage of said second select MOS transistor in said first memory cell unit being lower than the threshold voltage of said second select MOS transistor in said second memory cell unit when the threshold voltage of said first select MOS transistor in said first memory cell unit is higher than the threshold voltage of said first select MOS transistor in said second memory cell unit.

4. A nonvolatile semiconductor memory device according to claim 3, further comprising means for applying a write select gate voltage to said first and second select MOS transistors in such a manner that, when the first memory cell unit is programmed into, at least one of said first and second select MOS transistors of said second memory cell unit is made nonconducting, both of said first and second select MOS transistors are made conducting in said first memory cell unit, and applying programming potential from said first common signal line to said selected memory cell units to be programmed, after said programming unselected potential is applied to said second memory cell unit from said first common signal line by means of making conducting both of said first and second select MOS transistors in said second memory cell unit.

5. A nonvolatile semiconductor memory device according to claim 1, wherein said unselected potential is applied from said first common signal line.

6. A nonvolatile semiconductor memory device according to claim 1, wherein said unselected potential is applied from said second common signal line.

7. A nonvolatile semiconductor memory device according to claim 3, further comprising means for applying a write select gate voltage to said first select MOS transistor in such a manner that, when the first memory cell unit is programmed, at least one of said first and second select MOS transistors of said second memory cell unit is made nonconducting, both of said first and said second select MOS transistors are made conducting in said first memory cell unit, and for applying programming potential from said first common signal line to said selected memory cell units to be programmed, after said programming unselected potential is applied to said second memory cell unit from said second common signal line.

\* \* \* \* \*